US012094944B2

(12) United States Patent
Iwata et al.

(10) Patent No.: US 12,094,944 B2
(45) Date of Patent: Sep. 17, 2024

(54) TRANSISTOR CIRCUITS INCLUDING FRINGELESS TRANSISTORS AND METHOD OF MAKING THE SAME

(71) Applicant: SANDISK TECHNOLOGIES LLC, Addison, TX (US)

(72) Inventors: Dai Iwata, Yokkaichi (JP); Hiroshi Nakatsuji, Yokkaichi (JP); Hiroyuki Ogawa, Nagoya (JP); Eiichi Fujikura, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 272 days.

(21) Appl. No.: 17/316,015

(22) Filed: May 10, 2021

(65) Prior Publication Data

US 2022/0359690 A1 Nov. 10, 2022

(51) Int. Cl.
*H01L 27/092* (2006.01)
*H01L 21/8238* (2006.01)
(Continued)

(52) U.S. Cl.
CPC .. *H01L 29/42356* (2013.01); *H01L 21/82385* (2013.01); *H01L 21/823857* (2013.01); *H01L 21/823871* (2013.01); *H01L 21/823878* (2013.01); *H01L 27/0629* (2013.01); *H01L 27/0727* (2013.01); *H01L 27/0922* (2013.01); *H01L 29/401* (2013.01); *H01L 29/42376* (2013.01); *H01L 29/66553* (2013.01); *H01L 29/6656* (2013.01)

(58) Field of Classification Search
CPC ....... H01L 21/82345; H01L 21/823462; H01L 21/823842; H01L 21/823857; H01L 27/0629; H01L 27/0922
See application file for complete search history.

(56) References Cited

U.S. PATENT DOCUMENTS

| | | | |
|---|---|---|---|
| 4,704,368 | A | 11/1987 | Goth et al. |
| 6,074,903 | A | 6/2000 | Rengarajan et al. |

(Continued)

OTHER PUBLICATIONS

Akaiwa, J. et al., "Transistor Circuits Including Fringeless Transistors and Method of Making the Same," U.S. Appl. No. 17/316,079, filed May 10, 2021.

(Continued)

*Primary Examiner* — Bryan R Junge
(74) *Attorney, Agent, or Firm* — THE MARBURY LAW GROUP PLLC

(57) ABSTRACT

A field effect transistor includes a gate dielectric and a gate electrode overlying an active region and contacting a sidewall of a trench isolation structure. The transistor may be a fringeless transistor in which the gate electrode does not overlie a portion of the trench isolation region. A planar dielectric spacer plate and a conductive gate cap structure may overlie the gate electrode. The conductive gate cap structure may have a z-shaped vertical cross-sectional profile to contact the gate electrode and to provide a segment overlying the planar dielectric spacer plate. Alternatively or additionally, a conductive gate connection structure may be provided to provide electrical connection between two electrodes of adjacent field effect transistors.

10 Claims, 73 Drawing Sheets

(51) Int. Cl.

| | |
|---|---|
| ***H01L 27/06*** | (2006.01) |
| ***H01L 27/07*** | (2006.01) |
| ***H01L 29/40*** | (2006.01) |
| ***H01L 29/423*** | (2006.01) |
| ***H01L 29/66*** | (2006.01) |

(56) References Cited

U.S. PATENT DOCUMENTS

| | | | | |
|---|---|---|---|---|
| 8,241,984 | B2 * | 8/2012 | Iwase .................... | H01L 27/105 438/257 |
| 9,209,182 | B2 | 12/2015 | Chern et al. | |
| 9,859,422 | B2 | 1/2018 | Nishikawa et al. | |
| 10,115,735 | B2 | 10/2018 | Amano et al. | |
| 10,224,407 | B2 | 3/2019 | Chowdhury et al. | |
| 10,256,099 | B1 | 4/2019 | Akaiwa et al. | |
| 10,355,017 | B1 | 7/2019 | Nakatsuji et al. | |
| 10,355,100 | B1 | 7/2019 | Ueda et al. | |
| 10,770,459 | B2 | 9/2020 | Iwata et al. | |
| 10,910,020 | B1 | 2/2021 | Kodate et al. | |
| 2001/0050396 | A1 | 12/2001 | Esaki | |
| 2002/0036317 | A1 * | 3/2002 | Matsui .................. | H01L 27/105 257/315 |
| 2003/0132521 | A1 | 7/2003 | Tseng et al. | |
| 2005/0118757 | A1 | 6/2005 | Cabral, Jr. et al. | |
| 2007/0018209 | A1 | 1/2007 | Sahara et al. | |
| 2007/0018328 | A1 | 1/2007 | Hierlemann et al. | |
| 2008/0006885 | A1 * | 1/2008 | Arai .................. | H01L 21/76895 257/E21.59 |
| 2011/0133291 | A1 | 6/2011 | Shibata | |
| 2012/0168846 | A1 * | 7/2012 | Matsui .................. | H10B 69/00 257/316 |
| 2012/0292666 | A1 | 11/2012 | Tamaru | |
| 2013/0020623 | A1 | 1/2013 | Tsui et al. | |
| 2016/0005640 | A1 | 1/2016 | Shinohara et al. | |
| 2016/0351709 | A1 | 12/2016 | Nishikawa et al. | |
| 2017/0207092 | A1 | 7/2017 | Tsukamoto | |
| 2018/0247954 | A1 | 8/2018 | Amano et al. | |
| 2018/0248013 | A1 | 8/2018 | Chowdhury et al. | |
| 2018/0331118 | A1 | 11/2018 | Amano | |
| 2019/0206995 | A1 | 7/2019 | Kim | |
| 2019/0296012 | A1 | 9/2019 | Iwata et al. | |
| 2020/0321355 | A1 * | 10/2020 | Jeong .................. | H01L 27/0207 |

OTHER PUBLICATIONS

ISR—Notification of Transmittal of the International Search Report and Written Opinion of the International Searching Authority for International Patent Application No. PCT/US2022/012579, dated Jun. 27, 2022, 13 pages.

USPTO Office Communication, Non-Final Office Action for U.S. Appl. No. 17/316,079, dated Sep. 29, 2022, 18 pages.

U.S. Appl. No. 16/791,049, filed Feb. 14, 2020, SanDisk Technologies LLC.

U.S. Appl. No. 16/809,798, filed Mar. 5, 2020, SanDisk Technologies LLC.

U.S. Appl. No. 16/901,091, filed Jun. 15, 2020, SanDisk Technologies LLC.

U.S. Appl. No. 17/007,761, filed Aug. 28, 2020, SanDisk Technologies LLC.

U.S. Appl. No. 17/007,823, filed Aug. 31, 2020, SanDisk Technologies LLC.

U.S. Appl. No. 17/063,084, filed Oct. 5, 2020, SanDisk Technologies LLC.

U.S. Appl. No. 17/063,145, filed Oct. 5, 2020, SanDisk Technologies LLC.

U.S. Appl. No. 17/063,182, filed Oct. 5, 2020, SanDisk Technologies LLC.

U.S. Appl. No. 17/188,271, filed Mar. 1, 2021, SanDisk Technologies LLC.

USPTO Office Communication, Non-Final Office Action for U.S. Appl. No. 17/501,163, mailed Jan. 17, 2024, 30 pages.

* cited by examiner

TRANSISTOR CIRCUITS INCLUDING FRINGELESS TRANSISTORS AND METHOD OF MAKING THE SAME

FIELD

The present disclosure relates generally to the field of semiconductor devices and specifically to transistor circuits including fringeless transistors and methods of making the same.

BACKGROUND

Peripheral (i.e., driver) circuitry for a memory device includes multiple types of field effect transistors configurated to operate at different operating voltages. Providing field effect transistors that operate at different operating voltages at a high device density is a challenge.

SUMMARY

According to an aspect of the present disclosure, a semiconductor structure comprising a first field effect transistor is provided. The first field effect transistor comprises a first active region having a pair of lengthwise sidewalls and a pair of widthwise sidewalls that contact sidewalls of, and are laterally surrounded by, a first portion of a trench isolation structure. The first active region comprises a first source region, a first drain region, and a first channel region located between the first source region and the first drain region. A first gate structure including a first gate dielectric, a first gate electrode, a first planar dielectric spacer plate, and a first conductive gate cap structure overlies the first channel region. The first gate dielectric and the first gate electrode contact a sidewall of a protruding region of the first portion of the trench isolation structure that laterally extends along a first horizontal direction. The first planar dielectric spacer plate contacts a first portion of a top surface of the first gate electrode. The first conductive gate cap structure comprises a first segment that contacts a second portion of the top surface of the first gate electrode, a second segment that overlies the first planar dielectric spacer plate, and a connecting segment that contacts a first sidewall of the first planar dielectric spacer plate and connecting the first segment and the second segment.

According to another aspect of the present disclosure, a method of forming a semiconductor structure is provided. The method comprises: forming a first gate dielectric layer and a semiconductor gate material layer over a semiconductor material layer; forming a trench isolation structure through the semiconductor gate material layer and the first gate dielectric layer, wherein patterned portions of the semiconductor gate material layer and the first gate dielectric layer comprise a stack of a first gate dielectric plate and a first gate electrode material plate that is laterally surrounded by a first portion of the trench isolation structure; forming a planar dielectric spacer layer over the first gate electrode; physically exposing a top surface of a portion of the first semiconductor gate material layer by patterning the planar dielectric spacer layer; and forming a first conductive gate cap structure on the physically exposed portion of the top surface of the first gate electrode material plate; and patterning the stack of the first gate dielectric plate and the first gate electrode material plate into a stack of a first gate dielectric and a first gate electrode.

According to yet another aspect of the present disclosure, a semiconductor structure comprising a first field effect transistor and a second field effect transistor is provided. The first field effect transistor and the second field effect transistor comprise a first active region and a second active region, respectively, wherein the first active region and the second active region contact sidewalls of, and are laterally surrounded by, a trench isolation structure, wherein a laterally-extending portion of the trench isolation structure is located between the first active region and the second active region. A stack of a first gate dielectric and a first gate electrode overlies a first channel region within the first active region and contacts a first sidewall of the laterally-extending portion of the trench isolation structure. A stack of a second gate dielectric and a second gate electrode overlies a second channel region within the second active region and contacts a second sidewall of the laterally-extending portion of the trench isolation structure. A conductive gate connection structure contacting a top surface of the first gate electrode, a top surface of the second gate electrode, and a portion of a top surface of the laterally-extending portion of the trench isolation structure, and comprising a pair of widthwise sidewalls that laterally extend along a first horizontal direction and a pair of lengthwise sidewalls that laterally extend along a second horizontal direction. Lengthwise sidewalls of the first gate electrode and the second gate electrode are vertically coincident with the pair of lengthwise sidewalls of the conductive gate connection structure.

According to still another aspect of the present disclosure, a semiconductor structure comprises a first field effect transistor. The first field effect transistor comprises a first active region including a source region, a drain region and a channel region located between the source region and the drain region, a first gate dielectric overlying the active region, a first gate electrode overlying the first gate dielectric, and a trench isolation region surrounding the first active region, the first field effect transistor does not include a fringe region in which the first gate electrode extends past the active region in a horizontal direction which is perpendicular to the source region to the drain region direction, the first gate electrode does not overlie a portion of the trench isolation region, and an entire foot print of the first gate electrode is located over and within a lateral boundary of the first active region.

According to still another aspect of the present disclosure, a method of forming a semiconductor structure is provided. The method comprises: forming a gate dielectric layer and a semiconductor gate material layer over a semiconductor material layer; forming a trench isolation structure through the semiconductor gate material layer and the gate dielectric layer, wherein patterned portions of the semiconductor gate material layer and the gate dielectric layer comprise a first stack of a first gate dielectric plate and a first gate electrode material plate overlying a first active region of the semiconductor material layer and a second stack of a second gate dielectric plate and a second gate electrode material plate overlying a second active region of the semiconductor material layer; forming a conductive gate connection material layer over the first gate electrode material plate, the second gate electrode material plate, and the trench isolation structure; patterning the conductive gate connection material layer into a conductive gate connection structure; anisotropically etching portions of the first gate electrode material plate and the second gate electrode material plate that are not covered with the conductive gate connection structure, wherein patterned portions of the first gate electrode material plate and the second gate electrode material plate comprise a first gate electrode and a second gate electrode;

and patterning the first gate dielectric plate and the second gate dielectric plate into a first gate dielectric and a second gate dielectric, respectively.

DETAILED DESCRIPTION

Figure 1A:
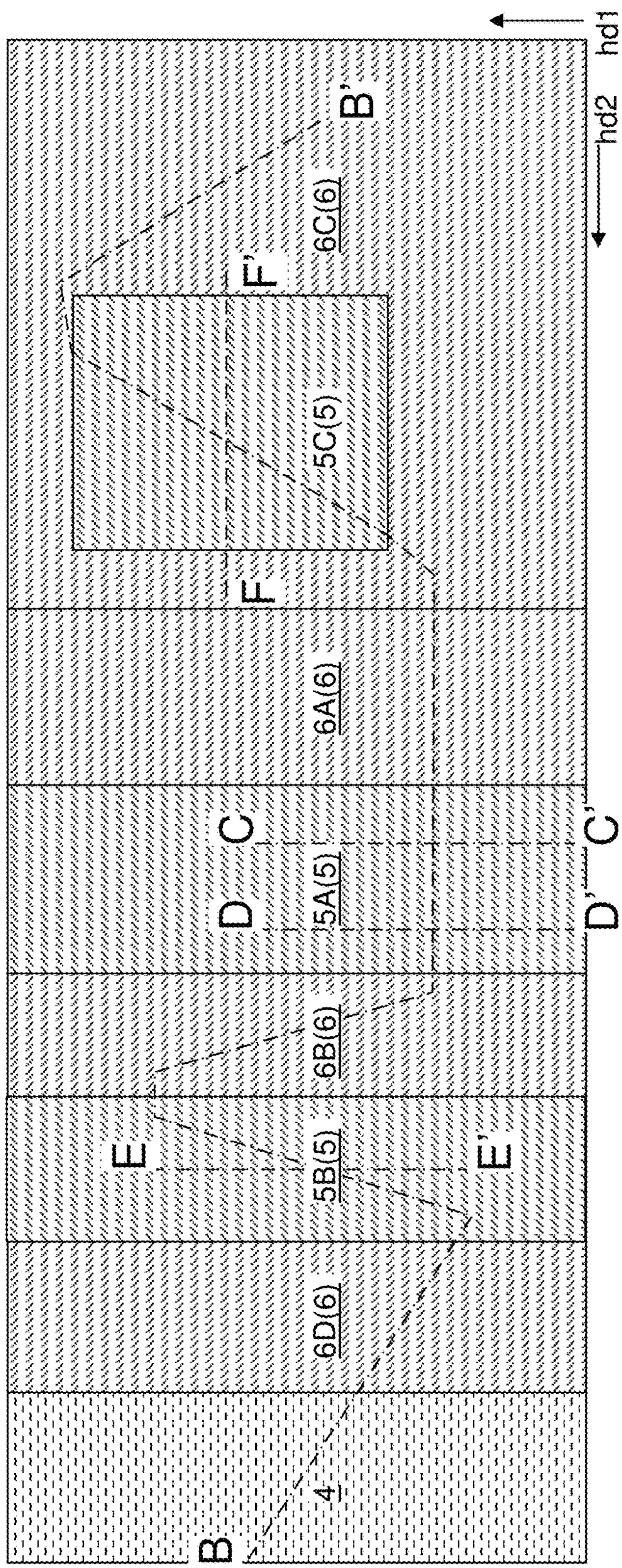
FIG. 1A is a top-down view of a first exemplary structure after formation of various doped wells according to a first embodiment of the present disclosure.
Figure 1B:
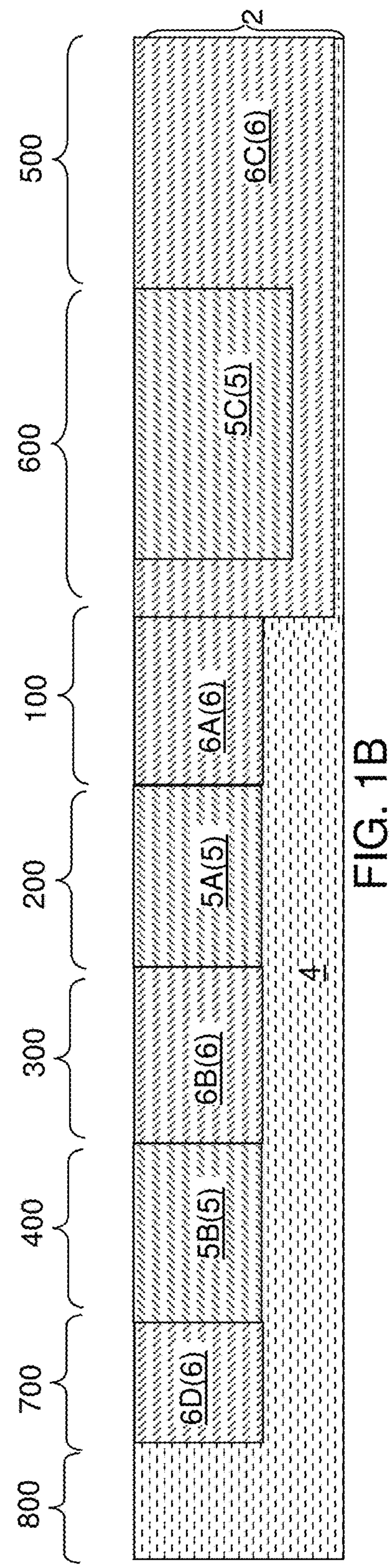
FIG. 1B is a vertical cross-sectional view of the first exemplary structure along the hinged vertical plane B-B' of FIG. 1A.
Figure 1C:
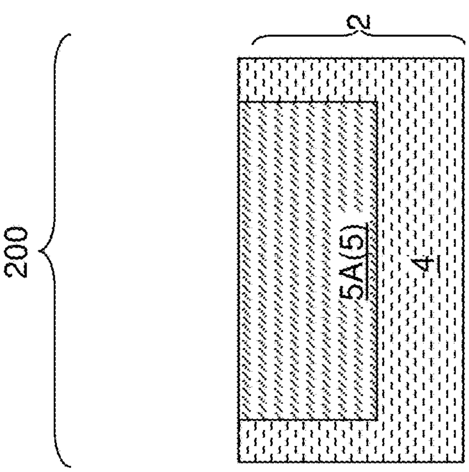
FIG. 1C is a vertical cross-sectional view of the first exemplary structure along the vertical plane C-C' of FIG. 1A.
Figure 1D:
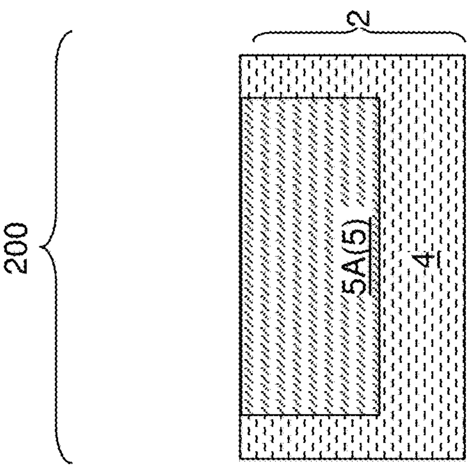
FIG. 1D is a vertical cross-sectional view of the first exemplary structure along the vertical plane D-D' of FIG. 1A.
Figure 1E:
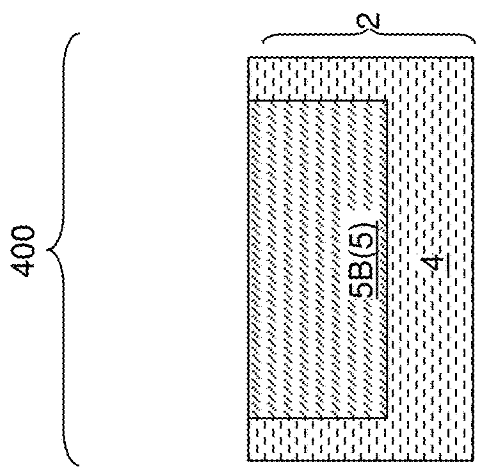
FIG. 1E is a vertical cross-sectional view of the first exemplary structure along the vertical plane E-E' of FIG. 1A.
Figure 1F:
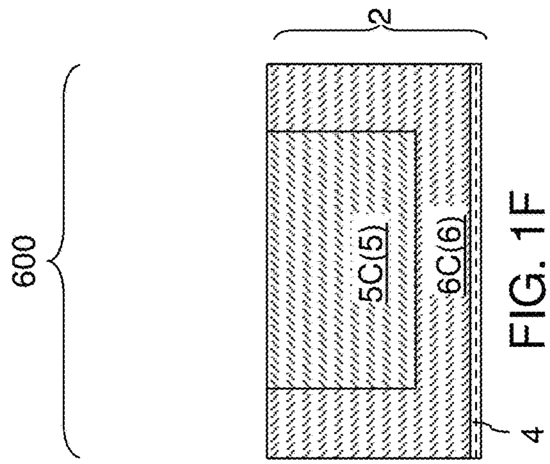
FIG. 1F is a vertical cross-sectional view of the first exemplary structure along the vertical plane F-F' of FIG. 1A.
Figure 2A:
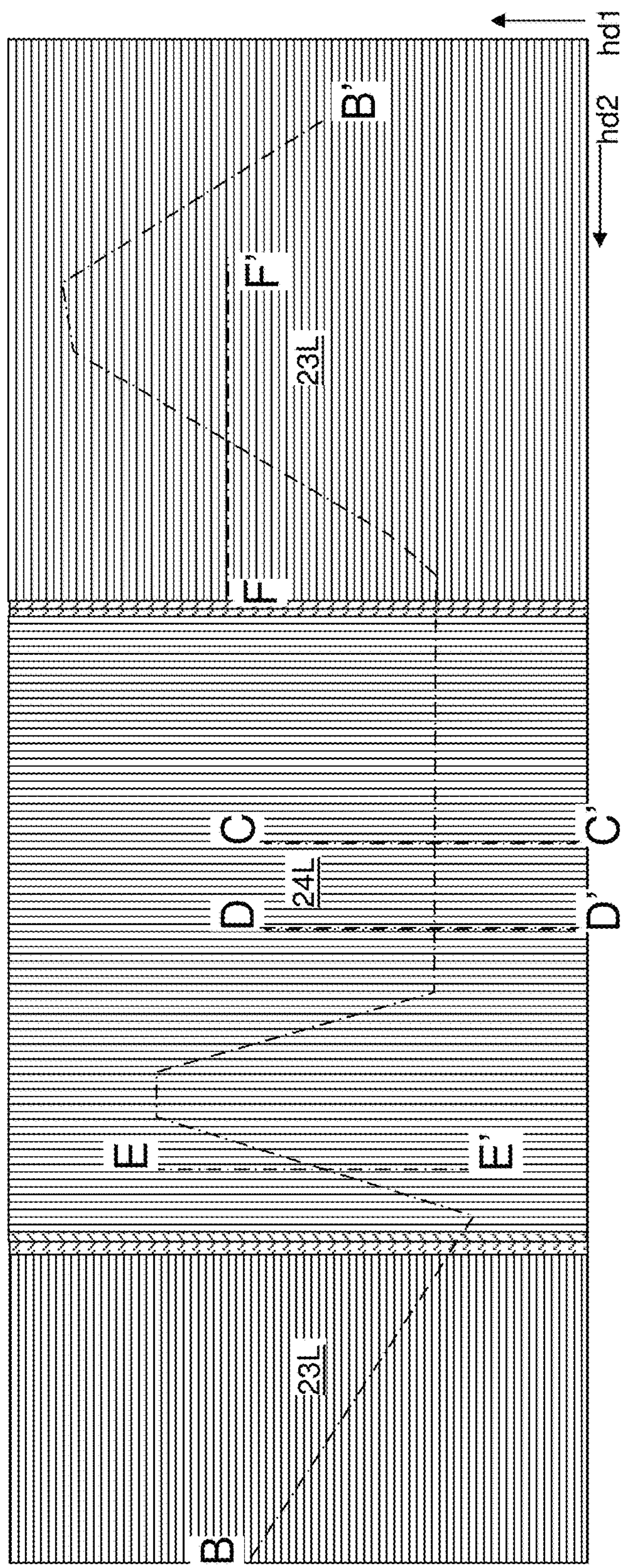
FIG. 2A is a top-down view of the first exemplary structure after formation of gate dielectric layers and semiconductor gate material layers according to the first embodiment of the present disclosure.
Figure 2B:
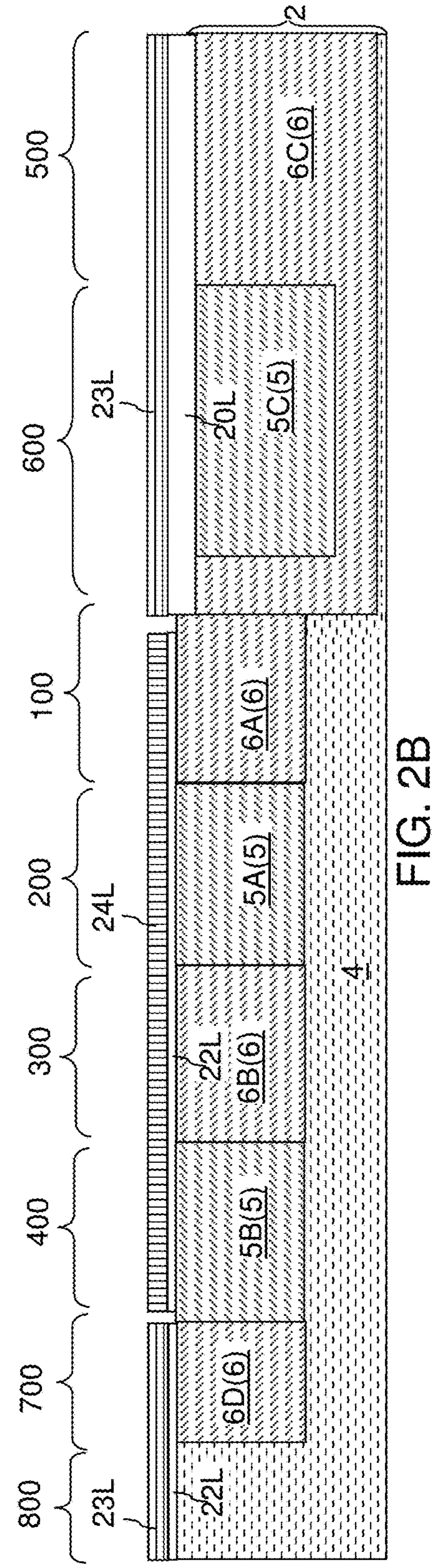
FIG. 2B is a vertical cross-sectional view of the first exemplary structure along the hinged vertical plane B-B' of FIG. 2A.
Figure 2C:
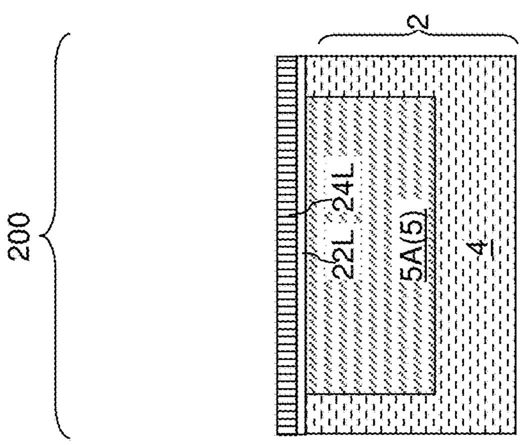
FIG. 2C is a vertical cross-sectional view of the first exemplary structure along the vertical plane C-C' of FIG. 2A.
Figure 2D:
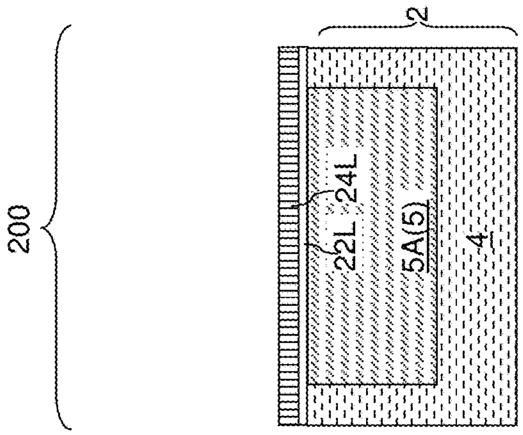
FIG. 2D is a vertical cross-sectional view of the first exemplary structure along the vertical plane D-D' of FIG. 2A.
Figure 2E:
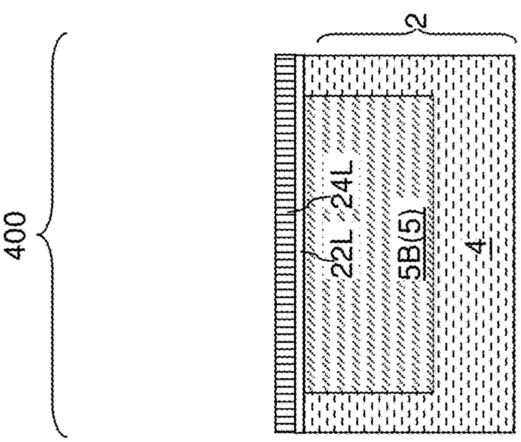
FIG. 2E is a vertical cross-sectional view of the first exemplary structure along the vertical plane E-E' of FIG. 2A.
Figure 2F:
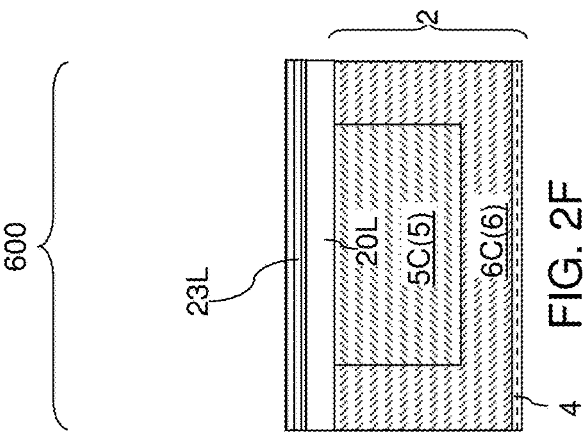
FIG. 2F is a vertical cross-sectional view of the first exemplary structure along the vertical plane F-F' of FIG. 2A.
Figure 3A:
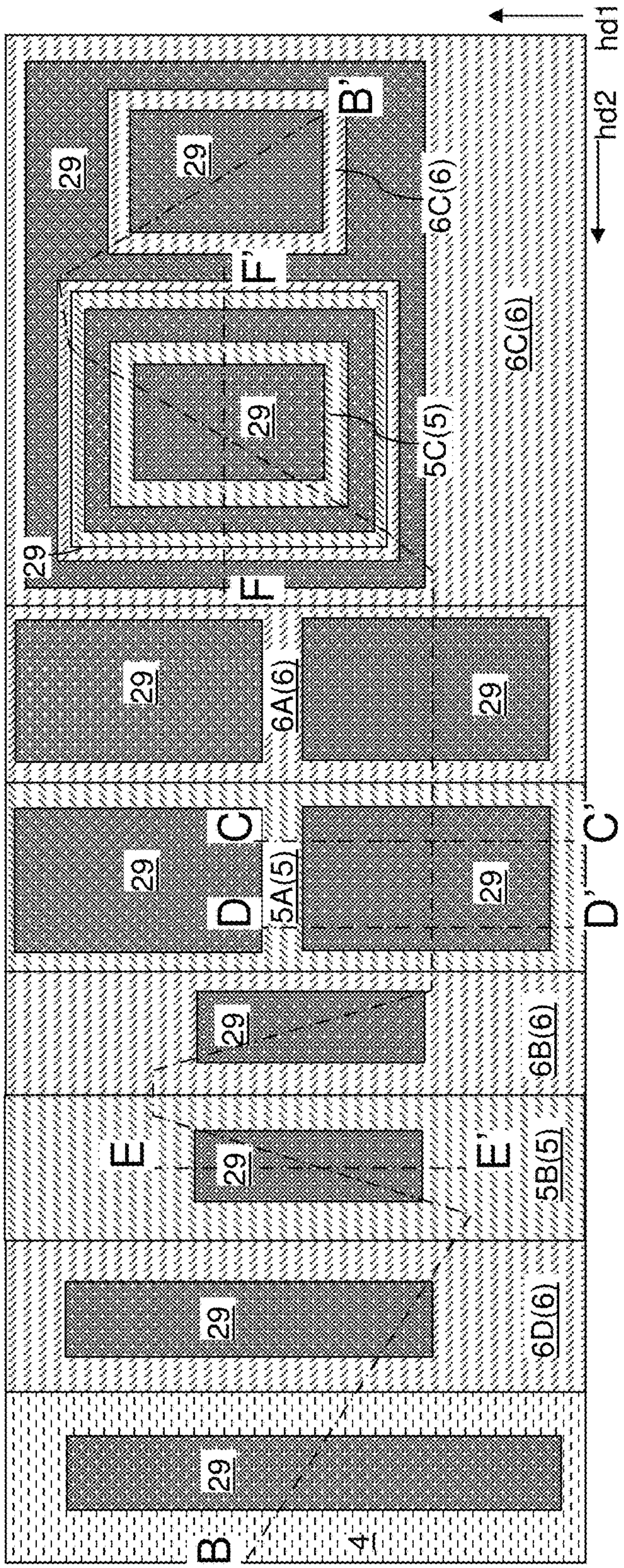
FIG. 3A is a top-down view of the first exemplary structure after formation of a patterned mask layer, shallow trenches, and deep trenches according to the first embodiment of the present disclosure.
Figure 3B:
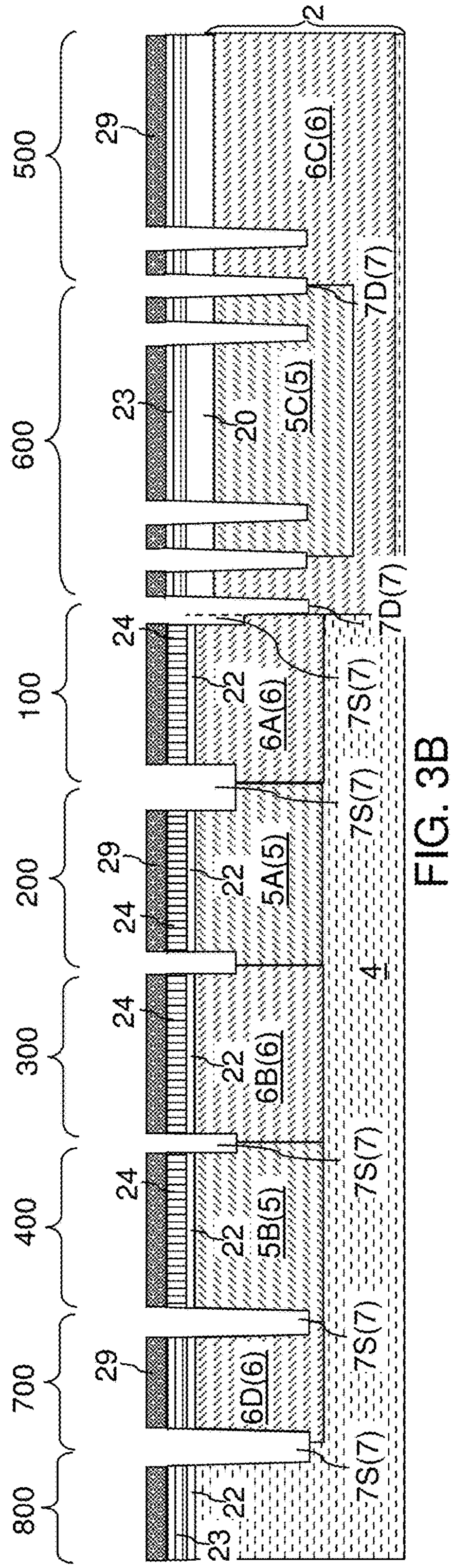
FIG. 3B is a vertical cross-sectional view of the first exemplary structure along the hinged vertical plane B-B' of FIG. 3A.
Figure 3C:
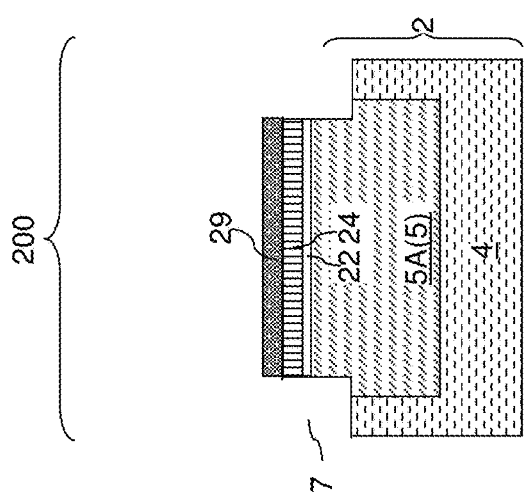
FIG. 3C is a vertical cross-sectional view of the first exemplary structure along the vertical plane C-C' of FIG. 3A.
Figure 3D:
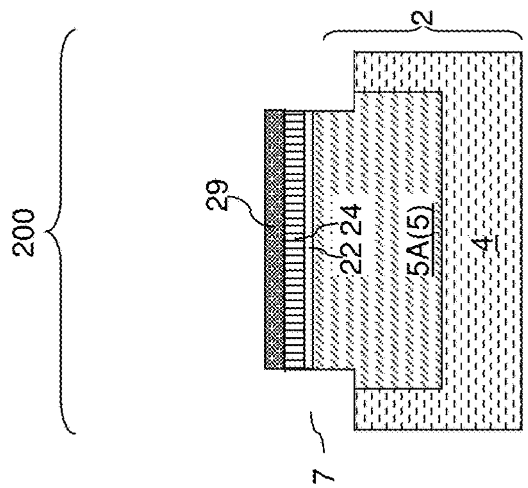
FIG. 3D is a vertical cross-sectional view of the first exemplary structure along the vertical plane D-D' of FIG. 3A.
Figure 3E:
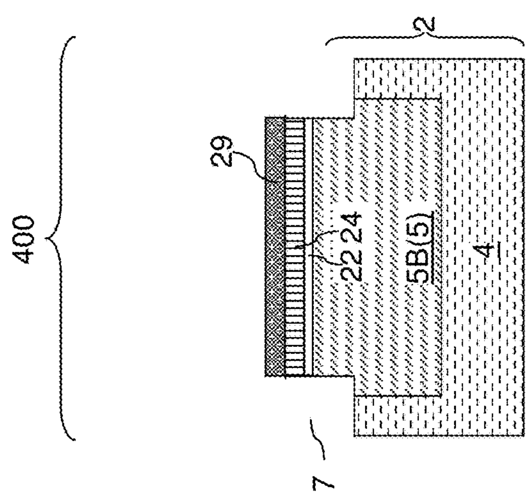
FIG. 3E is a vertical cross-sectional view of the first exemplary structure along the vertical plane E-E' of FIG. 3A.
Figure 3F:
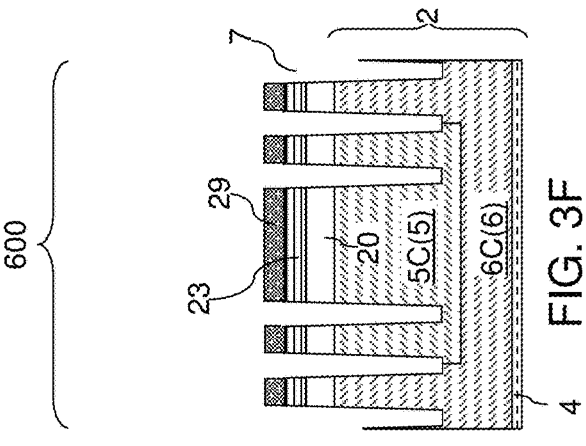
FIG. 3F is a vertical cross-sectional view of the first exemplary structure along the vertical plane F-F' of FIG. 3A.

Embodiments of the present disclosure provide transistor circuits including fringeless transistors and methods of making the same, the various aspects of which are described below. Such high density transistor circuits including fringeless transistors may be employed in various applications such as sense amplifier and peripheral low voltage driver circuits of memory device, such as a three-dimensional memory array.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material", "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. A "source/drain region" may be a source region or a drain region. An "active region" collectively refers to a source region, a drain region, and a channel region of a field effect transistor. A "source extension region" refers to a doped semiconductor region that is a portion of a source region and having a lesser dopant concentration than the rest of the source region. A "drain extension region" refers to a doped semiconductor region that is a portion of a drain region and having a lesser dopant concentration than the rest of the drain region. An "active region extension" refers to a source extension region or a drain extension region.

Referring to FIGS. 1A-1F, a first exemplary structure according to an embodiment of the present disclosure is illustrated. The first exemplary structure includes a semiconductor substrate 2. As used herein, a "semiconductor substrate" refers to a substrate that includes at least one semiconductor material portion, i.e., at least one portion of a semiconductor material. The semiconductor substrate 2 includes a semiconductor material at least at a top portion thereof. The semiconductor substrate 2 may optionally include at least one additional material layer at a bottom portion thereof. In one embodiment, the semiconductor substrate 2 can be a bulk semiconductor substrate consisting of a semiconductor material (e.g., single crystal silicon wafer), or can be a semiconductor-on-insulator (SOI) substrate including a buried insulator layer (such as a silicon oxide layer) underlying the semiconductor (e.g., silicon) material portion, and a handle substrate underlying the buried insulator layer.

The semiconductor substrate 2 can include a substrate semiconductor layer 4 that includes a lightly doped semiconductor material portion, on which at least one field effect transistor can be formed. In one embodiment, the entirety of the semiconductor substrate 2 may be the substrate semiconductor layer 4. In another embodiment, the substrate semiconductor layer 4 may comprise an upper portion of the semiconductor substrate 2, such as doped well in a silicon wafer. The substrate semiconductor layer 4 may include a lightly doped semiconductor material including electrical dopants at an atomic concentration in a range from $1.0\times10^{14}/cm^{3}$ to $1.0\times10^{18}/cm^{3}$, such as from $1.0\times10^{15}/cm^{3}$ to $1.0\times10^{17}/cm^{3}$, although lesser and greater atomic concentrations can also be employed.

The semiconductor material of the substrate semiconductor layer 4 can be an elemental semiconductor material (such as silicon) or an alloy of at least two elemental semiconductor materials (such as a silicon-germanium alloy), or can be a compound semiconductor material (such as a III-V compound semiconductor material or a II-VI compound semiconductor material), or can be an organic semiconductor material. The thickness of the substrate semiconductor layer 4 can be in a range from 0.5 mm to 2 mm in case the semiconductor substrate 2 is a bulk semiconductor substrate. In case the semiconductor substrate 2 is a semiconductor-on-insulator substrate, the thickness of the substrate semiconductor layer 4 may be in a range from 100 nm to 1,000 nm, although lesser and greater thicknesses can also be employed.

Various doped wells (5, 6) can be formed in an upper portion of the semiconductor substrate 2 (e.g., in the substrate semiconductor layer 4). The various doped wells (5, 6) may include p-type wells 5 having a respective p-type doping and n-type wells 6 having a respective n-type doping. For example, the p-type wells 5 may include a first p-type well 6A, a second p-type well 5B, a third p-type well 5C, etc. The n-type wells 6 may include a first n-type well 6A, a second n-type well 6B, a third n-type well 6C, a fourth n-type well 6D, etc. The regions including the various doped wells (5, 6) may be employed to form various semiconductor devices. For example, the region including the first n-type well 6A may comprise a first p-type field effect transistor region 100 in which first p-type field effect transistors including p-doped source and drain regions are to be subsequently formed; the region including the first p-type well 5A may comprise a first n-type field effect transistor region 200 in which first n-type field effect transistors including n-doped source and drain regions are to be subsequently formed; the region including the second n-type well 6B may comprise a second p-type field effect transistor region 300 in which second p-type field effect transistors including p-doped source and drain regions are to be subsequently formed; the region including the second p-type well 5B may comprise a second n-type field effect transistor region 400 in which second n-type field effect transistors including n-doped source and drain regions are to be subsequently formed; the region including the third n-type well 6C may comprise a third p-type field effect transistor region 500 in which third p-type field effect transistors including p-doped source and drain regions are to be subsequently formed; and the region including the third p-type well 5C may comprise a third n-type field effect transistor region 600 in which third n-type field effect transistors including n-doped source and drain regions are to be subsequently formed. Optionally, the region including the fourth n-doped well 6D may comprise a first passive device region 700 in which a first passive device such as a resistor is subsequently formed. Optionally, a region in which the substrate semiconductor layer 4 is physically exposed may be employed for a passive device region, such as a second passive device region 800, in which a second passive device such as a capacitor is subsequently formed. For example, regions 100 and 200 may contain low voltage transistors, regions 300 and 400 may contain very low voltage transistors which operate at a lower voltage than the low voltage transistors, and regions 500 and 600 may contain high voltage transistors which operate at a higher voltage than the low voltage transistors.

The various device regions may be arranged in any pattern on a top surface of the semiconductor substrate 2. While the present disclosure is described employing an embodiment in which the direction of semiconductor channels (i.e., the direction of current flow in the channel regions of the field effect transistors) is parallel to a first horizontal direction hd1 and perpendicular to a second horizontal direction hd2, it is understood that the direction of the semiconductor channel may be oriented along any direction for each field effect transistor to be subsequently formed. The depth of each doped well (5, 6) and the dopant concentration in each doped well (5, 6) may be suitably selected. For example, the dopant concentration in each doped well (5, 6) may be in a range from $1.0\times10^{14}/cm^3$ to $1.0\times10^{18}/cm^3$, such as from $1.0\times10^{15}/cm^3$ to $1.0\times10^{17}/cm^3$, although lesser and greater atomic concentrations can also be employed. The depth of each well (5, 6) may be in a range from 50 nm to 2,000 nm, although lesser and greater depths may also be employed.

Referring to FIGS. 2A-2F, various gate dielectric layers (20L, 22L) can be formed on a top surface of the semiconductor substrate 2. For example, a first gate dielectric layer 22L can be formed in regions in which low and very low voltage field effect transistors employing thinner gate dielectrics are to be subsequently formed, and a second gate dielectric layer 20L can be formed in regions in which high voltage field effect transistors employing thicker gate dielectrics are to be subsequently formed. In an illustrative example, the first p-type field effect transistor region 100 may include low voltage p-type field effect transistors, the first n-type field effect transistor region 200 may include low voltage n-type field effect transistors, the second p-type field effect transistor region 300 may include very low voltage p-type field effect transistors, the second n-type field effect transistor region 400 may include very low voltage n-type field effect transistors, the third p-type field effect transistor region 500 may include high voltage p-type field effect transistors, and the third n-type field effect transistor region 600 may include high voltage n-type field effect transistors. The above transistors may be employed in a peripheral (e.g., driver) circuit for a memory device. Additional transistors may be employed in a sense amplifier circuit of the memory device. In this case, the first gate dielectric layer 22L may be formed in the first p-type field effect transistor region 100, the first n-type field effect transistor region 200, the second p-type field effect transistor region 300, and the second n-type field effect transistor region 400. The second gate dielectric layer 20L may be formed in the third p-type field effect transistor region 500 and in the third n-type field effect transistor region 600. The first passive device region 700 and the second passive device region 800 may include a portion of the first gate dielectric layer 22L and/or a portion of the second gate dielectric layer 20L as needed. In an illustrative example, the second gate dielectric layer 20L may be formed on the top surface of the semiconductor substrate 2 and can be patterned so that portions of the second gate dielectric layer 20L are removed from the first p-type field effect transistor region 100, the first n-type field effect transistor region 200, the second p-type field effect transistor region 300, and the second n-type field effect transistor region 400. Subsequently, the first gate dielectric layer 22L can be formed by thermal oxidation of physically exposed surface portions of the semiconductor substrate 2 and/or by deposition of a dielectric material such as silicon oxide. The thickness of the first gate dielectric layer 22L may be in a range from 1 nm to 6 nm, such as from 1.5 nm to 3 nm, although lesser and greater thicknesses may also be employed. The first gate dielectric layer 22L may be thicker in the low voltage transistor regions 100 and 200 than in the very low voltage transistor regions 300 and 400. The thickness of the second gate dielectric layer 20L may be thicker than that of the first gate dielectric layer 22L and may be in a range from 4 nm to 30 nm, such as from 6 nm to 15 nm, although lesser and greater thicknesses may also be employed.

A polish stop pad layer 23L and a semiconductor gate material layer 24L may be formed over the first and second gate dielectric layers (22L, 20L). The polish stop pad layer 23L may comprise any suitable sacrificial material, such as silicon nitride and/or a bilayer of silicon nitride and silicon oxide, which may be used as a polish stop. The semiconductor gate material layer 24L may comprise a heavily doped polysilicon layer. Optionally, the polish stop pad layer 23L may also be formed on top of the semiconductor gate material layer 24L. The thickness of layers (23L, 24L) may be in a range from 50 nm to 300 nm, such as from 100 nm to 200 nm, although lesser and greater thicknesses may also be employed.

Referring to FIGS. 3A-3F, a mask layer 29 such as a photoresist layer or hard mask layer 29 can be deposited over the layers (23L, 24L). The mask layer 29 is patterned to form a pattern of openings around each area in which semiconductor devices are to be subsequently formed. For example, within the areas of the field effect transistor regions (100, 200, 300, 400, 500, 600), the areas of the openings in the mask layer 29 can be located outside the areas of active regions (i.e., outside the areas of the source regions, the drain regions, and the channel regions). Within the areas of the passive device regions (700, 800), the areas of the opening in each mask layer 29 can be located outside the areas of the passive devices to be subsequently formed. An anisotropic etch can be performed to transfer the pattern of the openings in the mask layer 29 through the underlying layers. For example, deep trenches 7D may be formed in regions 500, 600, 700 and 800 through the polish stop pad layer 23L into an upper portion of the semiconductor substrate 2. The depth of the deep trenches 7D may be in a range from 1,000 nm to 2,000 nm, although lesser and greater depths may also be employed. Shallow trenches 7C may be formed in regions 100, 200, 300 and 400 through the semiconductor gate material layer 24L (and optionally through any portion of the polish stop pad layer located on the semiconductor gate material layer 24L) into an upper portion of the semiconductor substrate 2. The depth of the shallow trenches 7S may be shallower than the depth of the deep trenches 7D. The depth of the shallow trenches 7S may be in a range from 150 nm to 500 nm, although lesser and greater depths may also be employed. The mask layer 29 can be subsequently removed. The combination of the deep trenches 7D and the shallow trenches 7S is collectively referred to as trenches 7. The trenches 7 divide the layers (23L, 24L) into polish stop plates 23 and gate electrode material plates 24. Further, the trenches divide the gate dielectric layers (22L, 20L) into gate dielectric plates (22, 20), which may include, for example, first gate dielectric plates 22 and second gate dielectric plates 20.

Figure 4:
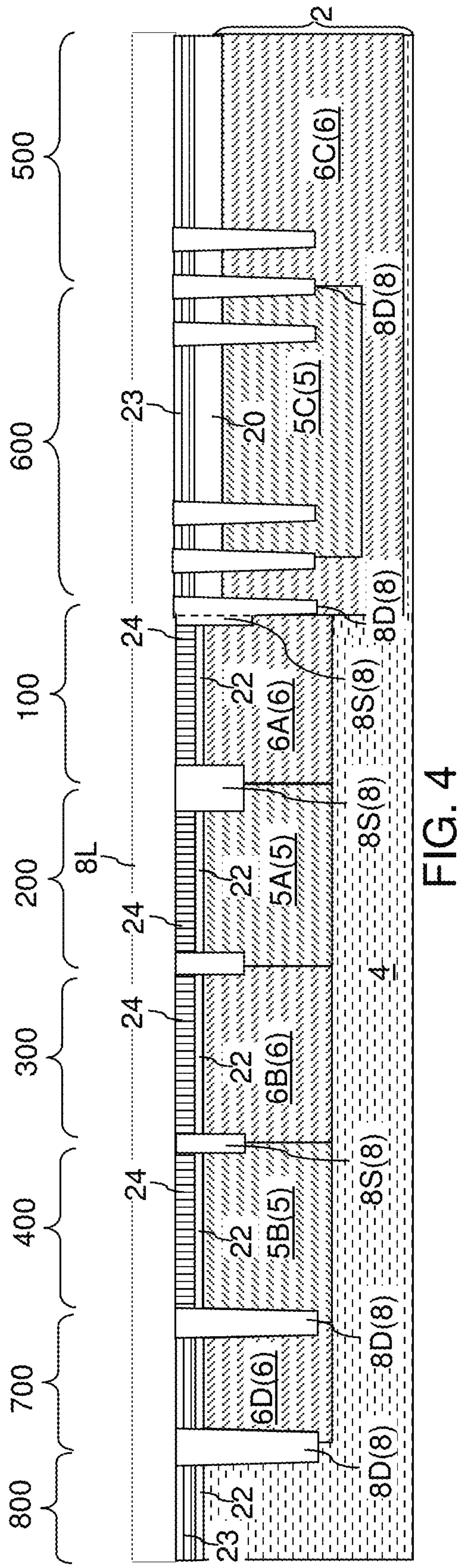
FIG. 4 is a vertical cross-sectional of the first exemplary structure after formation of the trench fill material layer according to the first embodiment of the present disclosure.
Figure 5A:
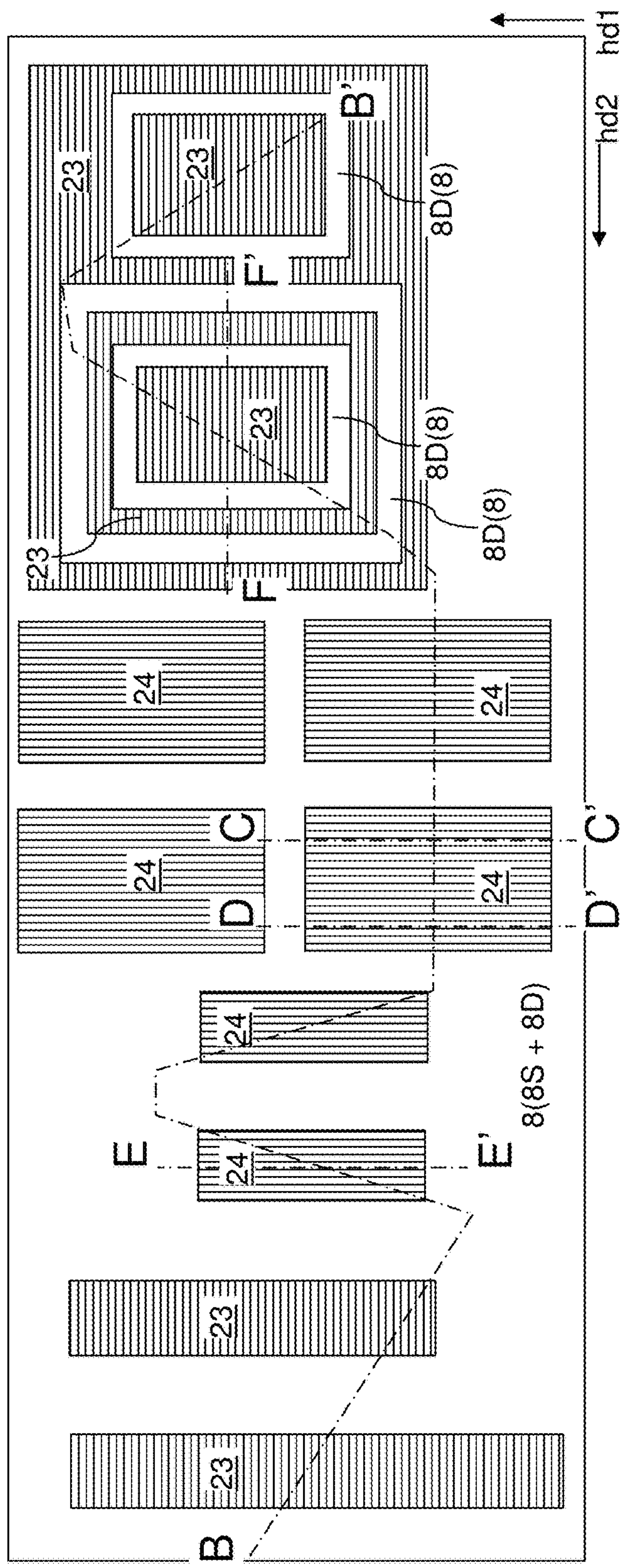
FIG. 5A is a top-down view of the first exemplary structure after forming trench isolation structures according to the first embodiment of the present disclosure.
Figure 5B:
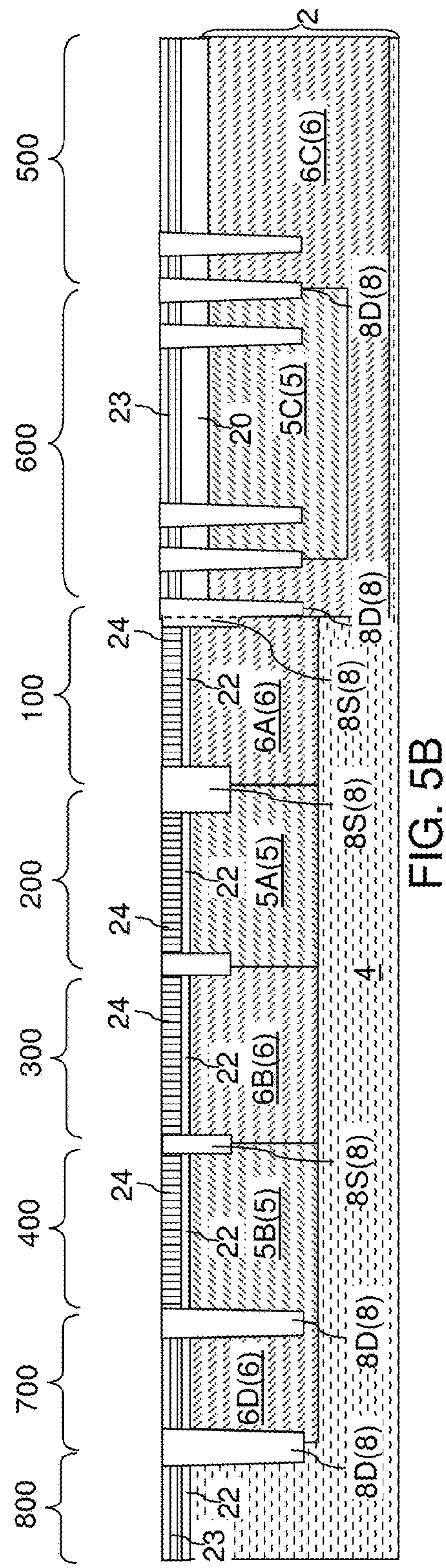
FIG. 5B is a vertical cross-sectional view of the first exemplary structure along the hinged vertical plane B-B' of FIG. 5A.
Figure 5D:
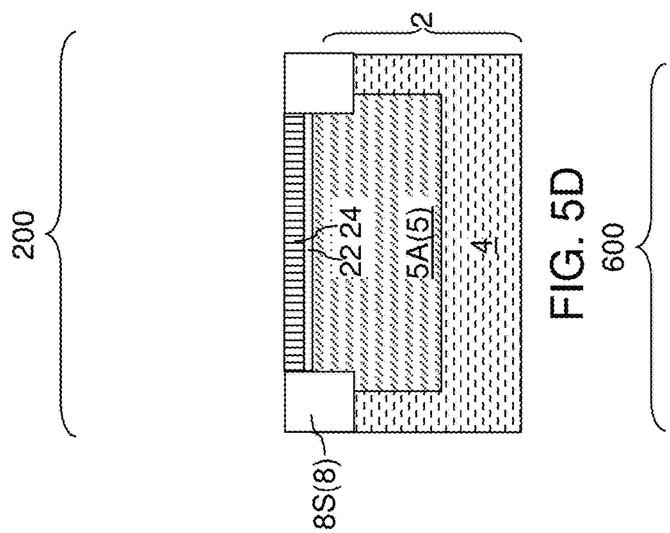
FIG. 5D is a vertical cross-sectional view of the first exemplary structure along the vertical plane D-D' of FIG. 5A.
Figure 5F:
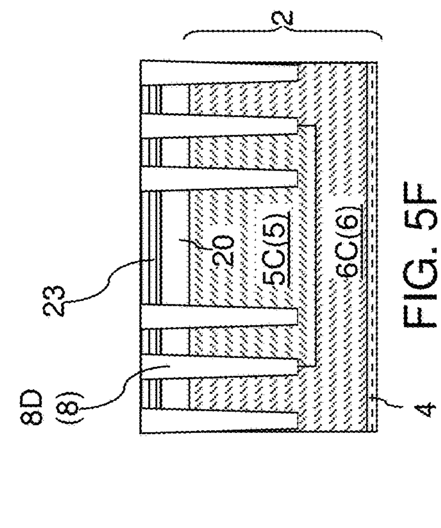
FIG. 5F is a vertical cross-sectional view of the first exemplary structure along the vertical plane F-F' of FIG. 5A.
Figure 5C:
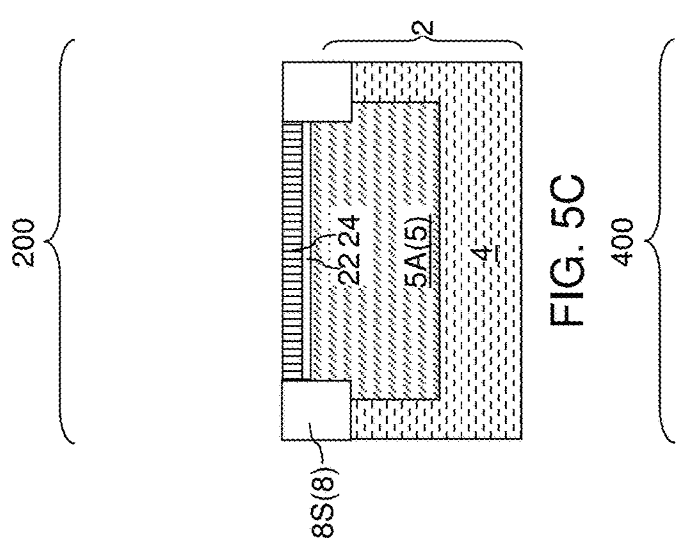
FIG. 5C is a vertical cross-sectional view of the first exemplary structure along the vertical plane C-C' of FIG. 5A.
Figure 5E:
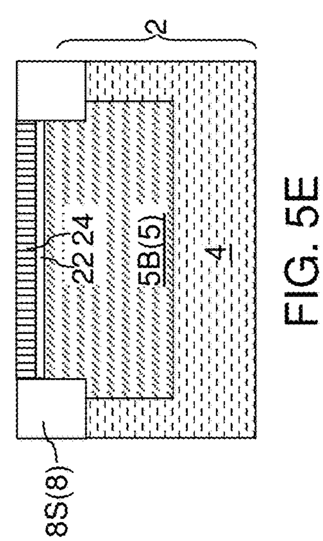
FIG. 5E is a vertical cross-sectional view of the first exemplary structure along the vertical plane E-E' of FIG. 5A.
Figure 6A:
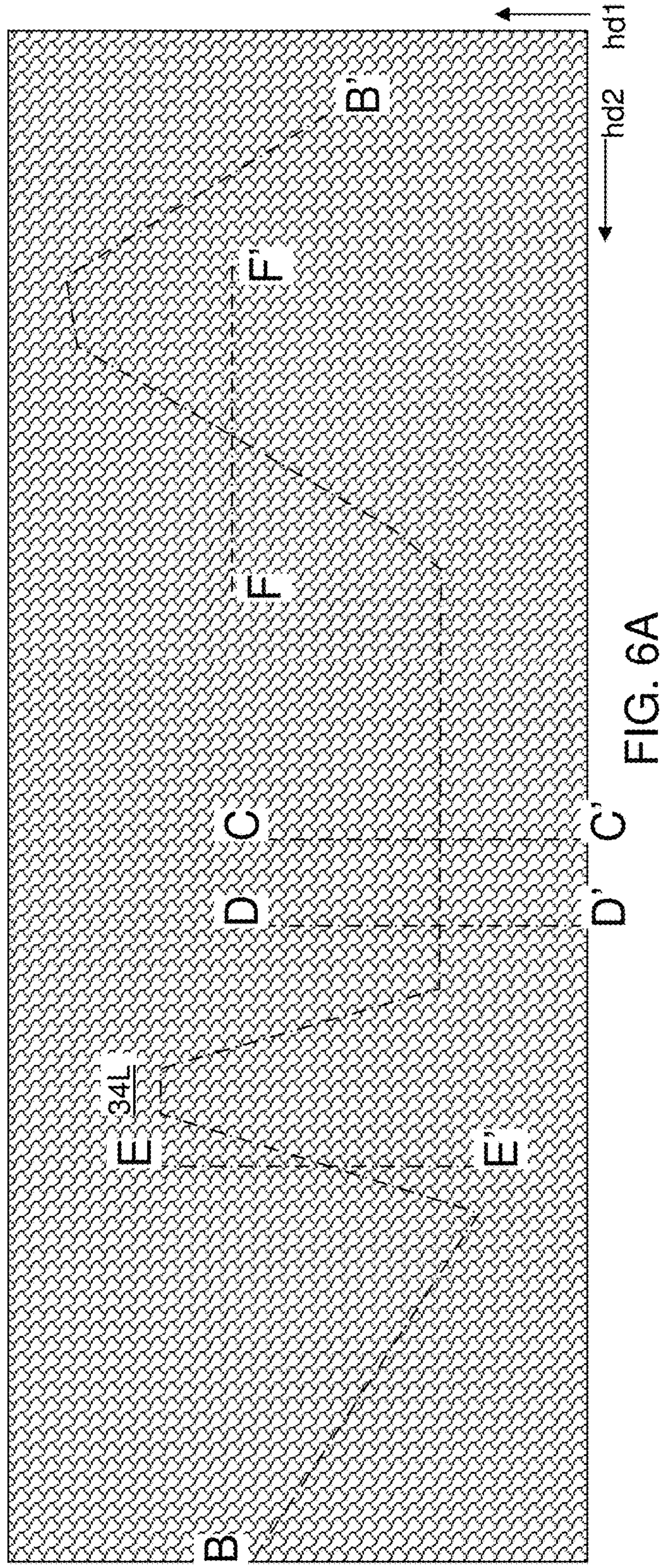
FIG. 6A is a top-down view of the first exemplary structure after formation of a planar semiconductor spacer layer according to the first embodiment of the present disclosure.
Figure 6B:
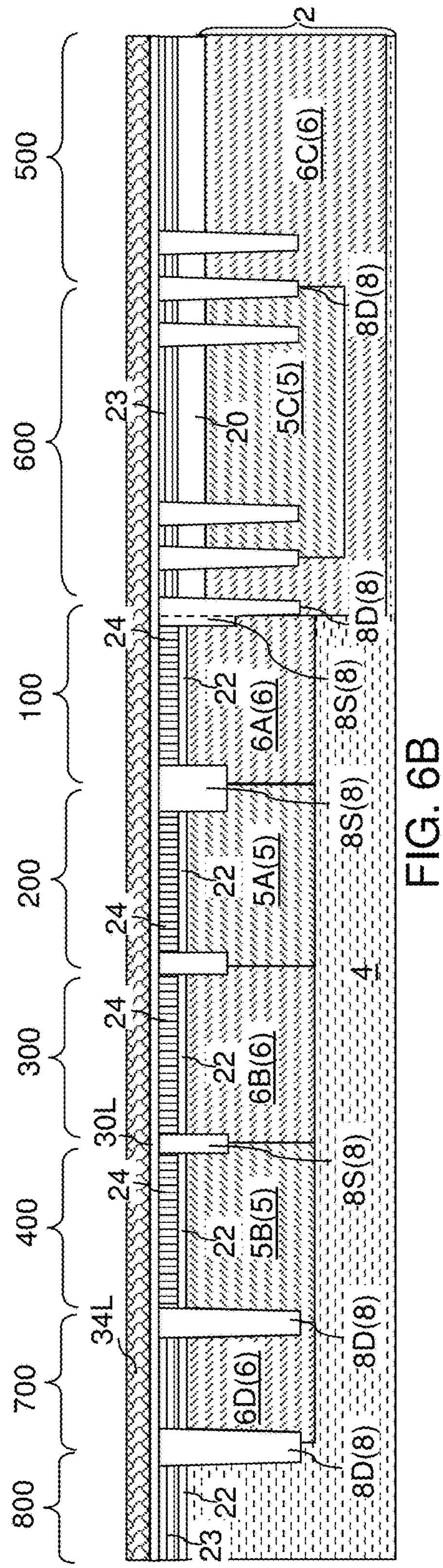
FIG. 6B is a vertical cross-sectional view of the first exemplary structure along the hinged vertical plane B-B' of FIG. 6A.
Figure 6C:
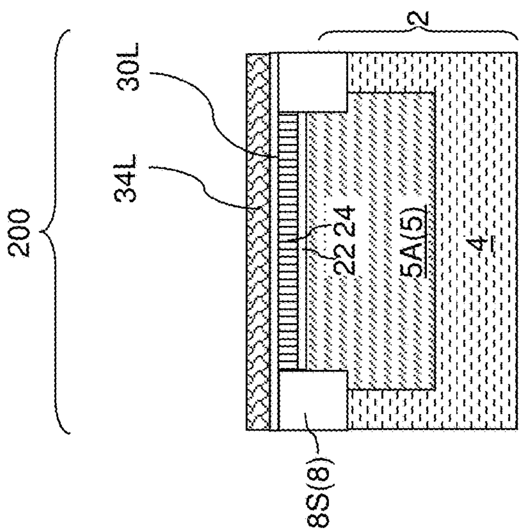
FIG. 6C is a vertical cross-sectional view of the first exemplary structure along the vertical plane C-C' of FIG. 6A.
Figure 6D:
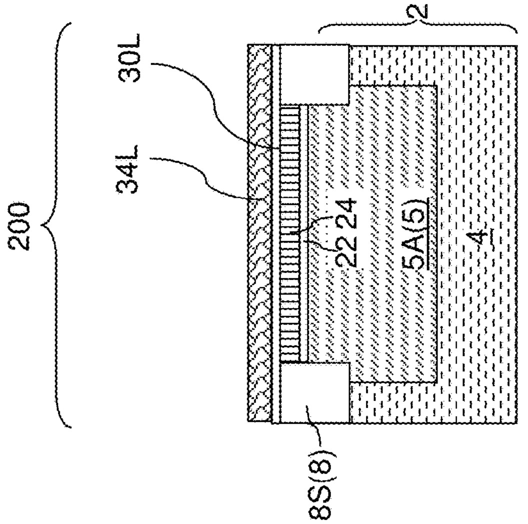
FIG. 6D is a vertical cross-sectional view of the first exemplary structure along the vertical plane D-D' of FIG. 6A.
Figure 6E:
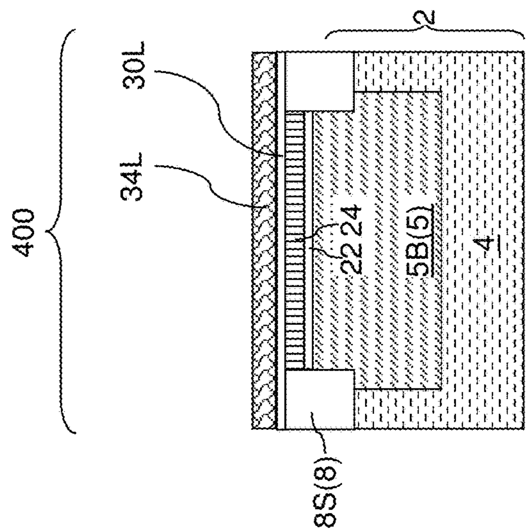
FIG. 6E is a vertical cross-sectional view of the first exemplary structure along the vertical plane E-E' of FIG. 6A.
Figure 6F:
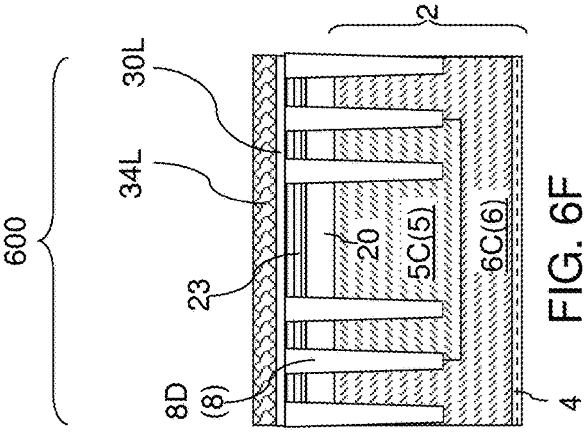
FIG. 6F is a vertical cross-sectional view of the first exemplary structure along the vertical plane F-F' of FIG. 6A.
Figure 7A:
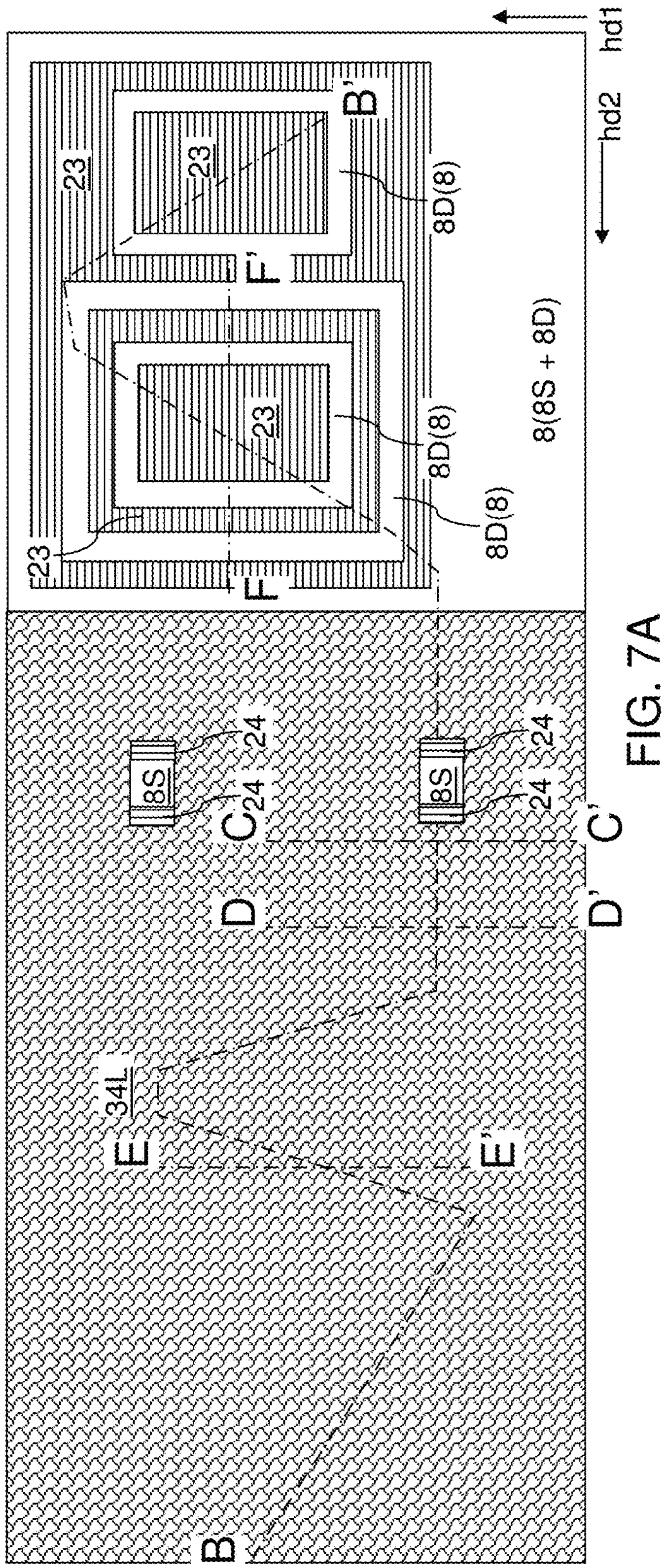
FIG. 7A is a top-down view of the first exemplary structure after patterning the planar semiconductor spacer layer according to the first embodiment of the present disclosure.
Figure 7B:
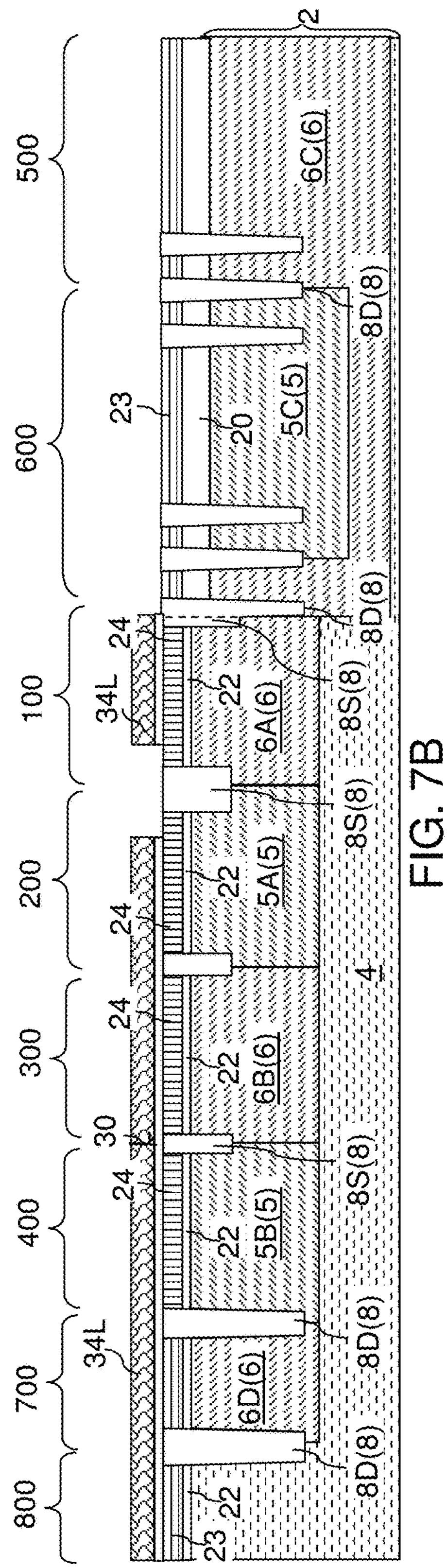
FIG. 7B is a vertical cross-sectional view of the first exemplary structure along the hinged vertical plane B-B' of FIG. 7A.
Figure 7C:
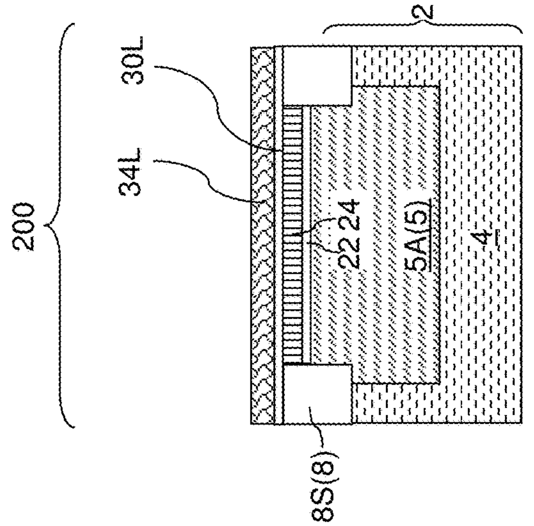
FIG. 7C is a vertical cross-sectional view of the first exemplary structure along the vertical plane C-C' of FIG. 7A.
Figure 7D:
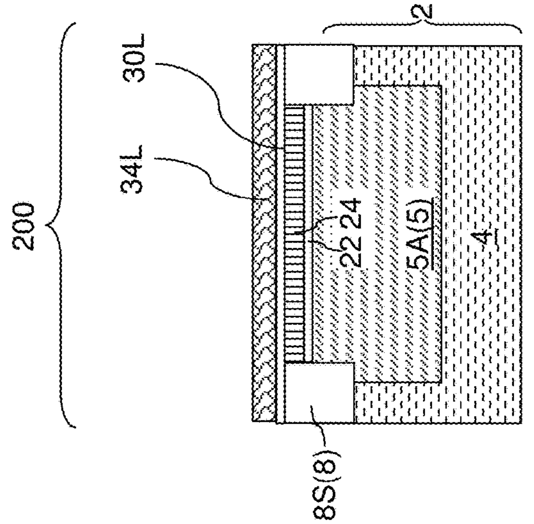
FIG. 7D is a vertical cross-sectional view of the first exemplary structure along the vertical plane D-D' of FIG. 7A.
Figure 7E:
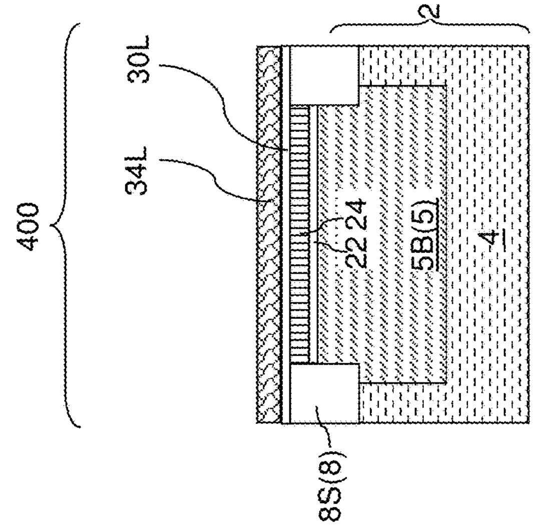
FIG. 7E is a vertical cross-sectional view of the first exemplary structure along the vertical plane E-E' of FIG. 7A.
Figure 7F:
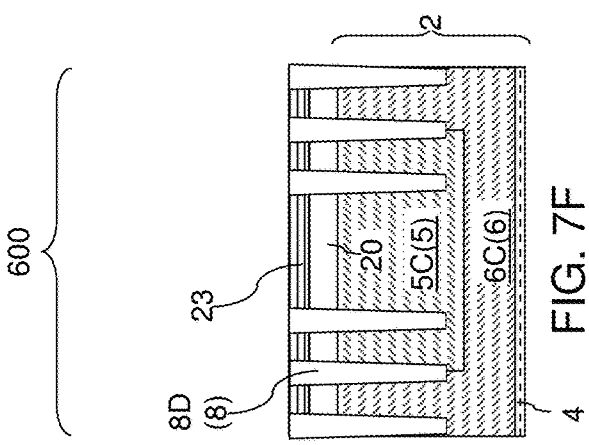
FIG. 7F is a vertical cross-sectional view of the first exemplary structure along the vertical plane F-F' of FIG. 7A.
Figure 8A:
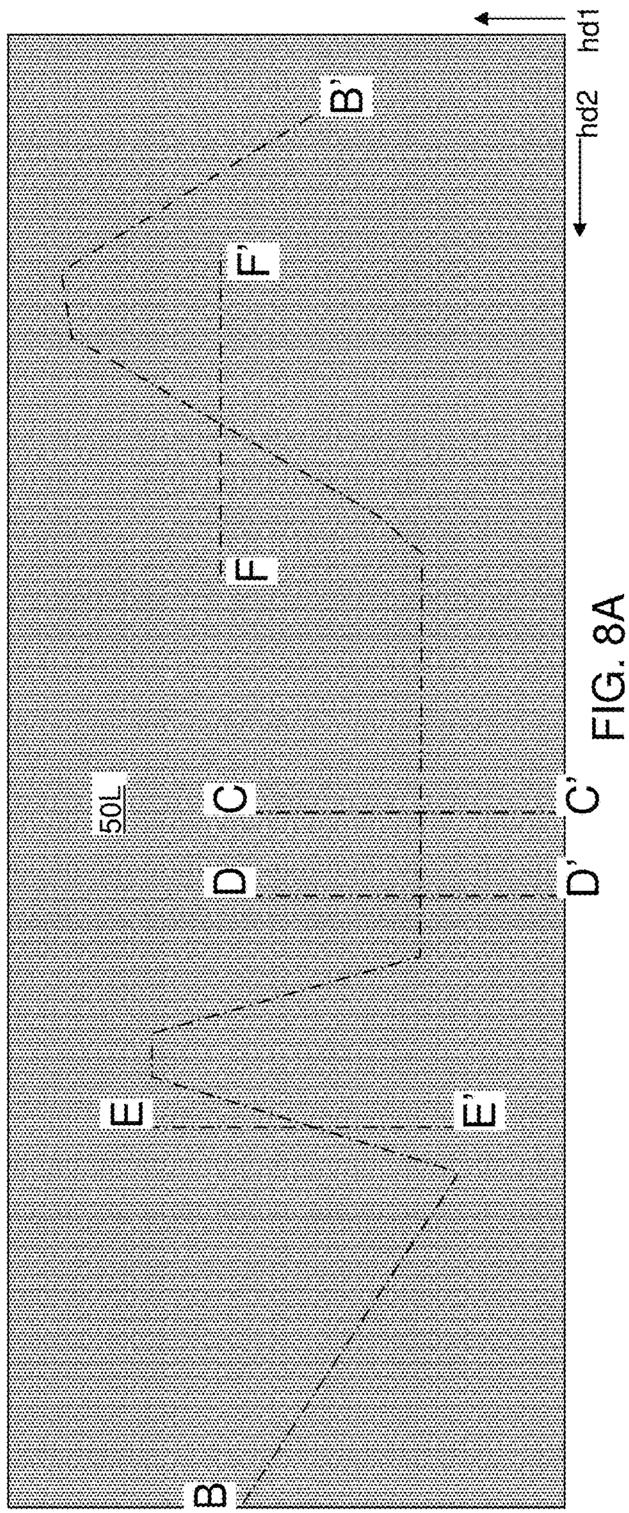
FIG. 8A is a top-down view of the first exemplary structure after deposition of a conductive gate cap layer and a gate cap dielectric layer according to the first embodiment of the present disclosure.
Figure 8B:
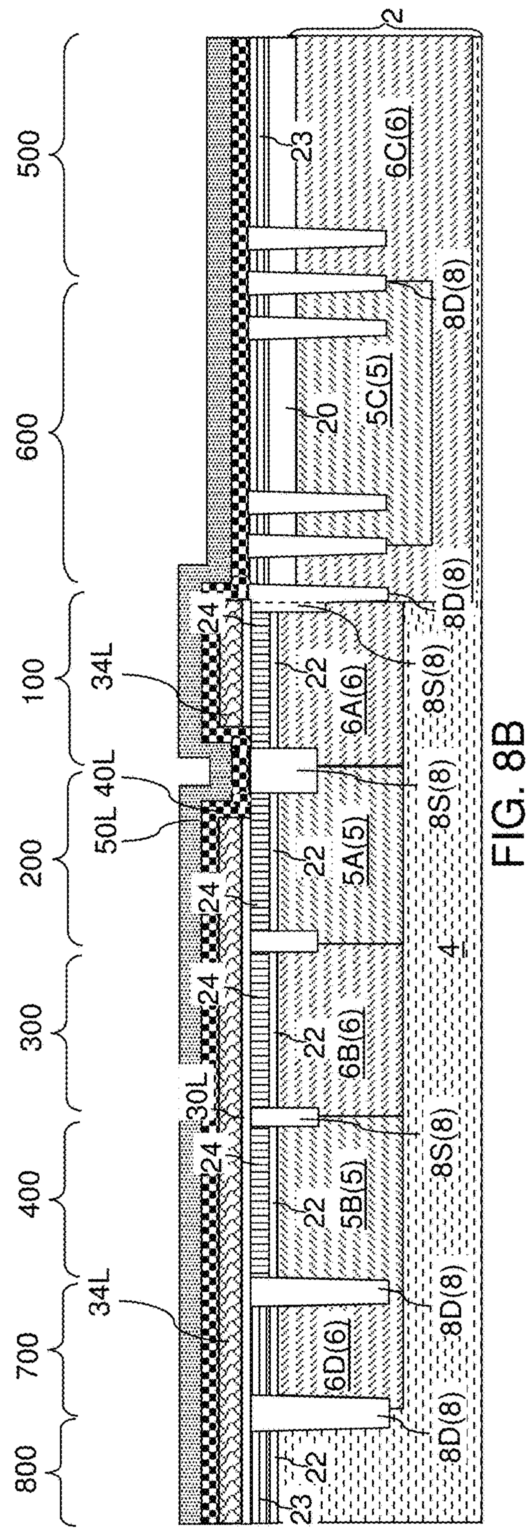
FIG. 8B is a vertical cross-sectional view of the first exemplary structure along the hinged vertical plane B-B' of FIG. 8A.
Figure 8C:
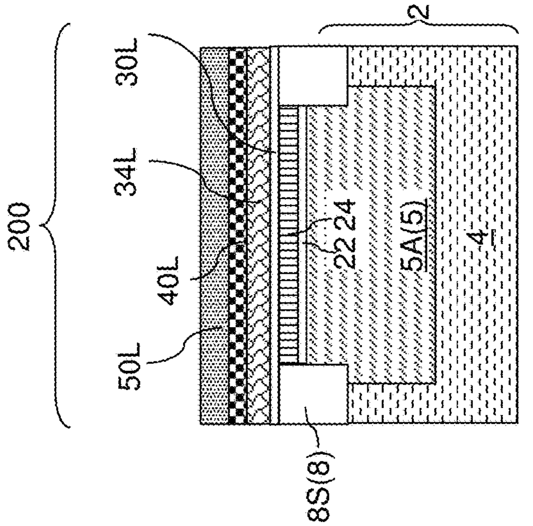
FIG. 8C is a vertical cross-sectional view of the first exemplary structure along the vertical plane C-C' of FIG. 8A.
Figure 8D:
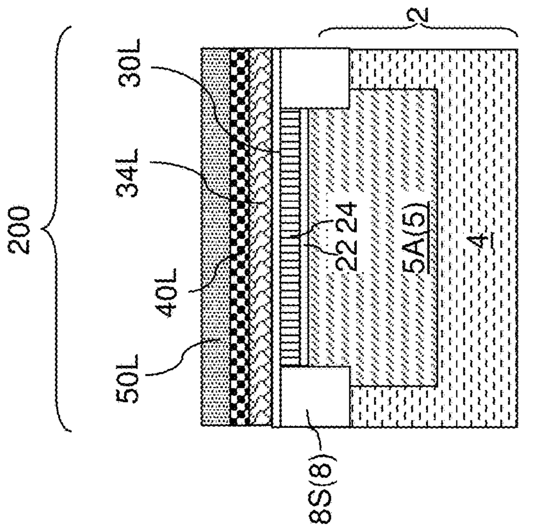
FIG. 8D is a vertical cross-sectional view of the first exemplary structure along the vertical plane D-D' of FIG. 8A.
Figure 8E:
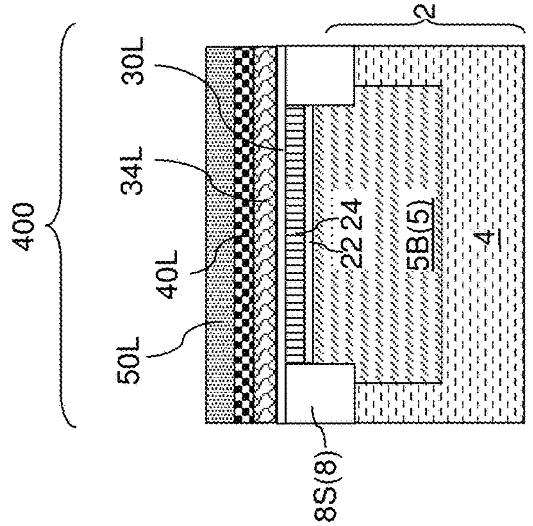
FIG. 8E is a vertical cross-sectional view of the first exemplary structure along the vertical plane E-E' of FIG. 8A.
Figure 8F:
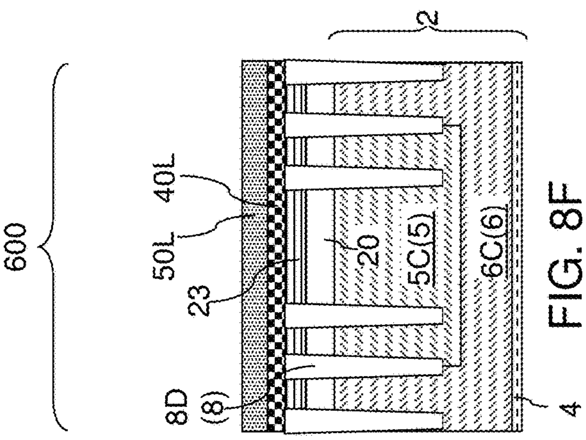
FIG. 8F is a vertical cross-sectional view of the first exemplary structure along the vertical plane F-F' of FIG. 8A.
Figure 9A:
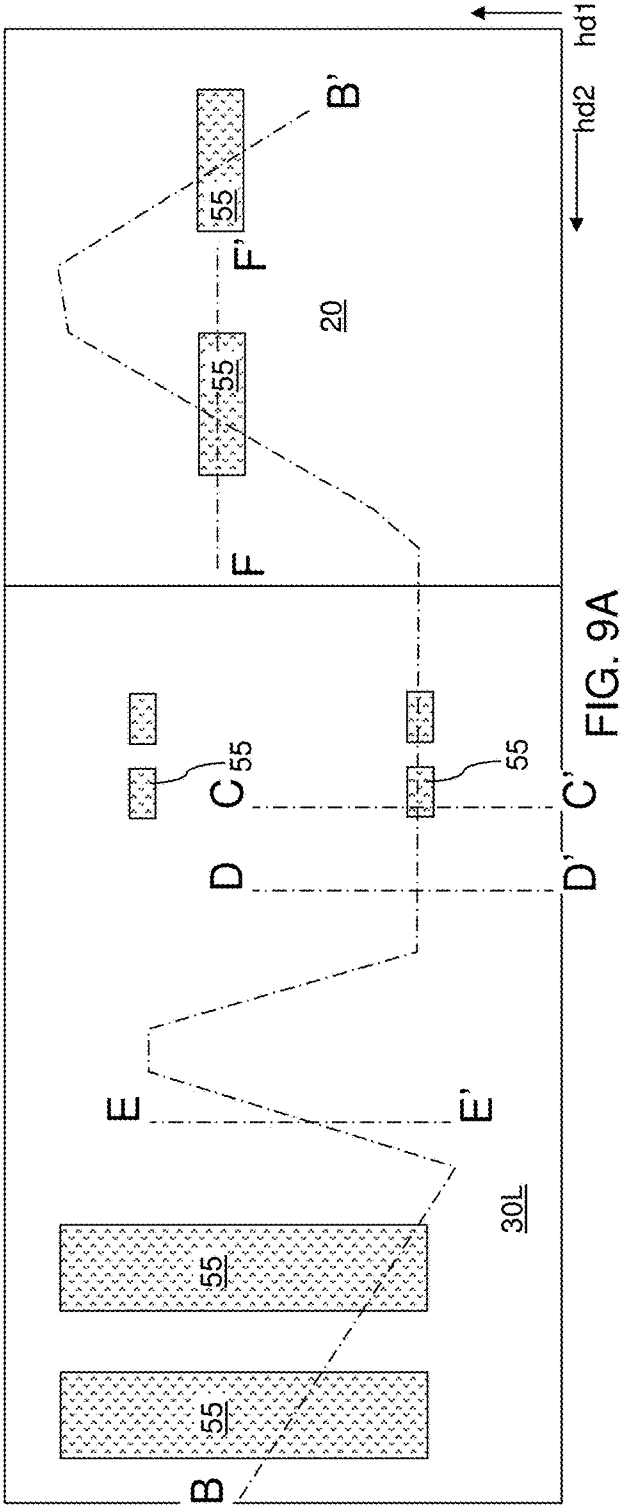
FIG. 9A is a top-down view of the first exemplary structure after patterning the gate cap dielectric layer, the conductive gate cap layer, and the planar semiconductor spacer layer according to the first embodiment of the present disclosure.
Figure 9B:
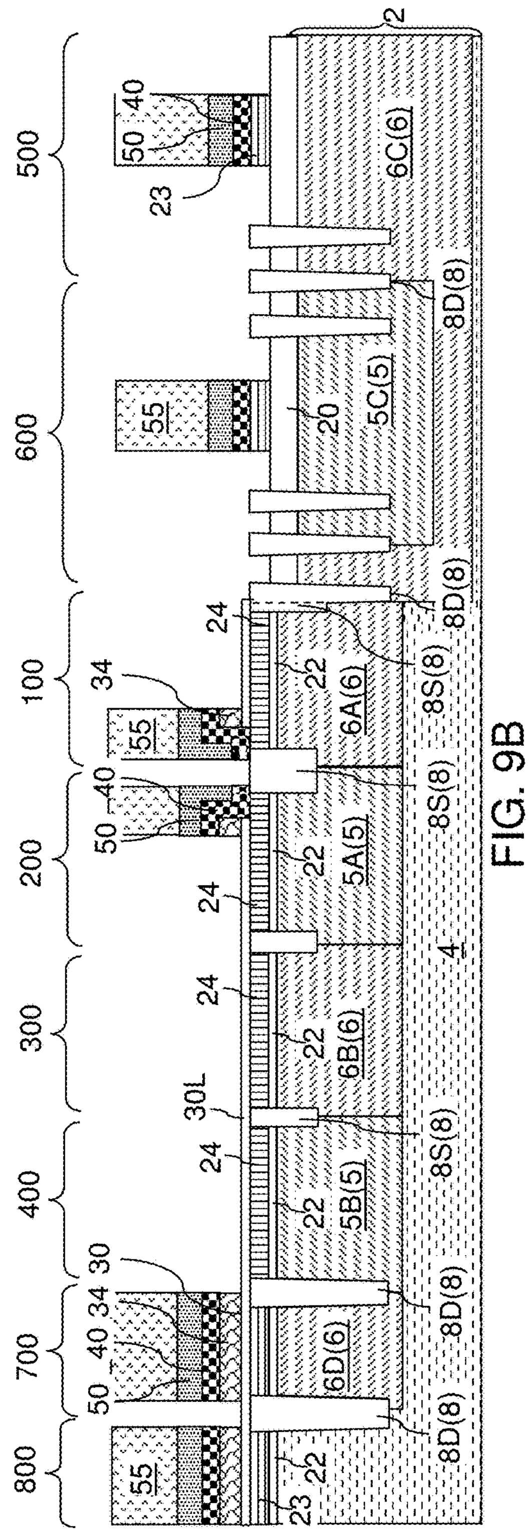
FIG. 9B is a vertical cross-sectional view of the first exemplary structure along the hinged vertical plane B-B' of FIG. 9A.
Figure 9D:
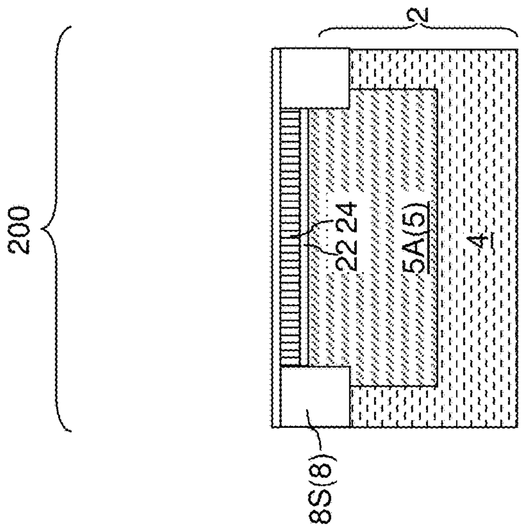
FIG. 9D is a vertical cross-sectional view of the first exemplary structure along the vertical plane D-D' of FIG. 9A.
Figure 9F:
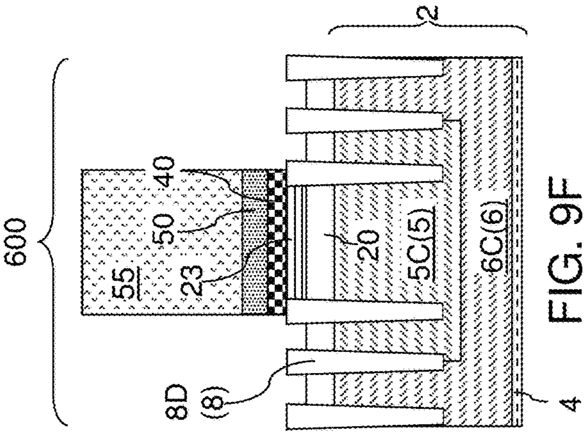
FIG. 9F is a vertical cross-sectional view of the first exemplary structure along the vertical plane F-F' of FIG. 9A.
Figure 9C:
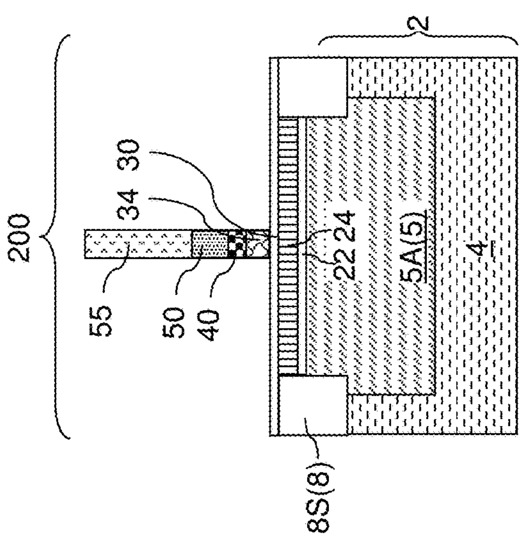
FIG. 9C is a vertical cross-sectional view of the first exemplary structure along the vertical plane C-C' of FIG. 9A.
Figure 9E:
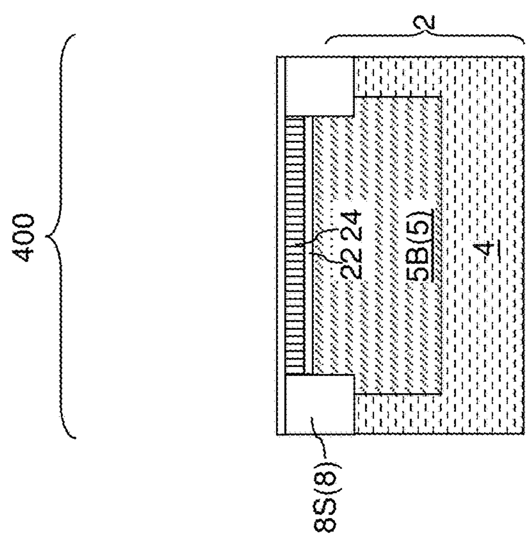
FIG. 9E is a vertical cross-sectional view of the first exemplary structure along the vertical plane E-E' of FIG. 9A.
Figure 10A:
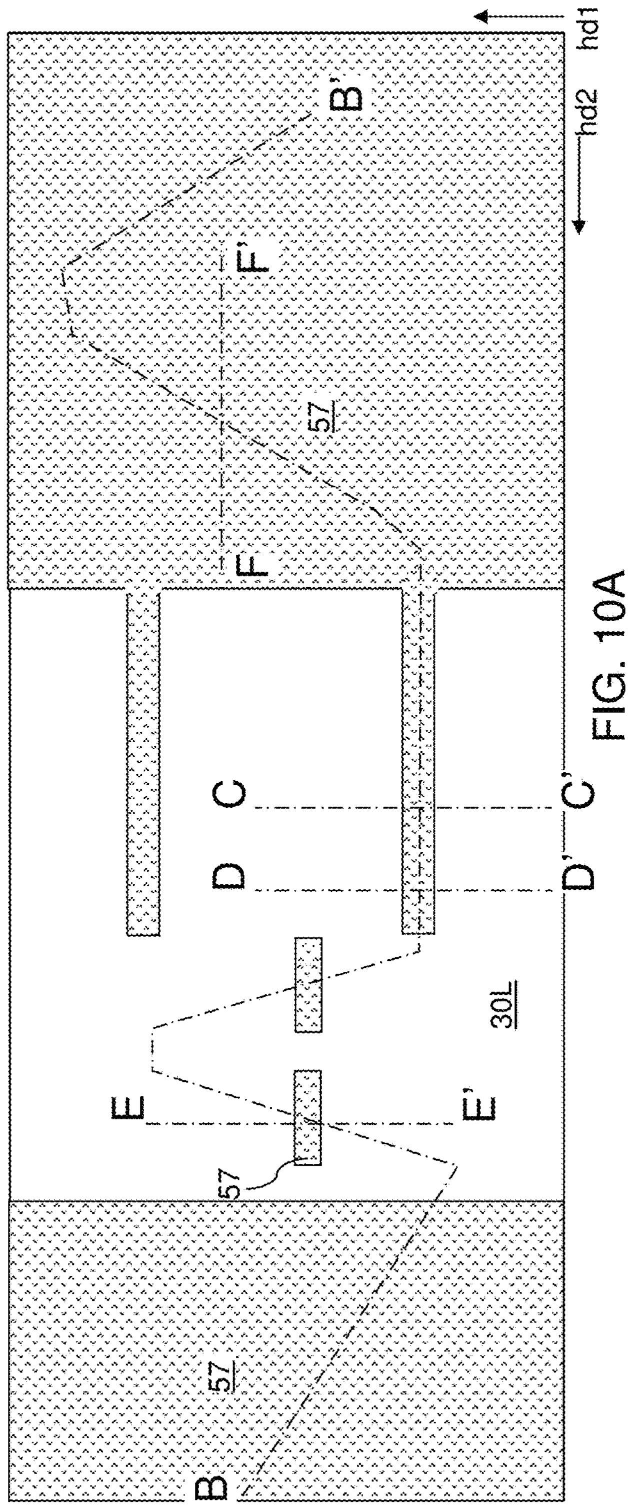
FIG. 10A is a top-down view of the first exemplary structure after applying and patterning a photoresist layer for patterning the semiconductor gate material layers according to the first embodiment of the present disclosure.
Figure 10B:
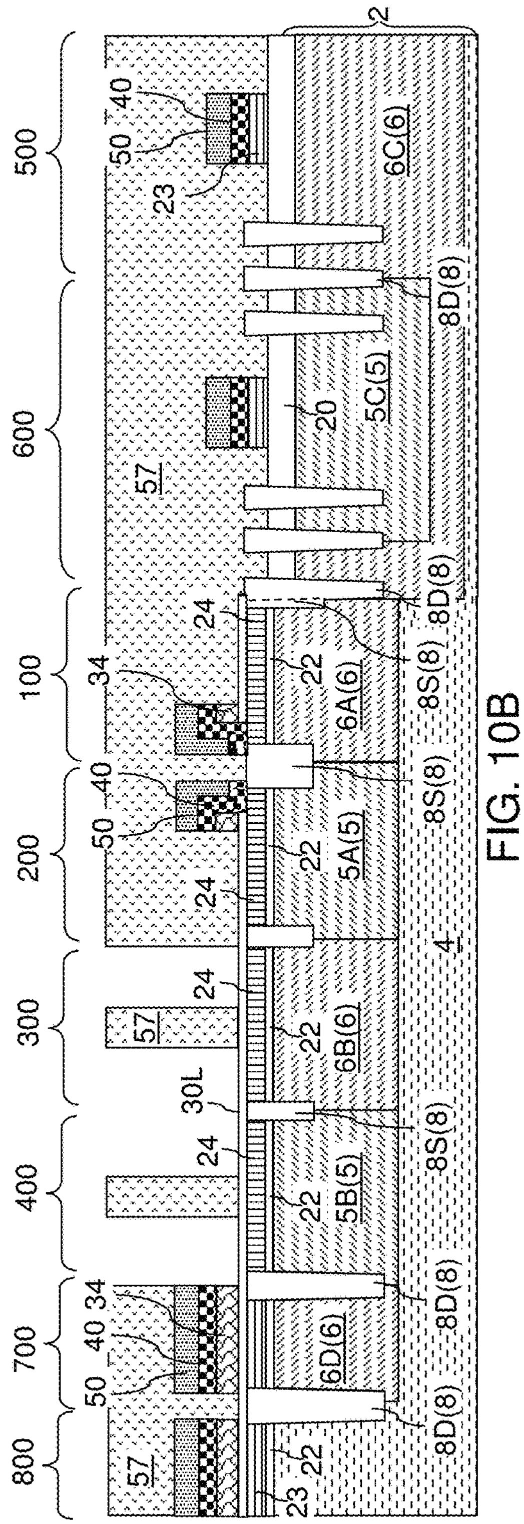
FIG. 10B is a vertical cross-sectional view of the first exemplary structure along the hinged vertical plane B-B' of FIG. 10A.
Figure 10C:
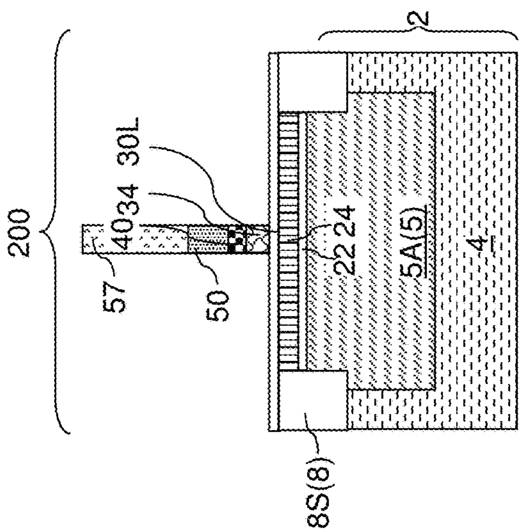
FIG. 10C is a vertical cross-sectional view of the first exemplary structure along the vertical plane C-C' of FIG. 10A.
Figure 10D:
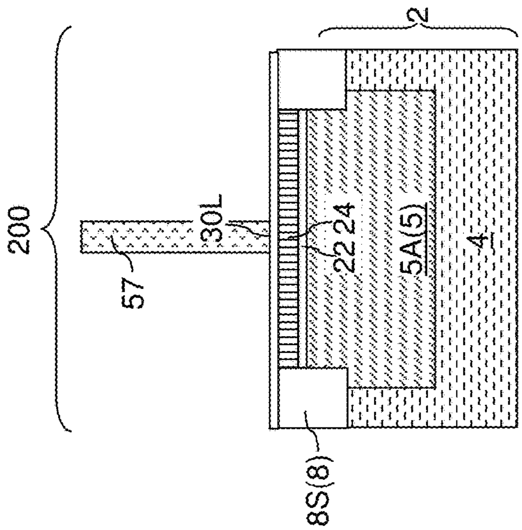
FIG. 10D is a vertical cross-sectional view of the first exemplary structure along the vertical plane D-D' of FIG. 10A.
Figure 10E:
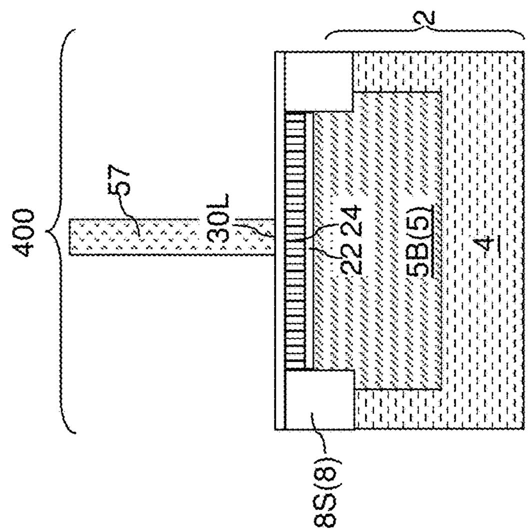
FIG. 10E is a vertical cross-sectional view of the first exemplary structure along the vertical plane E-E' of FIG.
Figure 10F:
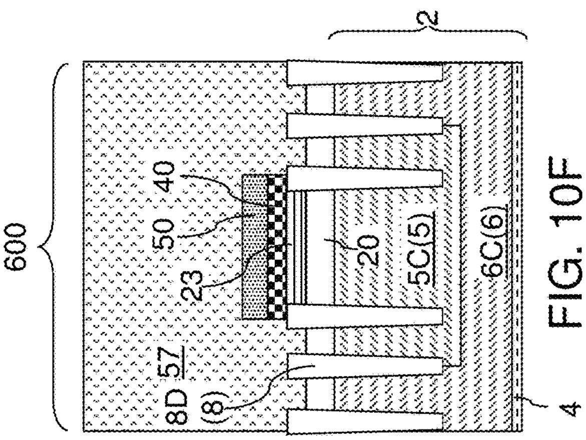
FIG. 10F is a vertical cross-sectional view of the first exemplary structure along the vertical plane F-F' of FIG. 10A.
Figure 11A:
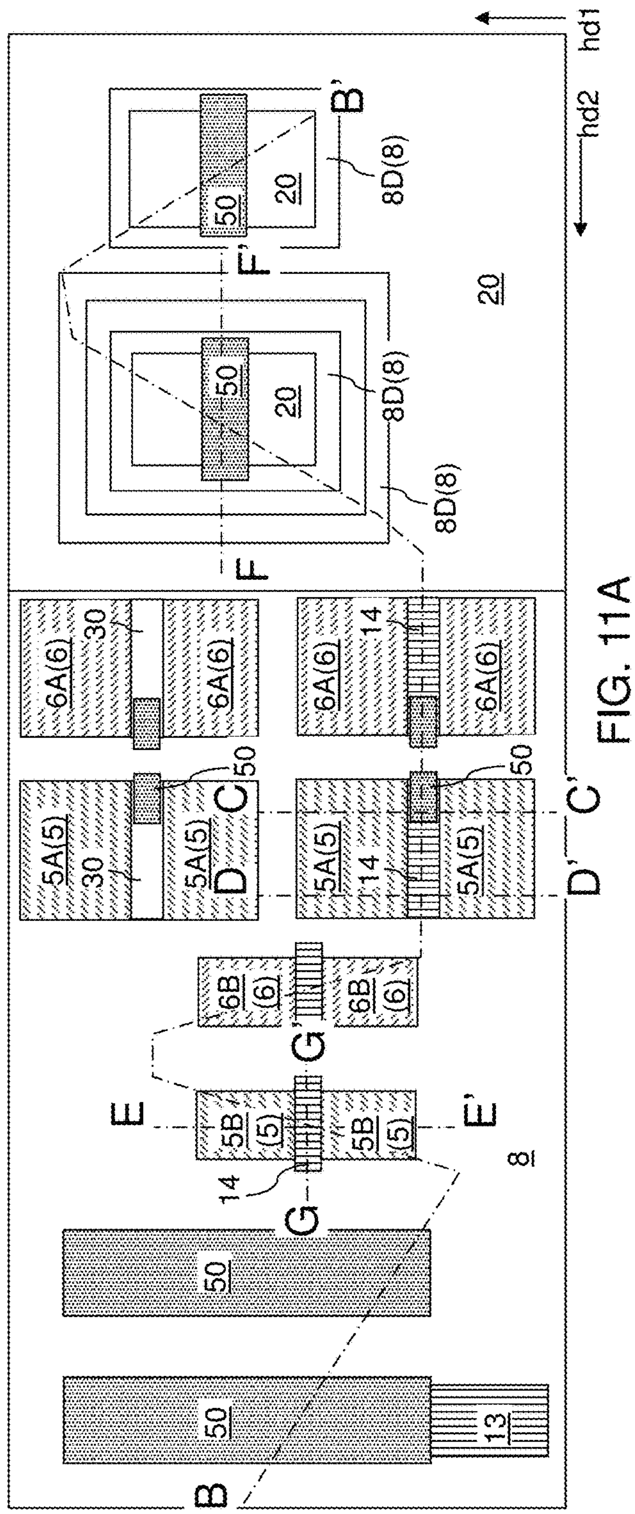
FIG. 11A is a top-down view of the first exemplary structure after applying and patterning the semiconductor gate material layers and the gate dielectric layers according to the first embodiment of the present disclosure.
Figure 11B:
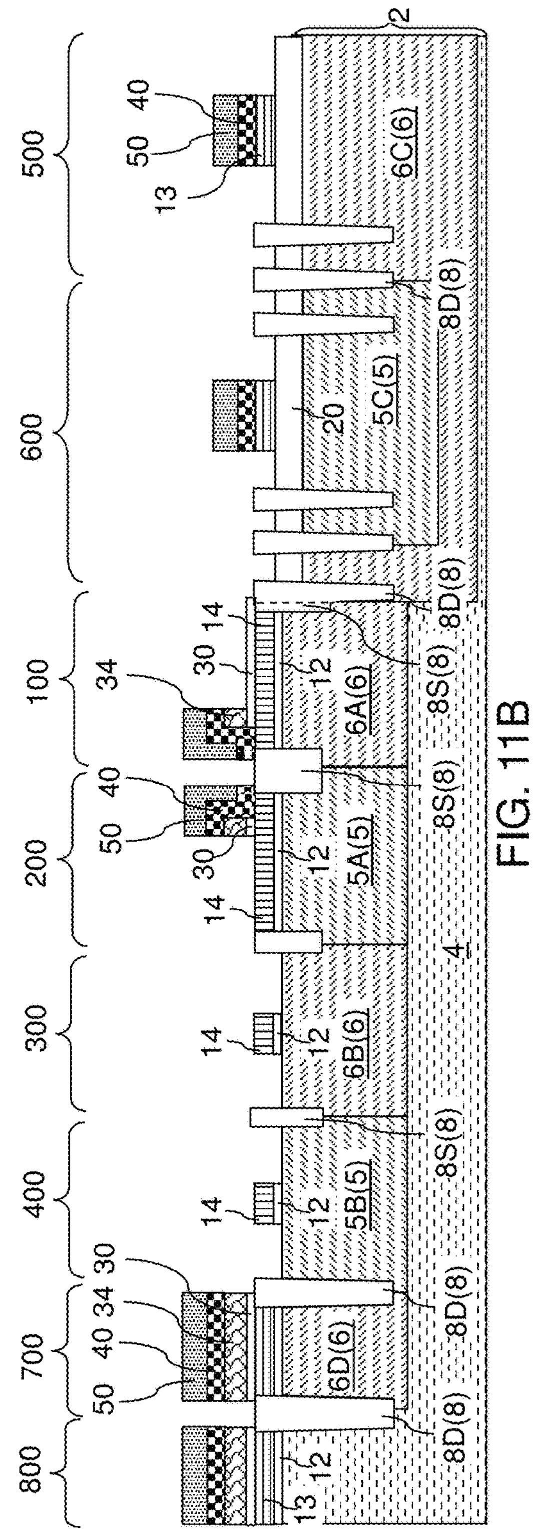
FIG. 11B is a vertical cross-sectional view of the first exemplary structure along the hinged vertical plane B-B' of FIG. 11A.
Figure 11C:
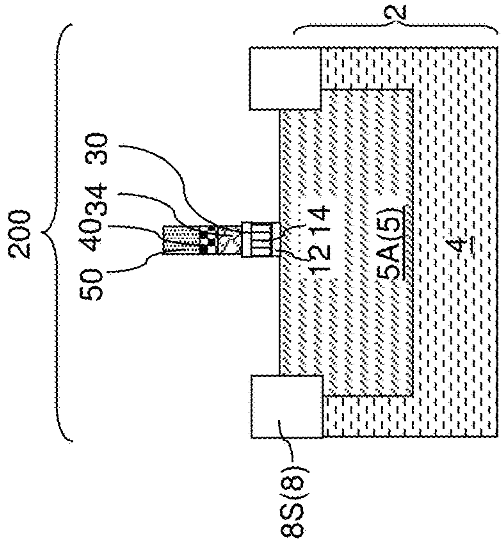
FIG. 11C is a vertical cross-sectional view of the first exemplary structure along the vertical plane C-C' of FIG. 11A.
Figure 11D:
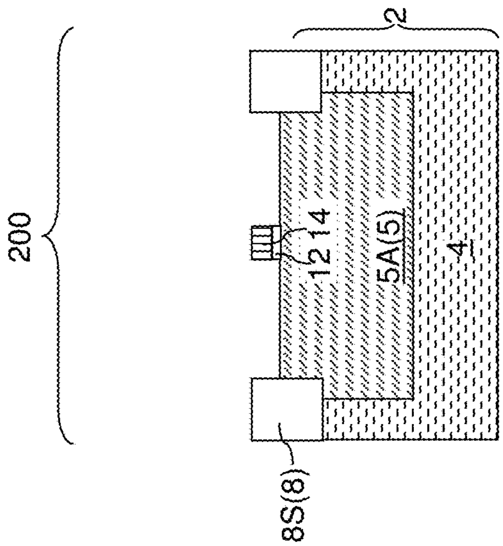
FIG. 11D is a vertical cross-sectional view of the first exemplary structure along the vertical plane D-D' of FIG. 11A.
Figure 11E:
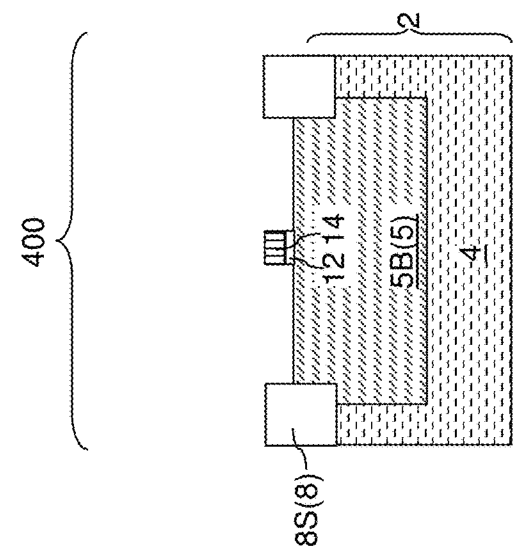
FIG. 11E is a vertical cross-sectional view of the first exemplary structure along the vertical plane E-E' of FIG. 11A.
Figure 11F:
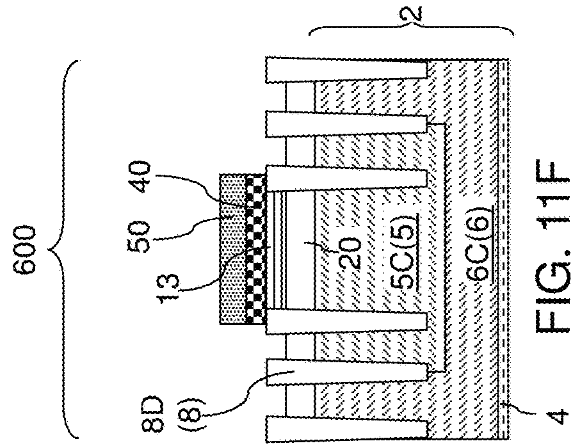
FIG. 11F is a vertical cross-sectional view of the first exemplary structure along the vertical plane F-F' of FIG. 11A.
Figure 11G:
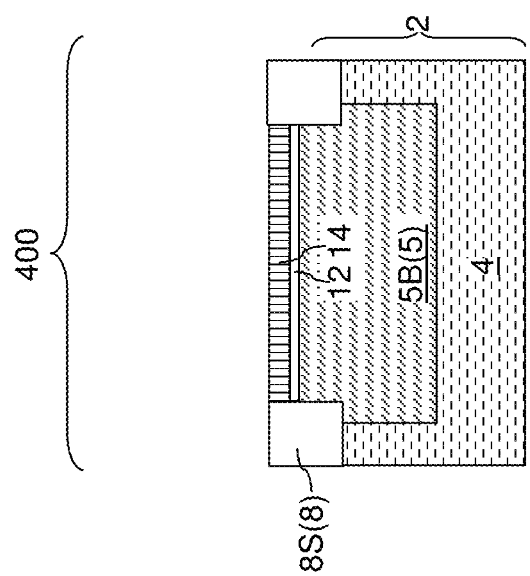
FIG. 11G is a vertical cross-sectional view of the first exemplary structure along the vertical plane G-G' of FIG. 11A.

Referring to FIG. 4 at least one trench fill material layer 8L can be conformally deposited in the trenches 7 and over the polish stop plates 23 and the gate electrode material plates 24. The at least one trench fill material layer 8L may consist of at least one dielectric fill material such as silicon oxide, or may include a combination of a dielectric liner (such as a silicon oxide liner) and at least one semiconductor fill material (such as amorphous silicon or polysilicon).

Referring to FIGS. 5A-5F, excess portions of the at least one trench fill material layer 8L can be removed from above the top surface of the polish stop plates 23 and the gate electrode material plates 24 by a planarization process, which may include a chemical mechanical polishing (CMP) process. The CMP process stops on the polish stop plates 23 and optionally on the gate electrode material plates 24 if they are exposed between the polish stop plates 23. The polish stop plates 23 located above the gate electrode material plates 24 may be removed during the CMP process, and the polish stop plates 23 located in other regions are thinned by the CMP process and/or completely or partially stripped by a selective etch, such as hot phosphoric acid etch.

The remaining portions of the at least one trench fill material layer 8L filling the trenches 7 constitute trench isolation structures 8, which may be a continuous structure contacting the semiconductor material of the semiconductor substrate 2 with dielectric surfaces and providing electrical isolation between adjacent semiconductor devices to be subsequently formed. The trench isolation structures 8 include deep trench isolation structures 8D located in the deep trenches 7D and shallow trench isolation structures 8S located in the shallow trenches 7S.

Generally, a trench isolation structure 8 can be formed through the plates (23L, 24L) and the gate dielectric layers (22L, 20L). Patterned portions of the semiconductor gate material layer 24L and the first gate dielectric layer 22L comprise stacks of a gate dielectric plate 22 and a gate electrode material plate 24 that is laterally surrounded by a respective portion of the trench isolation structure 8.

Referring to FIGS. 6A-6F, a planar dielectric spacer layer 30L and a planar semiconductor spacer layer 34L can be deposited over the gate electrode material plates (24, 23) and the trench isolation structure 8. The planar dielectric spacer layer 30L includes a dielectric material such as silicon oxide, and can be deposited by a conformal or non-conformal deposition process. The thickness of the planar dielectric spacer layer 30L may be in a range from 3 nm to 30 nm, although lesser and greater thicknesses may also be employed. The planar semiconductor spacer layer 34L includes a semiconductor material such as polysilicon, a silicon-germanium alloy, or a compound semiconductor material. The thickness of the planar semiconductor spacer layer 34L can be in a range from 30 nm to 300 nm, such as from 60 nm to 150 nm, although lesser and greater thicknesses may also be employed.

Referring to FIGS. 7A-7F, a photoresist layer (not shown) can be applied over the first exemplary structure, and can be lithographically patterned to form openings over areas of interfaces between the first p-type wells 5A and the trench isolation structure 8 and over areas of interfaces between the first n-type wells 6A and the trench isolation structure 8. Specifically, the openings in the photoresist layer can be formed in areas including interfaces between channel regions of the low voltage field effect transistors to be subsequently formed in the first p-type field effect transistor region 100 and in the first n-type field effect transistor region 200. Further, the photoresist layer can be removed from areas in which high voltage field effect transistors employing thick gate dielectrics are to be subsequently formed, such as the areas of the third p-type field effect transistor region 500 and the third n-type field effect transistor region 600.

An anisotropic etch process can be performed to remove unmasked portions of the planar semiconductor spacer layer 34L and the planar dielectric spacer layer 30L. Top surfaces of the plates 23 and the trench isolation structure 8 can be physically exposed in the third p-type field effect transistor region 500 and the third n-type field effect transistor region 600. In one embodiment, an opening through the planar semiconductor spacer layer 34L and the planar dielectric spacer layer 30L in the first p-type field effect transistor region 100 and in the first n-type field effect transistor region 200 may include an area of a portion of the shallow trench isolation structure 8S, an area of a portion of a first gate electrode material plate 24, and an area of a portion of another first gate electrode material plate 24.

Generally, the planar semiconductor spacer layer 34L and the planar dielectric spacer layer 30L can be patterned employing an etch process that employs an etch mask, such as a patterned photoresist layer. A portion of the top surface of the first semiconductor gate material layer 24L (comprising a portion of the top surface of a first semiconductor gate material plate 24) is physically exposed by patterning the planar semiconductor spacer layer 34L and the planar dielectric spacer layer 30L. The photoresist layer can be subsequently removed, for example, by ashing.

Referring to FIGS. 8A-8F, a conductive gate connection material layer comprising a metallic material can be deposited directly on physically exposed top surfaces plates (23, 24) and the trench isolation structure 8. In one embodiment, the conductive gate connection material layer may comprise a conductive gate cap layer 40L. The conductive gate cap layer 40L can include a metallic material such as an elemental metal (e.g., tungsten and/or titanium), an intermetallic alloy, a conductive metallic nitride (e.g., TiN or WN), a conducive metallic carbide, a heavily doped semiconductor (e.g., heavily doped polysilicon) and/or a conductive metal semiconductor alloy (such as a metal silicide). The thickness of the conductive gate cap layer 40L may be in a range from 20 nm to 200 nm, such as from 40 nm to 100 nm, although lesser and greater thicknesses may also be employed. Generally, the conductive gate cap layer 40L can be deposited over the planar semiconductor spacer layer 34L and directly on the top surfaces of remaining portions of the layers (23L, 24L), i.e., directly on the top surfaces of the plates (23, 24).

A gate cap dielectric layer 50L can be subsequently deposited over the conductive gate cap layer 40L. The gate cap dielectric layer 50L includes a dielectric material, such as silicon nitride. The thickness of the gate cap dielectric layer 50L can be in a range from 20 nm to 100 nm, such as from 30 nm to 50 nm, although lesser and greater thicknesses may also be employed.

Referring to FIGS. 9A-9F, a first photoresist layer 55 can be applied over the first exemplary structure, and can be lithographically patterned to form discrete patterned photoresist material portions. The patterned portions of the first photoresist layer 55 can include first portions that overlie an edge of the planar semiconductor material layer 34L in the first p-type field effect transistor region 100 and in the first n-type field effect transistor region 200. The patterned portions of the first photoresist layer 55 can include second portions that define the shapes of gate electrodes to be formed in the third p-type field effect transistor region 500 and in the third n-type field effect transistor region 600. The patterned portions of the first photoresist layer 55 can include additional portions that cover a respective area within the first passive device region 700 and in the second passive device region 800.

A first anisotropic etch process can be performed to transfer the pattern in the first photoresist layer 55 through the gate cap dielectric layer SOL, the conductive gate cap layer 40L, the planar semiconductor spacer layer 34L, and portions of the plates 23 located outside the areas of the planar dielectric spacer layer 30L, which include portions of plates 23 located within the third p-type field effect transistor region 500 and the third n-type field effect transistor region 600. The planar dielectric spacer layer 30L, the second gate dielectric plate 20, and the trench isolation structure 8 can function as etch stop structures for the first anisotropic etch process. In case the planar dielectric spacer layer 30L, the second gate dielectric plate 20, and the trench isolation structure 8 comprise silicon oxide, the etch chemistry of the terminal step of the first anisotropic etch process can etch the semiconductor materials of the planar semiconductor spacer layer 34L and the plates 23 selective to silicon oxide.

Each patterned portion of the gate cap dielectric layer SOL comprises a gate cap dielectric 50. Each patterned portion of the conductive gate cap layer 40L comprises a conductive gate cap structure 40. Each patterned portion of the planar semiconductor spacer layer 34L comprises a planar semiconductor spacer plate 34.

A contiguous combination of a first gate cap dielectric 50, a first conductive gate cap structure 40, and a first planar semiconductor spacer plate 34 can be formed on a top surface of each gate electrode material plate 24 in the first p-type field effect transistor region 100 and/or in the first n-type field effect transistor region 200. In this case, the first conductive gate cap structure 40 can be formed on the physically exposed top surface of a portion of the first gate electrode material plate 24. According to an aspect of the present disclosure, a first conductive gate cap structure 40 in the first p-type field effect transistor region 100 or in the first n-type field effect transistor region 200 comprises a first segment that contacts portion of the top surface of an underlying gate electrode material plate 24; a second segment that overlies the first planar dielectric spacer layer 34L; and a connecting segment that contacts a first sidewall of the first planar dielectric spacer layer 34L and connecting the first segment and the second segment.

According to an aspect of the present disclosure, a portion of the first conductive gate cap structure 40 covers a portion of a top surface of an underlying portion of the shallow trench isolation structure 8, and a portion of a bottom surface of the first conductive gate cap structure 40 contacts the portion of the top surface of the underlying portion of the shallow trench isolation structure 8. A first sidewall of the first planar semiconductor spacer plate 34 overlies, and is vertically coincident with, the first sidewall of the planar dielectric spacer layer 30L, and contacts the connecting segment of the first conductive gate cap structure 40. The first planar semiconductor spacer plate 34 can be formed on a top surface of the planar dielectric spacer layer 30L while a semiconductor gate plate 24 (i.e., a portion of the semiconductor gate material layer 24L) is covered with the planar dielectric spacer layer 30L. The first conductive gate cap structure 40 is formed directly on the first planar semiconductor spacer plate 34. The first photoresist layer 55 can be subsequently removed, for example, by ashing.

Referring to FIGS. 10A-10F, a second photoresist layer 57 can be applied over the first exemplary structure, and can be lithographically patterned to provide patterned photoresist material portions having the shapes of gate electrodes to be subsequently formed in the first p-type field effect transistor region 100, the first n-type field effect transistor region 200, the second p-type field effect transistor region 300, and the second n-type field effect transistor region 400. In one embodiment, the areas of the patterned portions of the second photoresist layer 57 may include the entirety of the areas of the patterned portions of the first photoresist layer 55 that is employed at the processing steps of FIGS. 9A-9F. The second photoresist layer 57 may cover the entirety of the areas of the third p-type field effect transistor region 500, the third n-type field effect transistor region 600, and the passive device regions (700, 800).

Referring to FIGS. 11A-11G, a second anisotropic etch process can be performed to transfer the pattern of the second photoresist layer 57 through the planar dielectric spacer layer 30L, the polish stop plates 23, the gate electrode material plates 24, and the first gate dielectric plates 22. Each patterned portion of the planar dielectric spacer layer 30L constitutes a planar dielectric spacer plate 30. Each patterned portion of the polish stop plates 23 constitutes dielectric portion 13. The dielectric portions 13 may comprise silicon nitride portions, which function as part of a composite silicon nitride/silicon oxide gate dielectric (13, 20) in the high voltage transistors in regions 500 and 600. Each patterned portion of the gate electrode material plates 24 constitutes a gate electrode 14. Each patterned portion of the first gate dielectric plates 22 constitutes a first gate dielectric 12. The terminal portion of the second anisotropic etch process may be selective to the to the semiconductor material of the semiconductor substrate 2. The second photoresist layer 57 can be subsequently removed, for example, by ashing.

Generally, stacks of a first gate dielectric plate 22 and a gate electrode material plate 24 can be patterned into a stack of a first gate dielectric 12 and a first gate electrode 14. The gate electrode material plate 24 is patterned into the gate electrode 14 by the second anisotropic etch process employing the photoresist layer 57 as a patterned etch mask. The first gate dielectric plate 22 and the planar dielectric spacer layer 30L can be patterned into the first gate dielectric 12 and a first planar dielectric spacer plate 30, respectively, by a same etch process such as the second anisotropic etch process.

A first planar dielectric spacer plate 30 covers a first portion of a top surface of the gate electrode 14 upon patterning the first gate electrode material plate 24 into the first gate electrode 14. A first portion of a top surface of the gate electrode 14 contacts a bottom surface of the first planar dielectric spacer plate 30. A first conductive gate cap structure 40 comprises a first segment that contacts a second portion of the top surface of the gate electrode 14 a second segment that overlies the first planar dielectric spacer plate 30, and a connecting segment that contacts a first sidewall of the first planar dielectric spacer plate 30 and connecting the first segment and the second segment.

Referring to FIGS. 12A-12G, source/drain extension regions (not shown) can be optionally formed by implantation of p-type dopants and n-type dopants employing a respective patterned implantation mask layer (such as a patterned photoresist layer) and a respective ion implantation process. A dielectric gate spacer material layer including a dielectric material can be deposited by a conformal deposition process such as a chemical vapor deposition process.

The dielectric material of the dielectric gate spacer material layer may include, for example, silicon nitride and/or silicon oxide. An anisotropic etch process can be performed to etch horizontally-extending portions of the dielectric gate spacer material layer. Remaining vertically-extending portions of the dielectric gate spacer material layer constitute dielectric gate spacers 56.

The anisotropic etch process may be extended to etch unmasked portions of the dielectric materials of the second gate dielectric plates 20 and the trench isolation structures 8 selective to the materials of the gate electrodes 14. In this case, the second gate dielectric plates 20 can be patterned into second gate dielectrics 10 (which may comprise portions of a composite silicon nitride/silicon oxide gate dielectrics (10, 13) for the high voltage transistors in regions 500 and 600), and the physically exposed top surfaces of the trench isolation structures 8 can be vertically recessed. In one embodiment, an outer sidewall of each second gate dielectric 10 can be vertically coincident with an outer sidewall of a respective one of the gate dielectric spacers 56. As used herein, a first surface and a second surface are vertically coincident with each other if the first surface and the second surface overlie or underlie each other, and are located within a same vertical plane. In one embodiment, the recessed portions of the top surfaces of the trench isolation structure 8 may be at, or about, the height of the top surfaces of the third doped wells (5C, 5D) in the third field effect transistor regions (500, 600).

In one embodiment, a first dielectric gate spacer 56 located within a first field effect transistor region (100 or 200) comprises an upper portion that laterally surrounds and contacts a first conductive gate cap structure 40 and the planar semiconductor spacer plate 34, and contacts a portion of a top surface of the first planar dielectric spacer plate 30. The first dielectric gate spacer 56 contacts a first sidewall of the first semiconductor spacer plate 34 that is vertically coincident with a first sidewall of the first planar dielectric spacer plate 30, and a second sidewall of the first planar semiconductor spacer plate 34 that is laterally offset from a second sidewall of the first planar dielectric spacer plate 34. An outer sidewall of the first dielectric gate spacer 56 can be vertically coincident with the second sidewall of the first planar dielectric spacer plate 30.

Figure 12A:
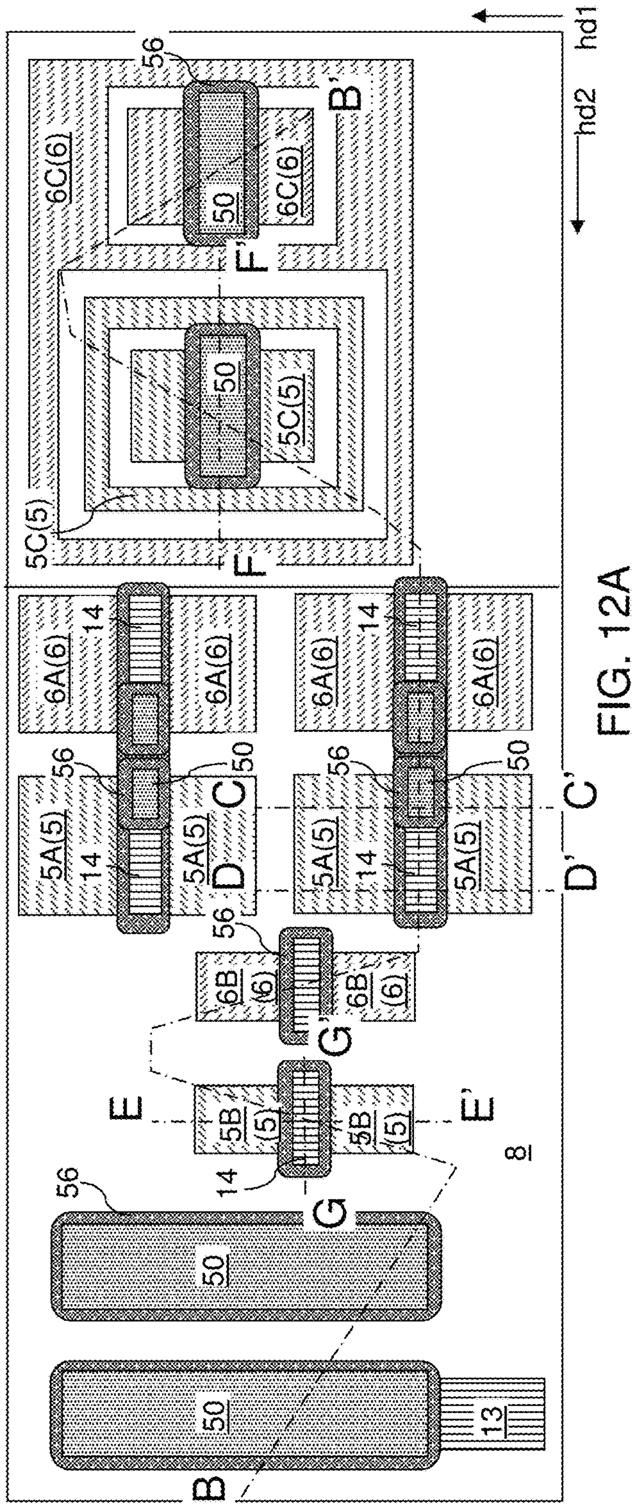
FIG. 12A is a top-down view of the first exemplary structure after formation of dielectric gate spacers according to the first embodiment of the present disclosure.
Figure 12B:
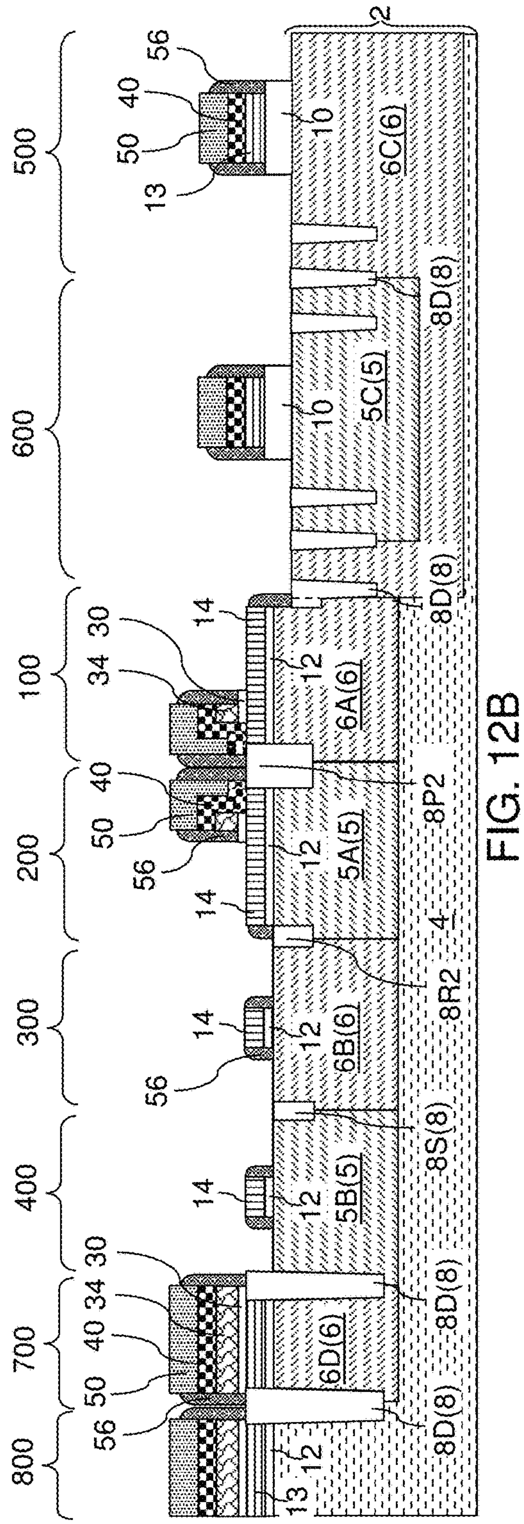
FIG. 12B is a vertical cross-sectional view of the first exemplary structure along the hinged vertical plane B-B' of FIG. 12A.

The first planar semiconductor spacer plate 34 can contact a top surface of the first planar dielectric spacer plate 30, can have a lesser area than the first planar dielectric spacer plate 30, and can contact a bottom surface of the second segment of the first conductive gate cap structure 40 that overlies the stack of the first planar dielectric spacer plate 30 and the first planar semiconductor spacer plate 34. A portion of the first conductive gate cap structure 40 covers a top surface of a first portion of the shallow trench isolation structure 8 that surrounds a portion of a first doped well (5A or 6A) that underlies a gate structure (12, 14, 30, 34, 40, 50) and the first gate dielectric spacer 56. As shown in FIG. 12F, a segment 8P1 of the first portion of the deep trench isolation structure 8D that underlies the first conductive gate cap structure 40 protrudes above a horizontal top surface of a recessed region 8R1 of the first portion of the deep trench isolation structure 8D because the first conductive gate cap structure 40 masks the protruding segment 8P of the first portion of the deep trench isolation structure 8D during the anisotropic etch process that vertically recesses unmasked portions of the trench isolation structure 8. Likewise, as shown in FIG. 12B, a segment 8P2 of the first portion of the shallow trench isolation structure 8S that underlies the first conductive gate cap structure 40 protrudes above a horizontal top surface of a recessed region 8R2 of the first portion of the shallow trench isolation structure 8S.

Figure 12C:
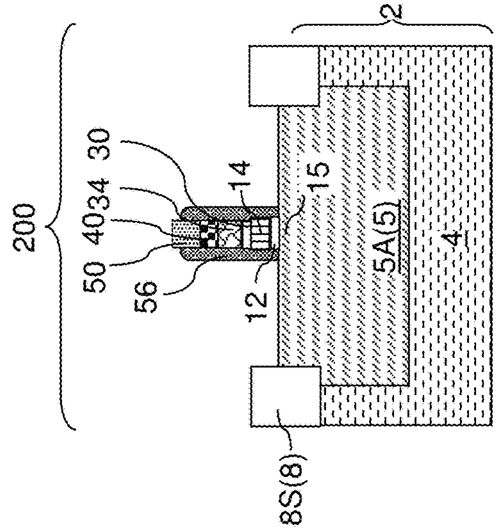
FIG. 12C is a vertical cross-sectional view of the first exemplary structure along the vertical plane C-C' of FIG. 12A.
Figure 12D:
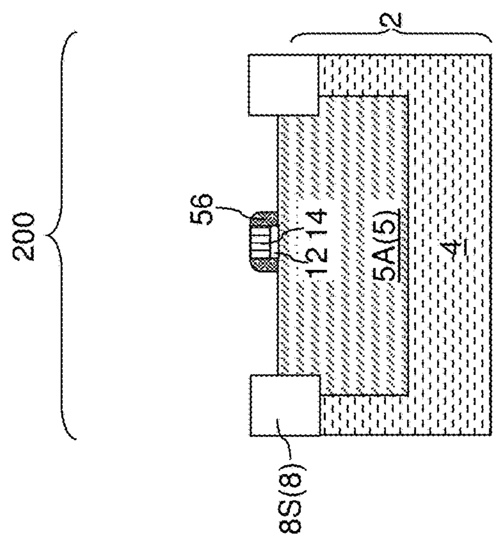
FIG. 12D is a vertical cross-sectional view of the first exemplary structure along the vertical plane D-D' of FIG. 12A.
Figure 12E:
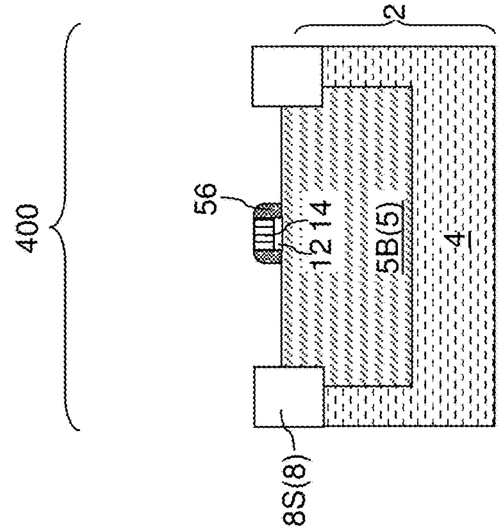
FIG. 12E is a vertical cross-sectional view of the first exemplary structure along the vertical plane E-E' of FIG. 12A.
Figure 12F:
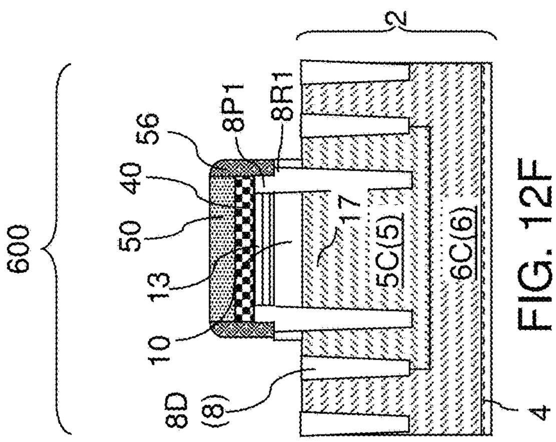
FIG. 12F is a vertical cross-sectional view of the first exemplary structure along the vertical plane F-F' of FIG. 12A.
Figure 12G:
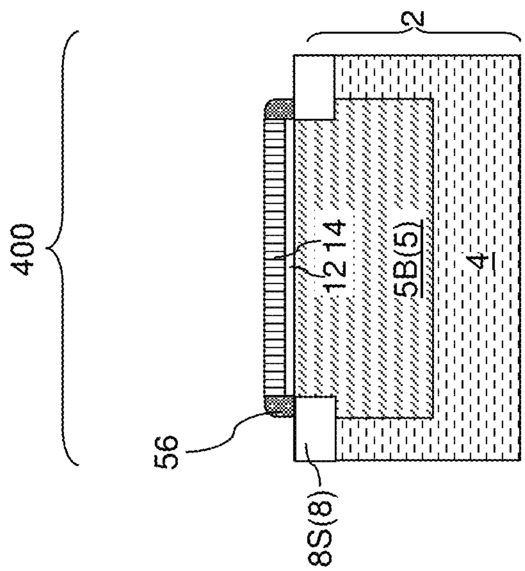
FIG. 12G is a vertical cross-sectional view of the first exemplary structure along the vertical plane G-G' of FIG. 12A.
Figure 13A:
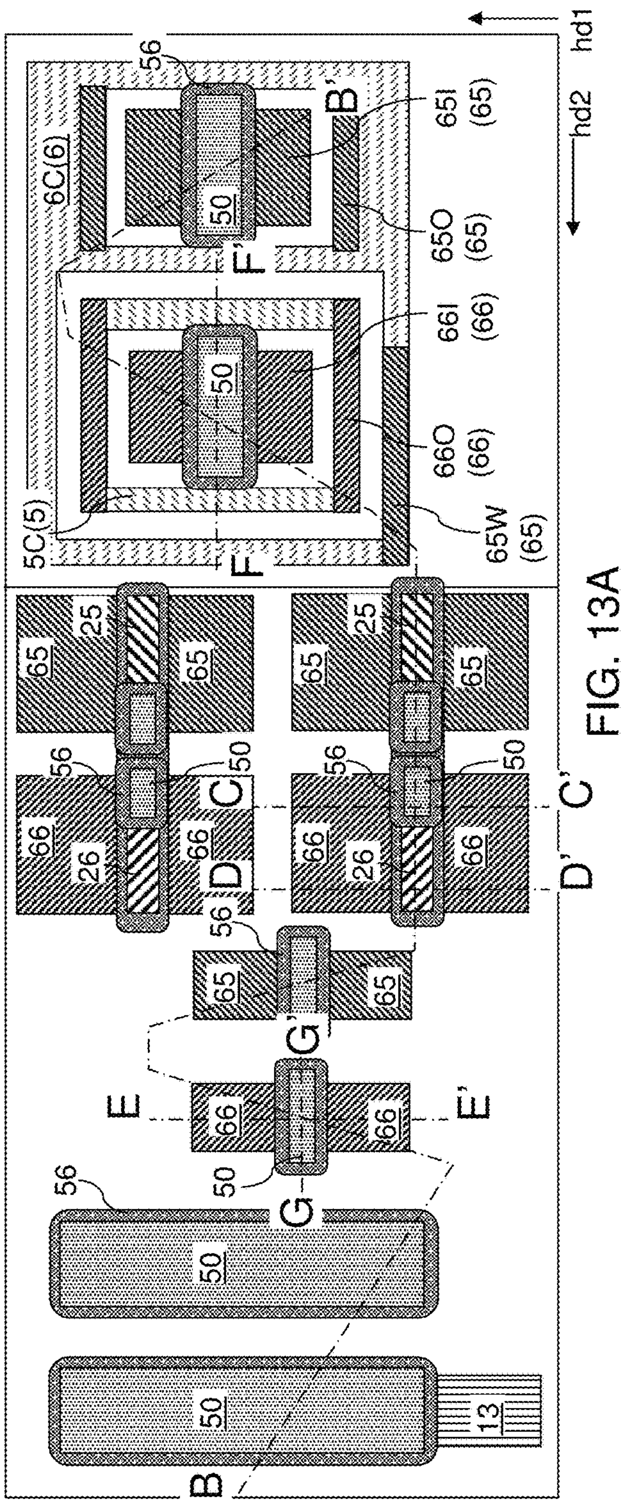
FIG. 13A is a top-down view of the first exemplary structure after formation of source regions and drain regions according to the first embodiment of the present disclosure.
Figure 13B:
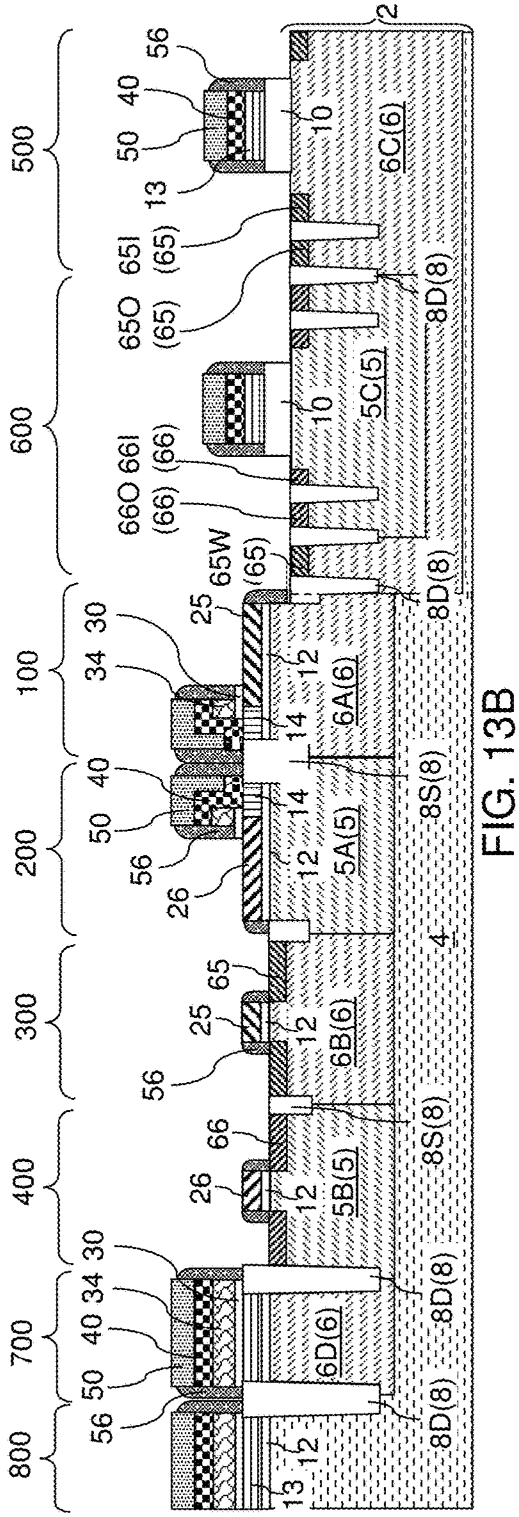
FIG. 13B is a vertical cross-sectional view of the first exemplary structure along the hinged vertical plane B-B' of FIG. 13A.
Figure 13D:
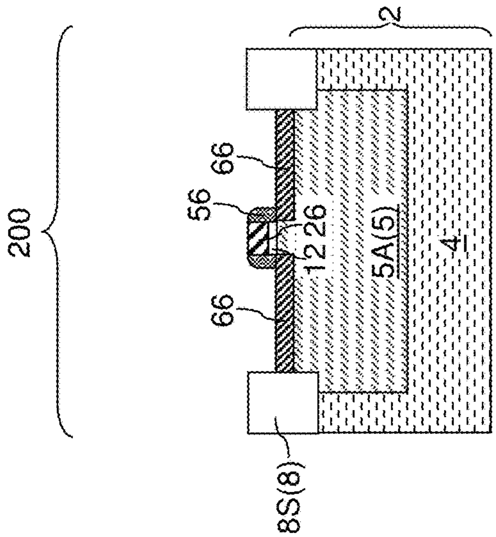
FIG. 13D is a vertical cross-sectional view of the first exemplary structure along the vertical plane D-D' of FIG. 13A.
Figure 13F:
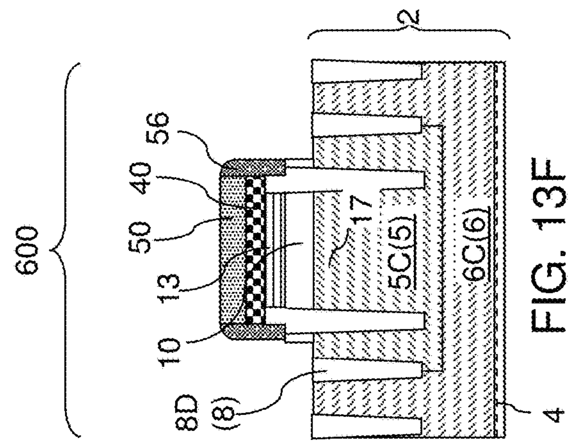
FIG. 13F is a vertical cross-sectional view of the first exemplary structure along the vertical plane F-F' of FIG. 13A.
Figure 13C:
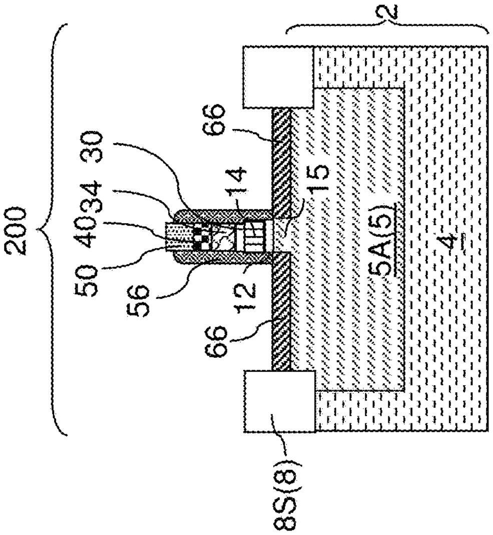
FIG. 13C is a vertical cross-sectional view of the first exemplary structure along the vertical plane C-C' of FIG. 13A.
Figure 13E:
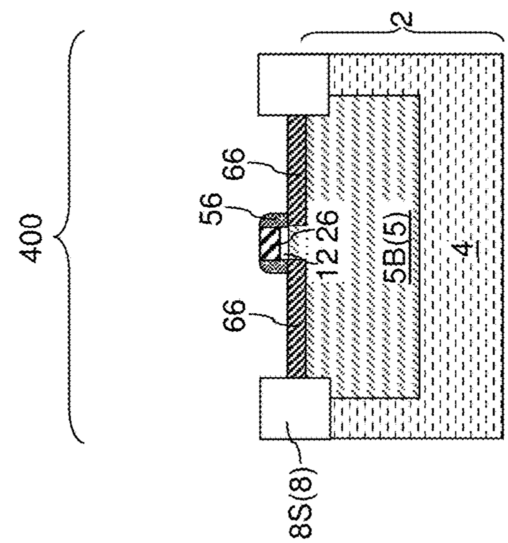
FIG. 13E is a vertical cross-sectional view of the first exemplary structure along the vertical plane E-E' of FIG. 13A.
Figure 13G:
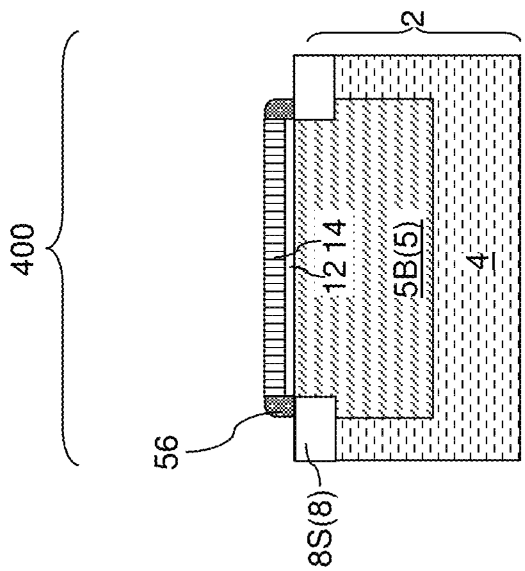
FIG. 13G is a vertical cross-sectional view of the first exemplary structure along the vertical plane G-G' of FIG. 13A.

A first gate structure (12, 14, 30, 34, 40, 50) including a first gate dielectric 12, a first gate electrode 14, a first planar dielectric spacer plate 30, and a first conductive gate cap structure 40 overlies a first channel region 15 of a first (e.g., low voltage or very low voltage) field effect transistor in regions 100 and 200, as shown in FIG. 12C. The first channel region 15 can be a surface portion of a doped well (5, 6) that has an areal overlap with the first gate structure (12, 14, 30, 34, 40, 50) in a plan view. In one embodiment, the first gate dielectric 12 and the first gate electrode 14 comprise sidewalls that laterally extend along the first horizontal direction hd1, are vertically coincident with each other, and are laterally spaced from the sidewall of a recessed region 8R2 of a portion of the trench isolation structure 8 that laterally surrounds a portion of a doped well (5, 6), and are vertically coincident with a sidewall of another region of the portion of the trench isolation structure 8.

In one embodiment, the first gate dielectric 12 and the first gate electrode 14 contact a sidewall of a protruding region (i.e., a protruding segment) 8P2 of the portion of the trench isolation structure 8. The sidewall laterally extends along a first horizontal direction hd1. The first planar dielectric spacer plate 30 contacts a first portion of a top surface of the first gate electrode 14, and the first conductive gate cap structure 40 comprises a first segment that contacts a second portion of the top surface of the first gate electrode 14, a second segment that overlies the first planar dielectric spacer plate 30, and a connecting segment that contacts a first sidewall of the first planar dielectric spacer plate 30 and connecting the first segment and the second segment.

In one embodiment, the first gate dielectric 12 comprises a first sidewall that contacts the sidewall of the protruding region 8P2 of the first portion of the trench isolation structure 8. The first gate electrode 14 comprises a first sidewall that contacts the sidewall of the protruding region 8P2 of the first portion of the trench isolation structure 8. A second sidewall of the first gate dielectric 12 and a second sidewall of the first gate electrode 14 that laterally extend along the first horizontal direction hd1 contacts a sidewall of a lower portion of the first dielectric gate spacer 56. Additional sidewalls of the first gate dielectric 12 and the first gate electrode 14 contact additional sidewalls of the lower portion of the first dielectric gate spacer 56 that laterally extends along a second horizontal direction hd2 that is perpendicular to the first horizontal direction hd1.

A second gate structure (10, 13, 40, 50) including a second composite silicon nitride/silicon oxide gate dielectric (13, 10), a second gate electrode 40 (which comprises a second conductive gate cap structure 40) overlies a second channel region 17 of a second (e.g., high voltage) field effect transistor in regions 500 and 600, as shown in FIG. 12F.

Referring to FIGS. 13A-13G, masked ion implantation processes can be performed to implant p-type dopants within unmasked surface portions of the n-type wells 6, and to implant n-type dopants within unmasked surface portions of the p-type wells 5. A combination of a patterned photoresist layer, the gate structures {(12, 10, 14, 13, 30, 34, 40, 50) and (10, 13, 40, 50)} and the dielectric gate spacers 56 can be employed as a composite implantation mask during each ion implantation process. Source regions and drain regions are formed within the implanted surface portions of the p-doped wells 5 and the n-doped wells 6. The source regions and the drain regions are collectively referred to as source/drain regions (65, 66), which include p-doped source/drain regions 65 that are formed within a respective one of the n-doped wells 6, and n-doped source/drain regions 66 that are formed within a respective one of the p-doped wells 5.

In one embodiment, configurations for increasing the breakdown voltage of field effect transistors may be employed in device regions in which high-voltage field effect transistors are formed such as the third field effect transistor regions (500, 600). In this case, the p-doped source/drain regions 65 may include inner p-doped source/drain regions 651 and outer p-doped source/drain regions 650 that are laterally spaced apart by an additional trench isolation structure 8 (e.g., deep trench isolation structure 8D), which may be disjoined from the trench isolation structure 8 (e.g., shallow trench isolation structure 8S) in the first field effect transistor regions (100, 200). Further, the n-doped source/drain regions 66 may include inner n-doped source/drain regions 661 and outer n-doped source/drain regions 660 that are laterally spaced apart by another additional trench isolation structure 8. Optionally, a well contact source/drain region 65W may be employed to facilitate biasing of a doped well.

In one embodiment, gate electrodes 14 located within the low and very low voltage field effect transistor regions (100, 200, 300, 400) may be doped with p-type dopants or n-type dopants to form doped gate electrodes (25, 26) that are doped with p-type dopants or n-type dopants. The doped gate electrodes (25, 26) include p-doped second gate electrodes 25 formed in the p-type field effect transistor regions (100, 300) and n-doped second gate electrodes 26 formed in the n-type field effect transistor regions (200, 400). Alternatively or in addition, the polysilicon gate electrodes 14 and/or heavily doped semiconductor (e.g., heavily doped polysilicon) conductive gate cap structures 40 may be silicided by forming a metal on the polysilicon 14 and annealing the metal to form a metal silicide on the exposed top surfaces of the polysilicon.

Generally, various field effect transistors having different gate dielectric thicknesses, different gate lengths (i.e., different lateral distances between a source region and a drain region), and different configurations can be formed in the various field effect transistor regions (100, 200, 300, 400, 500, 600).

Referring to FIGS. 14A-14F, a contact-level dielectric layer 70 and various contact via structures (76A, 76G, 86A, 86G, 96A, 96G, 96R, 96C) can be subsequently formed. The contact-level dielectric layer 70 includes a dielectric material such as silicon oxide, and can be formed by a conformal or non-conformal deposition process. The top surface of the contact-level dielectric layer 70 can be planarized by a planarization process such as a chemical mechanical polishing (CMP) process. The vertical distance between the topmost surfaces of the gate cap dielectrics 50 and the top surface of the contact-level dielectric layer 70 can be in a range from 30 nm to 500 nm, although lesser and greater vertical distances may also be employed.

The contact-level dielectric layer 70 overlies and laterally surrounds each of the field effect transistors. In one embodiment shown in FIG. 13B, a first portion 14A of the top surface of a first gate electrode (14, 26) of a first field effect transistor in a first transistor region (100, 200) contacts a first planar dielectric spacer plate 30, a second portion 14B of the top surface of a first gate electrode 14 contacts a lower portion of the conductive gate cap structure 40, and the contact-level dielectric layer 70 can contact a third portion 14C of the top surface of the first gate electrode (14, 26). The third portion 14C of the top surface of the first gate electrode 14 can be laterally spaced from the second portion 14B of the top surface of the first gate electrode 14 by the first portion 14A of the top surface of the first gate electrode 14.

Figure 14A:
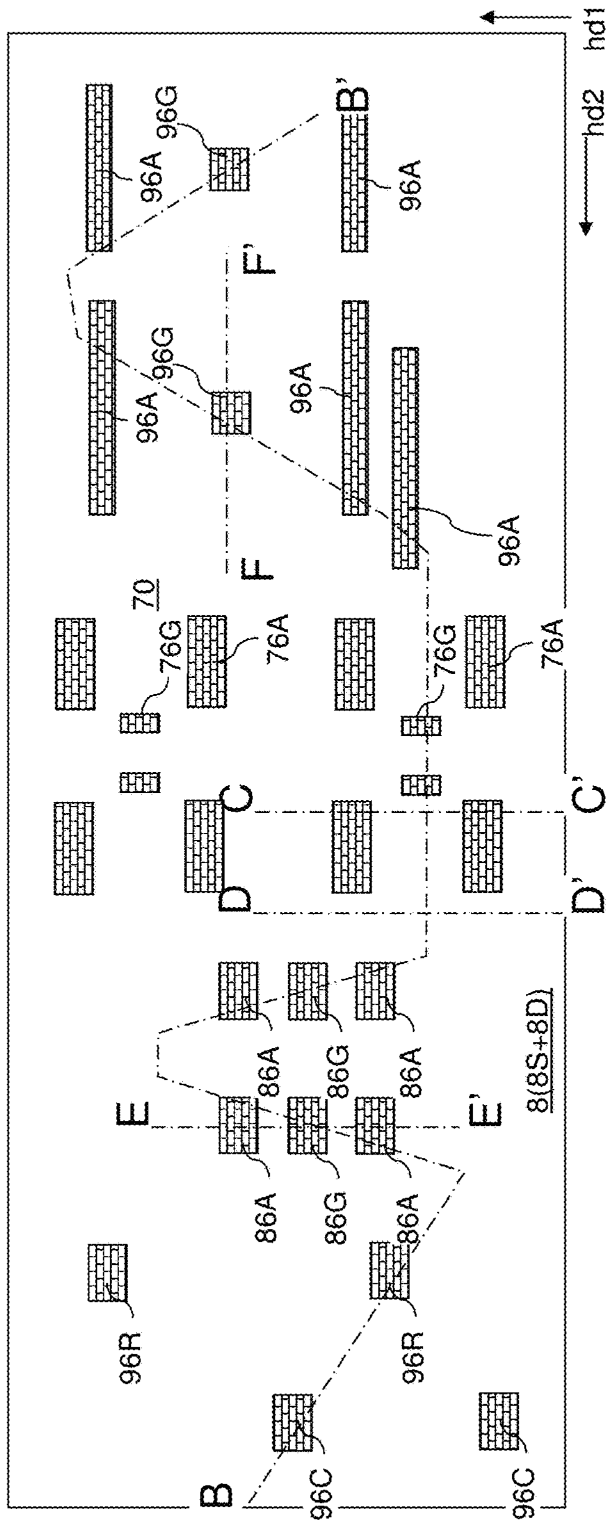
FIG. 14A is a top-down view of the first exemplary structure after formation of a contact-level dielectric layer and various contact via structures according to the first embodiment of the present disclosure.
Figure 14B:
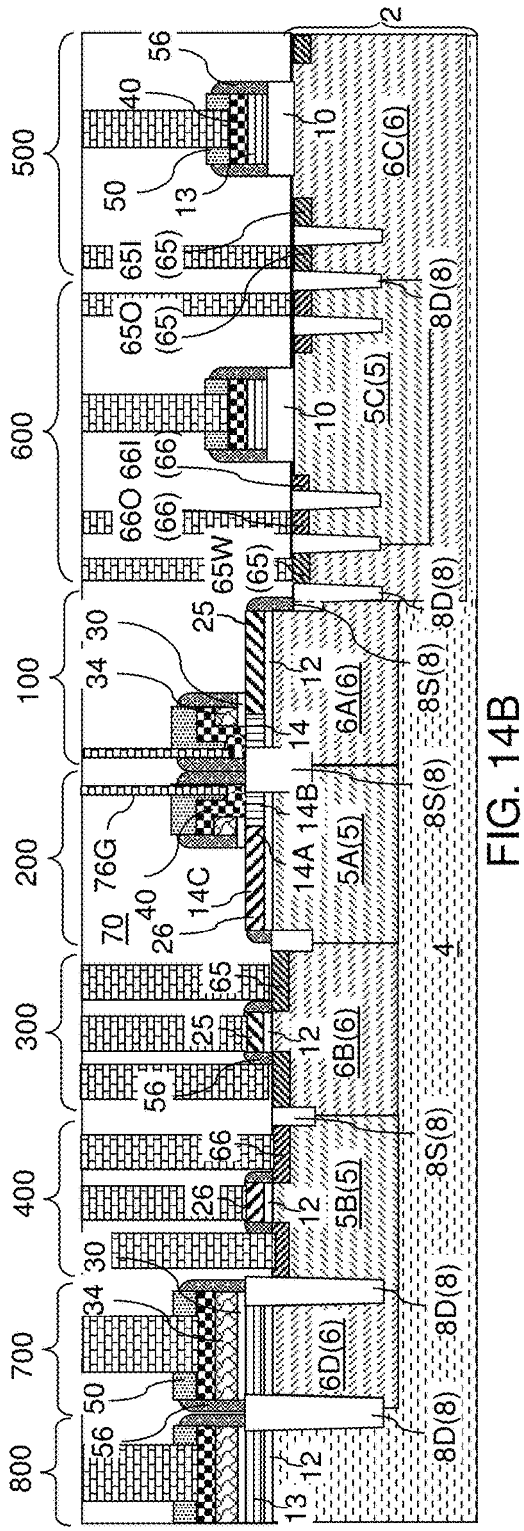
FIG. 14B is a vertical cross-sectional view of the first exemplary structure along the hinged vertical plane B-B' of FIG. 14A.
Figure 14C:
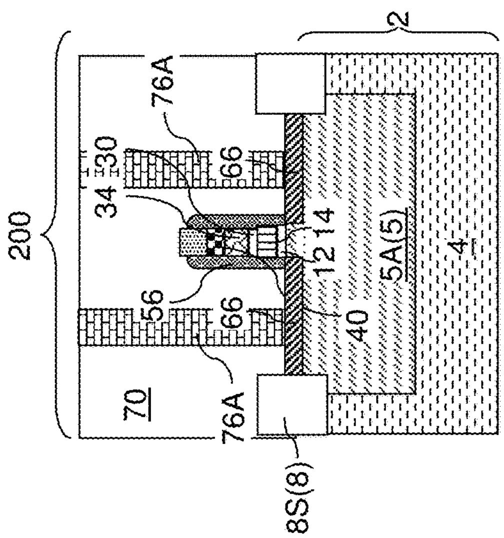
FIG. 14C is a vertical cross-sectional view of the first exemplary structure along the vertical plane C-C' of FIG. 14A.
Figure 14D:
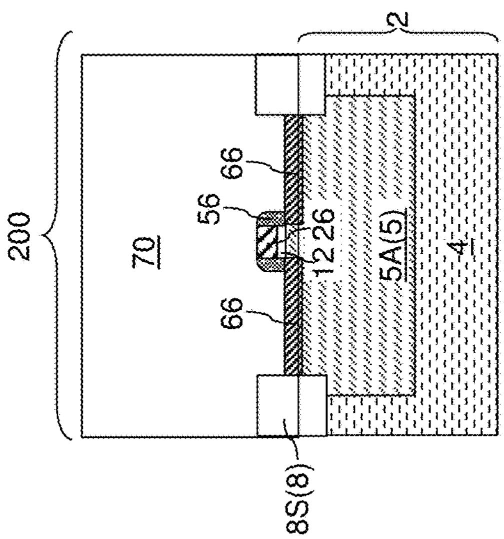
FIG. 14D is a vertical cross-sectional view of the first exemplary structure along the vertical plane D-D' of FIG. 14A.
Figure 14E:
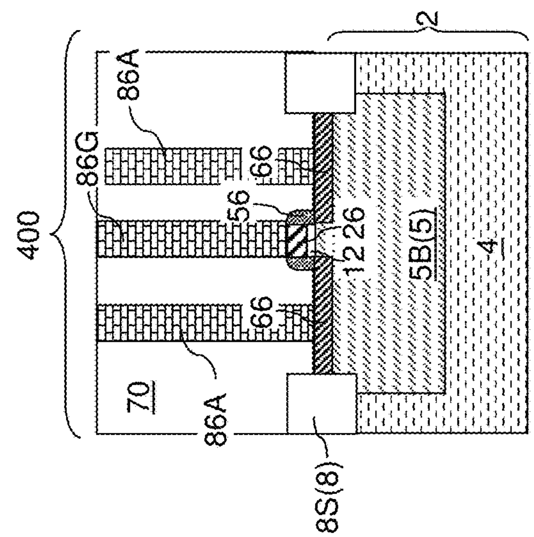
FIG. 14E is a vertical cross-sectional view of the first exemplary structure along the vertical plane E-E' of FIG. 14A.
Figure 14F:
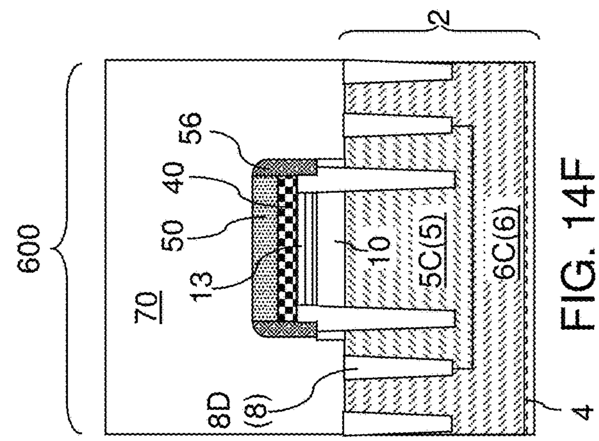
FIG. 14F is a vertical cross-sectional view of the first exemplary structure along the vertical plane F-F' of FIG. 14A.

The contact via structures (76A, 76G, 86A, 86G, 96A, 96G, 96R, 96C) comprise first source/drain region contact via structures 76A contacting source/drain regions (65, 66) within the first field effect transistor regions (100, 200), as shown in FIG. 14C, first gate contact via structures 76G contacting top surfaces of the lower portions of the conductive gate cap structures 40 which are laterally offset from the semiconductor plates 34 within the first field effect transistor regions (100, 200), second source/drain region contact via structures 86A contacting source/drain regions (65, 66) within the second field effect transistor regions (300, 400), second gate contact via structures 86G contacting the second gate electrodes (25, 26) within the second field effect transistor regions (300, 400), third source/drain region contact via structures 96A contacting source/drain regions (65, 66) within the third field effect transistor regions (500, 600), and third gate contact via structures 96G contacting top surfaces of conductive gate cap structures 40 within the third field effect transistor regions (500, 600). Further, the contact via structures (76A, 76G, 86A, 86G, 96A, 96G, 96R, 96C) can comprise first passive device contact via structures 96R that contact first passive devices such as resistors, and second passive device contact via structures 96C that contact second passive devices such as capacitors.

Generally, a first field effect transistor can be formed in a first field effect transistor region (100 or 200). The first field effect transistor comprises a first active region having a pair of lengthwise sidewalls and a pair of widthwise sidewalls that contact sidewalls of and are laterally surrounded by a first portion of a trench isolation structure 8. The first active region comprises a first source region, a first drain region, and a first channel region located between the first source region and the first drain region. The first field effect transistor can comprise a first gate structure (12, 14, 25 or 26, 30, 34, 40, 50).

A second field effect transistor can be formed in a second field effect transistor region (300 or 400). The second field effect transistor comprises a second active region having a pair of lengthwise sidewalls and a pair of widthwise sidewalls that contact sidewalls of and are laterally surrounded by a second portion of the trench isolation structure 8. A second gate structure (12, 25 or 26) including a second gate dielectric 12 and a second gate electrode (25 or 26) overlies the second active region. The contact-level dielectric layer 70 overlies the first gate structure (12, 14, 25 or 26, 30, 34, 40, 50) and the second gate structure (12, 25 or 26). At least one gate contact structure (such as a second gate contact via structures 86G) is in contact with a portion of a top surface of the second gate electrode (25 or 26). An entirety of the top surface of the second gate electrode (25 or 26) that is not in contact with the at least one gate contact structure 86G is in contact with the contact-level dielectric layer 70.

The first exemplary structure can comprise an additional field effect transistor such as a third field effect transistor formed in a third field effect transistor region (500 or 600). The additional field effect transistor comprises an additional active region having a pair of lengthwise sidewalls and a pair of widthwise sidewalls that contact sidewalls of and are laterally surrounded by an additional portion of the trench isolation structure 8. The additional field effect transistor comprises an additional gate structure (10, 13, 40, 50) overlies the additional active region. The additional gate structure (10, 13, 40, 50) can include an additional composite gate dielectric comprising a silicon oxide sublayer 10 having a greater thickness than the first gate dielectric 12, and a silicon nitride sublayer 13, and an additional conductive gate cap structure 40 having a same thickness and a same material composition as the first segment of the first conductive gate cap structure 40. An entirety of a top surface of the silicon nitride portion 13 is in contact with a bottom surface of the additional conductive gate cap structure 40.

In one embodiment, the first exemplary structure may further comprise a passive device, which may be selected from a capacitor, a resistor, or any other passive device known in the art. The passive device comprises a layer stack including, from bottom to top, a first dielectric layer (such as another instance of a silicon oxide gate dielectric 12 and a silicon nitride portion 13), a second dielectric layer (such as a planar dielectric spacer plate 30), a semiconductor plate (such as a planar semiconductor spacer plate 34), and a metallic plate (such as a conductive gate cap structure 40). The second dielectric layer has a same material composition and a same thickness as the first planar dielectric spacer plate 30. The metallic plate has a same material composition and a same thickness as the first segment of the first conductive gate cap structure 40.

Referring to FIGS. 15A-15F, a second exemplary structure according to a second embodiment of the present disclosure may be derived from the first exemplary structure of FIGS. 5A-5F by rearranging and/or omitting a subset of the doped wells (5, 6). For example, the first p-doped wells 5A may extend into areas occupied by the first n-doped wells 6A in region 100 in the first embodiment. Alternatively, the first n-doped wells 6A may extend into areas occupied by the first p-doped wells 5A in region 200 in the first embodiment. In the configuration shown in FIG. 15B, the first p-doped wells 5A can be formed such that a plurality of active regions laterally surrounded by a respective portion of the trench isolation structure 8 is provided within the first n-type field effect transistor region 200. The first p-type field effect transistor region 100 is not illustrated for the drawings of the second exemplary structure, but may be present within the second exemplary structure. While the present disclosure is described employing an embodiment in which pairs of active regions are present within the first n-type field effect transistor region 200, embodiments are expressly contemplated herein in which pairs of active regions are present within the first p-type field effect transistor region 100 and field effect transistors having the same geometrical features are formed in the first p-type field effect transistor region 100. In other words, the devices of the present disclosure may be formed with opposite conductivity types.

Figure 15A:
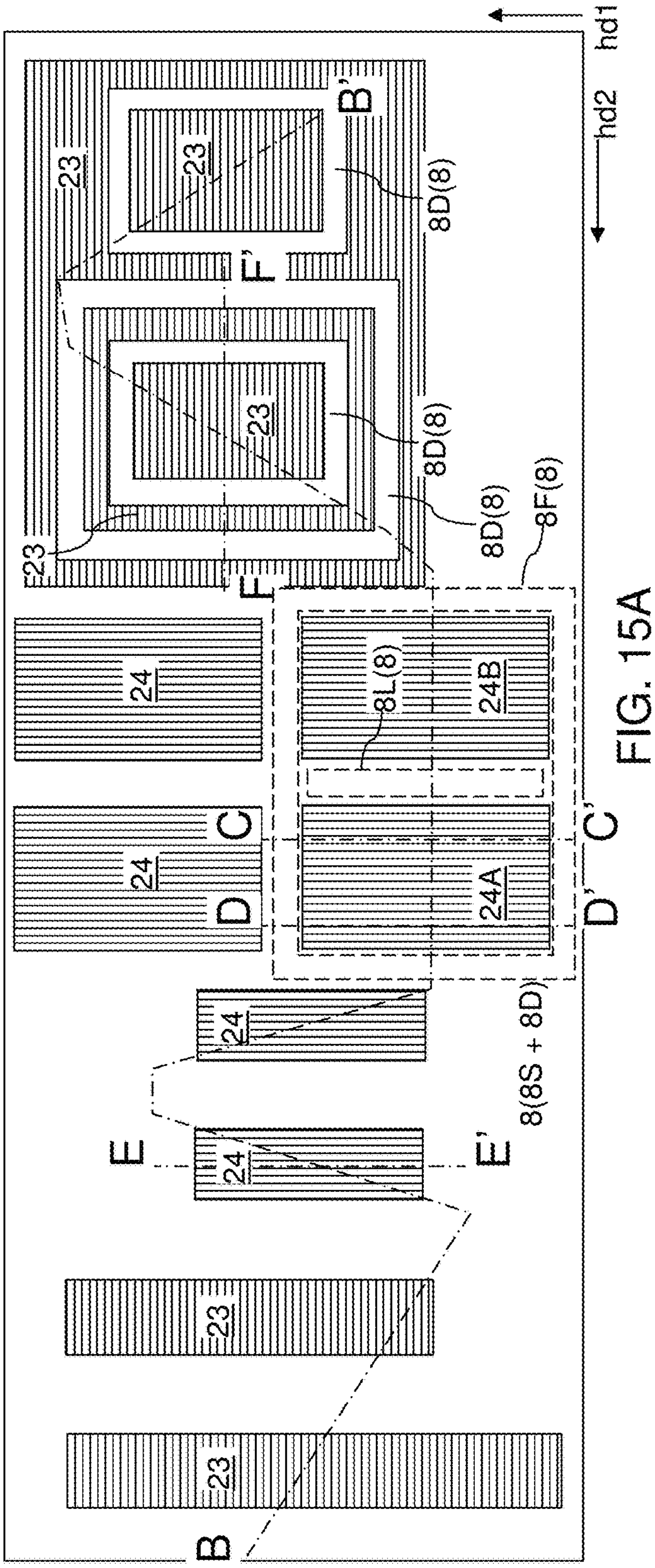
FIG. 15A is a top-down view of a second exemplary structure after formation of trench isolation structures according to the second embodiment of the present disclosure.
Figure 15B:
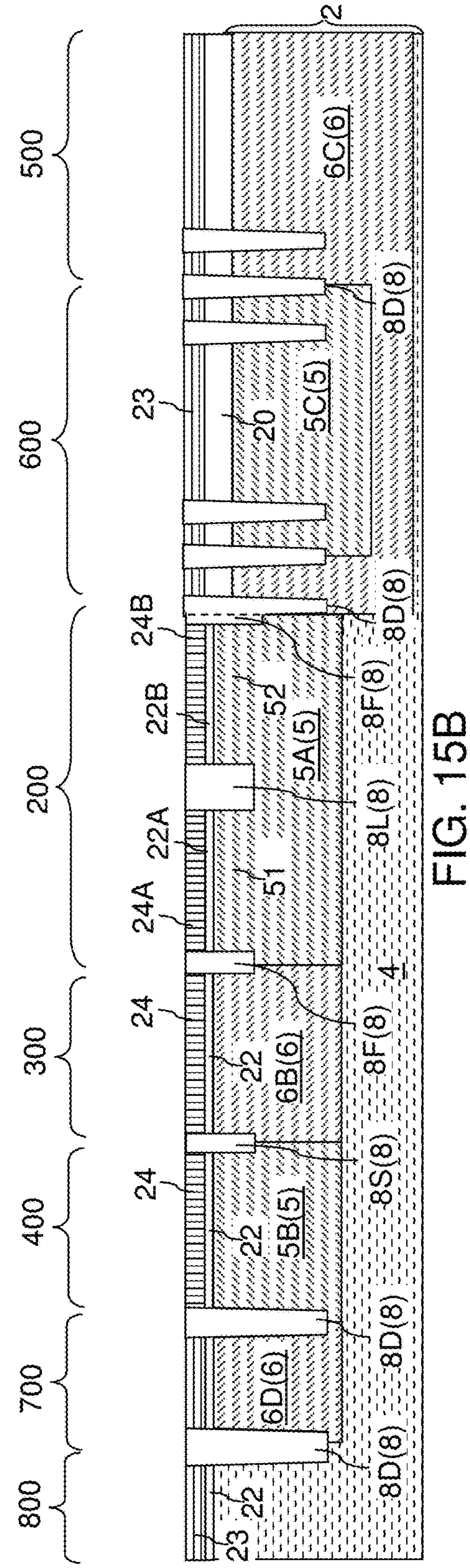
FIG. 15B is a vertical cross-sectional view of the second exemplary structure along the hinged vertical plane B-B' of FIG. 15A.
Figure 15C:
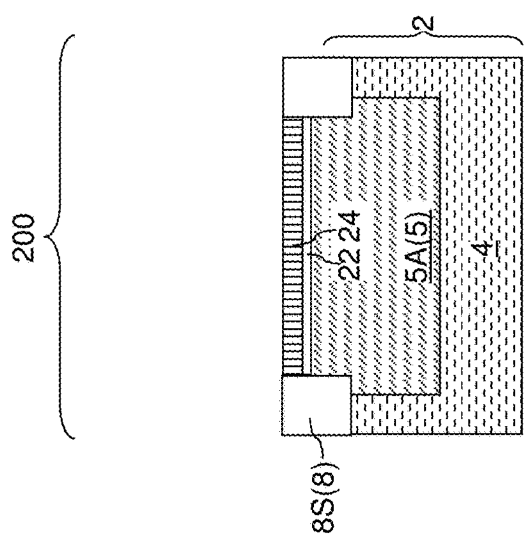
FIG. 15C is a vertical cross-sectional view of the second exemplary structure along the vertical plane C-C' of FIG. 15A.
Figure 15D:
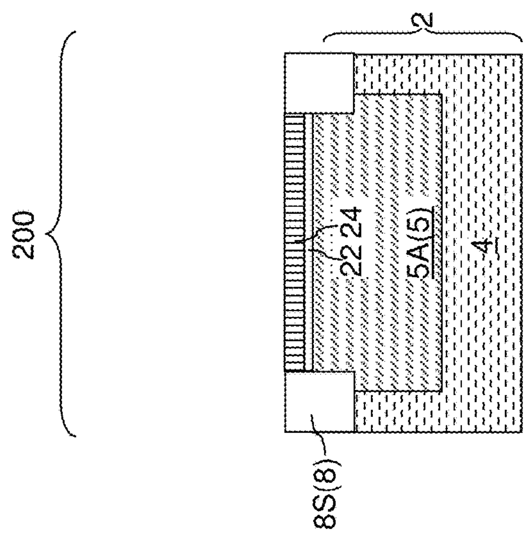
FIG. 15D is a vertical cross-sectional view of the second exemplary structure along the vertical plane D-D' of FIG. 15A.
Figure 15E:
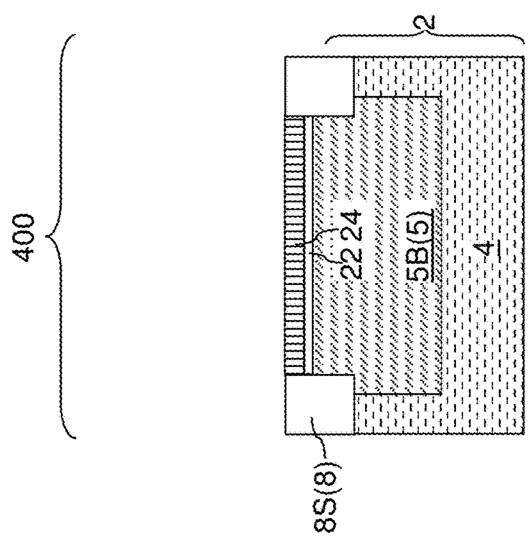
FIG. 15E is a vertical cross-sectional view of the second exemplary structure along the vertical plane E-E' of FIG. 15A.
Figure 15F:
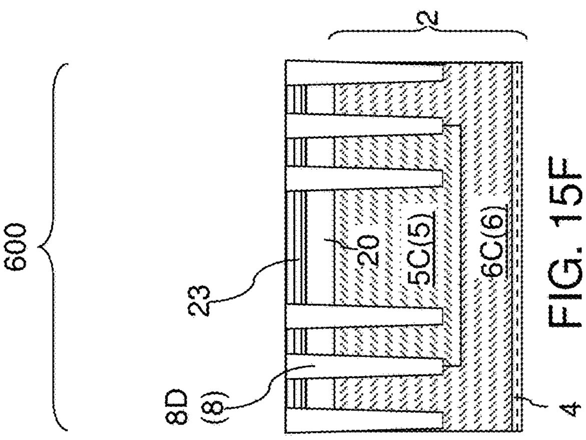
FIG. 15F is a vertical cross-sectional view of the second exemplary structure along the vertical plane F-F' of FIG. 15A.
Figure 16A:
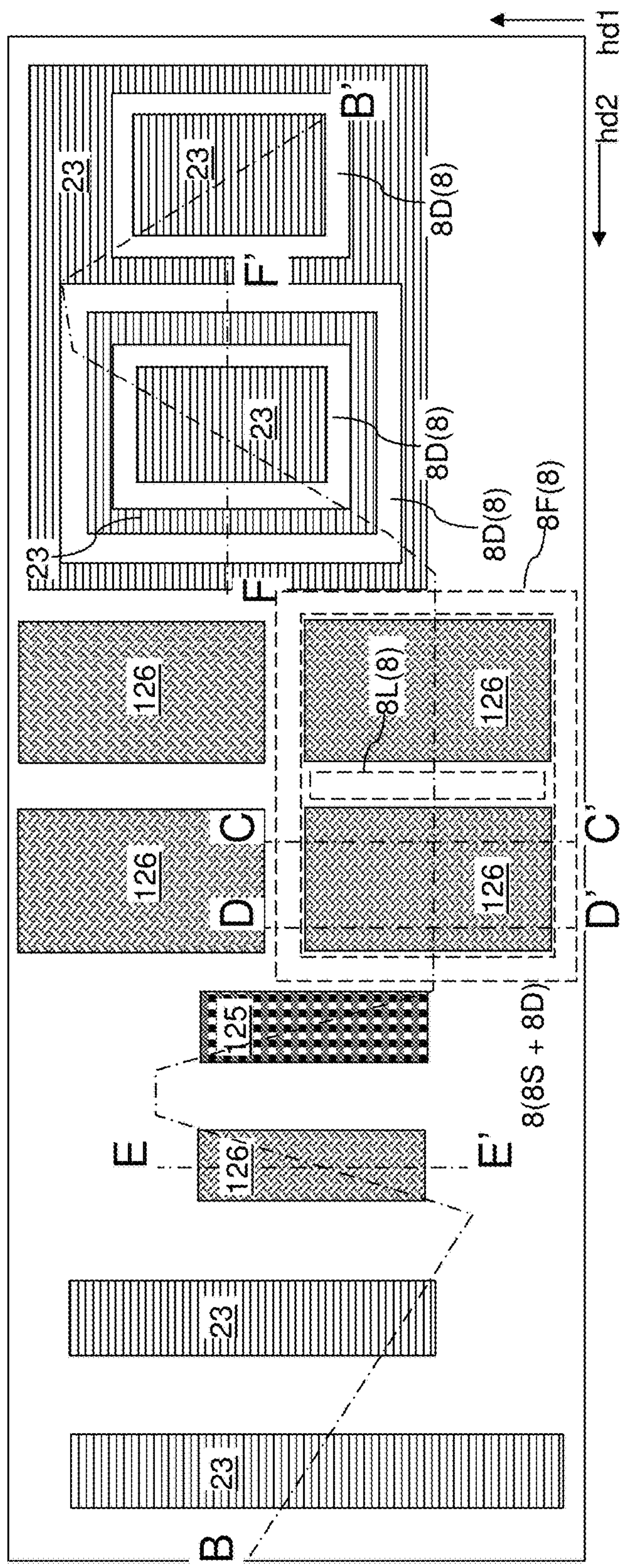
FIG. 16A is a top-down view of a second exemplary structure after implanting electrical dopants into a subset of the lower semiconductor gate material layers according to the second embodiment of the present disclosure.
Figure 16B:
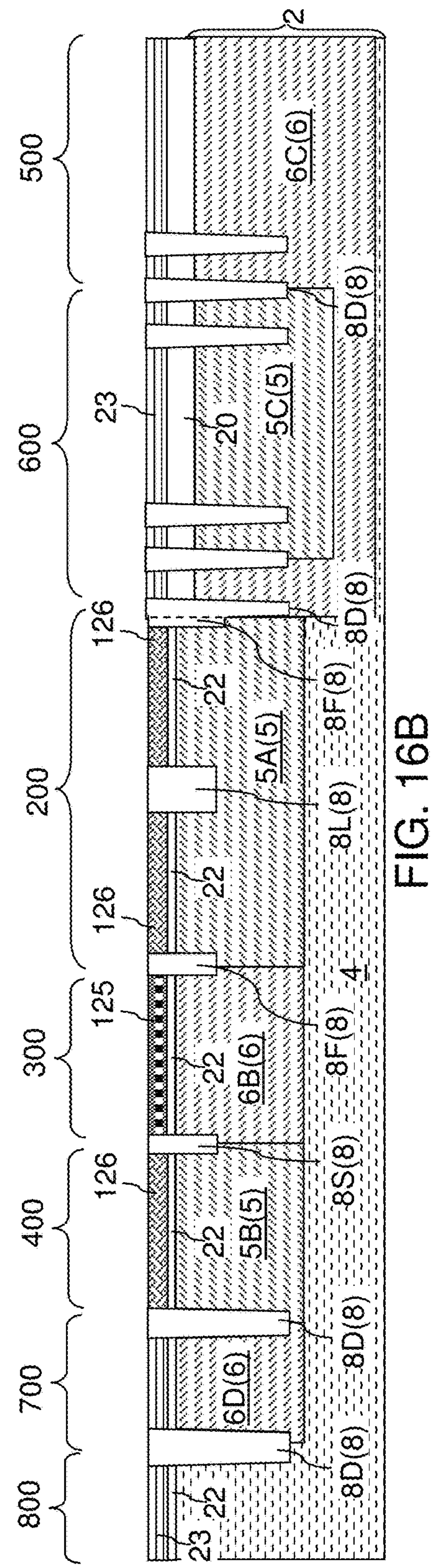
FIG. 16B is a vertical cross-sectional view of the second exemplary structure along the hinged vertical plane B-B' of FIG. 16A.
Figure 16C:
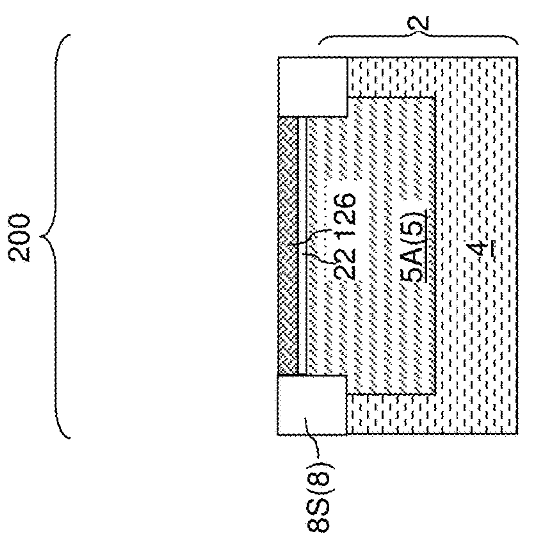
FIG. 16C is a vertical cross-sectional view of the second exemplary structure along the vertical plane C-C' of FIG. 16A.
Figure 16D:
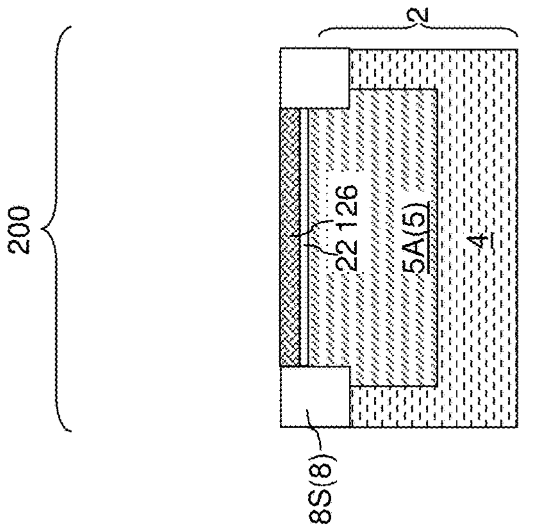
FIG. 16D is a vertical cross-sectional view of the second exemplary structure along the vertical plane D-D' of FIG. 16A.
Figure 16E:
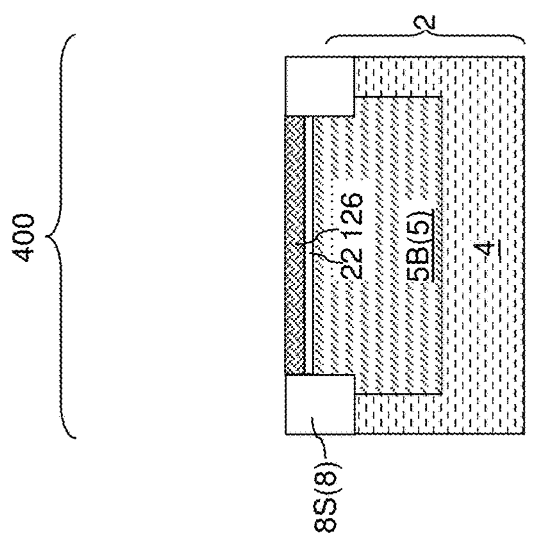
FIG. 16E is a vertical cross-sectional view of the second exemplary structure along the vertical plane E-E' of FIG. 16A.
Figure 16F:
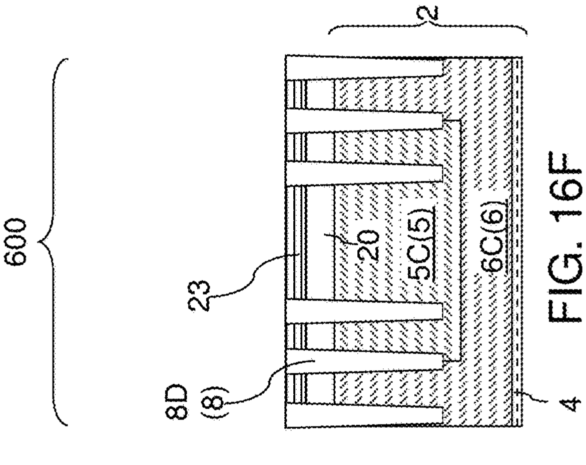
FIG. 16F is a vertical cross-sectional view of the second exemplary structure along the vertical plane F-F' of FIG. 16A.
Figure 17A:
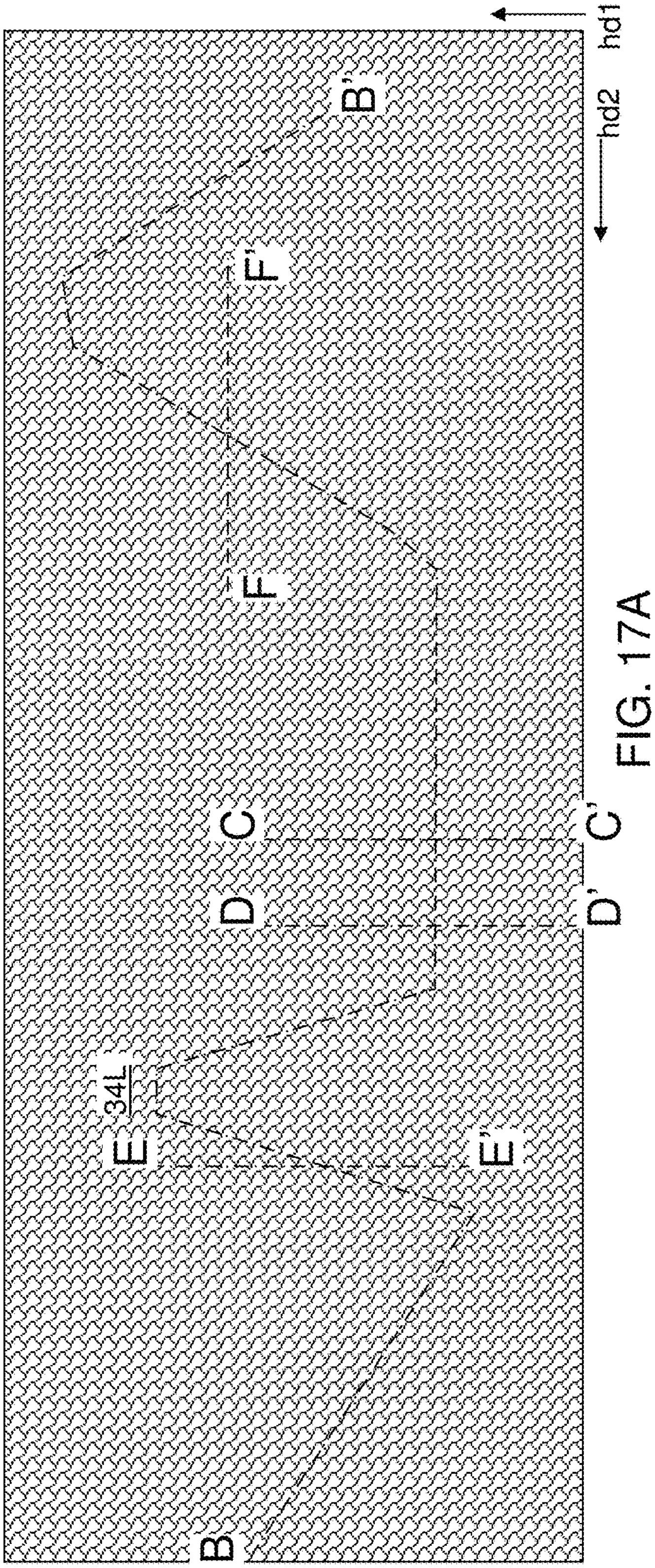
FIG. 17A is a top-down view of the second exemplary structure after formation of a planar semiconductor spacer layer according to the second embodiment of the present disclosure.
Figure 17B:
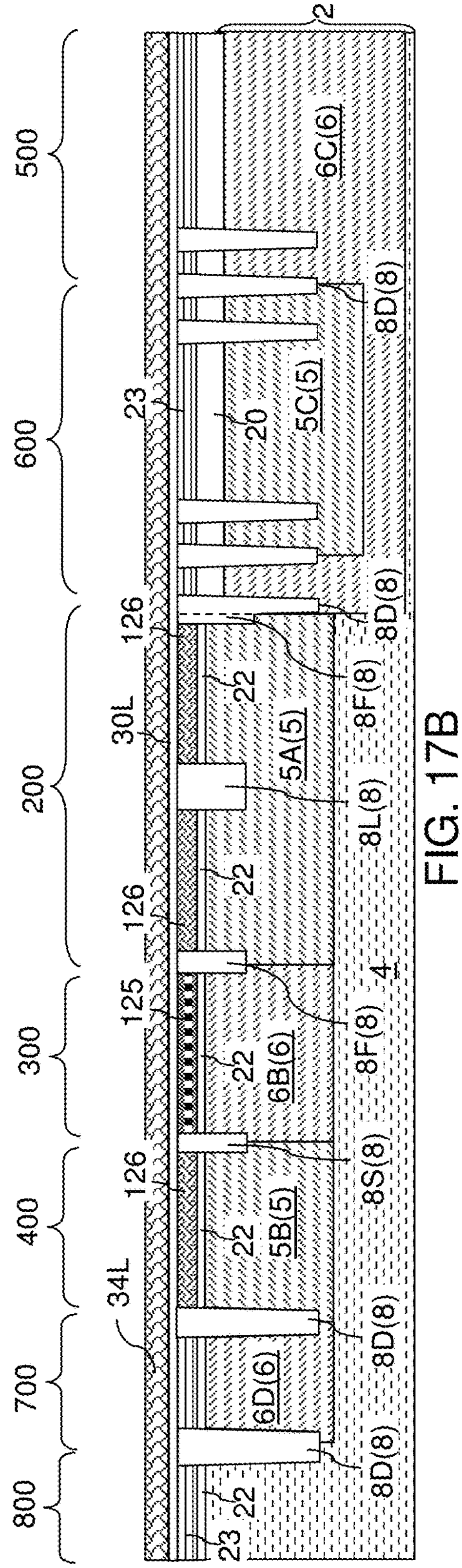
FIG. 17B is a vertical cross-sectional view of the second exemplary structure along the hinged vertical plane B-B' of FIG. 17A.
Figure 17C:
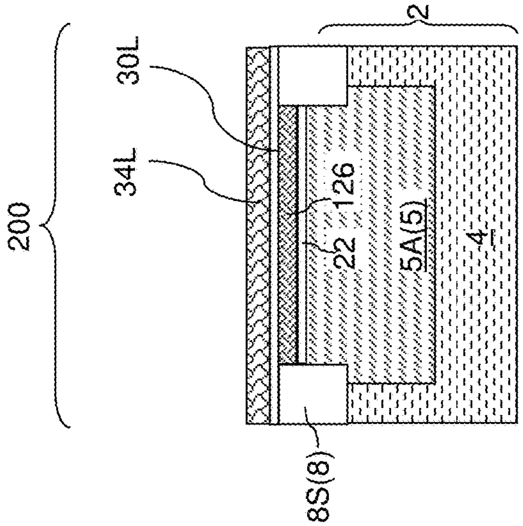
FIG. 17C is a vertical cross-sectional view of the second exemplary structure along the vertical plane C-C' of FIG. 17A.
Figure 17D:
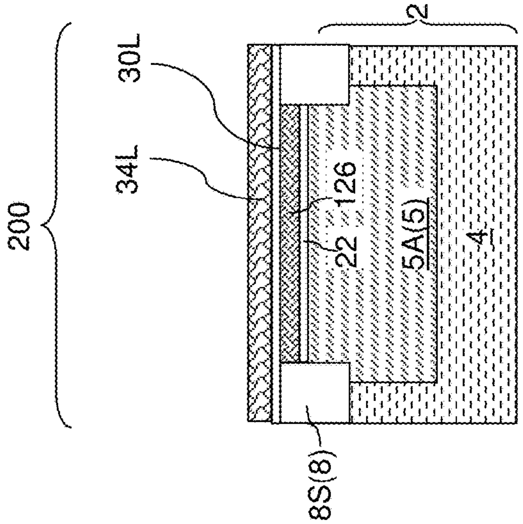
FIG. 17D is a vertical cross-sectional view of the second exemplary structure along the vertical plane D-D' of FIG. 17A.
Figure 17E:
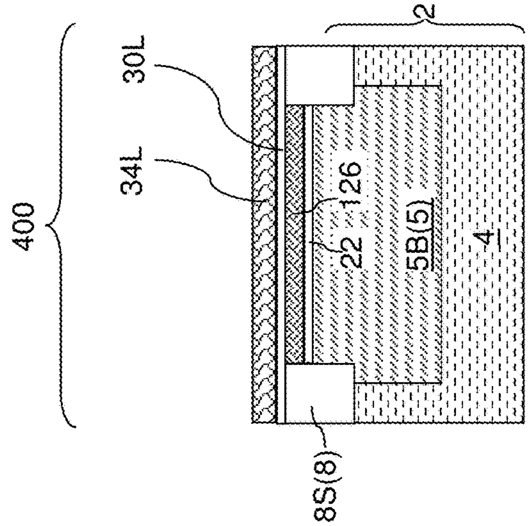
FIG. 17E is a vertical cross-sectional view of the second exemplary structure along the vertical plane E-E' of FIG. 17A.
Figure 17F:
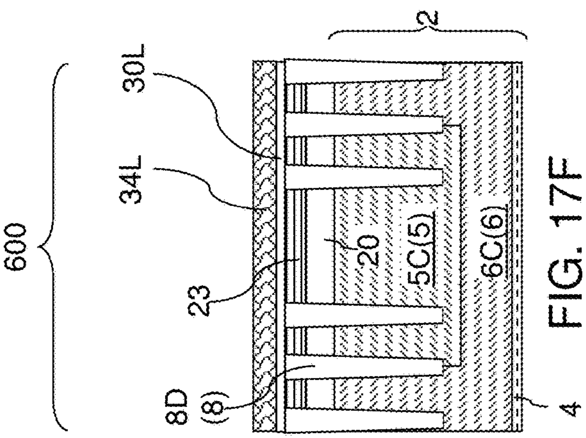
FIG. 17F is a vertical cross-sectional view of the second exemplary structure along the vertical plane F-F' of FIG. 17A.
Figure 18A:
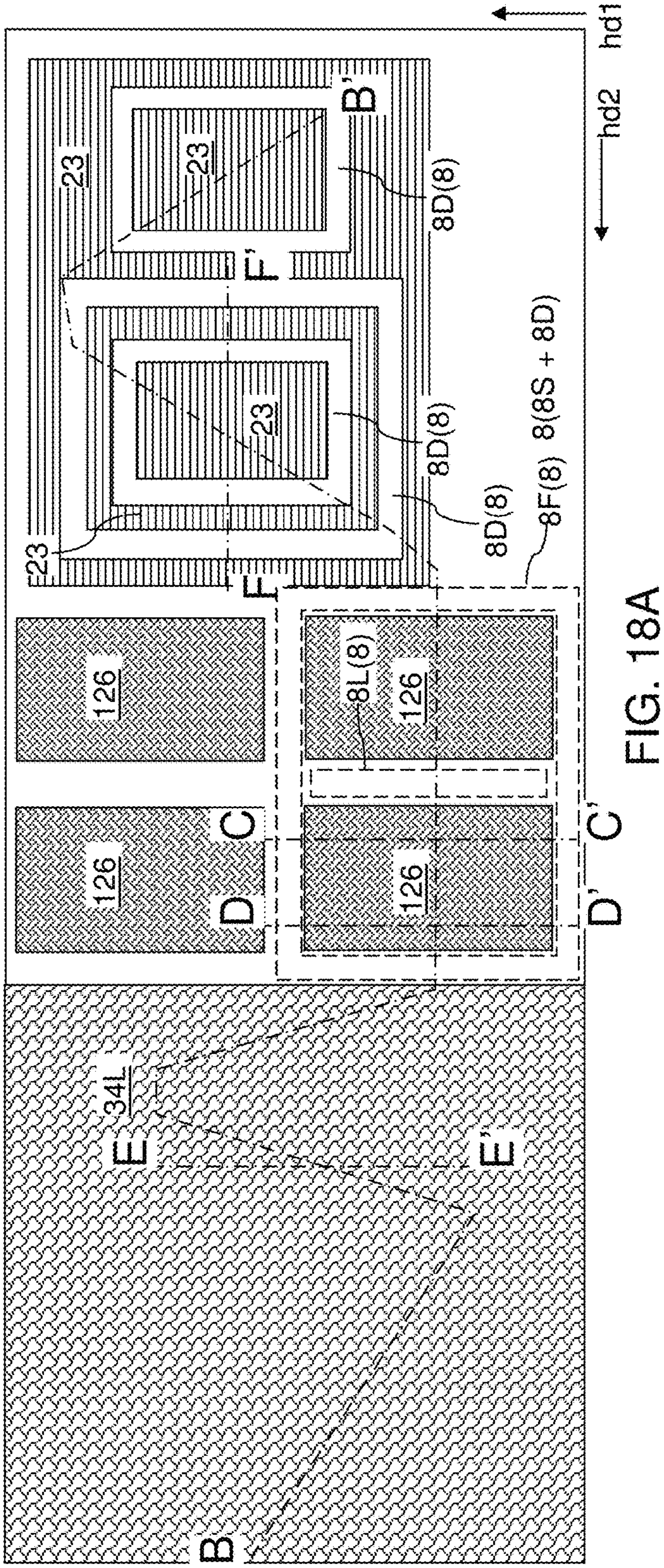
FIG. 18A is a top-down view of the second exemplary structure after patterning the planar semiconductor spacer layer according to the second embodiment of the present disclosure.
Figure 18B:
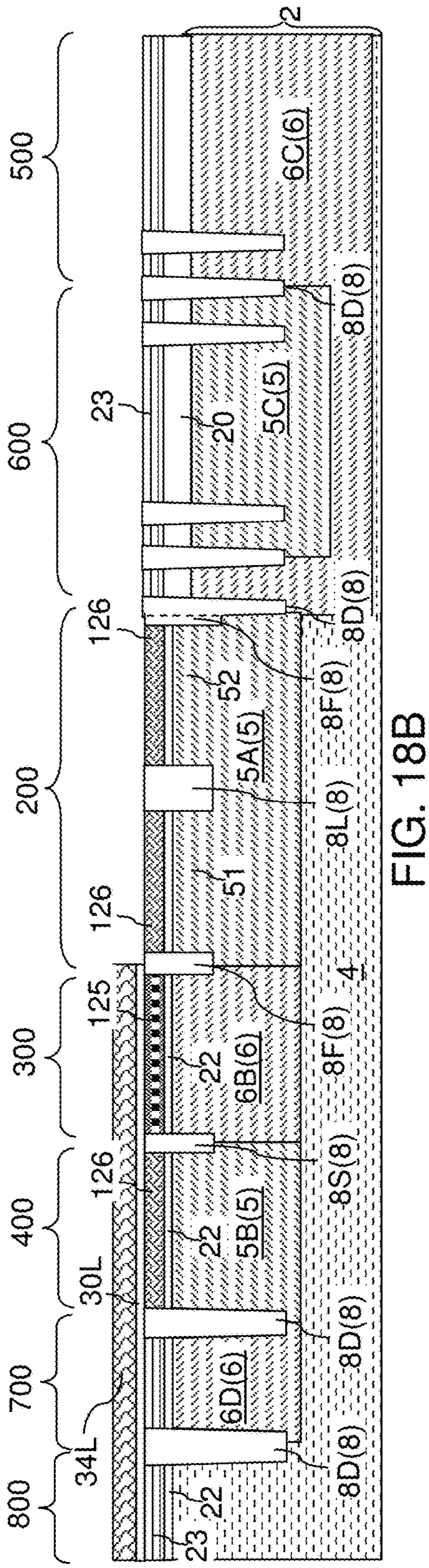
FIG. 18B is a vertical cross-sectional view of the second exemplary structure along the hinged vertical plane B-B' of FIG. 18A.
Figure 18D:
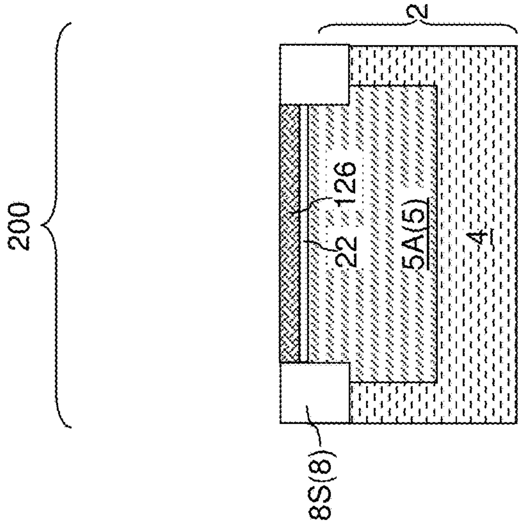
FIG. 18D is a vertical cross-sectional view of the second exemplary structure along the vertical plane D-D' of FIG. 18A.
Figure 18F:
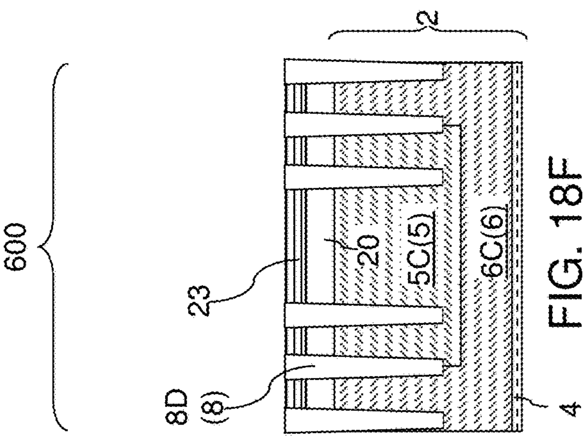
FIG. 18F is a vertical cross-sectional view of the second exemplary structure along the vertical plane F-F' of FIG. 18A.
Figure 18C:
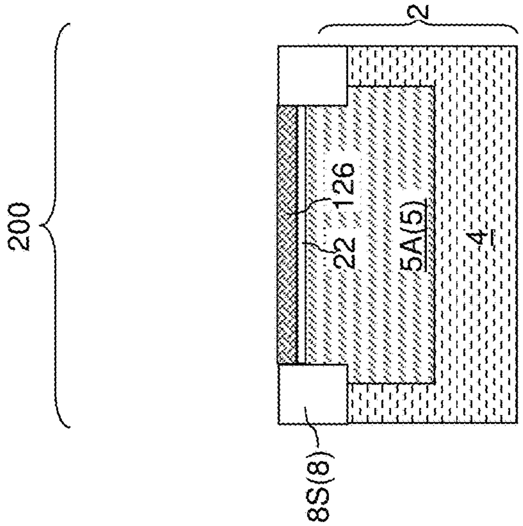
FIG. 18C is a vertical cross-sectional view of the second exemplary structure along the vertical plane C-C' of FIG. 18A.
Figure 18E:
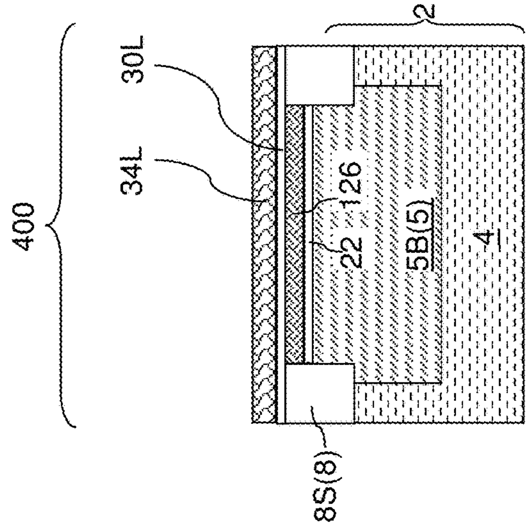
FIG. 18E is a vertical cross-sectional view of the second exemplary structure along the vertical plane E-E' of FIG. 18A.
Figure 19A:
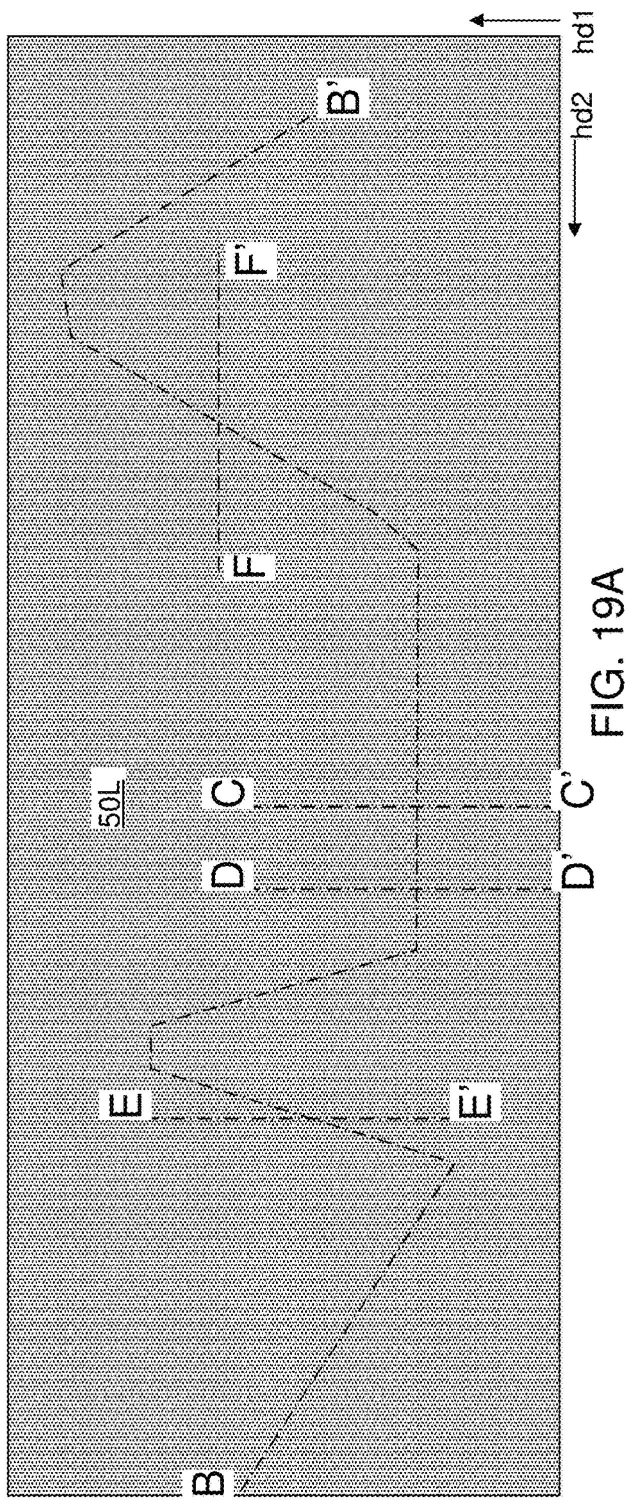
FIG. 19A is a top-down view of the second exemplary structure after deposition of a conductive gate cap layer and a planar dielectric spacer layer according to the second embodiment of the present disclosure.
Figure 19B:
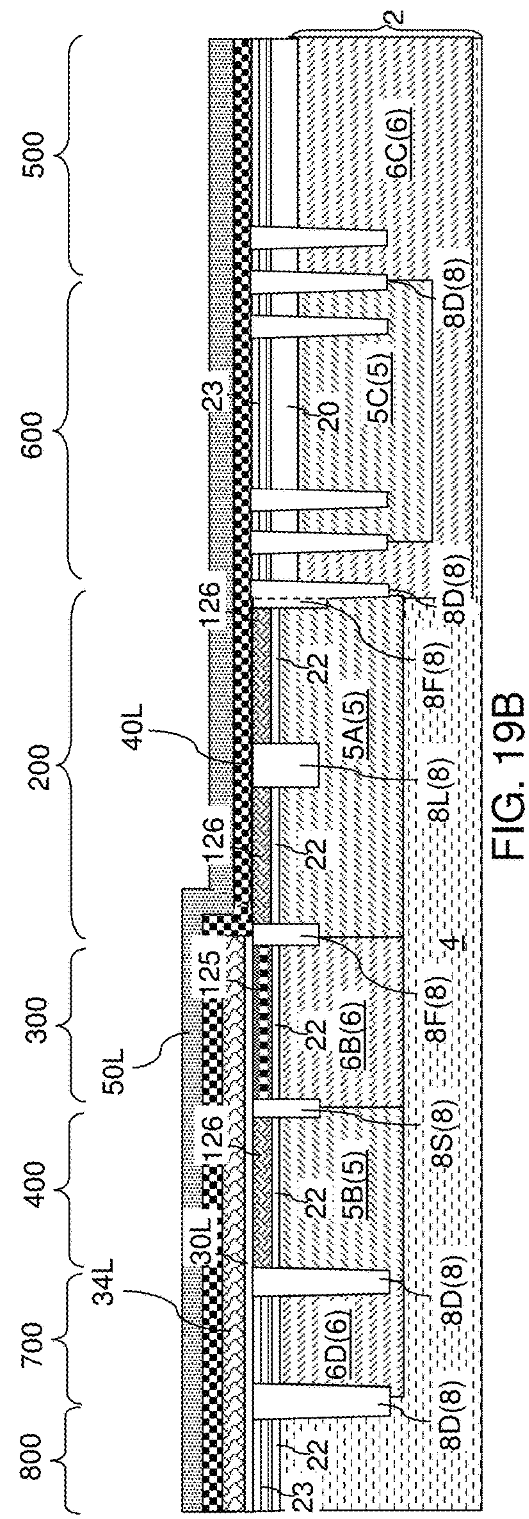
FIG. 19B is a vertical cross-sectional view of the second exemplary structure along the hinged vertical plane B-B' of FIG. 19A.
Figure 19C:
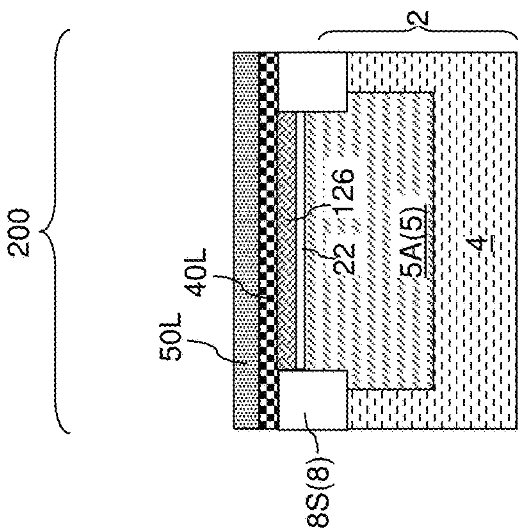
FIG. 19C is a vertical cross-sectional view of the second exemplary structure along the vertical plane C-C' of FIG. 19A.
Figure 19D:
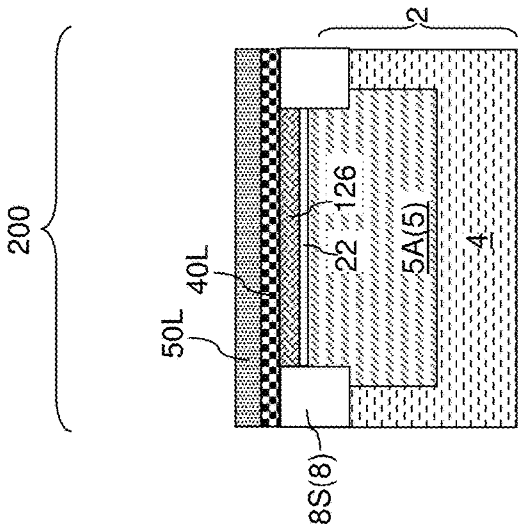
FIG. 19D is a vertical cross-sectional view of the second exemplary structure along the vertical plane D-D' of FIG. 19A.
Figure 19E:
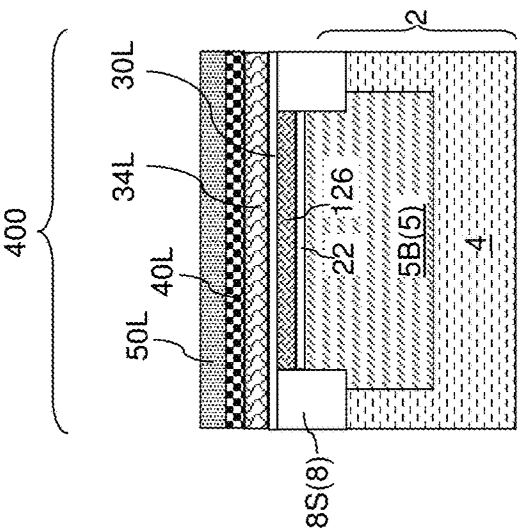
FIG. 19E is a vertical cross-sectional view of the second exemplary structure along the vertical plane E-E' of FIG. 19A.
Figure 19F:
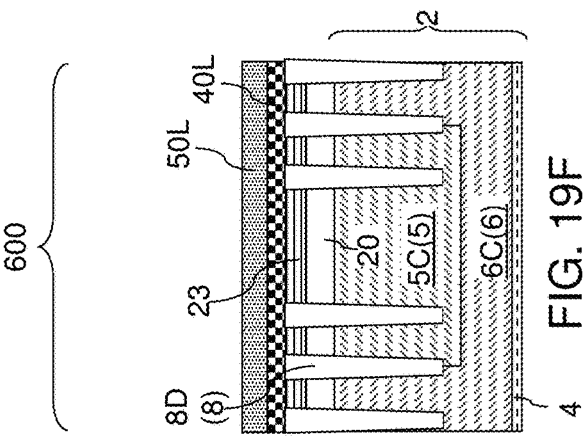
FIG. 19F is a vertical cross-sectional view of the second exemplary structure along the vertical plane F-F' of FIG. 19A.
Figure 20A:
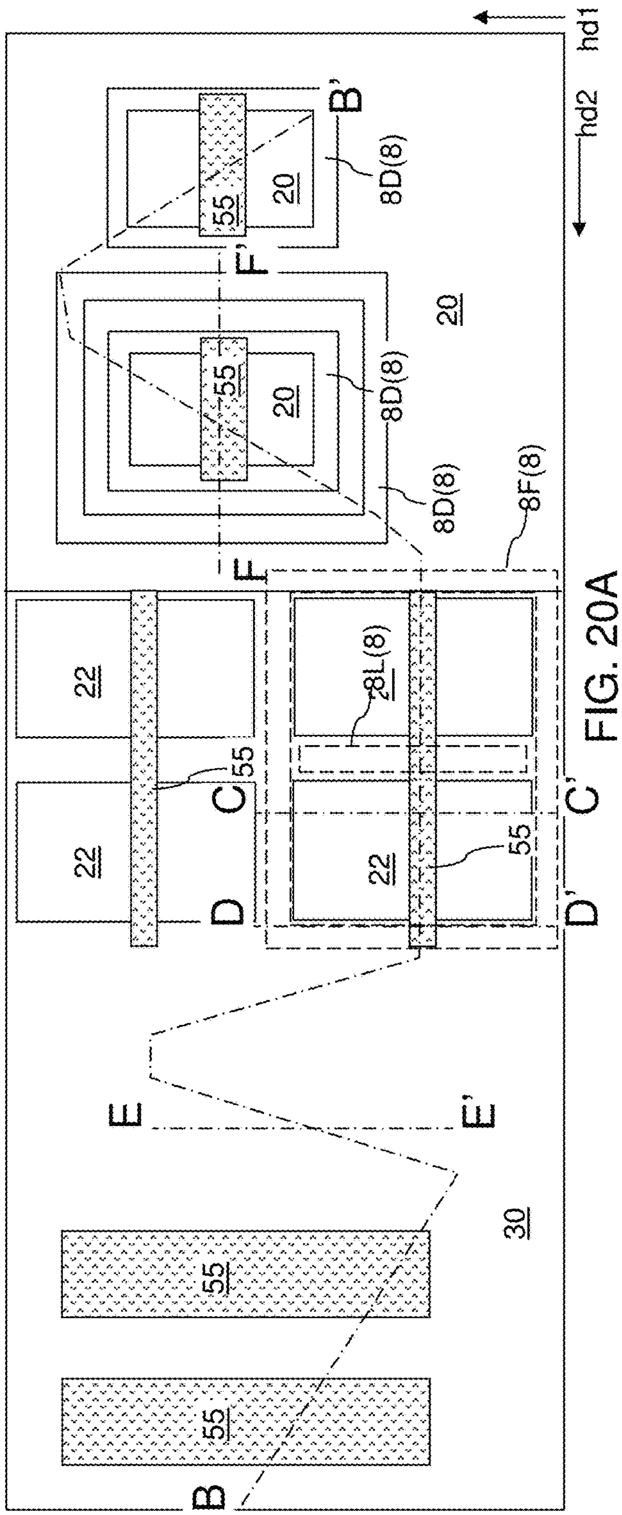
FIG. 20A is a top-down view of the second exemplary structure after patterning the gate cap dielectric layer, the conductive gate cap layer, and the planar semiconductor spacer layer according to the second embodiment of the present disclosure.
Figure 20B:
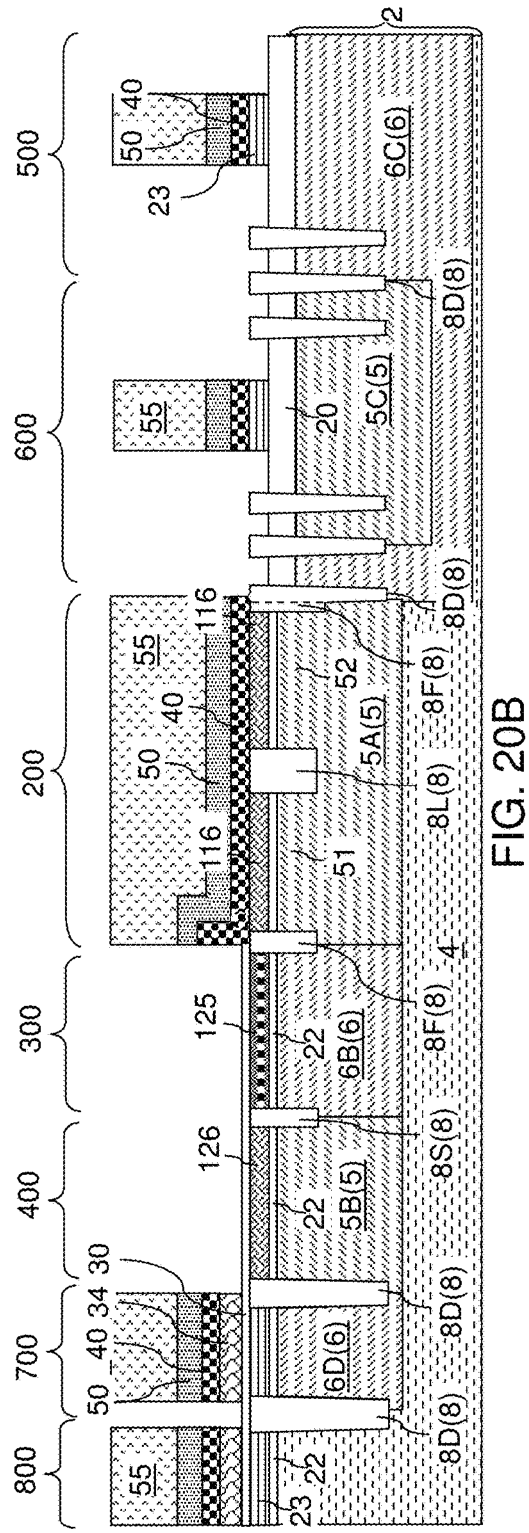
FIG. 20B is a vertical cross-sectional view of the second exemplary structure along the hinged vertical plane B-B' of FIG. 20A.
Figure 20D:
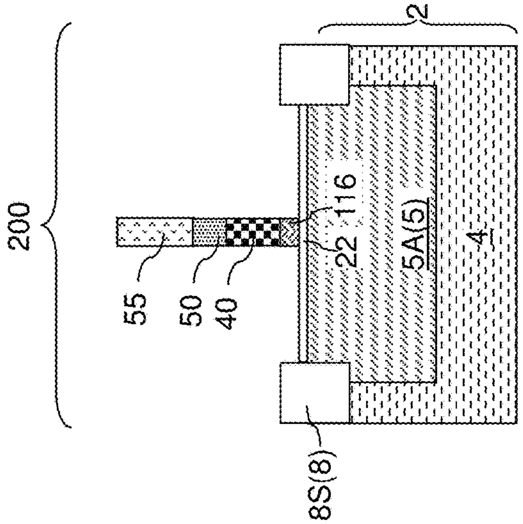
FIG. 20D is a vertical cross-sectional view of the second exemplary structure along the vertical plane D-D' of FIG. 20A.
Figure 20F:
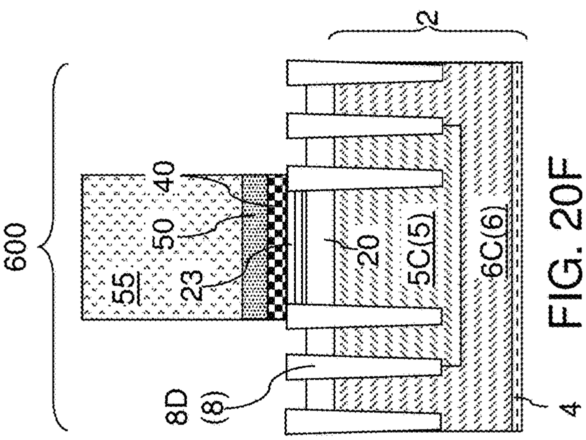
FIG. 20F is a vertical cross-sectional view of the second exemplary structure along the vertical plane F-F' of FIG. 20A.
Figure 20C:
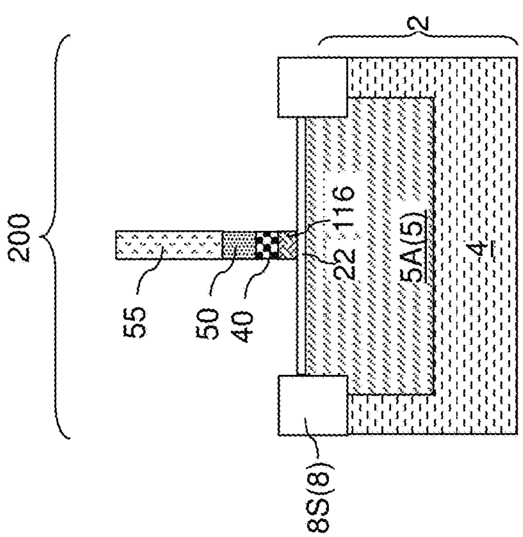
FIG. 20C is a vertical cross-sectional view of the second exemplary structure along the vertical plane C-C' of FIG. 20A.
Figure 20E:
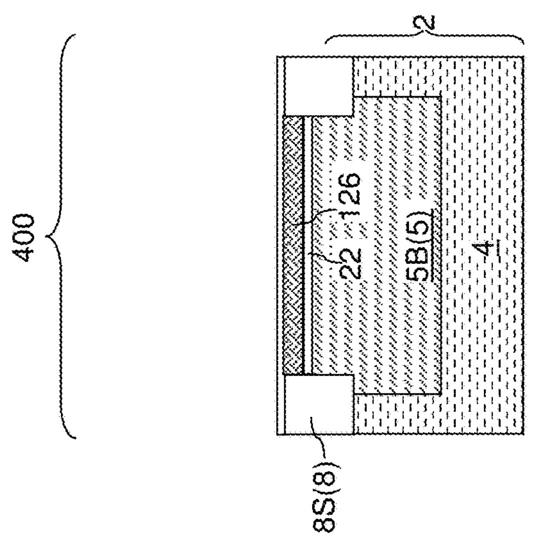
FIG. 20E is a vertical cross-sectional view of the second exemplary structure along the vertical plane E-E' of FIG. 20A.
Figure 21A:
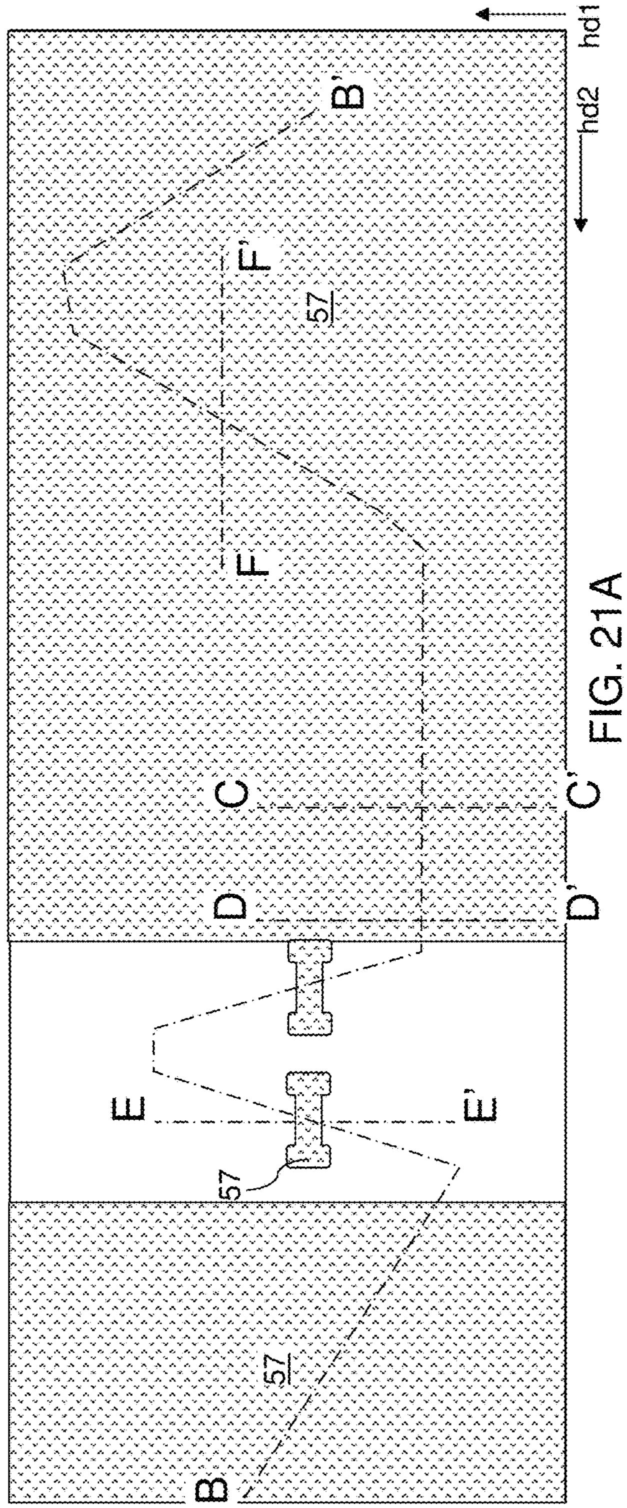
FIG. 21A is a top-down view of the second exemplary structure after applying and patterning a photoresist layer for patterning the lower semiconductor gate material layers according to the second embodiment of the present disclosure.
Figure 21B:
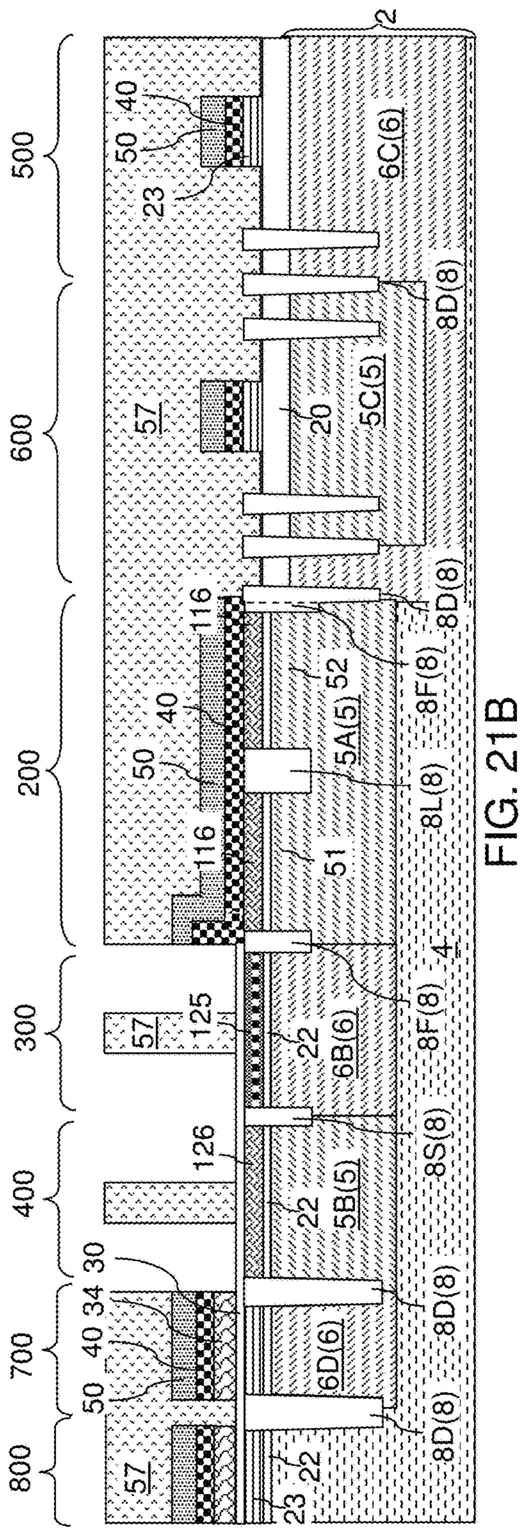
FIG. 21B is a vertical cross-sectional view of the second exemplary structure along the hinged vertical plane B-B' of FIG. 21A.
Figure 21C:
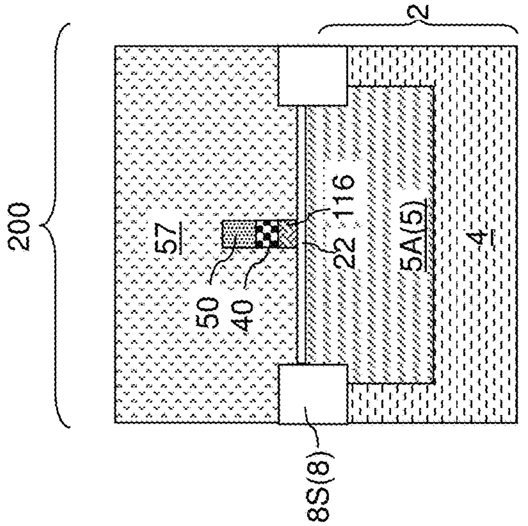
FIG. 21C is a vertical cross-sectional view of the second exemplary structure along the vertical plane C-C' of FIG. 21A.
Figure 21D:
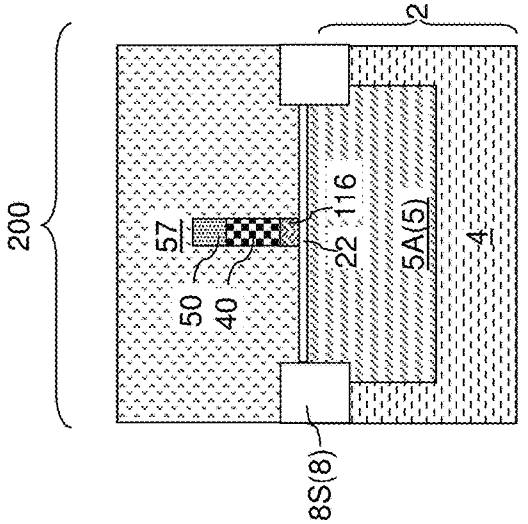
FIG. 21D is a vertical cross-sectional view of the second exemplary structure along the vertical plane D-D' of FIG. 21A.
Figure 21E:
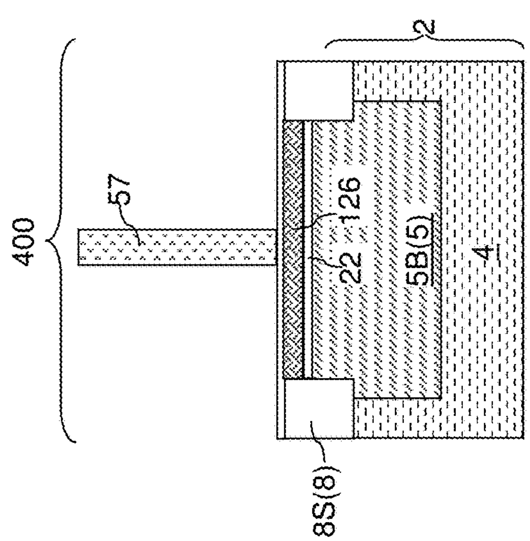
FIG. 21E is a vertical cross-sectional view of the second exemplary structure along the vertical plane E-E' of FIG. 21A.
Figure 21F:
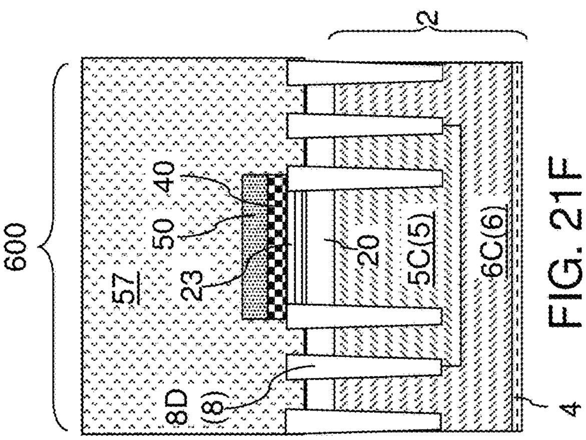
FIG. 21F is a vertical cross-sectional view of the second exemplary structure along the vertical plane F-F' of FIG. 21A.
Figure 22A:
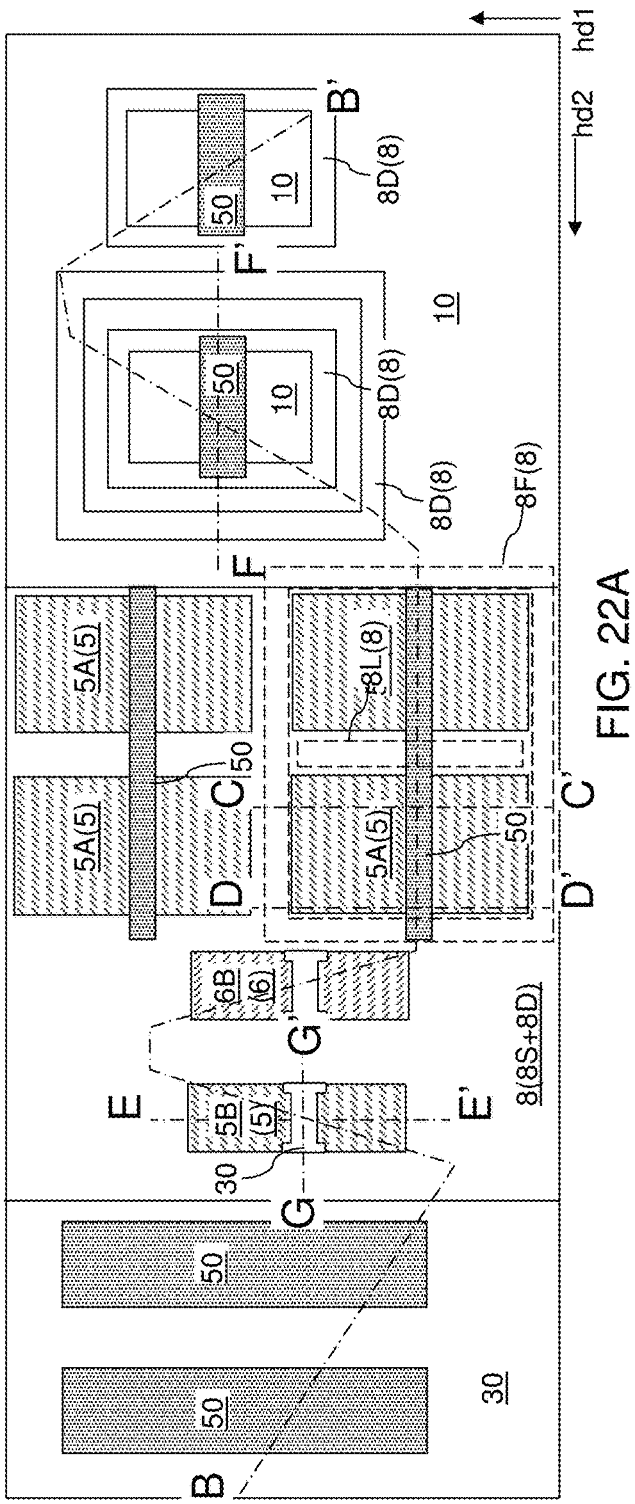
FIG. 22A is a top-down view of the second exemplary structure after applying and patterning the lower semiconductor gate material layers and the gate dielectric layers according to the second embodiment of the present disclosure.
Figure 22B:
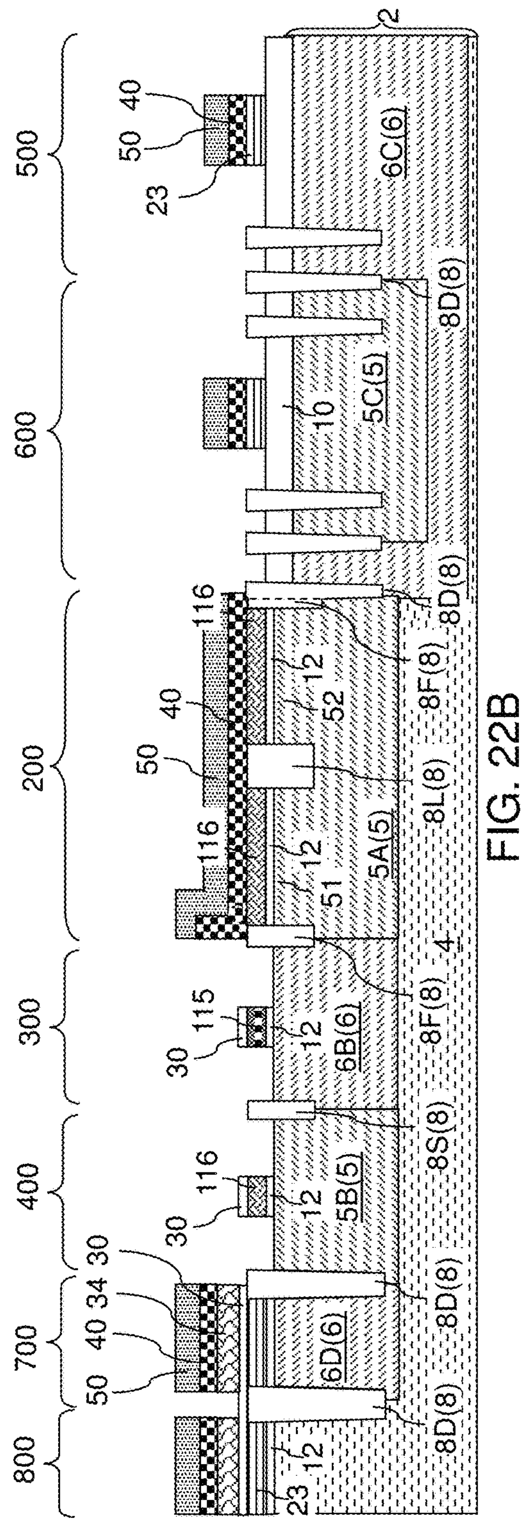
FIG. 22B is a vertical cross-sectional view of the second exemplary structure along the hinged vertical plane B-B' of FIG. 22A.
Figures 22C, 22D, 22E, 22F:
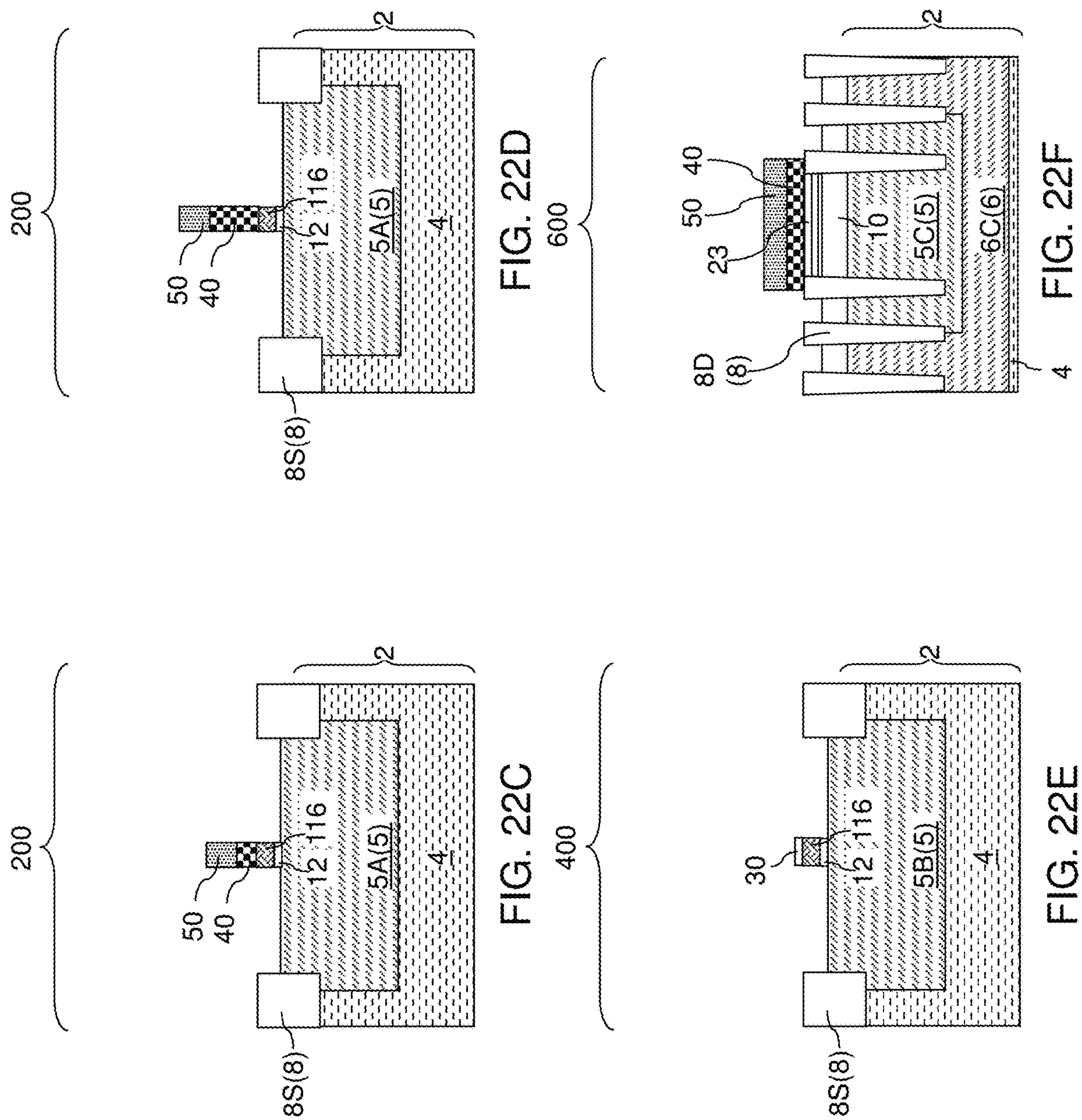
FIG. 22C is a vertical cross-sectional view of the second exemplary structure along the vertical plane C-C' of FIG. 22A.
FIG. 22D is a vertical cross-sectional view of the second exemplary structure along the vertical plane D-D' of FIG. 22A.
FIG. 22E is a vertical cross-sectional view of the second exemplary structure along the vertical plane E-E' of FIG. 22A.
FIG. 22F is a vertical cross-sectional view of the second exemplary structure along the vertical plane F-F' of FIG. 22A.
Figure 22G:
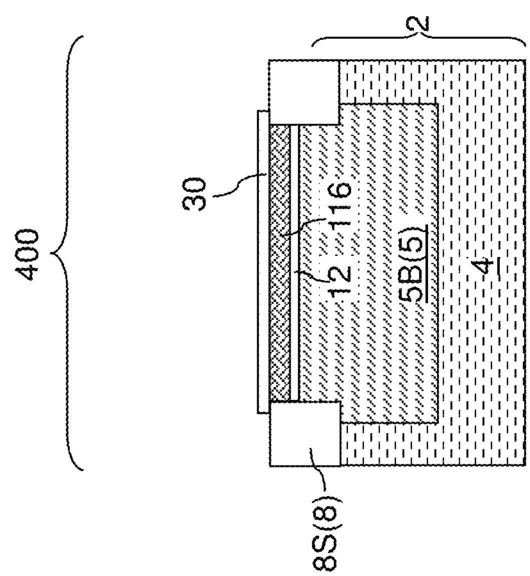
FIG. 22G is a vertical cross-sectional view of the second exemplary structure along the vertical plane G-G' of FIG. 22A.
Figures 23A, 23B:
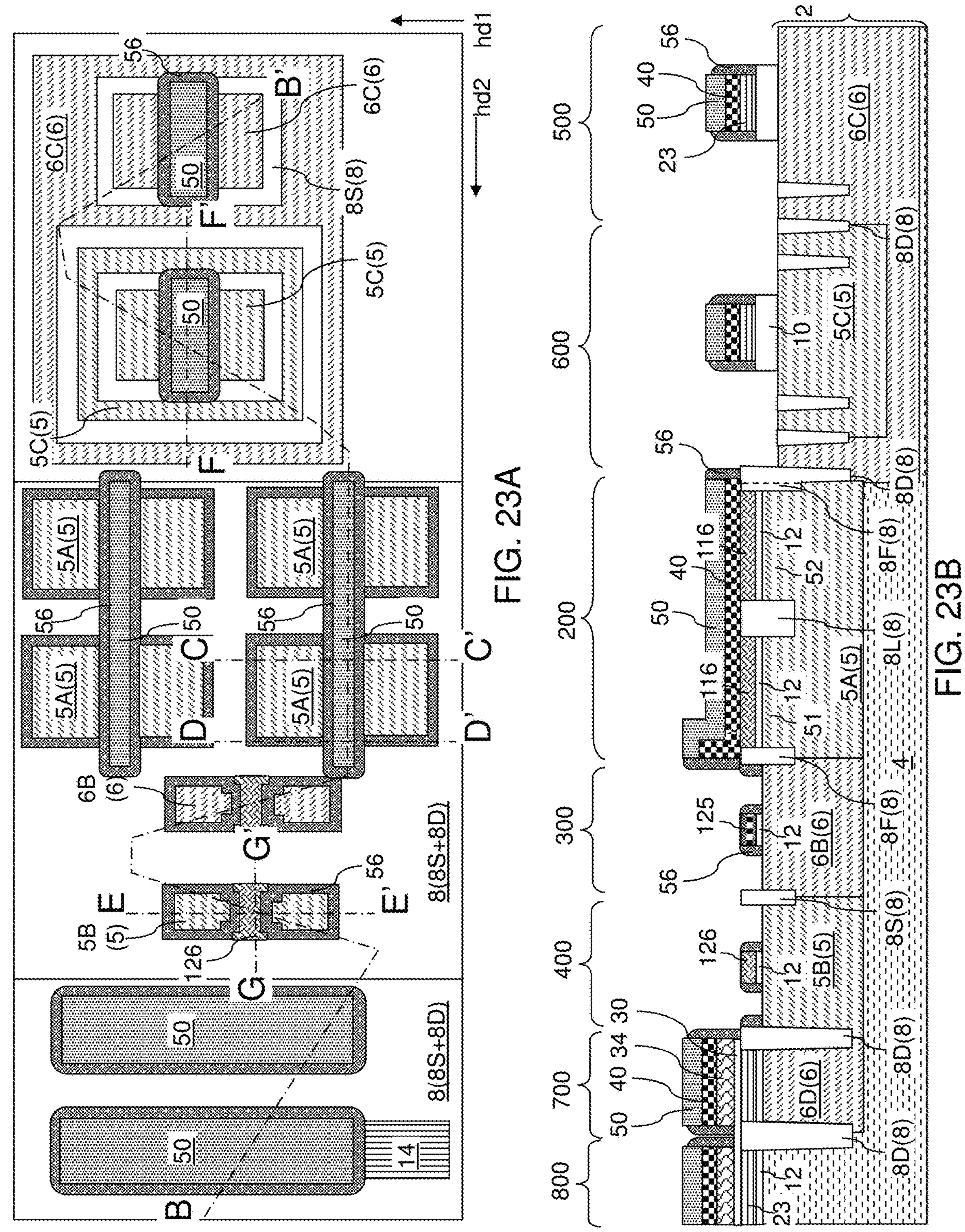
FIG. 23A is a top-down view of the second exemplary structure after formation of dielectric gate spacers according to the second embodiment of the present disclosure.
FIG. 23B is a vertical cross-sectional view of the second exemplary structure along the hinged vertical plane B-B' of FIG. 23A.
Figures 23C, 23D, 23E, 23F:
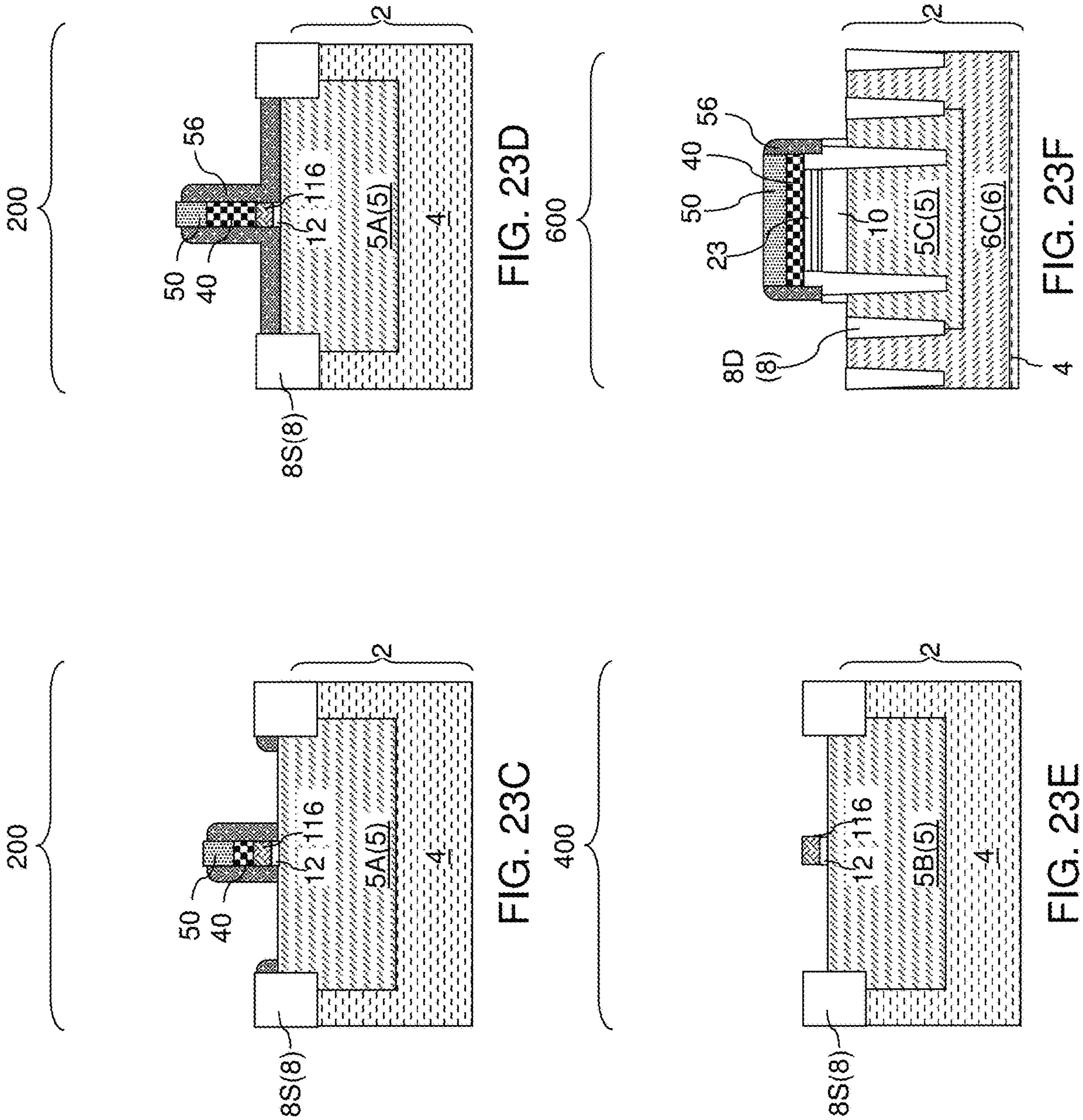
FIG. 23C is a vertical cross-sectional view of the second exemplary structure along the vertical plane C-C' of FIG. 23A.
FIG. 23D is a vertical cross-sectional view of the second exemplary structure along the vertical plane D-D' of FIG. 23A.
FIG. 23E is a vertical cross-sectional view of the second exemplary structure along the vertical plane E-E' of FIG. 23A.
FIG. 23F is a vertical cross-sectional view of the second exemplary structure along the vertical plane F-F' of FIG. 23A.
Figure 23G:
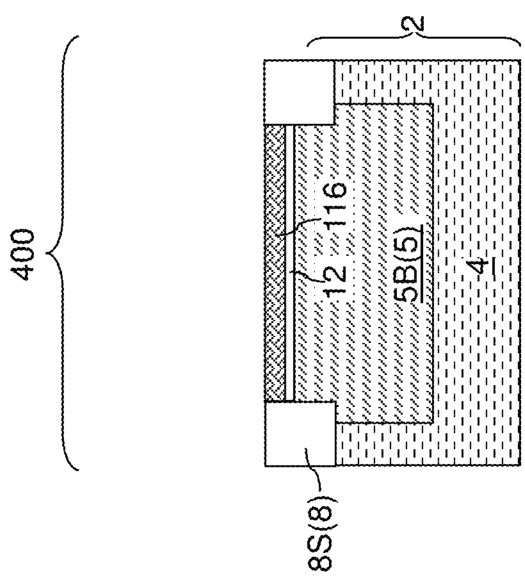
FIG. 23G is a vertical cross-sectional view of the second exemplary structure along the vertical plane G-G' of FIG. 23A.
Figure 24A:
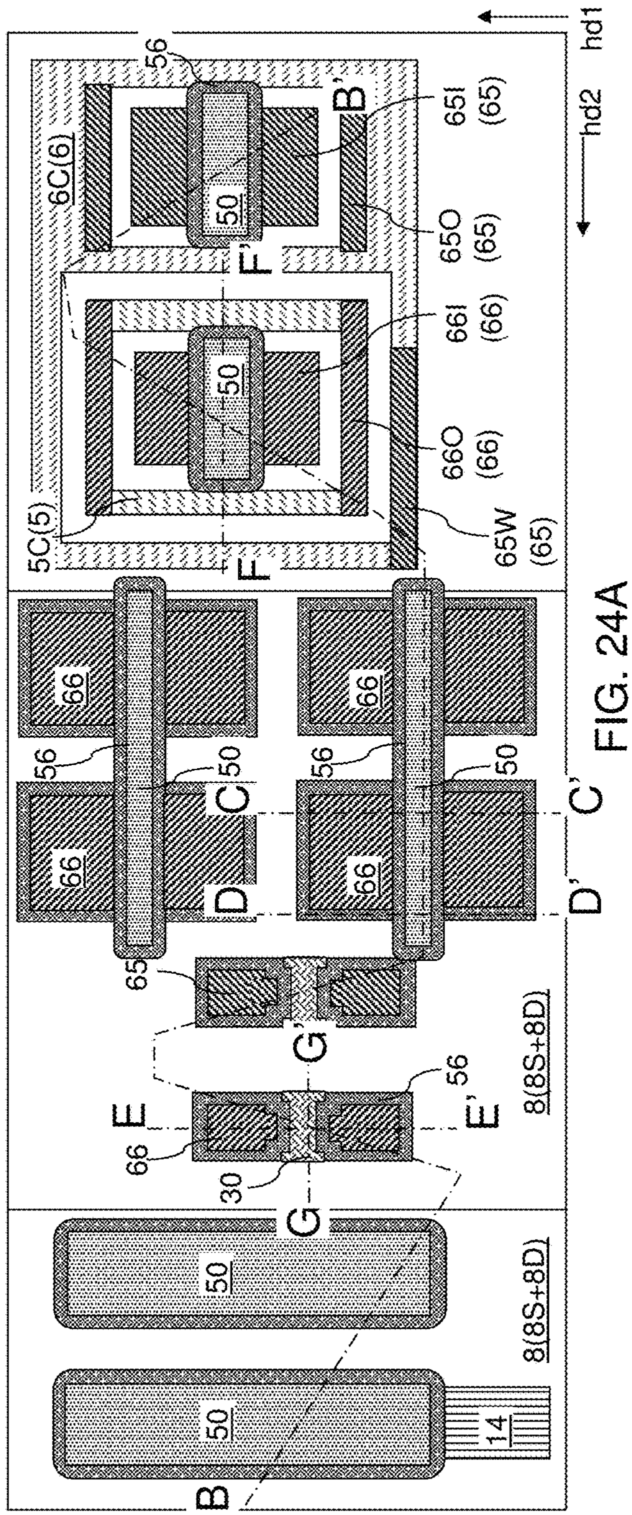
FIG. 24A is a top-down view of the second exemplary structure after formation of source regions and drain regions according to the second embodiment of the present disclosure.
Figure 24B:
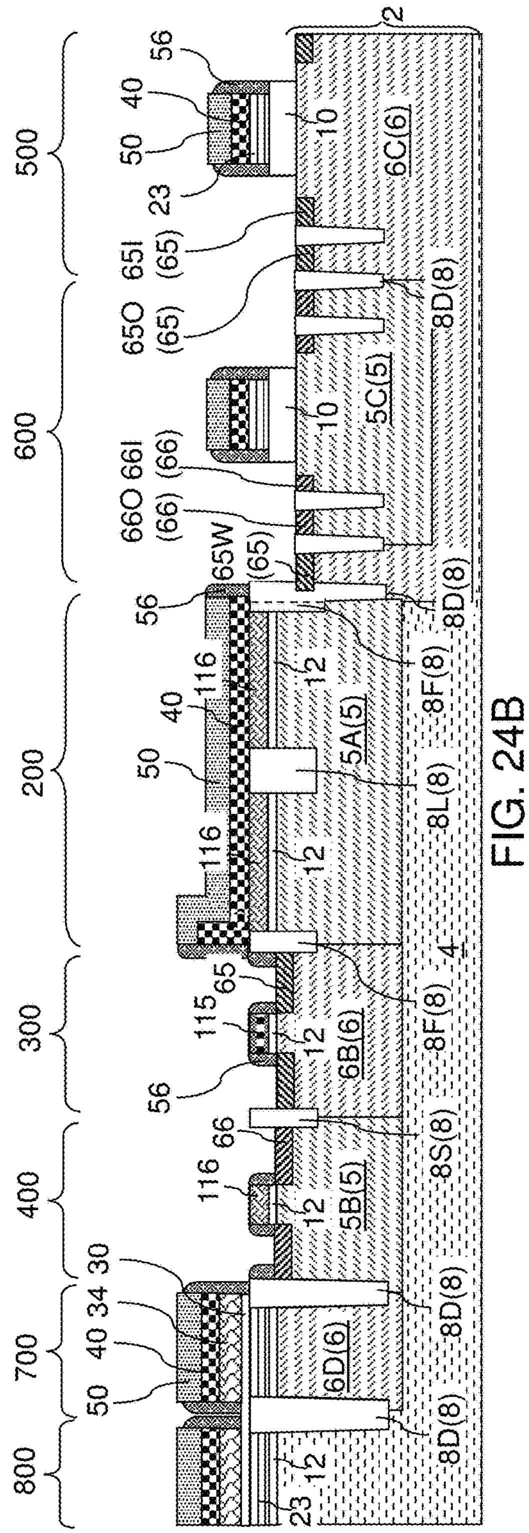
FIG. 24B is a vertical cross-sectional view of the second exemplary structure along the hinged vertical plane B-B' of FIG. 24A.
Figure 24C:
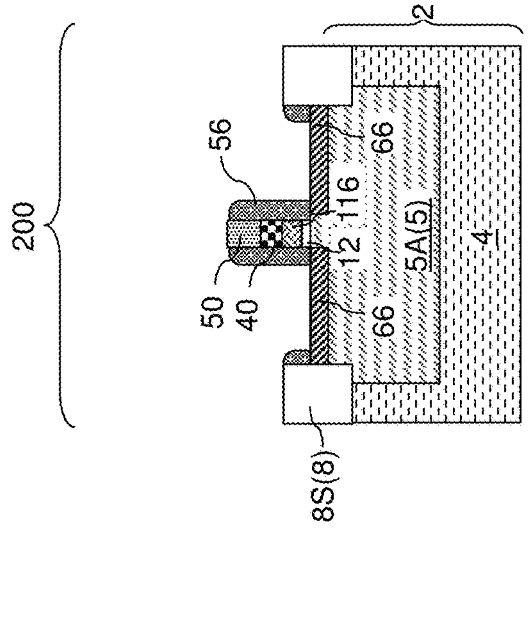
FIG. 24C is a vertical cross-sectional view of the second exemplary structure along the vertical plane C-C' of FIG. 24A.
Figure 24D:
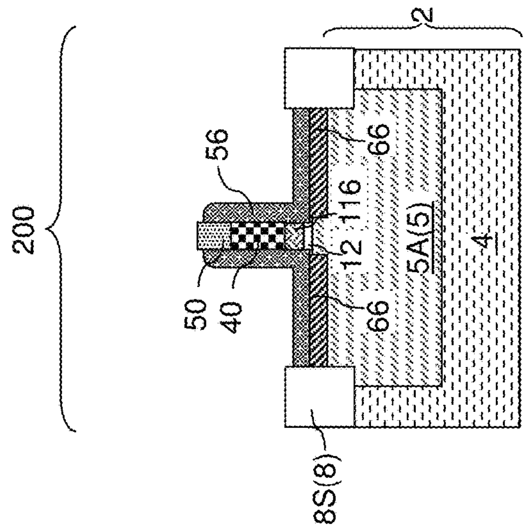
FIG. 24D is a vertical cross-sectional view of the second exemplary structure along the vertical plane D-D' of FIG. 24A.
Figure 24E:
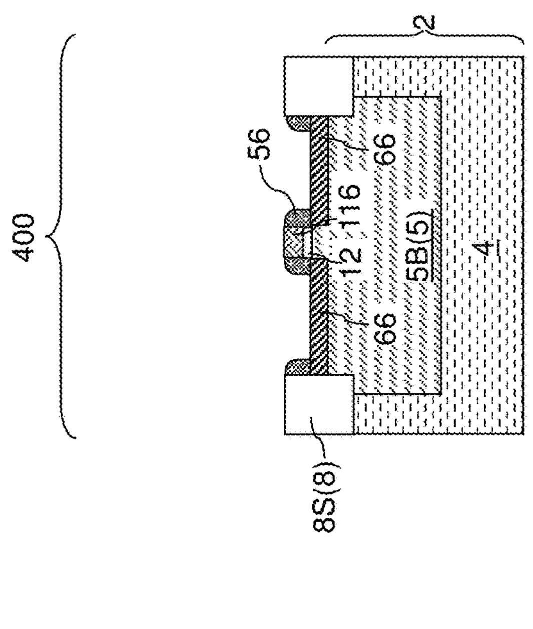
FIG. 24E is a vertical cross-sectional view of the second exemplary structure along the vertical plane E-E' of FIG. 24A.
Figure 24F:
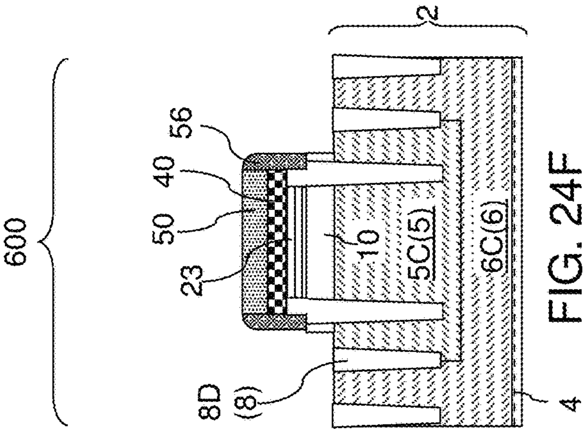
FIG. 24F is a vertical cross-sectional view of the second exemplary structure along the vertical plane F-F' of FIG. 24A.
Figure 24G:
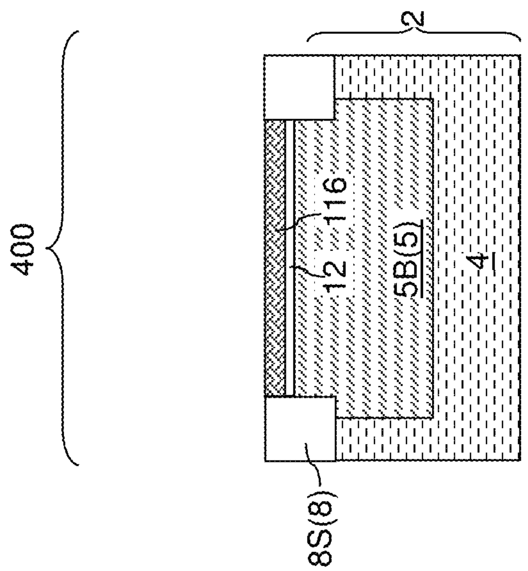
FIG. 24G is a vertical cross-sectional view of the second exemplary structure along the vertical plane G-G' of FIG. 24A.
Figure 25A:
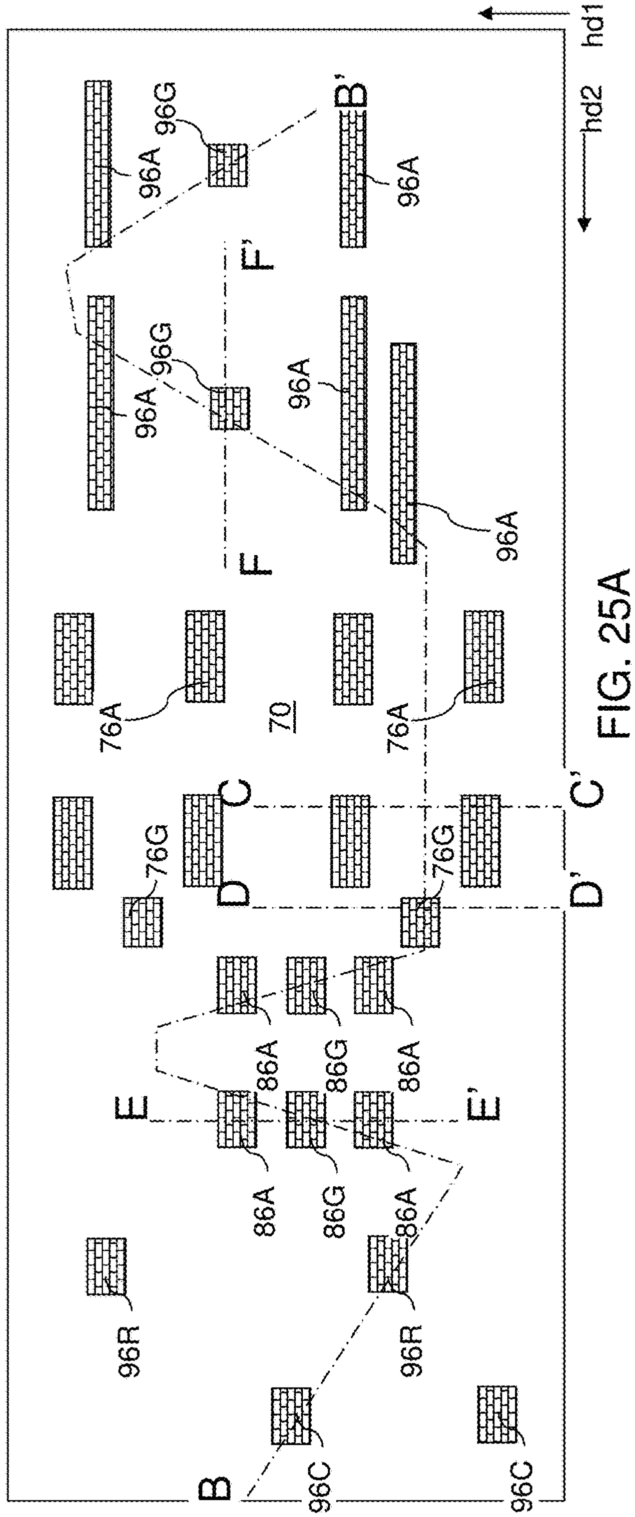
FIG. 25A is a top-down view of the second exemplary structure after formation of a contact-level dielectric layer and various contact via structures according to the second embodiment of the present disclosure.
Figure 25B:
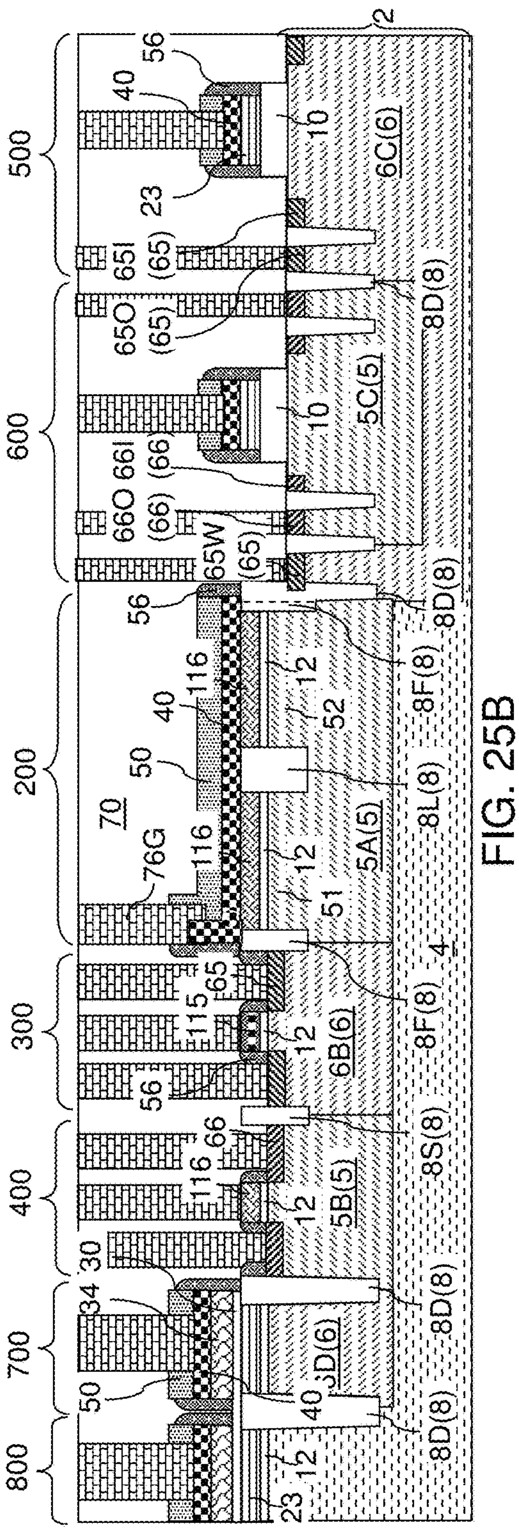
FIG. 25B is a vertical cross-sectional view of the second exemplary structure along the hinged vertical plane B-B' of FIG. 25A.
Figure 25C:
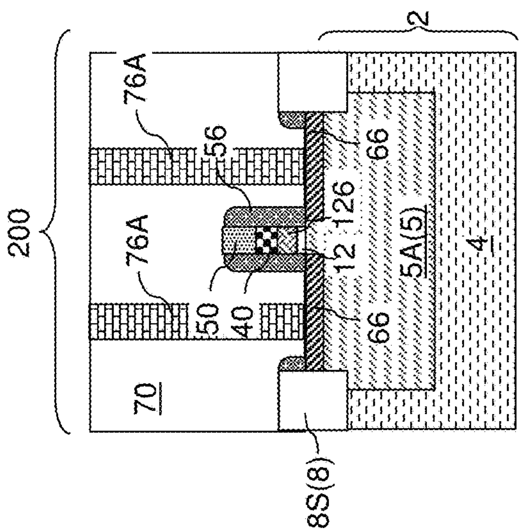
FIG. 25C is a vertical cross-sectional view of the second exemplary structure along the vertical plane C-C' of FIG. 25A.
Figure 25D:
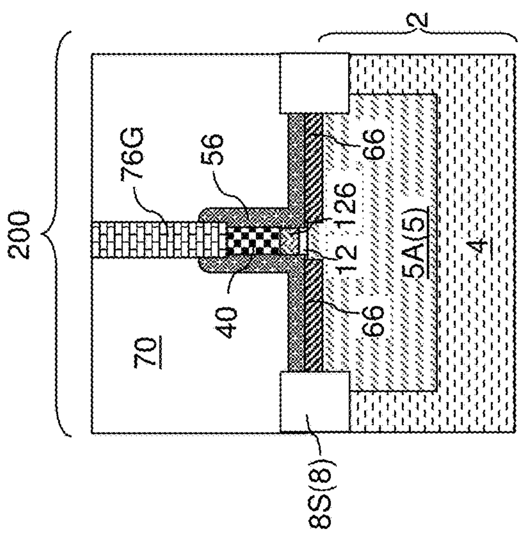
FIG. 25D is a vertical cross-sectional view of the second exemplary structure along the vertical plane D-D' of FIG. 25A.
Figure 25E:
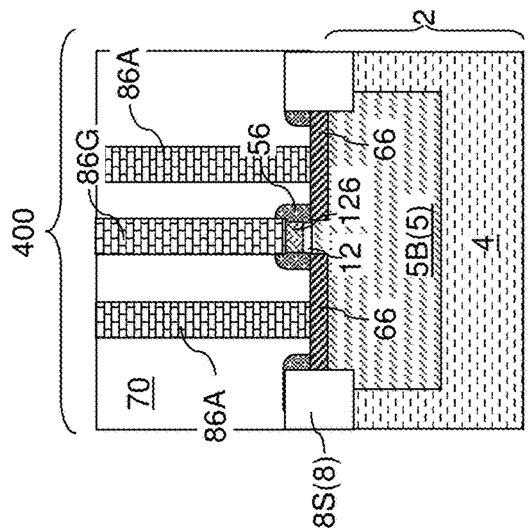
FIG. 25E is a vertical cross-sectional view of the second exemplary structure along the vertical plane E-E' of FIG. 25A.
Figure 25F:
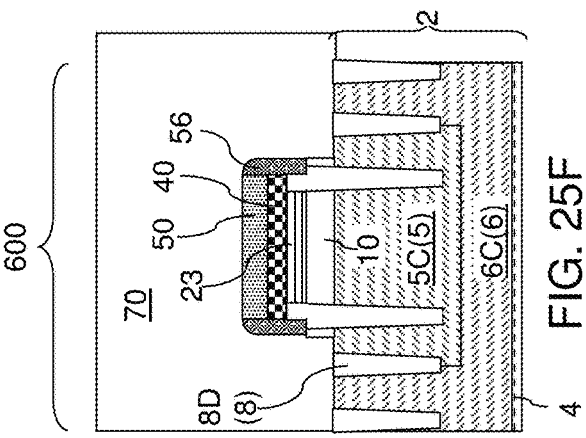
FIG. 25F is a vertical cross-sectional view of the second exemplary structure along the vertical plane F-F' of FIG. 25A.

Generally, at least one gate dielectric layer and at least one semiconductor gate material layer over a semiconductor material layer within the semiconductor substrate 2, and a trench isolation structure 8 can be formed through the at least one semiconductor gate material layer and the at least one gate dielectric layer. As shown in FIGS. 15A and 15B, patterned portions of the at least one semiconductor gate material layer and the at least one gate dielectric layer comprise a first stack (22A, 24A) of a first gate dielectric plate 22A and a first gate electrode material plate 24A overlying a first active region 51 of the semiconductor material layer, and a second stack (22B, 24B) of a second gate dielectric plate 22B and a second gate electrode material plate 24B overlying a second active region 52 of the semiconductor material layer.

The first stack (22A, 24A) and the second stack (22B, 24B) can be located within a same field effect transistor region such as the first n-type field effect transistor region 200. The trench isolation structure 8 comprises a frame portion 8F that laterally surrounds the first active region 51 and the second active region 52 continuously. A laterally-extending portion 8L of the trench isolation structure 8 can be located between the first active region 51 and the second active region 52.

Referring to FIGS. 16A-16F, masked ion implantation processes can be performed to dope any portion of the gate electrode material plates 24 with suitable conductivity types. In an illustrative example, n-doped gate electrode material plates 126 can be formed in the first and second n-type field effect transistor regions (200, 400) and p-doped gate electrode material plates 125 can be formed in the second p-type field effect transistor region 300 and in the first p-type field effect transistor region (not shown).

Referring to FIGS. 17A-17F, the processing steps of FIGS. 6A-6F can be performed to form a planar dielectric spacer layer 30L and a planar semiconductor spacer layer 34L over the top surfaces of the gate electrode material plates (125, 126), plates 23 and the trench isolation structure 8. The thickness and the material composition of each of the planar dielectric spacer layer 30L and the planar semiconductor spacer layer 34L may be the same as in the first exemplary structure.

Referring to FIGS. 18A-18F, the processing steps of FIGS. 7A-7F can be performed to pattern the planar dielectric spacer layer 30L and the planar semiconductor spacer layer 34L. In the second embodiment, the planar dielectric spacer layer 30L and the planar semiconductor spacer layer 34L can be patterned such that the planar dielectric spacer layer 30L and the planar semiconductor spacer layer 34L remain in the second field effect transistor regions (300, 400) and in the passive device regions (700, 800), and are removed from the first field effect transistor regions (100, 200) and the third field effect transistor regions (500, 600). In this case, a first active region and a second active region may be provided within the first n-type field effect transistor region 200, and remaining portions of the planar dielectric spacer layer 30L and the planar semiconductor spacer layer 34L can be located outside areas of the first active region 51 and the second active region 52.

Referring to FIGS. 19A-19F, the processing steps of FIGS. 8A-8F can be performed to deposit a conductive gate connection material layer comprising a metallic material directly on physically exposed top surfaces of the gate electrode material plates 126, the plates 23 and the trench isolation structure 8 and over the planar semiconductor spacer layer 34. In one embodiment, the conductive gate connection material layer may comprise a conductive gate cap layer 40L, which can have the same material composition and the same thickness range as in the first exemplary structure. A gate cap dielectric layer SOL can be subsequently deposited over the conductive gate cap layer 40L. The gate cap dielectric layer SOL includes a dielectric material such as silicon nitride.

Referring to FIGS. 20A-20F, a first photoresist layer 55 can be applied over the second exemplary structure, and can be lithographically patterned to form discrete patterned photoresist material portions. The patterned portions of the first photoresist layer 55 can include first portions that define the shapes of gate structures to be subsequently formed in the first field effect transistor regions (100, 200). The patterned portions of the first photoresist layer 55 can include second portions that define the shapes of gate electrodes to be subsequently formed in the third p-type field effect transistor region 500 and in the third n-type field effect transistor region 600. The patterned portions of the first photoresist layer 55 can include additional portions that cover a respective area within the first passive device region 700 and in the second passive device region 800.

A first anisotropic etch process can be performed to transfer the pattern in the first photoresist layer 55 through the gate cap dielectric layer 50L, the conductive gate cap layer 40L, the planar semiconductor spacer layer 34L, and portions of the plates 23 located outside the areas of the planar dielectric spacer layer 30L located within the third p-type field effect transistor region 500 and the third n-type field effect transistor region 600. The planar dielectric spacer layer 30L, the second gate dielectric plate 20, and the trench isolation structure 8 can function as etch stop structures for the first anisotropic etch process. In case the planar dielectric spacer layer 30L, the second gate dielectric plate 20, and the trench isolation structure 8 comprise silicon oxide, the etch chemistry of the terminal step of the first anisotropic etch process can etch the semiconductor materials of the planar semiconductor spacer layer 34L and the silicon nitride plates 23 selective to silicon oxide.

Each patterned portion of the gate cap dielectric layer SOL comprises a gate cap dielectric 50. Each patterned portion of the conductive gate cap layer 40L comprises a conductive gate cap structure 40. Each patterned portion of the planar semiconductor spacer layer 34L comprises the planar semiconductor spacer plate 34. Each patterned portion of the gate electrode material plates 126 constitutes a gate electrode 116.

Generally, a first gate electrode material plate 126 can be provided over a first active region 51 and a second gate electrode material plate 126 can be provided over a second active region 52 that is spaced from the first active region by a portion 8L of the trench isolation structure 8. Portions of the first gate electrode material plate 126 and the second gate electrode material plate 126 can be anisotropically etched. Patterned portions of the first gate electrode material plate 126 and the second gate electrode material plate 126 comprise a first gate electrode 116 and a second gate electrode 116, respectively.

According to an aspect of the present disclosure, a sidewall of a conductive gate cap structure 40 can be formed adjacent to a sidewall of the planar semiconductor spacer layer 34L as formed at the processing steps of FIGS. 18A-18F such that a vertically-extending portion of the conductive gate cap structure 40 adjacent to the sidewall of the planar semiconductor spacer layer 34L is included within the conductive gate cap structure 40. Generally, conductive gate cap structures 40 formed within the first field effect transistor regions (100, 200) can be formed with a vertically-protruding portion, which is remnant of a vertically extending portion of the conductive gate cap layer 40L that is formed adjacent to a sidewall of the planar semiconductor spacer layer 34L as formed at the processing steps of FIGS. 18A-18F.

A contiguous combination of a first gate cap dielectric 50, a first conductive gate cap structure 40, a first planar semiconductor spacer plate 34, and a pair of first gate electrodes 116 can be formed across a pair of active regions (51, 52) in the first n-type field effect transistor region 200. Generally, each first conductive gate cap structure 40 constitutes a conductive gate connection structure that provide an electrically conductive path between an underlying pair of first gate electrodes 116 overlying the pair of active regions (51, 52) separated by the trench isolation structure 8L. Thus, the conductive gate connection material layer which comprises the conductive gate cap layer 40L can be patterned into conductive gate connection structure which comprises the first conductive gate cap structures 40. The first photoresist layer 55 can be subsequently removed, for example, by ashing.

Referring to FIGS. 21A-21F, a second photoresist layer 57 can be applied over the second exemplary structure, and can be lithographically patterned to provide patterned photoresist material portions having the shapes of gate electrodes to be subsequently formed in the second p-type field effect transistor region 300 and the second n-type field effect transistor region 400. The shapes of the patterned portions of the second photoresist layer 57 may be selected as needed. In one embodiment, the patterned portions of the second photoresist layer 57 may have bulging segments adjacent to interface between active regions and the trench isolation structure 8.

Referring to FIGS. 22A-22G, a second anisotropic etch process can be performed to transfer the pattern of the second photoresist layer 57 through the planar dielectric spacer layer 30L, the gate electrode material plates (126, 125), and the gate dielectric plates 22. Each patterned portion of the planar dielectric spacer layer 30L constitutes a planar dielectric spacer plate 30. Each patterned portion of the gate electrode material plates (126, 125) constitutes a gate electrode (116, 115). Each patterned portion of the gate dielectric plates 22 constitutes a gate dielectric 12. The terminal portion of the second anisotropic etch process may be selective to the to the semiconductor material of the semiconductor substrate 2. The second photoresist layer 57 can be subsequently removed, for example, by ashing.

Subsequently, another anisotropic etch process may be optionally performed to pattern the gate dielectric plates 22 located within the first field effect transistor regions (100, 200). Portions of the gate dielectric plates 22 that do not underlie a gate electrode 126 can be etched, and remaining portions of the gate dielectric plates 22 in the first field effect transistor regions (100, 200) constitute gate dielectrics 12.

A stack of a first gate dielectric 12 and a first gate electrode 116 overlies a first channel region within the first active region 51 in a first field effect transistor region (100 or 200) and contacts a first sidewall of the laterally-extending portion 8F of the trench isolation structure 8. A stack of a second gate dielectric 12 and a second gate electrode 116 overlies a second channel region within the second active region 52 and contacts a second sidewall of the laterally-extending portion 8F of the trench isolation structure 8. A conductive gate connection structure (comprising the first conductive gate cap structure 40) contacts a top surface of the first gate electrode 116, a top surface of the second gate electrode 116, and a portion of a top surface of the laterally-extending portion 8F of the trench isolation structure 8. The conductive gate connection structure comprising the first conductive gate cap structure 40 comprises a pair of widthwise sidewalls that laterally extend along a first horizontal direction hd1 and a pair of lengthwise sidewalls that laterally extend along a second horizontal direction hd2.

The trench isolation structure 8 comprises a frame portion 8F that laterally surrounds the first active region and the second active region continuously. The conductive gate connection structure comprising the first conductive gate cap structure 40 comprises a first end portion and a second end portion that overlies and contacts a respective segment of a top surface of the frame portion 8F of the trench isolation structure 8. Lengthwise sidewalls of the first gate electrode 116 and the second gate electrode 116 are vertically coincident with the pair of lengthwise sidewalls of the conductive gate connection structure that laterally extend along the second horizontal direction hd2.

A first widthwise sidewall (extending along the first horizontal direction hd1) of the first gate dielectric 12 and a first widthwise sidewall (extending along the first horizontal direction hd1) of the first gate electrode 116 are vertically coincident with each other and contact a first sidewall of the laterally-extending portion 8L of the trench isolation structure 8. A first widthwise sidewall (extending along the first horizontal direction hd1) of the second gate dielectric 12 and a first widthwise sidewall (extending along the first horizontal direction hd1) of the second gate electrode 116 are vertically coincident with each other and contact a second sidewall of the laterally-extending portion 8L of the trench isolation structure 8.

A second widthwise sidewall (extending along the first horizontal direction hd1) of the first gate dielectric 12 and a second widthwise sidewall (extending along the first horizontal direction hd1) of the first gate electrode 116 are vertically coincident with each other and contact a first sidewall of the frame portion 8F of the trench isolation structure 8. A second widthwise sidewall (extending along the first horizontal direction hd1) of the second gate dielectric 12 and a second widthwise sidewall (extending along the first horizontal direction hd1) of the second gate electrode 116 are vertically coincident with each other and contact a second sidewall of the frame portion 8F of the trench isolation structure 8.

In one embodiment, the conductive gate connection structure comprises a metallic gate connection structure 40 having a first thickness over a predominant segment of the first gate electrode 116, over the laterally-extending portion 8L of the trench isolation structure 8, and over an entire area of the second gate electrode 116, and having a second thickness that is greater than the first thickness over a complementary segment of the first gate electrode 116.

Referring to FIGS. 23A-23G, source/drain extension regions (not shown) can be optionally formed by implantation of p-type dopants and n-type dopants employing a respective patterned implantation mask layer (such as a patterned photoresist layer) and a respective ion implantation process. A dielectric gate spacer material layer including a dielectric material can be deposited by a conformal deposition process such as a chemical vapor deposition process. The dielectric material of the dielectric gate spacer material layer may include, for example, silicon nitride and/or silicon oxide. An anisotropic etch process can be performed to etch horizontally-extending portions of the dielectric gate spacer material layer. Remaining vertically-extending portions of the dielectric gate spacer material layer constitute dielectric gate spacers 56.

The anisotropic etch process may be extended to etch unmasked portions of the dielectric materials of the second gate dielectric plates 20 and the trench isolation structures 8 selective to the materials of the gate electrodes 116. The planar dielectric spacer plates 30 in the second field effect transistor regions (300, 400) can be collaterally etched during the anisotropic etch process. In this case, the second gate dielectric plates 20 in the third field effect transistor regions (500, 600) can be patterned into second gate dielectrics 10, and the physically exposed top surfaces of the trench isolation structures 8 can be vertically recessed. In one embodiment, an outer sidewall of each second gate dielectric 10 can be vertically coincident with an outer sidewall of a respective one of the gate dielectric spacers 56. In one embodiment, the recessed portions of the top surfaces of the trench isolation structure 8 may be at, or about, the height of the top surfaces of the third doped wells (5C, 6C) in the third field effect transistor regions (500, 600).

In one embodiment, a first dielectric gate spacer 56 located within a first field effect transistor region (100 or 200) comprises an upper portion laterally surrounding the conductive gate connection structure comprising first conductive gate cap structure 40, and four lower portions vertically extending between a horizontal plane including a top surface of frame portion 8F of the trench isolation structure 8 and a horizontal plane including top surfaces of the first active region and the second active region and contacting a respective lengthwise sidewall of one of the first gate electrode 116 and the second gate electrode 116.

Referring to FIGS. 24A-24G, masked ion implantation processes can be performed to implant p-type dopants within unmasked surface portions of the n-type wells 6, and to implant n-type dopants within unmasked surface portions of the p-type wells 5. A combination of a patterned photoresist layer, the gate structures (12, 10, 116, 115, 13, 34, 40, 50), and the dielectric gate spacers 56 can be employed as a composite implantation mask during each ion implantation process. Source regions and drain regions are formed within the implanted surface portions of the p-doped wells 5 and the n-doped wells 6. The source regions and the drain regions are collectively referred to as source/drain regions (65, 66), which include p-doped source/drain regions 65 that are formed within a respective one of the n-doped wells 6, and n-doped source/drain regions 66 that are formed within a respective one of the p-doped wells 5.

In one embodiment, configurations for increasing the breakdown voltage of field effect transistors may be employed in device regions in which high-voltage field effect transistors are formed such as the third field effect transistor regions (500, 600). In this case, the p-doped source/drain regions 65 may include inner p-doped source/drain regions 651 and outer p-doped source/drain regions 650 that are laterally spaced apart by an additional trench isolation structure 8, which may be disjoined from the trench isolation structure 8 in the first field effect transistor regions (100, 200). Further, the n-doped source/drain regions 66 may include inner n-doped source/drain regions 661 and outer n-doped source/drain regions 660 that are laterally spaced apart by another additional trench isolation structure 8. Optionally, a well contact source/drain region 65W may be employed to facilitate biasing of a doped well.

Referring to FIGS. 25A-25F, a contact-level dielectric layer 70 and various contact via structures (76A, 76G, 86A, 86G, 96A, 96G, 96R, 96C) can be subsequently formed. The contact-level dielectric layer 70 includes a dielectric material such as silicon oxide, and can be formed by a conformal or non-conformal deposition process. The top surface of the contact-level dielectric layer 70 can be planarized by a planarization process such as a chemical mechanical polishing (CMP) process. The vertical distance between the topmost surfaces of the gate cap dielectrics 50 and the top surface of the contact-level dielectric layer 70 can be in a range from 30 nm to 500 nm, although lesser and greater vertical distances may also be employed.

The contact via structures (76A, 76G, 86A, 86G, 96A, 96G, 96R, 96C) comprise first source/drain region contact via structures 76A contacting source/drain regions (65, 66) within the first field effect transistor regions (100, 200), first gate contact via structures 76G contacting top surfaces of conductive gate cap structures 40 within the first field effect transistor regions (100, 200), second source/drain region contact via structures 86A contacting source/drain regions (65, 66) within the second field effect transistor regions (300, 400), second gate contact via structures 86G contacting the second gate electrodes (25, 26), third source/drain region contact via structures 96A contacting source/drain regions (65, 66) within the third field effect transistor regions (500, 600), and third gate contact via structures 96G contacting top surfaces of conductive gate cap structures 40 within the third field effect transistor regions (500, 600). Further, the contact via structures (76A, 76G, 86A, 86G, 96A, 96G, 96R, 96C) can comprise first passive device contact via structures 96R that contact first passive devices such as resistors, and second passive device contact via structures 96C that contact second passive devices such as capacitors.

Generally, various field effect transistors having different gate dielectric thicknesses, different gate lengths (i.e., different lateral distances between a source region and a drain region), and different configurations can be formed in the various field effect transistor regions (100, 200, 300, 400, 500, 600). A dielectric gate spacer 56 may overlie a periphery region of a source/drain region (65, 66) of field effect transistors in the second field effect transistor regions (300, 400), and contact sidewalls of a respective portion of the trench isolation structure 8.

The second exemplary structure can include a combination of a first field effect transistor and a second field effect transistor located in a first field effect transistor region (100 or 200). The first field effect transistor and the second field effect transistor comprise a first active region 51 and a second active region 52, respectively. The first active region and the second active region contact sidewalls of, and are laterally surrounded by, a trench isolation structure 8. A laterally-extending portion 8L of the trench isolation structure 8 is located between the first active region 51 and the second active region 52.

The second exemplary structure may comprise a third field effect transistor located in a second field effect transistor region (300 or 400). The third field effect transistor comprises: a third active region that is laterally surrounded by an additional portion of the trench isolation structure 8, a stack of a third gate dielectric 12 and a third gate electrode (116 or 115) having widthwise sidewalls contacting sidewalls of the additional portion of the trench isolation structure 8 and laterally extending along the first horizontal direction hd1, additional dielectric gate spacers 56 having a respective opening therethrough and contacting a respective subset of sidewalls of the additional portion of the trench isolation structure 8 and a respective lengthwise sidewall (which laterally extends along the second horizontal direction hd2) of the third gate electrode (116 or 115).

The first gate electrode 116 and the second gate electrode 116 do not contact the contact-level dielectric layer 70, and are spaced from the contact-level dielectric layer 70 by a first dielectric gate spacer 56 and a conductive gate connection structure (as embodied as a conductive gate cap structure 40). The third gate electrode (116 or 115) can have a same thickness as the first gate electrode 116 and the second gate electrode 116. A portion of a top surface of the third gate electrode (116 or 115) is in direct contact with the contact-level dielectric layer 70.

At least one gate contact structure (such as a first gate contact via structure 76G) extends through the contact-level dielectric layer 70 and contacts a top surface of the portion of the conductive gate connection structure comprising the conductive gate cap structure 40 which at least partially overlies the underlying first gate electrode 116, and at least one additional gate contact structure (such as a second gate contact via structure 86G) extends through the contact-level dielectric layer 70 and contacts a portion of a top surface of the third gate electrode 116. An entirety of the top surface of the third gate electrode 116 is in contact with the at least one additional gate contact structure or the contact-level dielectric layer 70.

The second exemplary structure can comprise an additional field effect transistor such as a fourth field effect transistor formed in a third field effect transistor region (500 or 600). The additional field effect transistor comprises an additional active region having a pair of lengthwise sidewalls and a pair of widthwise sidewalls that contact sidewalls of, and are laterally surrounded by, an additional portion of the trench isolation structure 8. The additional field effect transistor comprises an additional gate structure (10, 13, 40, 50) overlies the additional active region. The additional gate structure (10, 13, 40, 50) can include an additional composite gate dielectric (10, 13) comprising a silicon oxide sublayer 10 having a greater thickness than the first gate dielectric 12, and a silicon nitride sublayer 13, and an additional conductive gate cap structure 40 having a same thickness and a same material composition as the first segment of the first conductive gate cap structure 40. An entirety of a top surface of the silicon nitride sublayer 13 is in contact with a bottom surface of the additional conductive gate cap structure 40.

In one embodiment, the second exemplary structure may comprise a passive device, which may be selected from a capacitor, a resistor, or any other passive device known in the art. The passive device comprises a layer stack including, from bottom to top, a first dielectric layer (such as another instance of a silicon oxide gate dielectric 12 and a silicon nitride gate dielectric 13), a second dielectric layer (such as a planar dielectric spacer plate 30), a second semiconductor plate (such as a planar semiconductor spacer plate 34), and a metallic plate (such as a conductive gate cap structure 40). The first dielectric layer has a same material composition and a same thickness as the first gate dielectric 12. The first semiconductor plate may a same thickness as the first gate electrode (14, 25 or 26). The second dielectric layer has a same material composition and a same thickness as the first planar dielectric spacer plate 30. The metallic plate has a same material composition and a same thickness as the first segment of the first conductive gate cap structure 40.

Figure 26A:
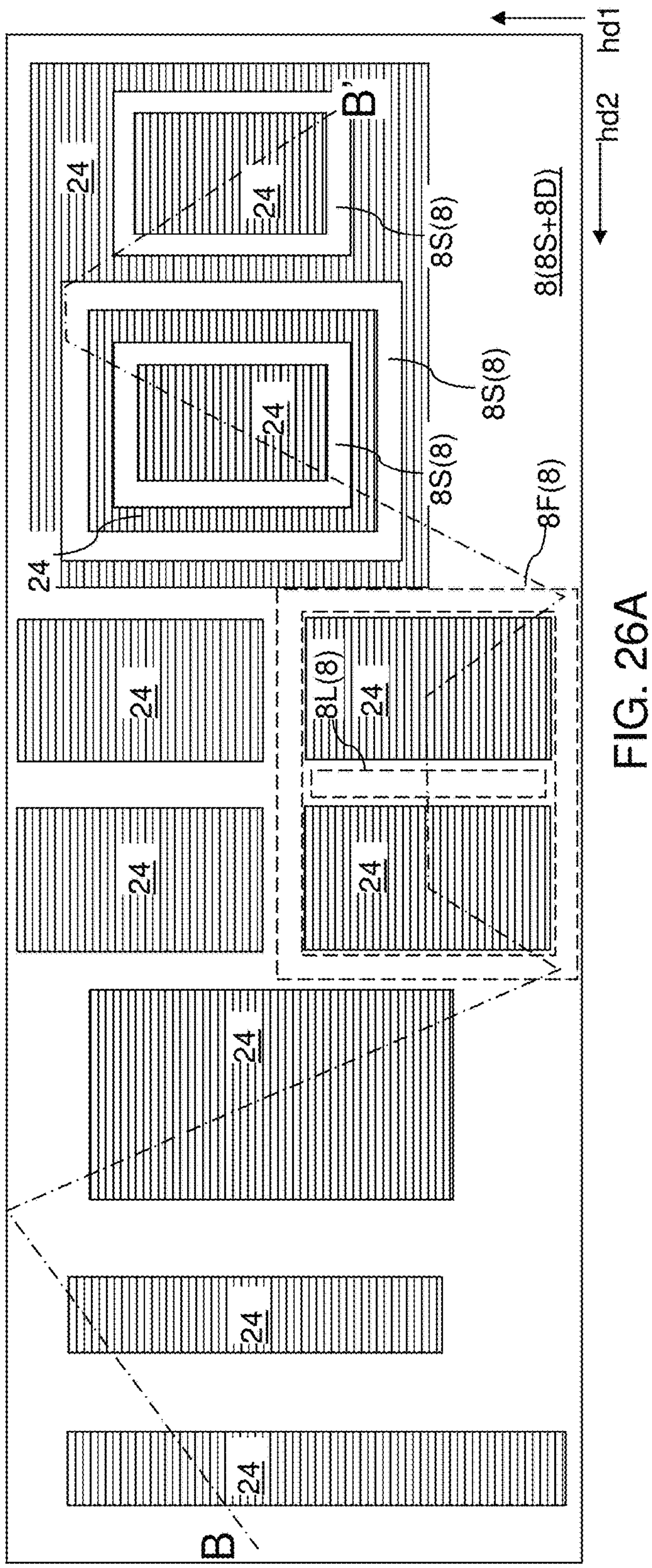
FIG. 26A is a top-down view of a third exemplary structure after formation of trench isolation structures according to the third embodiment of the present disclosure.
Figure 26B:
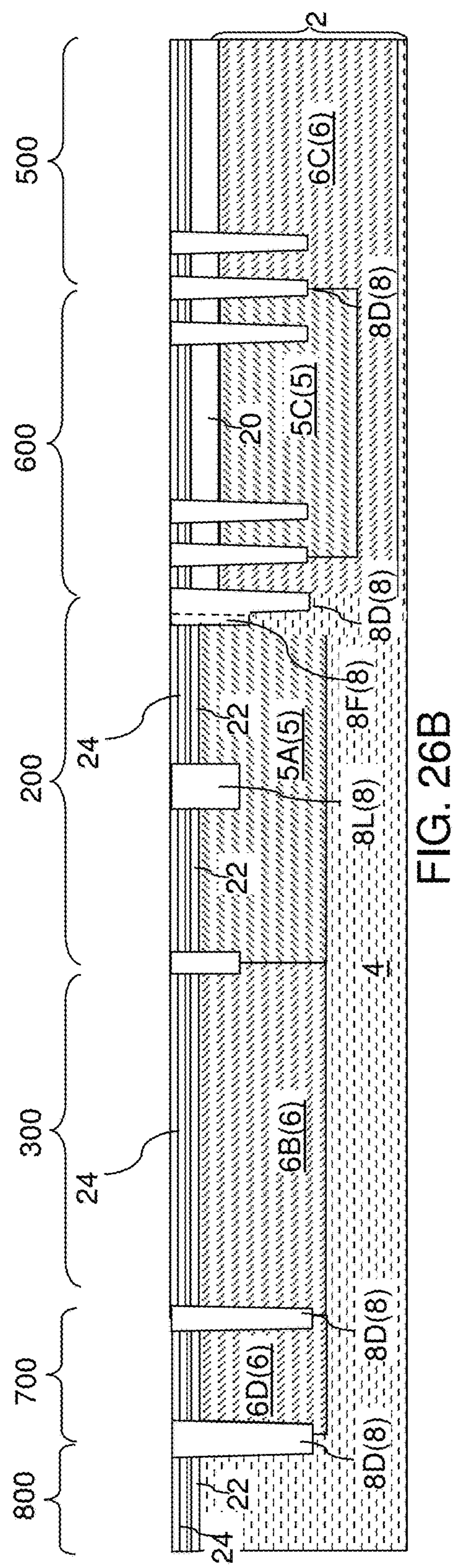
FIG. 26B is a vertical cross-sectional view of the third exemplary structure along the hinged vertical plane B-B' of FIG. 26A.

Referring to FIGS. 26A and 26B, a third exemplary structure according to a third embodiment of the present disclosure may be derived from the first exemplary structure of FIGS. 5A-5F by rearranging and/or omitting a subset of the doped wells (5, 6). For example, the first p-doped wells 5A can be formed such that a plurality of active regions laterally surrounded by a respective portion of the trench isolation structure 8 is provided within the first n-type field effect transistor region 200. A second field effect transistor region (300 or 400) may be formed adjacent to a first field effect transistor region (100 or 200). The first p-type field effect transistor region 100 and the second n-type field effect transistor region 400 are not illustrated for the drawings of the third exemplary structure, but may be present within the third exemplary structure. While the present disclosure is described employing an embodiment in which pairs of active regions are present within the first n-type field effect transistor region 200, embodiments are expressly contemplated herein in which pairs of active regions are present within the first p-type field effect transistor region 100 and field effect transistors having the same geometrical features are formed in the first p-type type field effect transistor region 100. In other words, the devices of the present disclosure may be formed with opposite conductivity types.

Generally, at least one gate dielectric layer and at least one semiconductor gate material layer over a semiconductor material layer within the semiconductor substrate 2, and a trench isolation structure 8 can be formed through the at least one semiconductor gate material layer and the at least one gate dielectric layer. Patterned portions of the at least one semiconductor gate material layer and the at least one gate dielectric layer comprise a first stack (22, 24) of a first gate dielectric plate 22 and a first gate electrode material plate 24 overlying a first active region of the semiconductor material layer and a second stack (22, 24) of a second gate dielectric plate 22 and a second gate electrode material plate 24 overlying a second active region of the semiconductor material layer. The first stack (22, 24) and the second stack (22, 24) can be located within a same field effect transistor region such as the first n-type field effect transistor region 200. The trench isolation structure 8 comprises a frame portion 8F that laterally surrounds the first active region and the second active region continuously. A laterally-extending portion 8L of the trench isolation structure 8 can be located between the first active region and the second active region. Optionally, masked ion implantation processes can be performed to dope any portion of the gate electrode material plates 24 with suitable conductivity types.

Figure 27A:
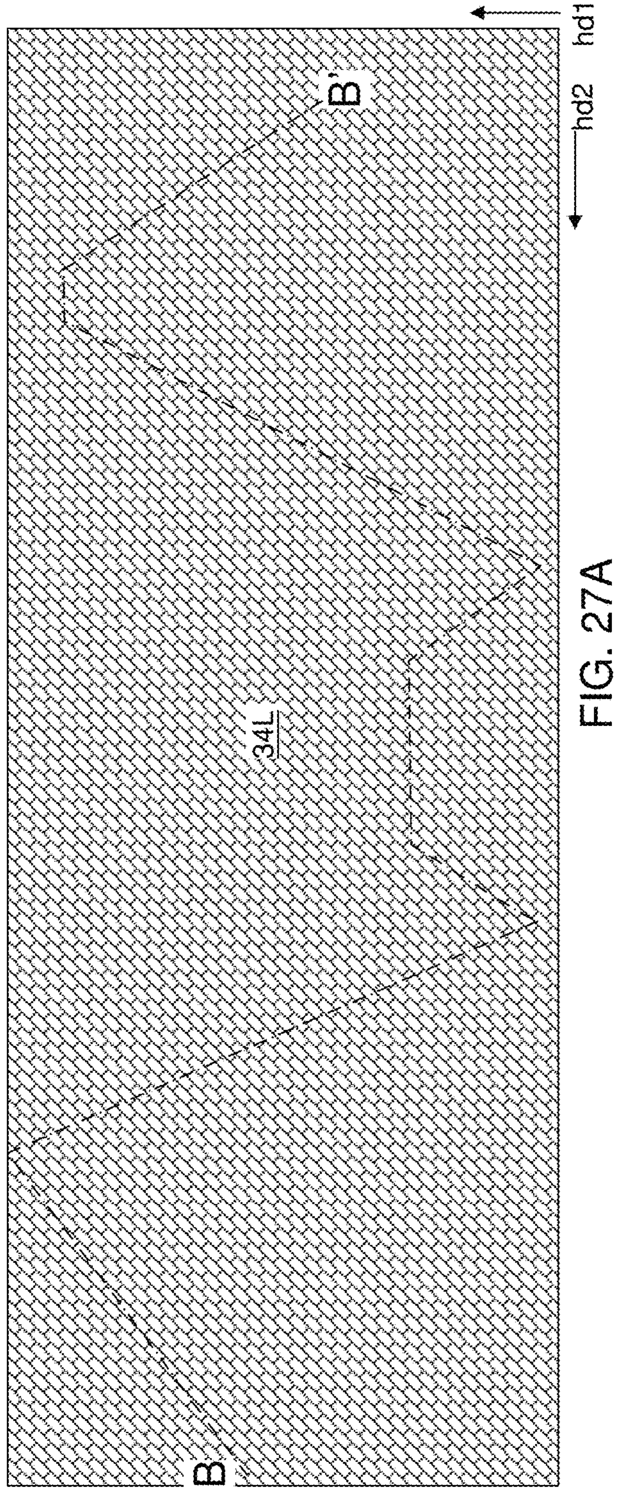
FIG. 27A is a top-down view of the third exemplary structure after formation of a planar semiconductor spacer layer according to the third embodiment of the present disclosure.
Figure 27B:
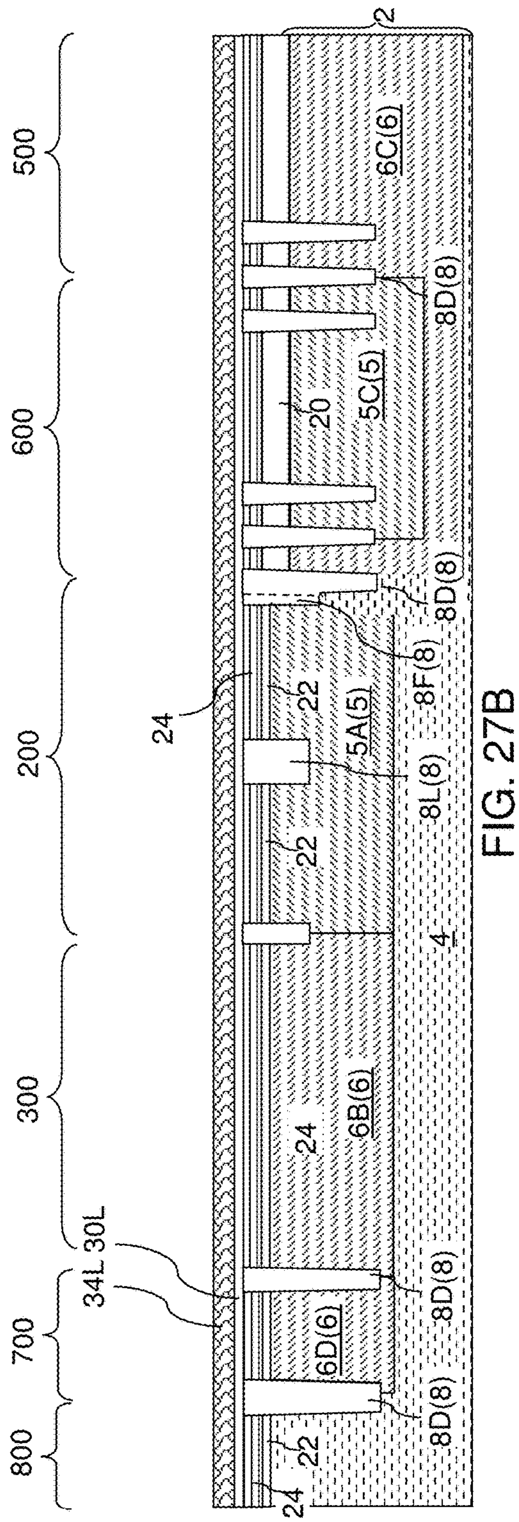
FIG. 27B is a vertical cross-sectional view of the third exemplary structure along the hinged vertical plane B-B' of FIG. 27A.
Figure 28A:
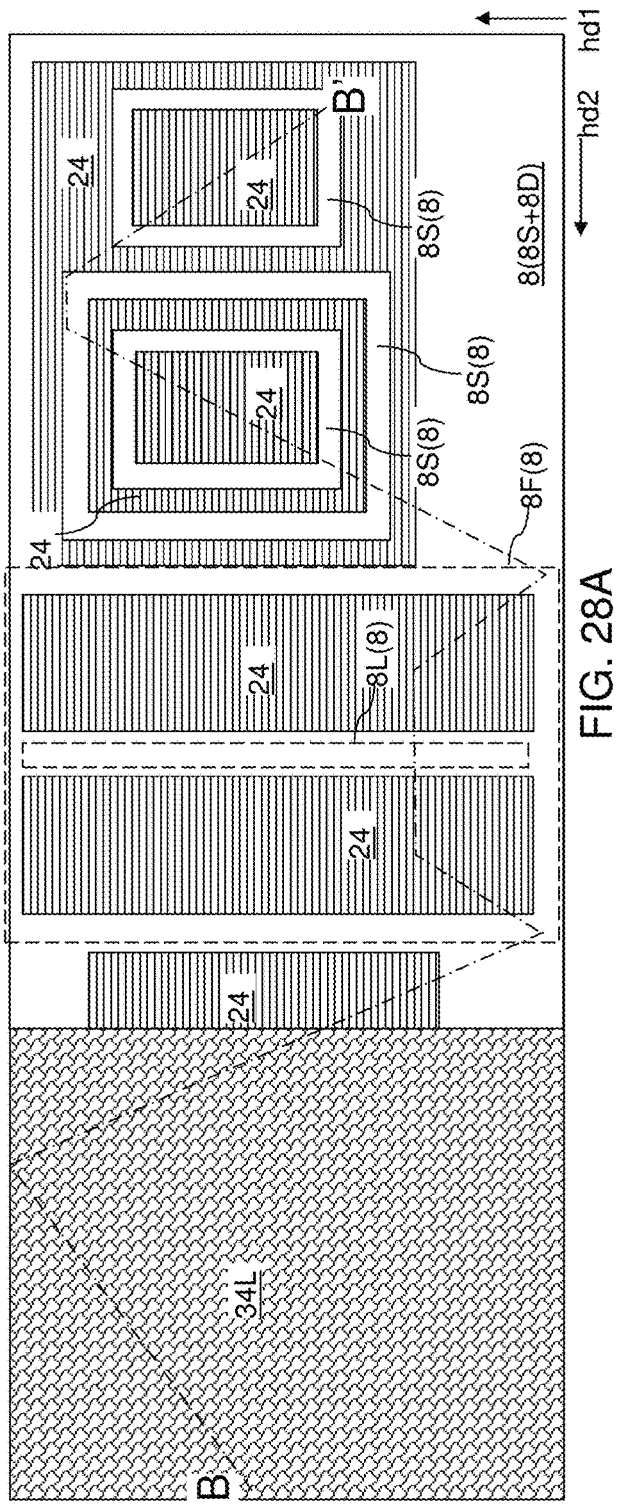
FIG. 28A is a top-down view of the third exemplary structure after patterning the planar semiconductor spacer layer according to the third embodiment of the present disclosure.
Figure 28B:
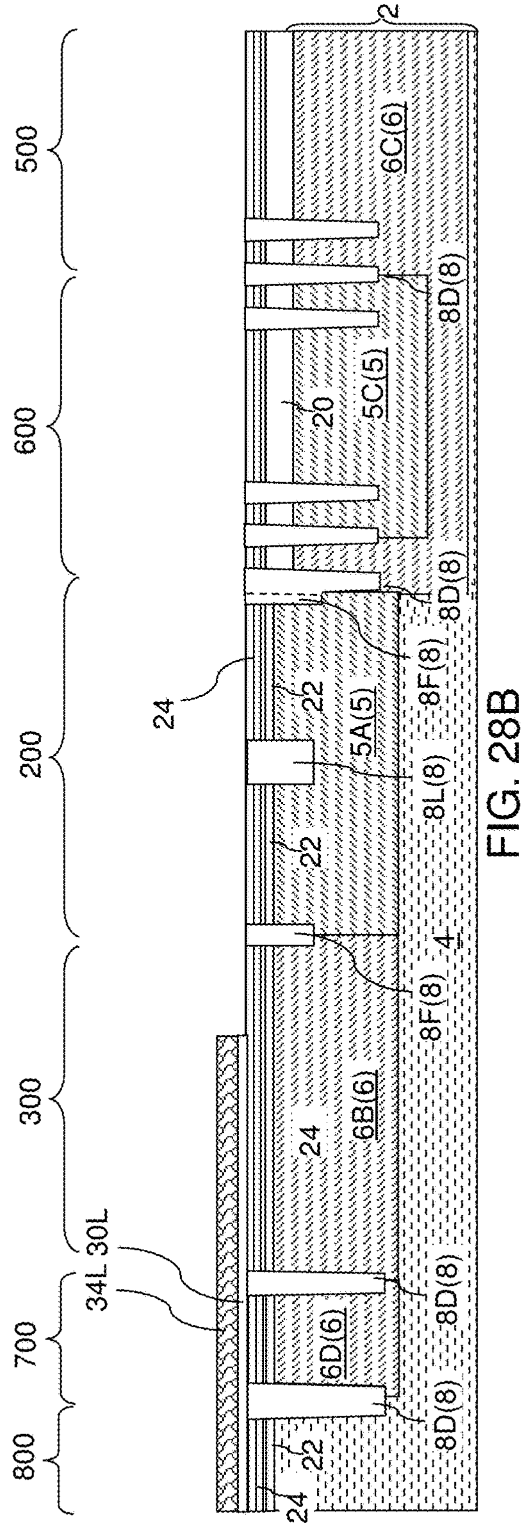
FIG. 28B is a vertical cross-sectional view of the third exemplary structure along the hinged vertical plane B-B' of FIG. 28A.
Figure 29A:
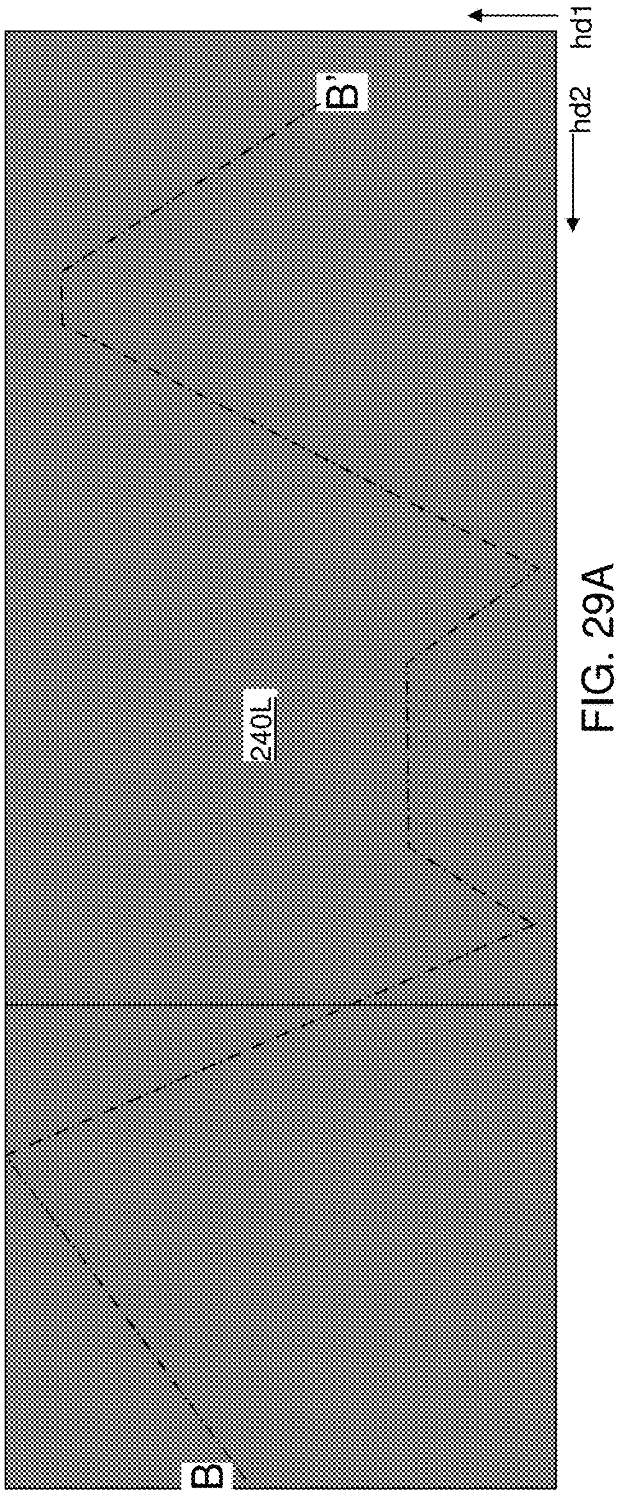
FIG. 29A is a top-down view of the third exemplary structure after deposition of an upper semiconductor gate material layer and a conductive gate cap layer according to the third embodiment of the present disclosure.
Figure 29B:
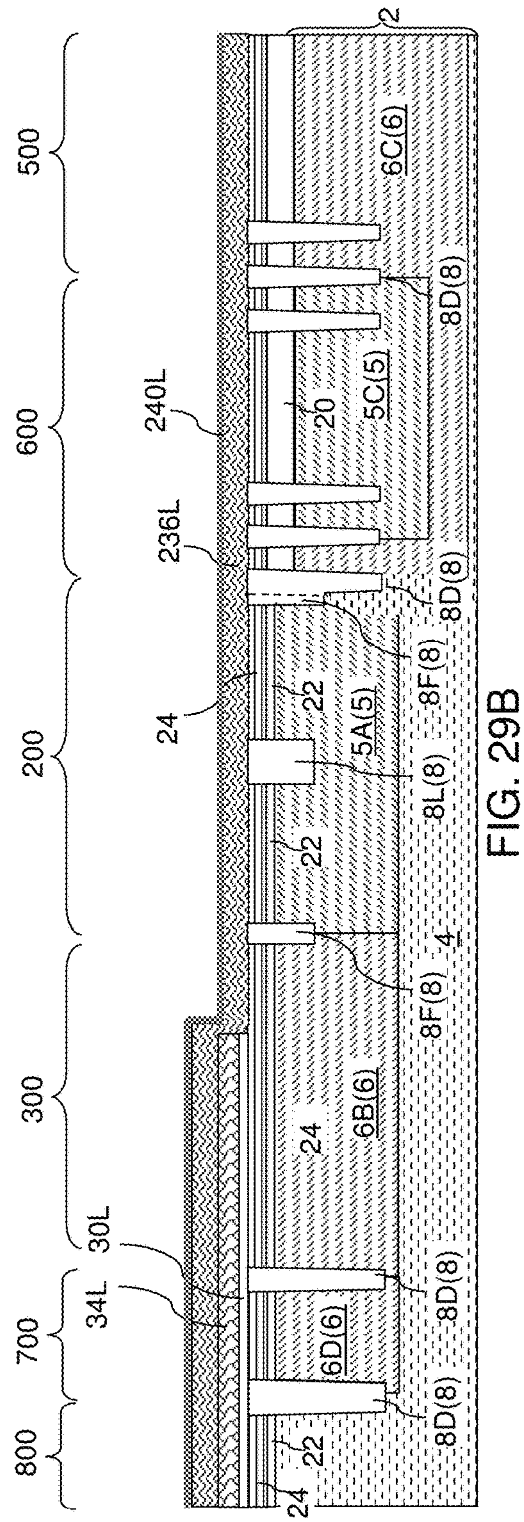
FIG. 29B is a vertical cross-sectional view of the third exemplary structure along the hinged vertical plane B-B' of FIG. 29A.

Referring to FIGS. 27A and 27B, the processing steps of FIGS. 6A-6F can be performed to form a planar dielectric spacer layer 30L and a planar semiconductor spacer layer 34L over the top surfaces of the gate electrode material plates 24 and the trench isolation structure 8. The thickness and the material composition of each of the planar dielectric spacer layer 30L and the planar semiconductor spacer layer 34L may be the same as in the first exemplary structure.

Referring to FIGS. 28A-28F, the processing steps of FIGS. 7A-7F can be performed to pattern the planar dielectric spacer layer 30L and the planar semiconductor spacer layer 34L. In the third embodiment, the planar dielectric spacer layer 30L and the planar semiconductor spacer layer 34L can be patterned such that sidewalls of patterned remaining portions of the planar dielectric spacer layer 30L and the planar semiconductor spacer layer 34L are formed in the second field effect transistor regions (300 or 400). The planar dielectric spacer layer 30L and the planar semiconductor spacer layer 34L can be removed from the first field effect transistor regions (100, 200), the third field effect transistor regions (500, 600), and peripheral regions of the second field effect transistor regions (300, 400) that border the first field effect transistor regions (100, 200). In this case, a first active region and a second active region may be provided within the first n-type field effect transistor region 200, and remaining portions of the planar dielectric spacer layer 30L and the planar semiconductor spacer layer 34L can be located outside areas of the first active region and the second active region. In one embodiment, the sidewall of the planar semiconductor spacer layer 34L can be perpendicular to the direction of gate electrodes to be patterned in a second field effect transistor region (300, 400). For example, the sidewall of the planar semiconductor spacer layer 34L can be parallel to the first horizontal direction hd1.

Referring to FIGS. 29A-29F, the processing steps of FIGS. 8A-8F can be performed to deposit a conductive gate connection material layer (234L, 236L) directly on physically exposed top surfaces of the gate electrode material plates 24 and the trench isolation structure 8 and over the planar semiconductor spacer layer 34. In one embodiment, the conductive gate connection material layer (236L, 240L) may comprise a vertical stack including, from bottom to top, a semiconductor gate cap layer 236L including a heavily doped semiconductor material and an optional conductive gate cap layer 240L. The heavily doped semiconductor material may include a doped semiconductor material such as polysilicon, and can have a same type of doping as an underlying gate electrode material plate 24. If multiple gate electrode material plates 24 having different conductivity types are employed, different portions of the semiconductor gate cap layer 236L may be doped with electrical dopants of different conductivity types to match the conductivity type of a respective underlying gate electrode material plate 24. The thickness of the semiconductor gate cap layer 236L may be in a range from 30 nm to 300 nm, such as from 40 nm to 100 nm, although lesser and greater thicknesses may also be employed. The conductive gate cap layer 240L can have the same material composition and the same thickness range as the conductive gate cap layer 40 in the first exemplary structure. The conductive gate cap layer 240L may comprise a metal silicide layer. Alternatively, the conductive gate cap layer 240L may be omitted at this step and then formed in subsequent steps by silicidiation of upper surfaces of gate electrodes. Optionally, a gate cap dielectric layer (not shown) may be subsequently deposited over the conductive gate cap layer 240L. The gate cap dielectric layer includes a dielectric material such as silicon nitride. The thickness of the gate cap dielectric layer, if present, can be in a range from 20 nm to 100 nm, such as from 30 nm to 50 nm, although lesser and greater thicknesses may also be employed.

Figure 30A:
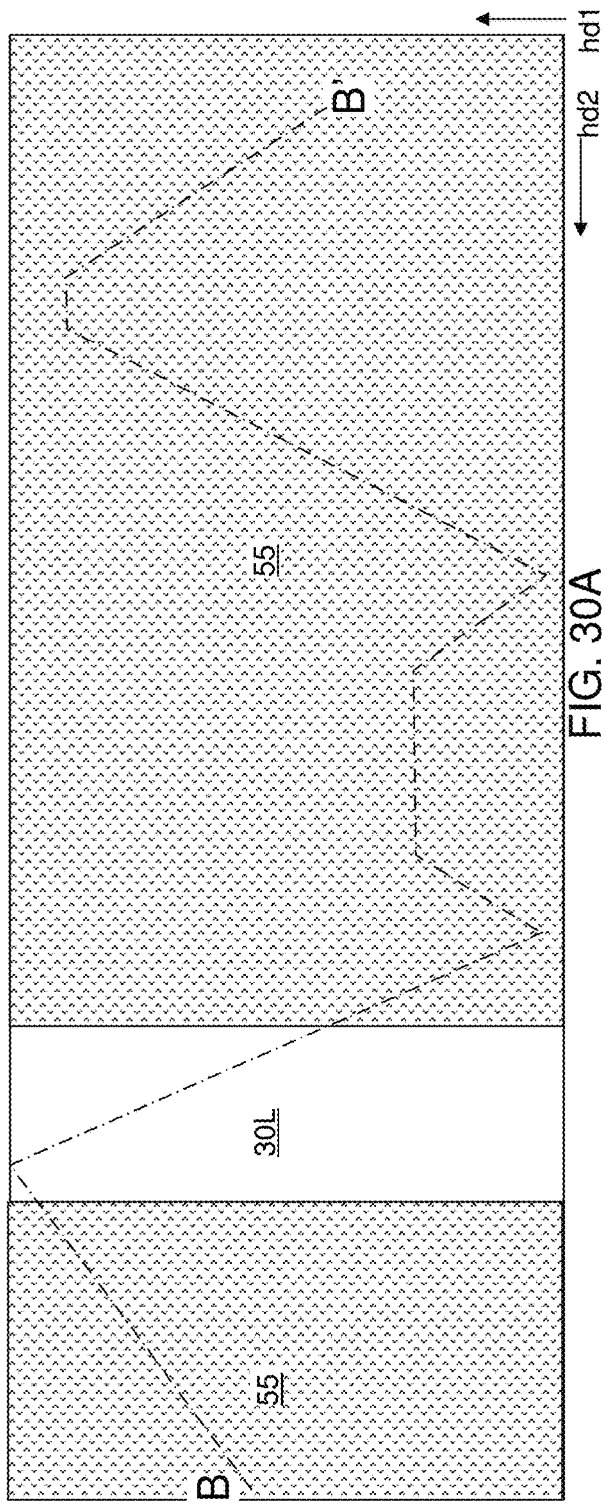
FIG. 30A is a top-down view of the third exemplary structure after patterning the conductive gate cap layer and the upper semiconductor gate material layer according to the third embodiment of the present disclosure.
Figure 30B:
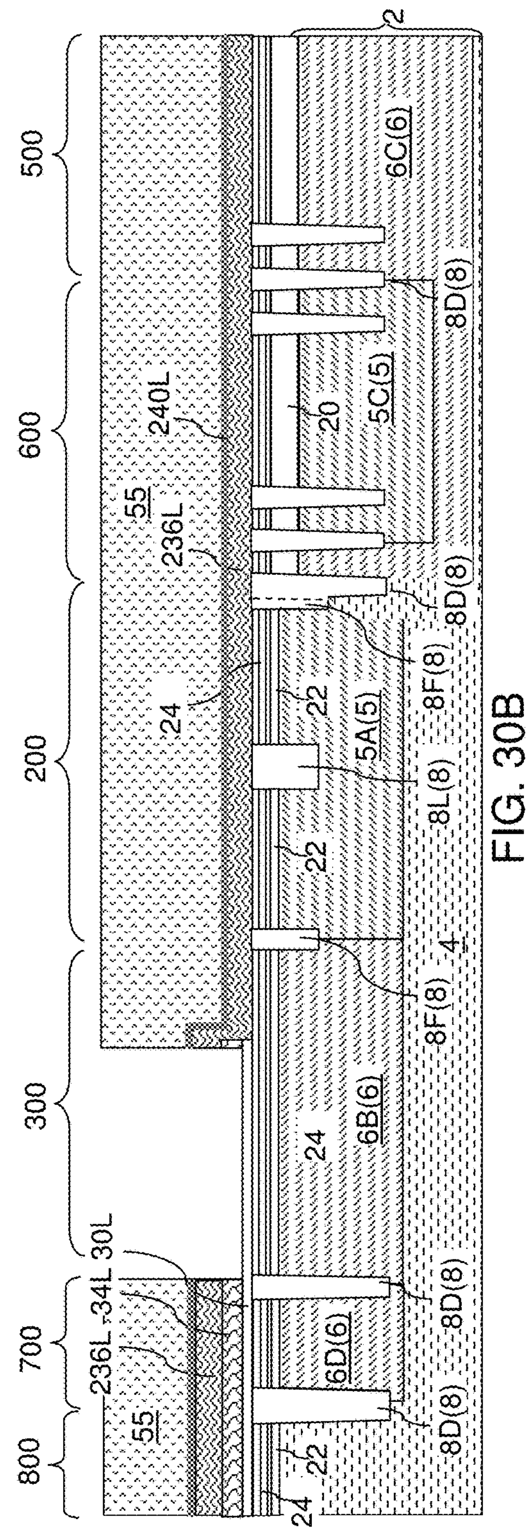
FIG. 30B is a vertical cross-sectional view of the third exemplary structure along the hinged vertical plane B-B' of FIG. 30A.

Referring to FIGS. 30A and 30B, a first photoresist layer 55 can be applied over the third exemplary structure, and can be lithographically patterned to form discrete patterned photoresist material portions. The patterned portions of the first photoresist layer 55 can include an opening in a second field effect transistor region (300 and/or 400). A first anisotropic etch process can be performed to transfer the pattern in the first photoresist layer 55 through the optional gate cap dielectric layer (if present), the conductive gate cap layer 240L, the semiconductor gate cap layer 236L, and the planar semiconductor spacer layer 34L. The first anisotropic etch process may be selective to the dielectric material of the planar dielectric spacer layer 30L.

Figure 31A:
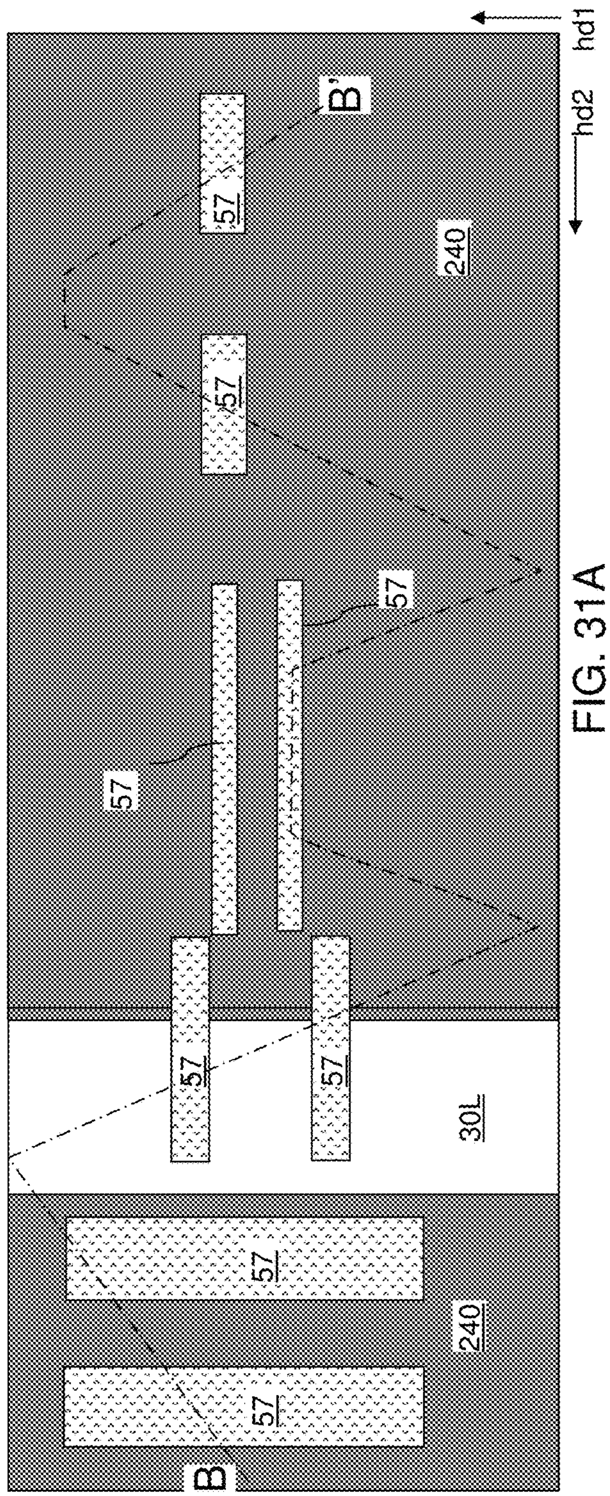
FIG. 31A is a top-down view of the third exemplary structure after applying and patterning a photoresist layer for patterning the planar semiconductor spacer layer and the lower semiconductor gate material layers according to the third embodiment of the present disclosure.
Figure 31B:
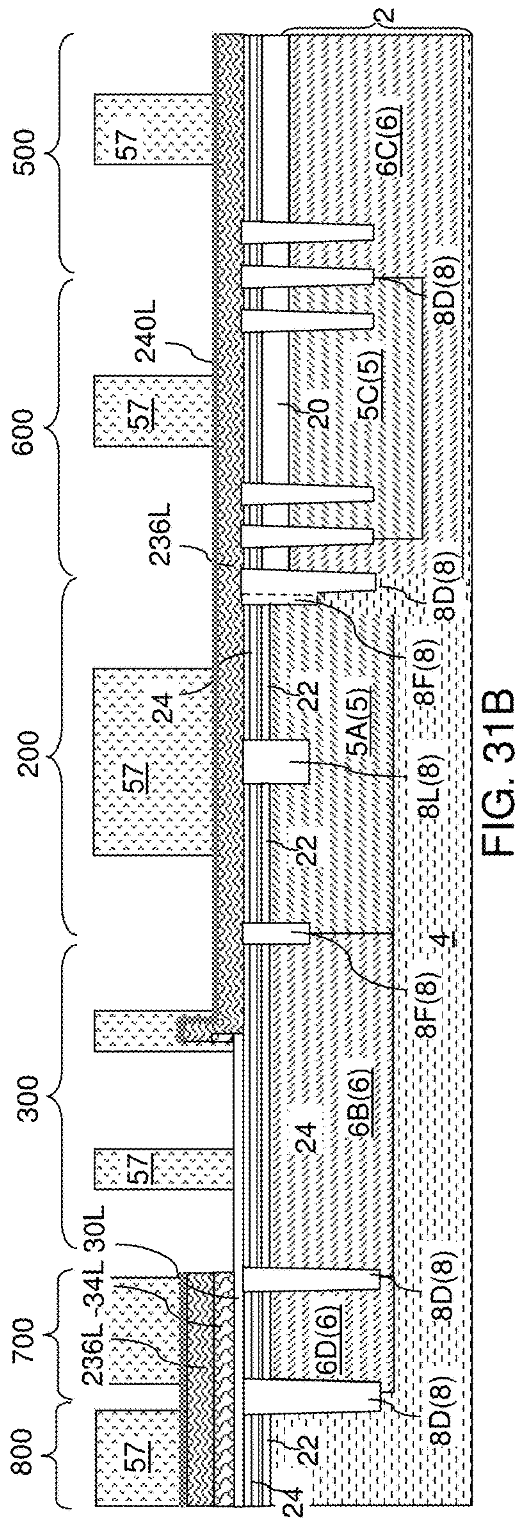
FIG. 31B is a vertical cross-sectional view of the third exemplary structure along the hinged vertical plane B-B' of FIG. 31A.

Referring to FIGS. 31A and 31B, a second photoresist layer 57 can be applied over the third exemplary structure, and can be lithographically patterned to provide patterned photoresist material portions having the shapes of gate electrodes and passive devices to be subsequently formed. The shapes of the patterned portions of the second photoresist layer 57 may be selected as needed. In one embodiment, a patterned portions of the second photoresist layer 57 may have extend across an edge of the planar semiconductor spacer layer 34L and across an edge of a portion of the conductive gate connection material layer (234L, 240L) that overlies a peripheral portion of the planar semiconductor spacer layer 34L within a second field effect transistor region (300 and/or 400).

Referring to FIGS. 32A-32D, a second anisotropic etch process can be performed to transfer the pattern of the second photoresist layer 57 through the dielectric gate cap layer (if present), the conductive gate connection material layer (234L, 240L), the planar semiconductor spacer layer 34L, the planar dielectric spacer layer 30L, the gate electrode material plates 24, and the gate dielectric plates 22. Each patterned portion of the conductive gate cap layer 240L constitutes a conductive gate cap structures 240. Each patterned portion of the semiconductor gate cap layer 236L constitutes a semiconductor gate cap structure 236. Each patterned portion of the planar semiconductor spacer layer 34L constitutes a planar semiconductor spacer plate 34. Each patterned portion of the planar dielectric spacer layer 30L constitutes a planar dielectric spacer plate 30. Each patterned portion of the gate electrode material plates 24 constitutes a gate electrode 14. Each patterned portion of the gate dielectric plates 22 constitutes a gate dielectric 12. The terminal portion of the second anisotropic etch process may be selective to the to the semiconductor material of the semiconductor substrate 2. The second photoresist layer 57 can be subsequently removed, for example, by ashing.

A stack of a first gate dielectric 12 and a first gate electrode 14 overlies a first channel region within the first active region 51 in a first field effect transistor region (100 or 200) and contacts a first sidewall of the laterally-extending portion 8F of the trench isolation structure 8. A stack of a second gate dielectric 12 and a second gate electrode 14 overlies a second channel region within the second active region 52 and contacts a second sidewall of the laterally-extending portion 8F of the trench isolation structure 8. A first conductive gate connection structure comprising the semiconductor gate cap structure 236 and the conductive gate cap structure 240 contacts a top surface of the first gate electrode 14, a top surface of the second gate electrode 14, and a portion of a top surface of the laterally-extending portion 8F of the trench isolation structure 8. The first conductive gate connection structure comprising the first conductive gate cap structure 240 comprises a pair of widthwise sidewalls that laterally extend along a first horizontal direction hd1 and a pair of lengthwise sidewalls that laterally extend along a second horizontal direction hd2. An entirety of a top surface of the first gate electrode 14 and an entirety of a top surface of the second gate electrode 14 contact a bottom surface of the conductive gate connection structure (236, 240), such as the bottom surface of the semiconductor gate cap structure 236.

Figure 32A:
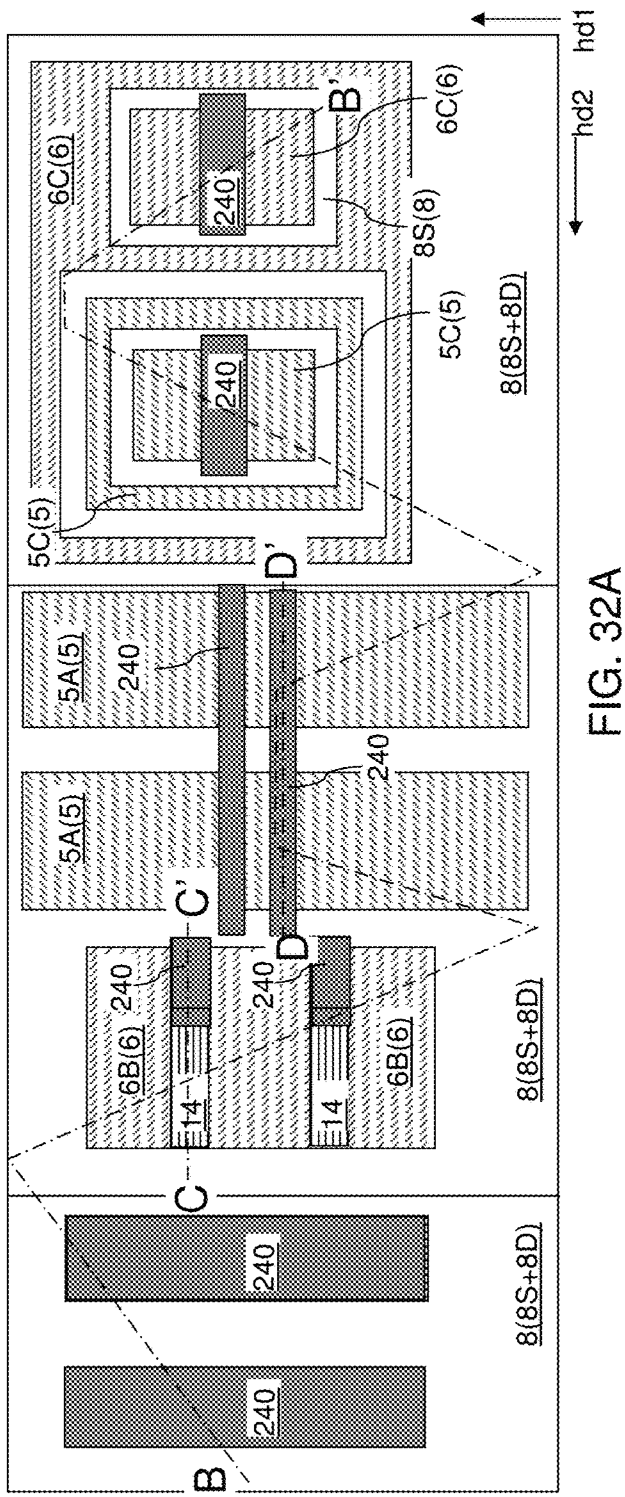
FIG. 32A is a top-down view of the third exemplary structure after applying and patterning the planar semiconductor spacer layer and the lower semiconductor gate material layers according to the third embodiment of the present disclosure.
Figure 32B:
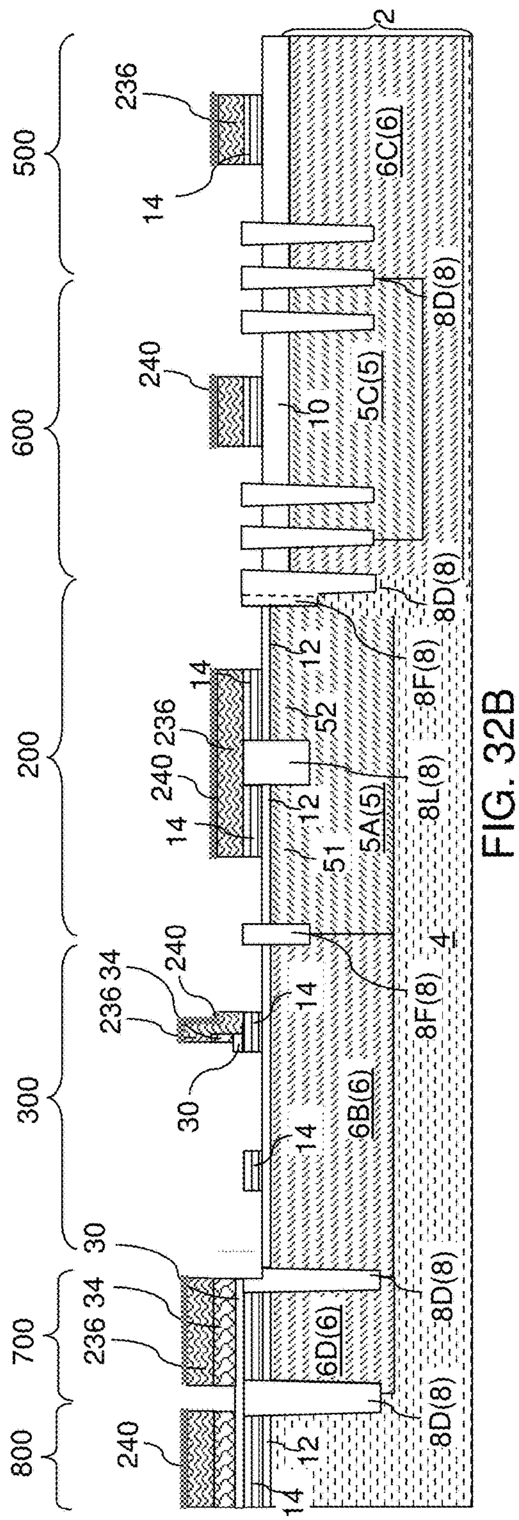
FIG. 32B is a vertical cross-sectional view of the third exemplary structure along the hinged vertical plane B-B' of FIG. 32A.
Figure 32D:
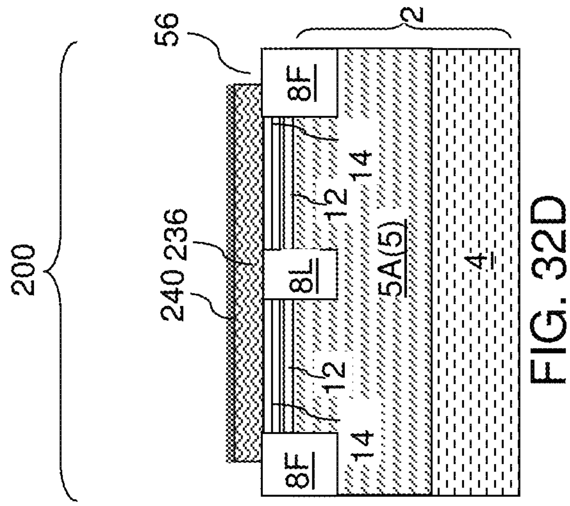
FIG. 32D is a vertical cross-sectional view of the third exemplary structure along the vertical plane D-D' of FIG. 32A.
Figure 32C:
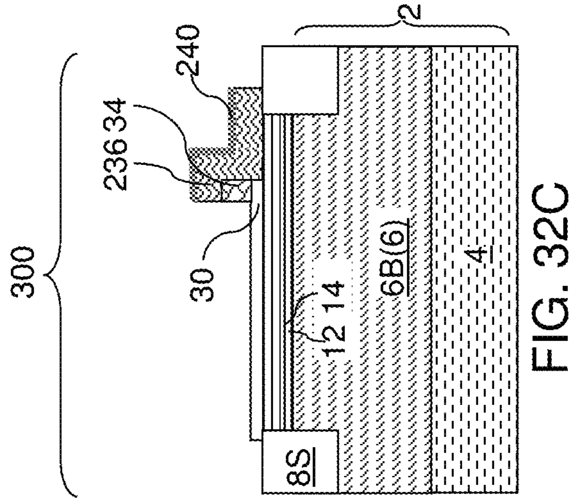
FIG. 32C is a vertical cross-sectional view of the third exemplary structure along the vertical plane C-C' of FIG. 32A.

The trench isolation structure 8 comprises a frame portion 8F that laterally surrounds the first active region 51 and the second active region 52 continuously. The first conductive gate connection structure comprising as a stack of a semiconductor gate cap structure 236 and a conductive gate cap structure 240 comprises a first end portion and a third end portion that overlies and contacts a respective segment of a top surface of the frame portion 8F of the trench isolation structure 8, as shown in FIG. 32A. Lengthwise sidewalls of the first gate electrode 14 and the second gate electrode 14 are vertically coincident with the pair of lengthwise sidewalls of the first conductive gate connection structure that laterally extend along the second horizontal direction hd2.

A first widthwise sidewall (extending along the first horizontal direction hd1) of the first gate dielectric 12 and a first widthwise sidewall (extending along the first horizontal direction hd1) of the first gate electrode 14 are vertically coincident with each other and contact a first sidewall of the laterally-extending portion 8L of the trench isolation structure 8. A first widthwise sidewall (extending along the first horizontal direction hd1) of the second gate dielectric 12 and a first widthwise sidewall (extending along the first horizontal direction hd1) of the second gate electrode 14 are vertically coincident with each other and contact a second sidewall of the laterally-extending portion 8L of the trench isolation structure 8.

A second widthwise sidewall (extending along the first horizontal direction hd1) of the first gate dielectric 12 and a second widthwise sidewall (extending along the first horizontal direction hd1) of the first gate electrode 14 are vertically coincident with each other and contact a first sidewall of the frame portion 8F of the trench isolation structure 8. A second widthwise sidewall (extending along the first horizontal direction hd1) of the second gate dielectric 12 and a second widthwise sidewall (extending along the first horizontal direction hd1) of the second gate electrode 14 are vertically coincident with each other and contact a second sidewall of the frame portion 8F of the trench isolation structure 8.

In one embodiment, the first conductive gate connection structure comprises a metallic gate connection structure includes the conductive gate cap structure 240 having a uniform thickness over the entirety of the first gate electrode 14 (which includes a predominant segment of the first gate electrode 14), over the laterally-extending portion 8L of the trench isolation structure 8, and over the entirety of the second gate electrode 14.

In one embodiment, the first conductive gate connection structure further comprises a semiconductor gate connection structure comprising the semiconductor gate cap structure 236 having a uniform thickness throughout and contacting top surfaces of the first gate electrode 14, the laterally-extending portion of the trench isolation structure 8L, and the second gate electrode 14. In one embodiment, the first conductive gate connection structure also comprises a metallic gate connection structure comprising the conductive gate cap structure 240 contacting an entirety of a top surface of the semiconductor gate connection structure and having a same area as the semiconductor gate structure.

According to an aspect of the present disclosure, second conductive gate connection structure can be provided within the second field effect transistor region (300 and/or 400). The second conductive gate connection structure comprises a stack of a second semiconductor gate cap structure 236 and a second conductive gate cap structure 240. The second semiconductor gate cap structure 236 comprises a first segment that contacts portion of the top surface of an underlying gate electrode 14; a second segment that overlies a planar dielectric spacer plate 34; and a connecting segment that contacts a first sidewall of the planar dielectric spacer plate 34 and connecting the first segment and the second segment.

Figure 33A:
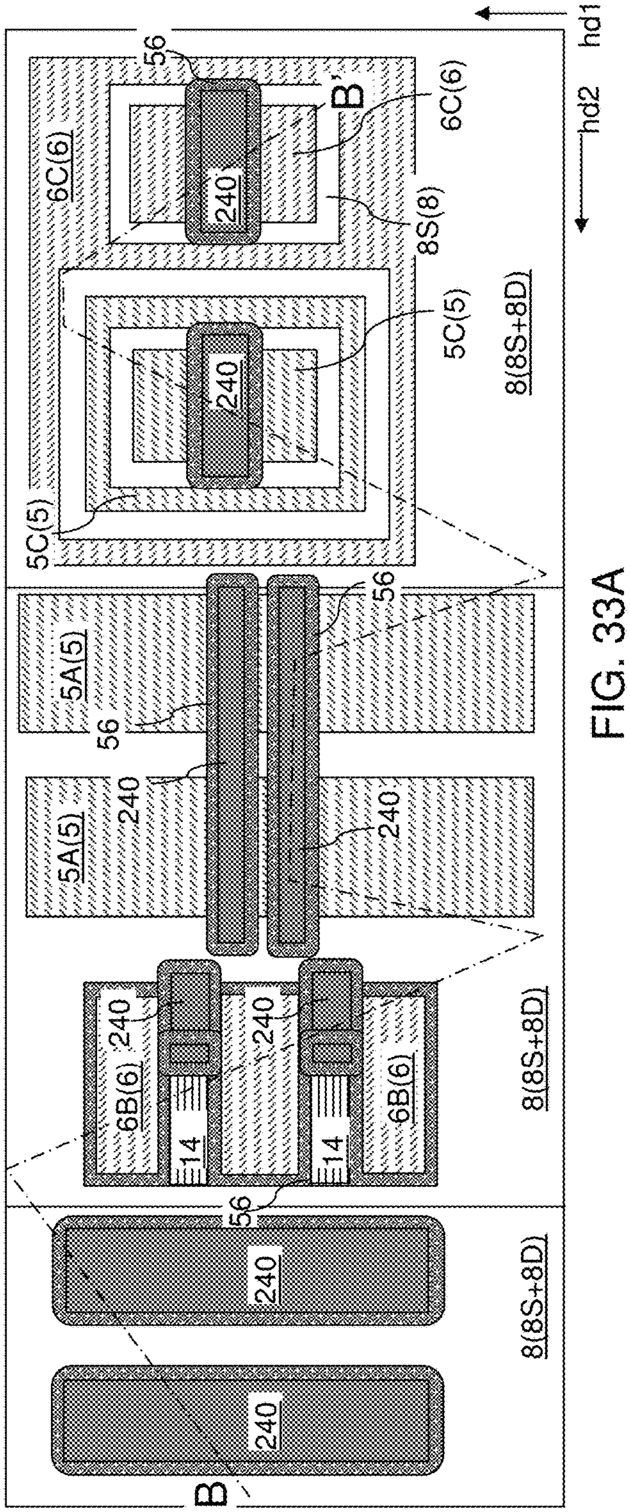
FIG. 33A is a top-down view of the third exemplary structure after formation of dielectric gate spacers according to the third embodiment of the present disclosure.
Figure 33B:
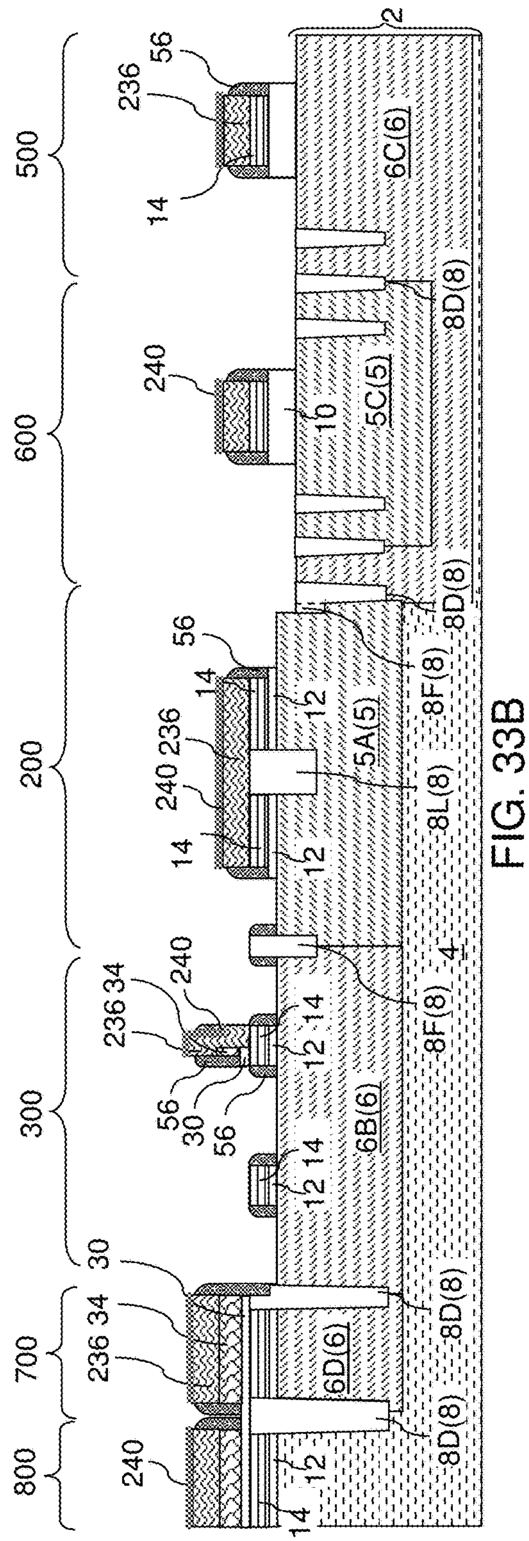
FIG. 33B is a vertical cross-sectional view of the third exemplary structure along the hinged vertical plane B-B' of FIG. 33A.
Figure 34A:
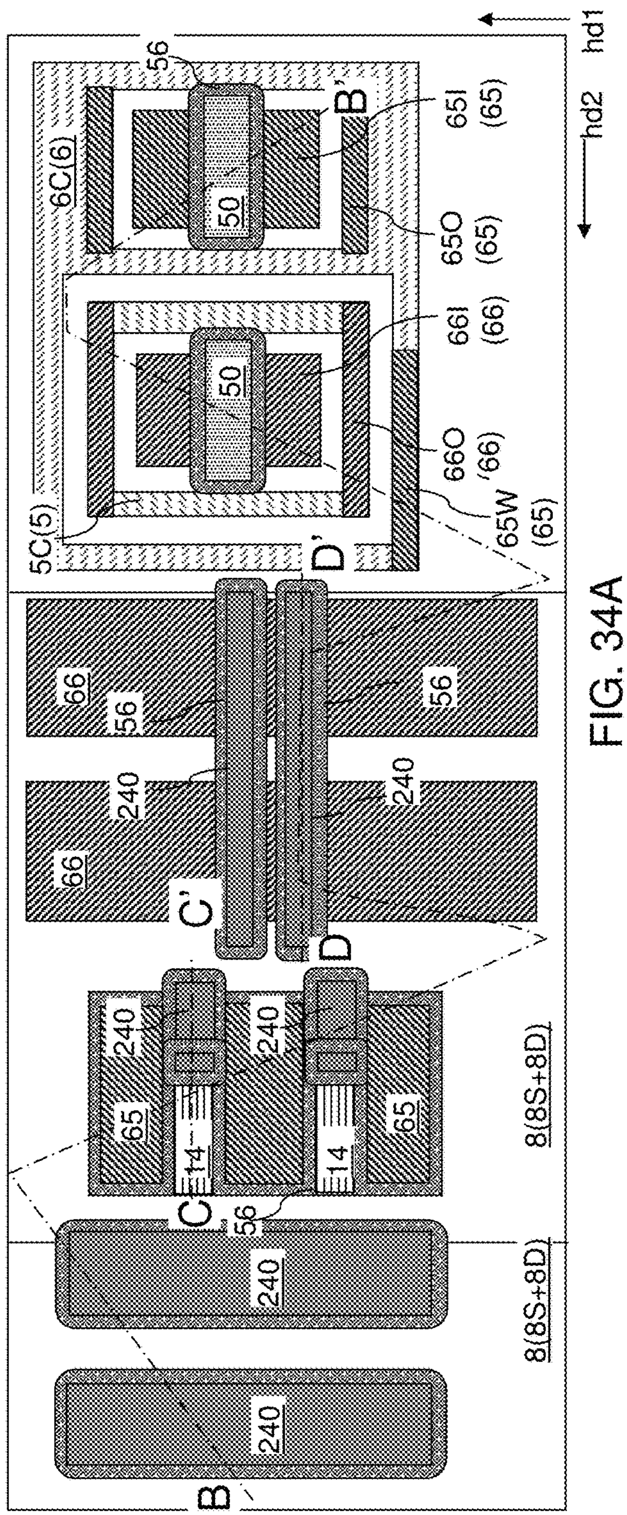
FIG. 34A is a top-down view of the third exemplary structure after formation of source regions and drain regions according to the third embodiment of the present disclosure.
Figure 34B:
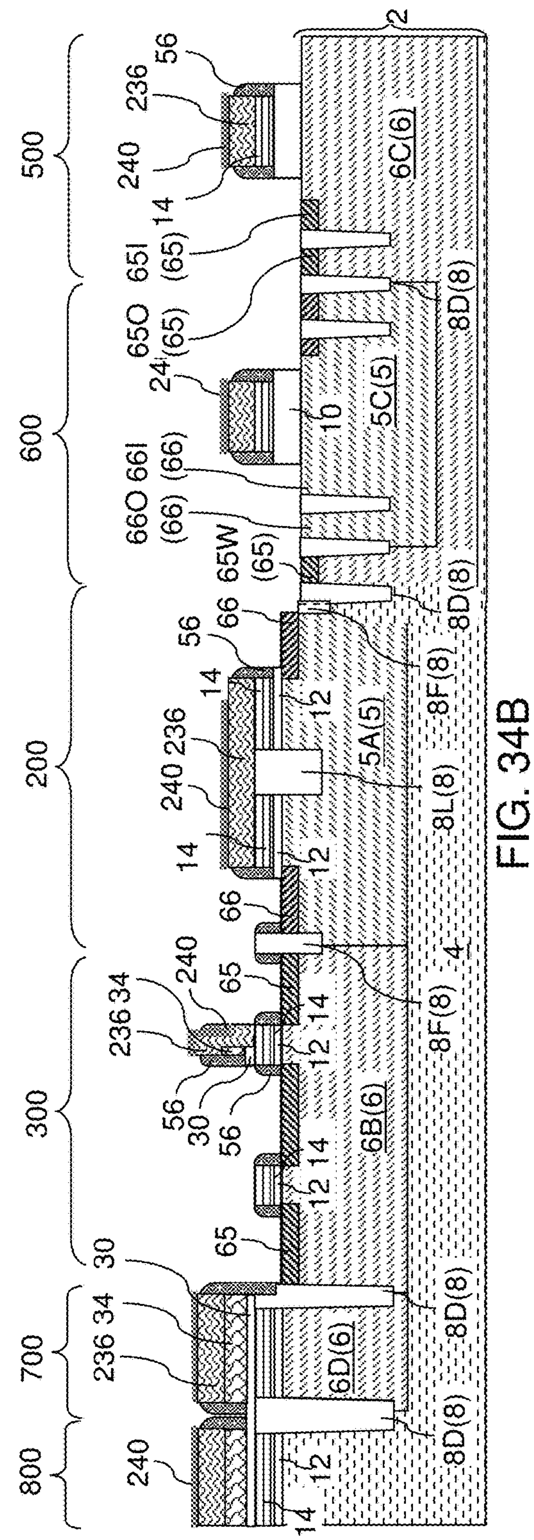
FIG. 34B is a vertical cross-sectional view of the third exemplary structure along the hinged vertical plane B-B' of FIG. 34A.
Figure 34D:
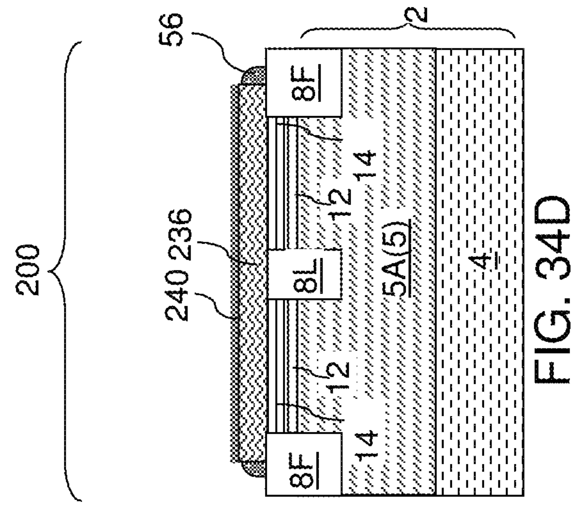
FIG. 34D is a vertical cross-sectional view of the third exemplary structure along the vertical plane D-D' of FIG. 34A.
Figure 34C:
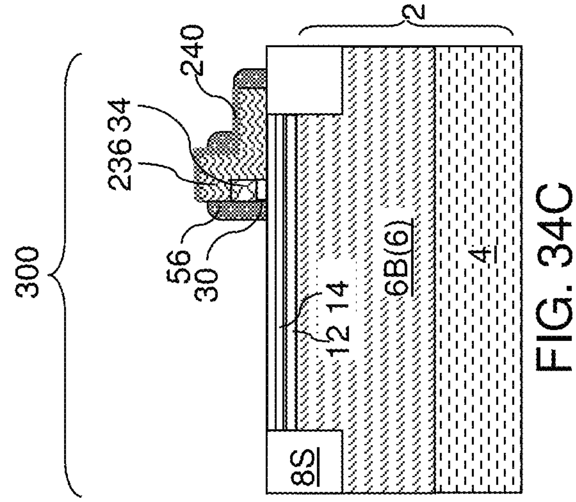
FIG. 34C is a vertical cross-sectional view of the third exemplary structure along the vertical plane C-C' of FIG. 34A.

Referring to FIGS. 33A and 33B, source/drain extension regions (not shown) can be optionally formed by implantation of p-type dopants and n-type dopants employing a respective patterned implantation mask layer (such as a patterned photoresist layer) and a respective ion implantation process. A dielectric gate spacer material layer including a dielectric material can be deposited by a conformal deposition process such as a chemical vapor deposition process. The dielectric material of the dielectric gate spacer material layer may include, for example, silicon nitride and/or silicon oxide. An anisotropic etch process can be performed to etch horizontally-extending portions of the dielectric gate spacer material layer. Remaining vertically-extending portions of the dielectric gate spacer material layer constitute dielectric gate spacers 56.

The anisotropic etch process may be extended to etch unmasked portions of the dielectric materials of the first gate dielectrics 12, the second gate dielectric plates 20 and the trench isolation structures 8 selective to the materials of the gate electrodes 14. The planar dielectric spacer plates 30 in the second field effect transistor regions (300, 400) can be collaterally etched during the anisotropic etch process. In this case, the second gate dielectric plates 20 in the third field effect transistor regions (500, 600) can be patterned into second gate dielectrics 10, and the physically exposed top surfaces of the trench isolation structures 8 can be vertically recessed. In one embodiment, an outer sidewall of each second gate dielectric 10 can be vertically coincident with an outer sidewall of a respective one of the gate dielectric spacers 56. In one embodiment, the recessed portions of the top surfaces of the trench isolation structure 8 may be at, or about, the height of the top surfaces of the third doped wells (5C, 6C) in the third field effect transistor regions (500, 600).

In one embodiment, a first dielectric gate spacer 56 located within a first field effect transistor region (100 or 200) comprises an upper portion laterally surrounding the conductive gate connection structure (comprising the stack of the semiconductor gate cap structure 236 and the conductive gate cap structure 240), and four lower portions vertically extending between a horizontal plane including a top surface of frame portion 8F of the trench isolation structure 8 and a horizontal plane including top surfaces of the first active region and the second active region and contacting a respective lengthwise sidewall of one of the first gate electrode 14 and the second gate electrode 14 and contacting a top surface of a respective one of the first active region and the second active region.

Referring to FIGS. 34A-34D, masked ion implantation processes can be performed to implant p-type dopants within unmasked surface portions of the n-type wells 6, and to implant n-type dopants within unmasked surface portions of the p-type wells 5. A combination of a patterned photoresist layer, the gate structures (12, 10, 14, 30, 34, 236, 240), and the dielectric gate spacers 56 can be employed as a composite implantation mask during each ion implantation process. Source regions and drain regions are formed within the implanted surface portions of the p-doped wells 5 and the n-doped wells 6. The source regions and the drain regions are collectively referred to as source/drain regions (65, 66), which include p-doped source/drain regions 65 that are formed within a respective one of the n-doped wells 6, and n-doped source/drain regions 66 that are formed within a respective one of the p-doped wells 5.

In one embodiment, configurations for increasing the breakdown voltage of field effect transistors may be employed in device regions in which high-voltage field effect transistors are formed such as the third field effect transistor regions (500, 600). In this case, the p-doped source/drain regions 65 may include inner p-doped source/drain regions 651 and outer p-doped source/drain regions 650 that are laterally spaced apart by an additional trench isolation structure 8, which may be disjoined from the trench isolation structure 8 in the first field effect transistor regions (100, 200). Further, the n-doped source/drain regions 66 may include inner n-doped source/drain regions 661 and outer n-doped source/drain regions 660 that are laterally spaced apart by another additional trench isolation structure 8. Optionally, a well contact source/drain region 65W may be employed to facilitate biasing of a doped well.

Figure 35A:
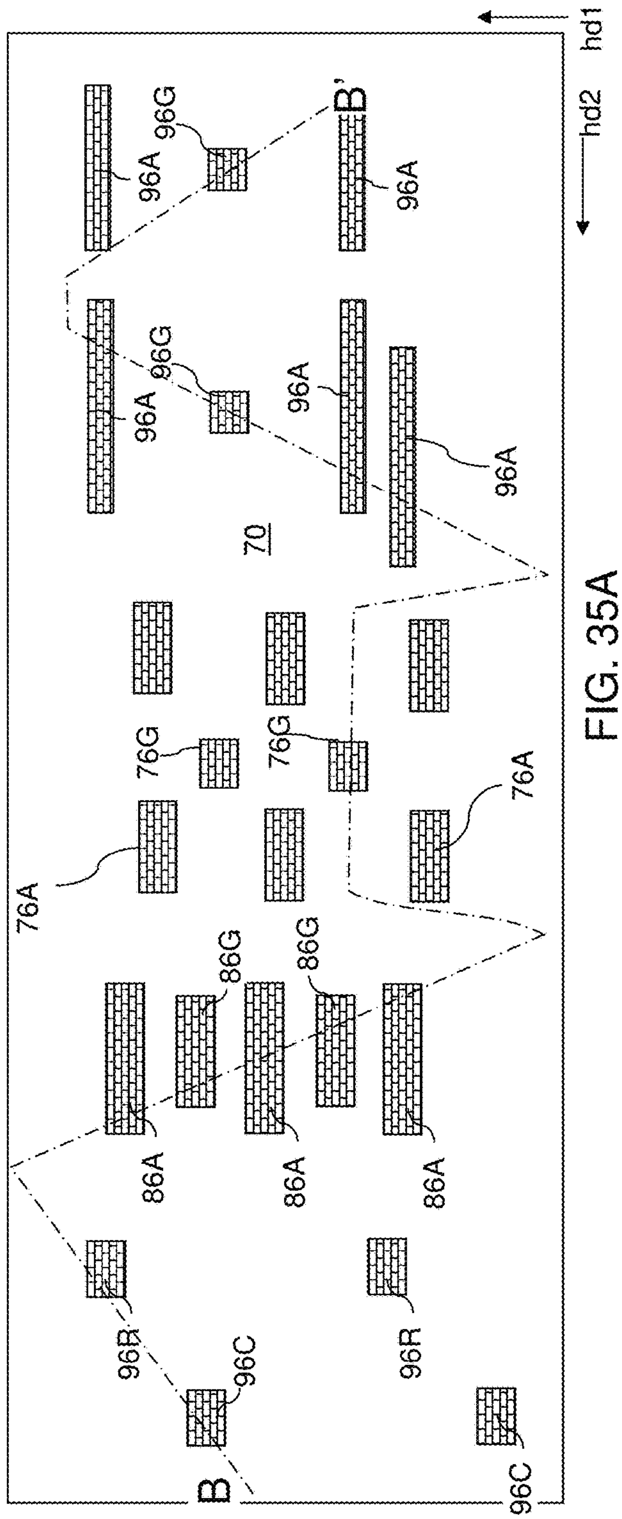
FIG. 35A is a top-down view of the third exemplary structure after formation of a contact-level dielectric layer and various contact via structures according to the third embodiment of the present disclosure.
Figure 35B:
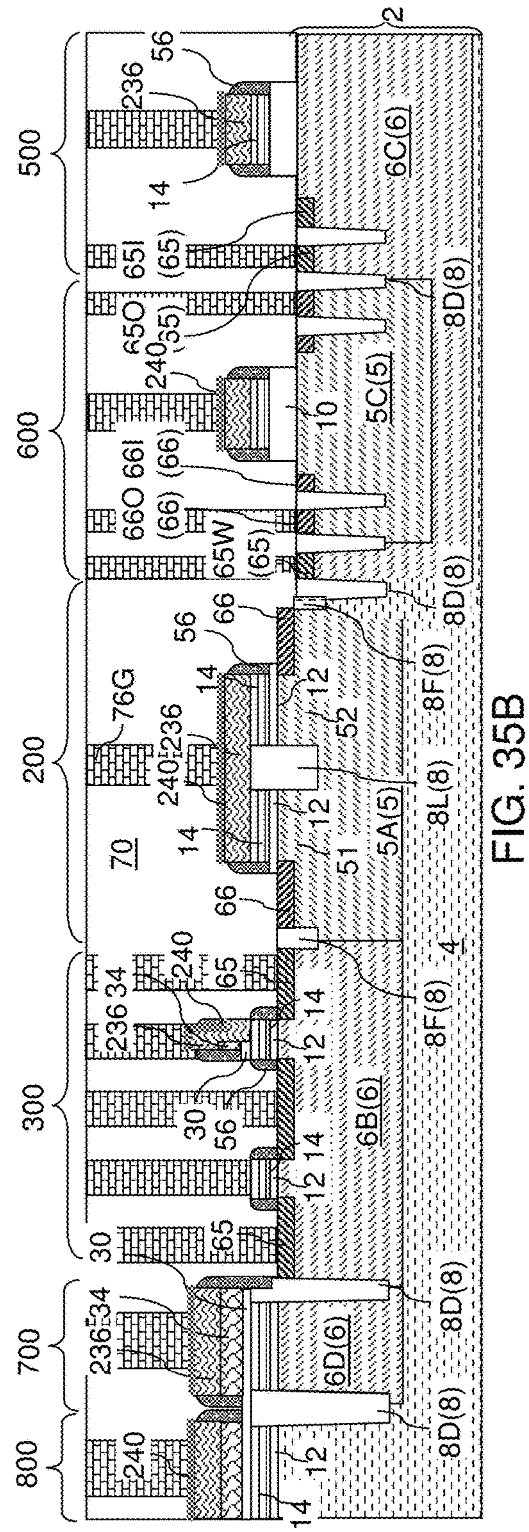
FIG. 35B is a vertical cross-sectional view of the third exemplary structure along the hinged vertical plane B-B' of FIG. 35A.

Referring to FIGS. 35A and 35B, a contact-level dielectric layer 70 and various contact via structures (76A, 76G, 86A, 86G, 96A, 96G, 96R, 96C) can be subsequently formed. The contact-level dielectric layer 70 includes a dielectric material such as silicon oxide, and can be formed by a conformal or non-conformal deposition process. The top surface of the contact-level dielectric layer 70 can be planarized by a planarization process such as a chemical mechanical polishing (CMP) process. The vertical distance between the topmost surfaces of the gate cap dielectrics 50 and the top surface of the contact-level dielectric layer 70 can be in a range from 30 nm to 500 nm, although lesser and greater vertical distances may also be employed.

The contact via structures (76A, 76G, 86A, 86G, 96A, 96G, 96R, 96C) comprise first source/drain region contact via structures 76A contacting source/drain regions (65, 66) within the first field effect transistor regions (100 or 200), first gate contact via structures 76G contacting top surfaces of conductive gate cap structures 240 within the first field effect transistor regions (100 or 200), second source/drain region contact via structures 86A contacting source/drain regions (65, 66) within the second field effect transistor regions (300 or 400), second gate contact via structures 86G contacting the second gate electrodes (25, 26), third source/drain region contact via structures 96A contacting source/drain regions (65, 66) within the third field effect transistor regions (500, 600), and third gate contact via structures 96G contacting top surfaces of conductive gate cap structures 240 within the third field effect transistor regions (500, 600). Further, the contact via structures (76A, 76G, 86A, 86G, 96A, 96G, 96R, 96C) can comprise first passive device contact via structures 96R that contact first passive devices such as resistors, and second passive device contact via structures 96C that contact second passive devices such as capacitors.

Generally, various field effect transistors having different gate dielectric thicknesses, different gate lengths (i.e., different lateral distances between a source region and a drain region), and different configurations can be formed in the various field effect transistor regions (100, 200, 300, 400, 500, 600). A dielectric gate spacer 56 may overlie a periphery region of a source/drain region (65, 66) of field effect transistors in the second field effect transistor regions (300 or 400), and contact sidewalls of a respective portion of the trench isolation structure 8.

The third exemplary structure can include a combination of a first field effect transistor and a second field effect transistor located in a first field effect transistor region (100 or 200). The first field effect transistor and the second field effect transistor comprise a first active region 51 and a second active region 52, respectively. The first active region and the second active region contact sidewalls of, and are laterally surrounded by, a trench isolation structure 8. A laterally-extending portion 8L of the trench isolation structure 8 is located between the first active region 51 and the second active region 52.

The third exemplary structure may comprise a third field effect transistor located in a second field effect transistor region (300 or 400). The third field effect transistor comprises: a third active region that is laterally surrounded by an additional portion of the trench isolation structure 8, a stack of a third gate dielectric 12 and a third gate electrode 14 having widthwise sidewalls contacting sidewalls of the additional portion of the trench isolation structure 8 and laterally extending along the first horizontal direction hd1, additional dielectric gate spacers 56 having a respective opening therethrough and contacting a respective subset of sidewalls of the additional portion of the trench isolation structure 8 and a respective lengthwise sidewall (which laterally extends along the second horizontal direction hd2) of the third gate electrode 14.

A portion of the top surface of third gate electrode 14 of the third field effect transistor can be contacted by the contact-level dielectric material layer 70. An additional conductive gate cap structure comprising a stack of a semiconductor gate cap structure 236 and a conductive gate cap structure 240 can contact another portion of the top surface of the third gate electrode 14. The additional conductive gate cap structure can comprise a same set of materials as the conductive gate connection structure in the first field effect transistor region (100 and/or 200). At least one gate contact structure (such as a first gate contact via structure 76G) can vertically extend through the contact-level dielectric layer 70 and can contact a top surface of a conductive gate connection structure (236, 240) in the first field effect transistor region (100 and/or 200), and at least one additional gate contact structure (such as a second gate contact via structure 86G) can vertically extend through the contact-level dielectric layer 70 and can contact a top surface of the additional conductive gate cap structure (236, 240).

The first gate electrode 14 and the second gate electrode 14 do not contact the contact-level dielectric layer 70, and are spaced from the contact-level dielectric layer 70 by a first dielectric gate spacer 56 and a conductive gate connection structure comprising the conductive gate cap structure 240). The third gate electrode 14 can have a same thickness as the first gate electrode 14 and the second gate electrode 14. A portion of a top surface of the third gate electrode 14 is in direct contact with the contact-level dielectric layer 70.

At least one gate contact structure (such as a first gate contact via structure 76G) extends through the contact-level dielectric layer 70 and contacts a top surface of the conductive gate connection structure comprising the conductive gate cap structure 240, and at least one additional gate contact structure (such as a second gate contact via structure 86G) extends through the contact-level dielectric layer 70 and contacts a portion of a top surface of the third gate electrode 14. An entirety of the top surface of the third gate electrode 14 is in contact with the at least one additional gate contact structure or the contact-level dielectric layer 70.

The third exemplary structure can comprise an additional field effect transistor such as a fourth field effect transistor formed in a third field effect transistor region (500 or 600). The additional field effect transistor comprises an additional active region having a pair of lengthwise sidewalls and a pair of widthwise sidewalls that contact sidewalls of, and are laterally surrounded by, an additional portion of the trench isolation structure 8. The additional field effect transistor comprises an additional gate structure (10, 14, 236, 240) overlies the additional active region. The additional gate structure (10, 14, 236, 240) can include an additional gate dielectric 10 having a greater thickness than the first gate dielectric 12, an additional gate electrode 14 (which may have a same thickness as the first gate electrode 14, an additional semiconductor gate cap structure 236 having a same thickness and a same material composition as the first semiconductor gate cap structures 236, and an additional conductive gate cap structure 240 having a same thickness and a same material composition as the first conductive gate cap structure 240. An entirety of a top surface of the additional gate electrode 14 is in contact with a bottom surface of the additional semiconductor gate cap structure 236.

In one embodiment, the third exemplary structure may comprise a passive device, which may be selected from a capacitor, a resistor, or any other passive device known in the art. The passive device comprises a layer stack including, from bottom to top, a first dielectric layer (such as another instance of a gate dielectric 12), a first semiconductor plate (such as a gate electrode 14), a second dielectric layer (such as a planar dielectric spacer plate 30), a second semiconductor plate (such as a planar semiconductor spacer plate 34), a third semiconductor plate (such as a semiconductor gate cap structure 236), and a metallic plate (such as a conductive gate cap structure 240). The first dielectric layer has a same material composition and a same thickness as the first gate dielectric 12. The first semiconductor plate may a same thickness as the first gate electrode 14. The second dielectric layer has a same material composition and a same thickness as the first planar dielectric spacer plate 30. The third semiconductor plate has the same material composition and the same thickness as the first semiconductor gate cap structure 236 in the first field effect transistor region (100 and/or 200). The metallic plate has a same material composition and a same thickness as the first conductive gate cap structure 240 in the first field effect transistor region (100 and/or 200).

Figure 36A:
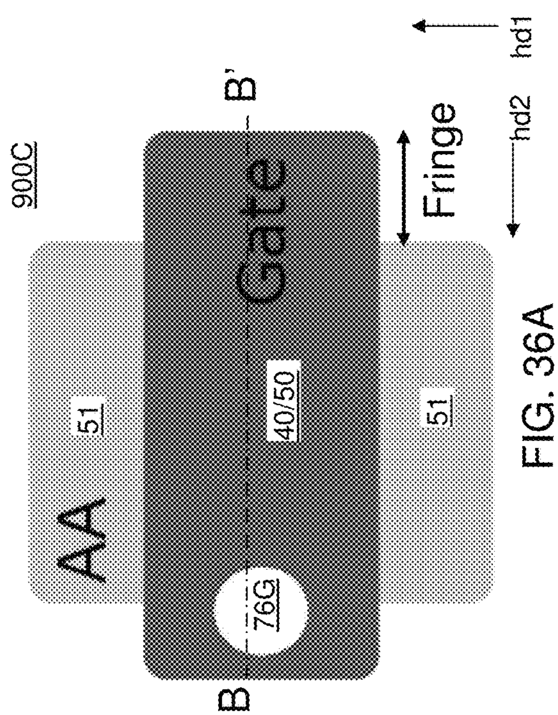
FIG. 36A is a top-down view of a comparative sense amplifier transistor structure.
Figure 36B:
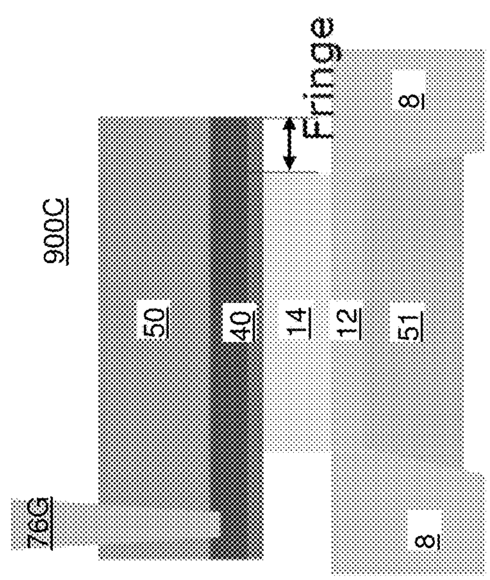
FIG. 36B is a vertical cross-sectional view of the comparative sense amplifier transistor structure along the vertical plane B-B' of FIG. 36A.

FIGS. 36A and 36B illustrate a comparative sense amplifier transistor 900C. The transistor 900C may be located in the sense amplifier region of the driver circuit. The gate electrode (40, 50) of the transistor 900C extends over the active region 51 in the second horizontal direction (e.g., transistor width direction) hd2. The second horizontal direction hd2 is perpendicular to the first horizontal direction (e.g., transistor length direction) hd1 which is parallel to the source to drain direction. The comparative sense amplifier transistor 900C includes fringe region in which the gate electrode (40, 50) extends past the active region 51 in the second horizontal direction hd2 and overlies a portion of the trench isolation region 8.

Figure 37A:
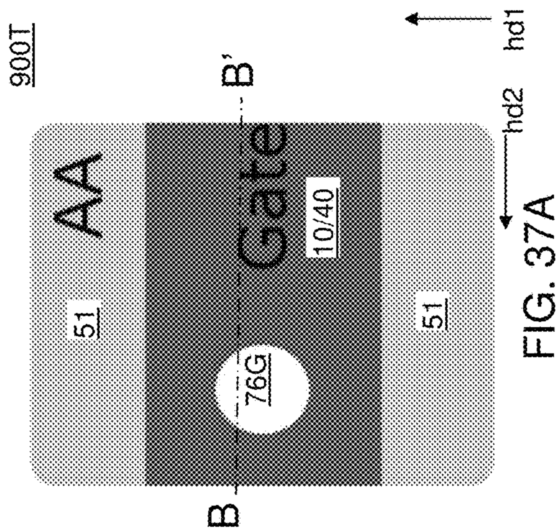
FIG. 37A is a top-down view of a fourth exemplary sense amplifier transistor structure according to the fourth embodiment of the present disclosure.
Figure 37B:
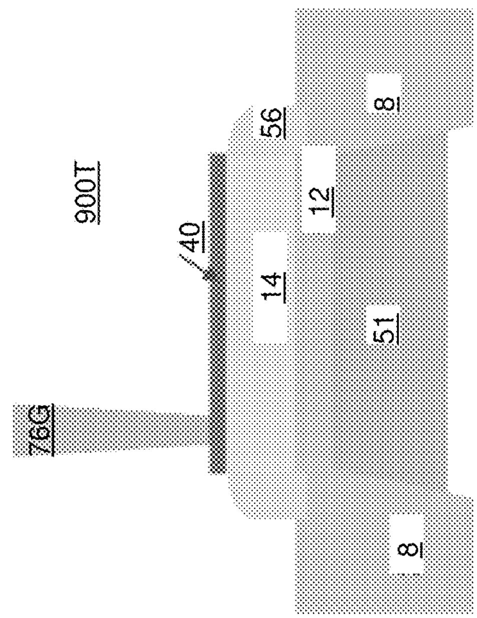
FIG. 37B is a vertical cross-sectional view of the fourth exemplary sense amplifier transistor structure along the vertical plane B-B' of FIG. 37A.

FIGS. 37A and 37B illustrate a fourth exemplary sense amplifier transistor 900T according to the fourth embodiment of the present disclosure. The gate cap dielectric 50 may be omitted in the transistor 900T, and the gate electrode may comprise a heavily doped polysilicon portion 14 and a conductive gate cap structure which comprises a self aligned silicide portion 40 located on the polysilicon portion 14. The transistor 900T does not include the fringe region in which the gate electrode (14, 40) extends past the active region 51 in the second horizontal direction hd2. Thus, the gate electrodes (14, 40) do not overlie a portion of the trench isolation region 8 and the entire foot print of the gate electrode (14, 40) is located over and within the lateral boundary of the active region 51. Thus, the gate electrode (14, 40) may be self aligned to the active region 51 and have a width that is substantially the same as the active region 51 width. The silicide portion 40 may act as a gate contact via structure 76G tap area. Alternatively, the conductive gate cap structure 40 may comprise a metal and/or metal nitride structure, such as a W/TiN/Ti structure.

Figure 38:
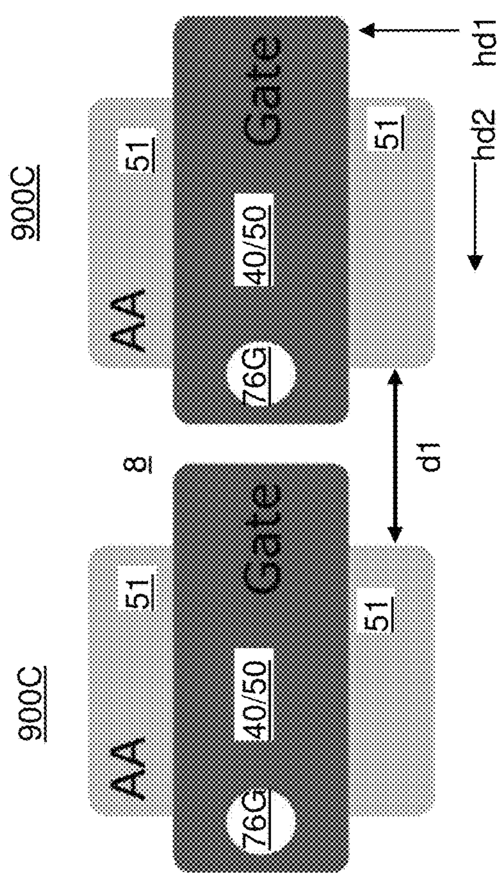
FIG. 38 is a top-down view of two adjacent comparative sense amplifier transistor structures of FIG. 36A.
Figure 39:
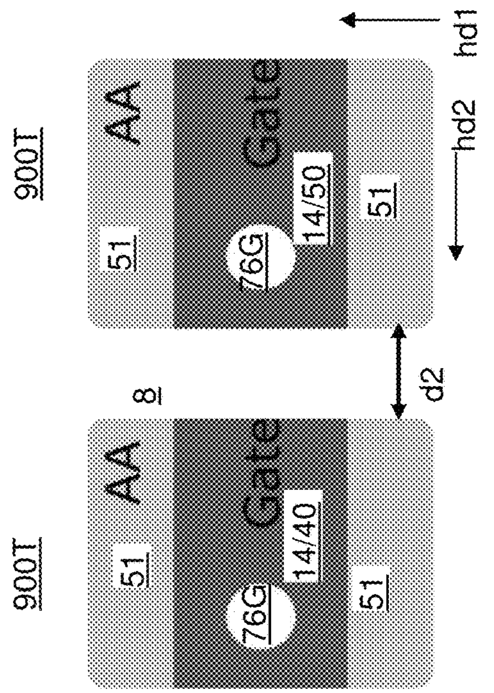
FIG. 39 is a top-down view of two adjacent fourth exemplary sense amplifier transistor structures of FIG. 37A according to the fourth embodiment of the present disclosure.

FIG. 38 is a top-down view of two adjacent comparative sense amplifier transistors 900C of FIG. 36A, and FIG. 39 is a top-down view of two adjacent fourth exemplary sense amplifier transistors 900T of FIG. 37A according to the fourth embodiment of the present disclosure. Due to the fringe region in the transistor 900C, the distance d1 along the second horizontal direction hd2 between the active regions 51 of adjacent transistors 900C is longer than the distance d2 along the second horizontal direction hd2 between the active regions 51 of adjacent transistors 900T. Therefore, the fringeless transistors 900T may be formed closer to each other and take up less chip space than the comparative transistors 900C. Thus, the overall chip size may be reduced.

Figure 40A:
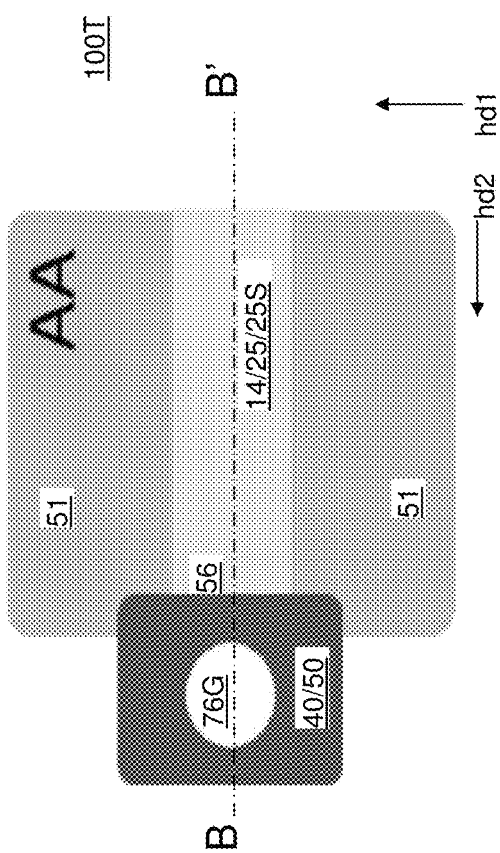
FIG. 40A is a top-down view of a first exemplary transistor structure according to the first embodiment of the present disclosure.
Figure 40B:
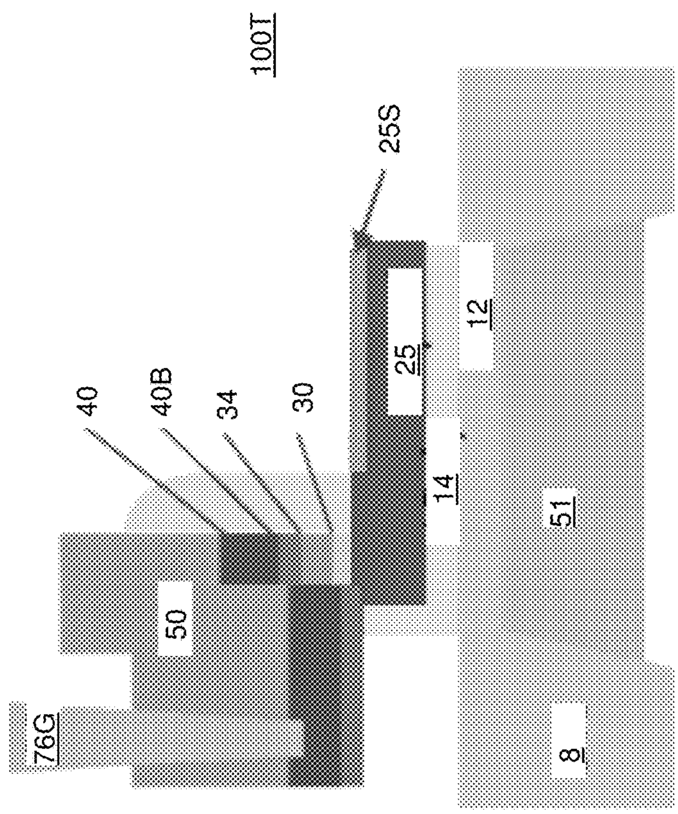
FIG. 40B is a vertical cross-sectional view of the first exemplary transistor structure along the vertical plane B-B' of FIG. 40A.

FIGS. 40A and 40B illustrate a first exemplary transistor 100T according to the first embodiment of the present disclosure. The transistor 100T may be located in the low or very low voltage transistor regions (100, 200, 300 or 400) of the peripheral circuit. For example, the transistor 100T may be located in region 100 of FIGS. 14A and 14B. The transistor 100T is also fringeless and lacks the above described fringe region.

Figure 42:
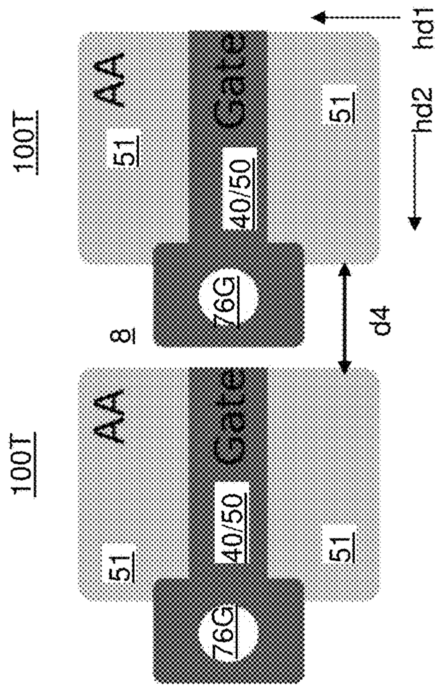
FIG. 42 is a top-down view of two adjacent first exemplary transistor structures according to the first embodiment of the present disclosure.
Figure 41:
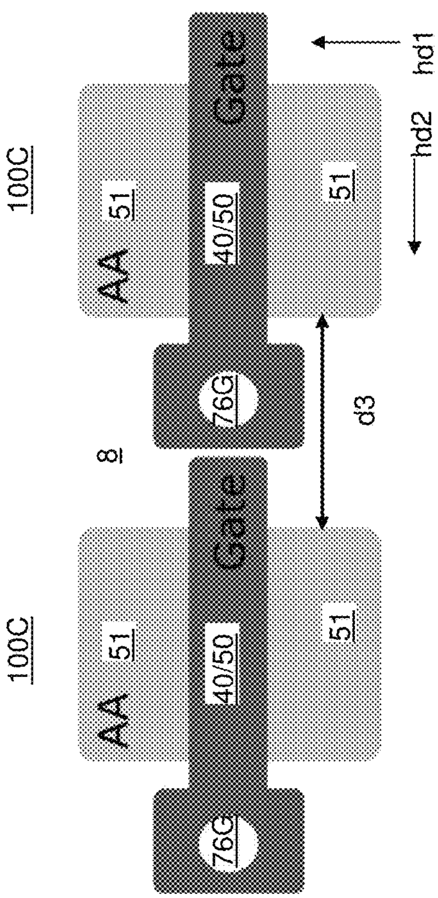
FIG. 41 is a top-down view of two adjacent comparative transistor structures.

FIG. 41 is a top-down view of two adjacent comparative transistors 100C which contain the above described fringe region in which the gate electrode (40, 50) extends past the back side boundary of the active region 51. FIG. 42 is a top-down view of two adjacent first exemplary transistors 100T of FIG. 40A which lack the fringe region on the back side of the active region 51. Due to the fringe region in the transistor 100C, the distance d3 along the second horizontal direction hd2 between the active regions 51 of adjacent transistors 100C is longer than the distance d4 along the second horizontal direction hd2 between the active regions 51 of adjacent transistors 100T. Therefore, the embodiment transistors 100T may be formed closer to each other and take up less chip space than the comparative transistors 100C. Thus, the overall chip size may be reduced.

Figure 43:
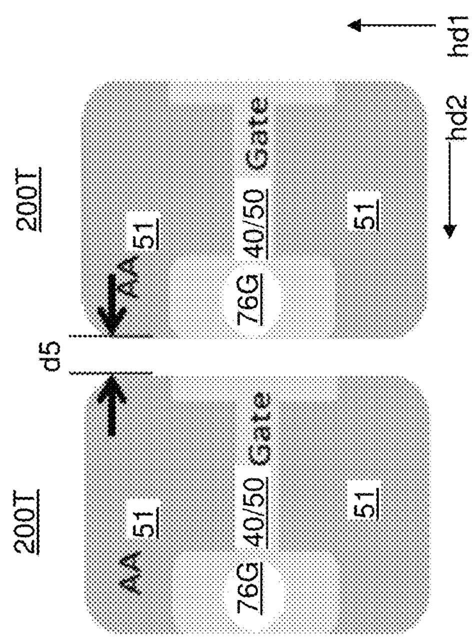
FIG. 43 is a top-down view of two adjacent second exemplary transistor structures according to the second embodiment of the present disclosure.
Figure 45A:
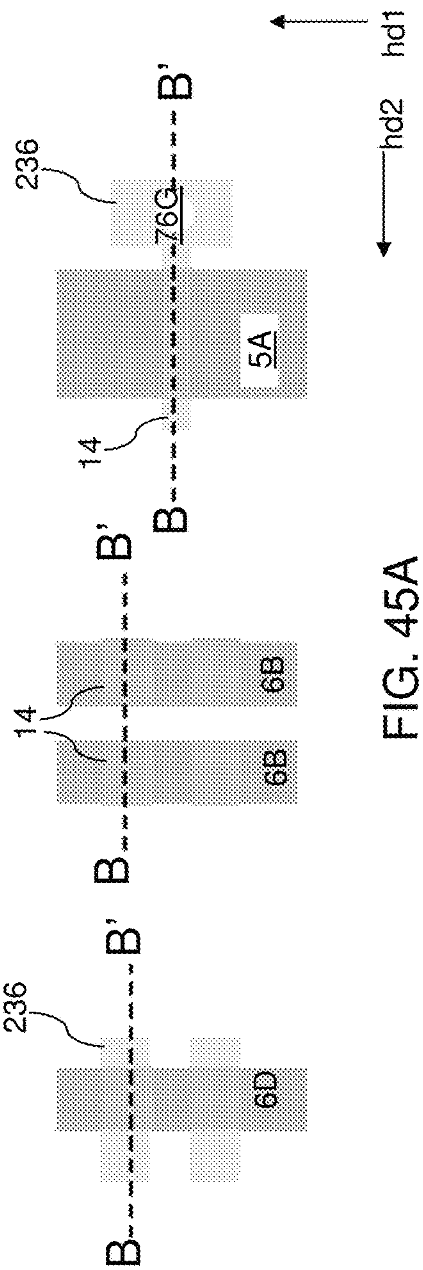
FIG. 45A is a top-down view of third exemplary transistor structures according to the third embodiment of the present disclosure.
Figure 45B:
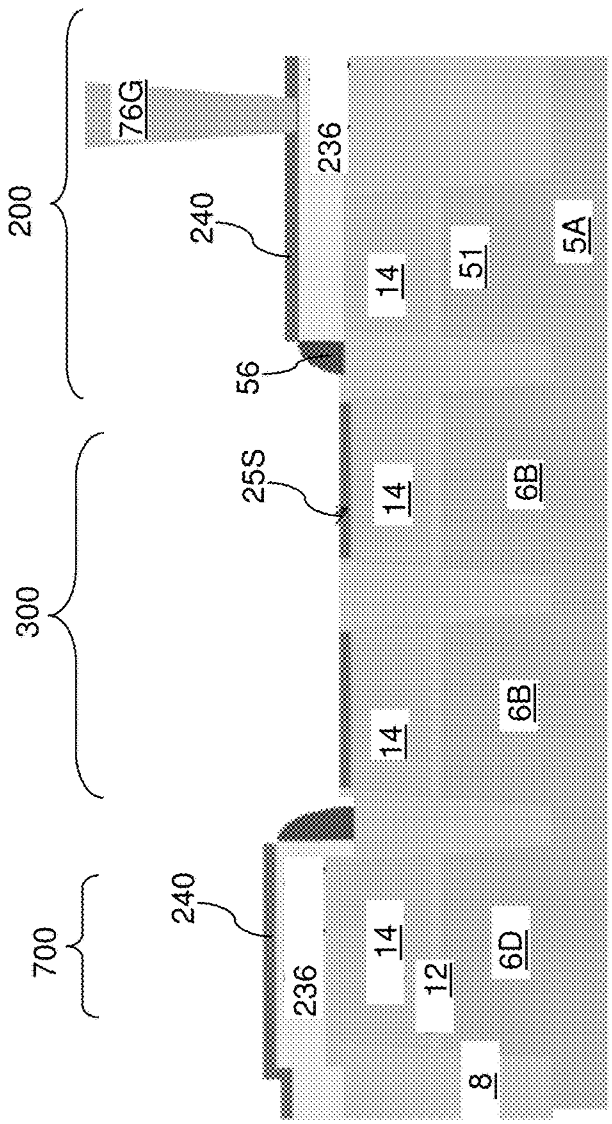
FIG. 45B is a vertical cross-sectional view of the third exemplary transistor structures along the vertical plane B-B' of FIG. 45A.

FIG. 43 is a top-down view of two adjacent second exemplary transistors 200T according to the second embodiment of the present disclosure. The second exemplary transistors 200T may be located in the low or very low voltage transistor region 200 of FIGS. 25A and 25B. The transistors 200T are fringeless and lack fringe regions on front and back sides of the active region 51. The gate electrode (40, 50) is located above and entirely within the boundaries (i.e., footprint) of the active region 51. Therefore, the fringeless transistors 200T may be formed even closer to each other than transistors 100T, and the distance d5 along the second horizontal direction hd2 between the active regions 51 of adjacent transistors 200C is even shorter longer than the distance d4 along the second horizontal direction hd2 between the active regions 51 of adjacent transistors 100T. Therefore, the embodiment transistors 200T may be formed even closer to each other and take up even less chip space.

Figure 44:
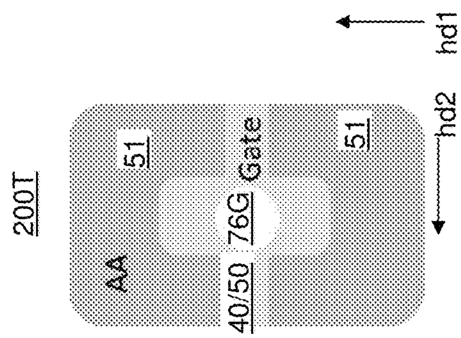
FIG. 44 is a top-down view of an alternative configuration of the second exemplary transistor structure according to the second embodiment of the present disclosure.

FIG. 44 is a top-down view of an alternative configuration of the second exemplary transistor 200T according to the second embodiment of the present disclosure. In the configuration of FIG. 44, the first gate contact via structures 76G may be located closer to the middle of the underlying gate electrode (40, 50), than to the edge of the underlying gate electrode (40, 50) as shown in FIG. 43. This configuration reduces the risk of misalignment between the contact pad area of the underlying gate electrode (40, 50) and the first gate contact via structures 76G.

Figure 46B:
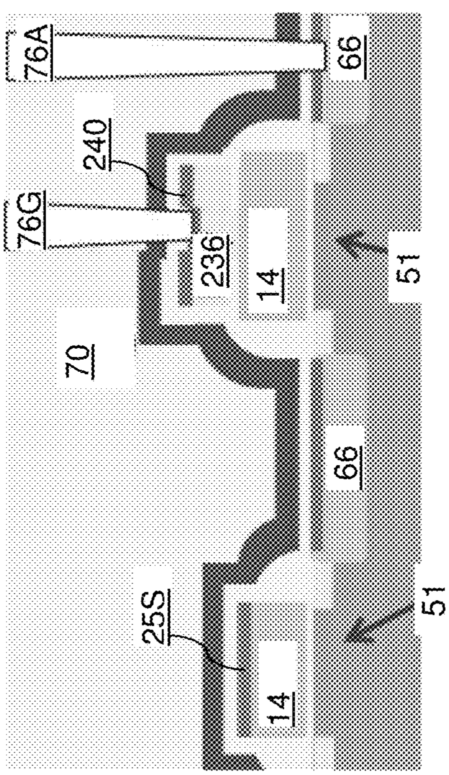
FIGS. 46B and 46C are vertical cross-sectional views of the third exemplary transistor structures along the vertical planes B-B' and C-C', respectively, of FIG. 46A.
Figure 46C:
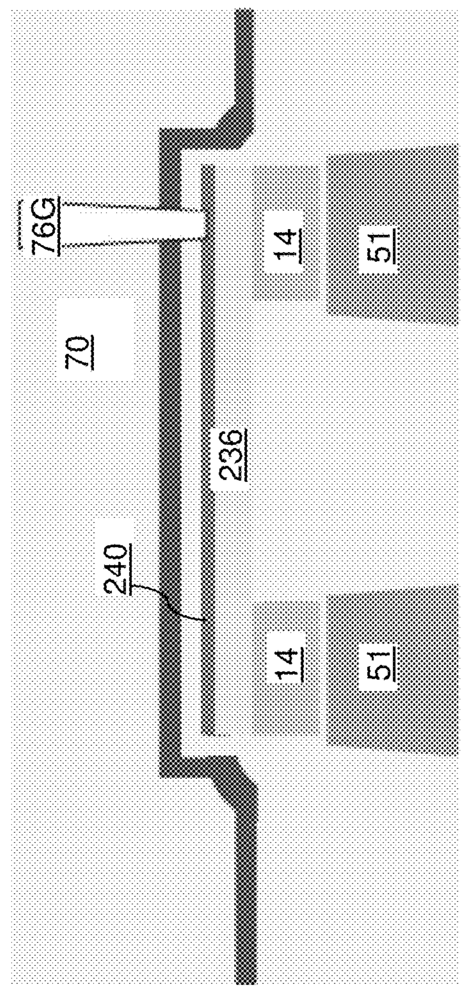
Figure 46A:
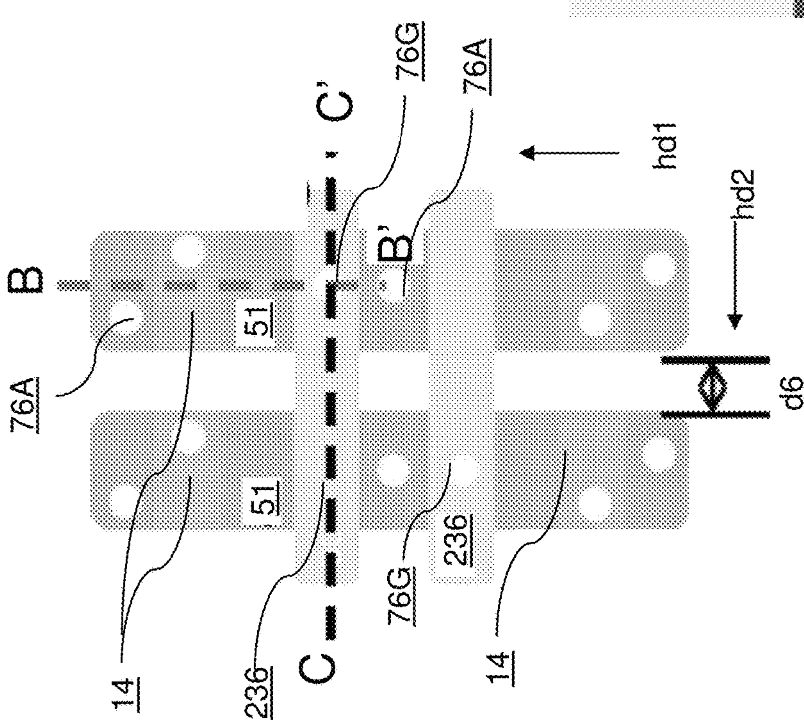
FIG. 46A is another top-down view of third exemplary transistor structures according to the third embodiment of the present disclosure.

FIGS. 45A, 45B, 46A, 46B and 46C illustrate third exemplary transistor structures according to the third embodiment of the present disclosure. The overlying semiconductor gate cap structure 236 and the conductive gate cap structure 240 are used as the gate contact via structure 76G tap area for transistor structures containing both fringed and fringeless transistors. Specifically, the fringeless transistors lack the overlying semiconductor gate cap structure 236 and may include a fringeless gate electrode 14. The fringed transistors include both the overlying semiconductor gate cap structure 236 and the underlying gate electrode 14 which extend past the boundary of the active regions 51, as shown in FIGS. 46A and 46C.

The polysilicon gate electrode 14 and semiconductor gate cap structure 236 resistance is reduced by including respective silicide regions 25S and 240 on their upper surfaces. The semiconductor gate cap structure 236 extends along the second horizontal direction hd2 between two adjacent transistor structures and acts as the common gate contact via structure 76G tap area. Furthermore, since both the underlying gate electrodes 14 and the overlying semiconductor gate cap structures 236 comprise polysilicon with a silicide cap structure, it becomes easier to tune the characteristics of the fringeless transistors which include only the underlying gate electrode 14 and the fringed transistors which include both the underlying gate electrodes 14 and the overlying semiconductor gate cap structures 236.

The transistor structures may be formed closer to each other (e.g., be separated by relatively small distance d2 along the second horizontal direction) and take up relatively less chip space. Thus, the overall chip size may be reduced.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a first field effect transistor, wherein:

the first field effect transistor comprises a first active region having a pair of lengthwise sidewalls and a pair of widthwise sidewalls that contact sidewalls of and are laterally surrounded by a first portion of a trench isolation structure;

the first active region comprises a first source region, a first drain region, and a first channel region located between the first source region and the first drain region;

a first gate structure includes a first gate dielectric, a first gate electrode, a first planar dielectric spacer plate, and a first conductive gate cap structure that overlies the first channel region;

the first gate dielectric and the first gate electrode contact a sidewall of a protruding region of the first portion of the trench isolation structure that laterally extends along a first horizontal direction;

the first planar dielectric spacer plate contacts a first portion of a top surface of the first gate electrode; and the first conductive gate cap structure comprises a first segment that contacts a second portion of the top surface of the first gate electrode, a second segment that overlies the first planar dielectric spacer plate, and a connecting segment that contacts a first sidewall of the first planar dielectric spacer plate and connecting the first segment and the second segment; and further comprising a contact-level dielectric layer overlying and laterally surrounding the first field effect transistor and contacting a third portion of the top surface of the first gate electrode, wherein the third portion of the top surface of the first gate electrode is laterally spaced from the second portion of the top surface of the first gate electrode by the first portion of the top surface of the first gate electrode.

2. A semiconductor structure comprising a first field effect transistor, wherein:

the first field effect transistor comprises a first active region having a pair of lengthwise sidewalls and a pair of widthwise sidewalls that contact sidewalls of and are laterally surrounded by a first portion of a trench isolation structure;

the first active region comprises a first source region, a first drain region, and a first channel region located between the first source region and the first drain region;

a first gate structure includes a first gate dielectric, a first gate electrode, a first planar dielectric spacer plate, and a first conductive gate cap structure that overlies the first channel region;

the first gate dielectric and the first gate electrode contact a sidewall of a protruding region of the first portion of the trench isolation structure that laterally extends along a first horizontal direction;

the first planar dielectric spacer plate contacts a first portion of a top surface of the first gate electrode; and the first conductive gate cap structure comprises a first segment that contacts a second portion of the top surface of the first gate electrode, a second segment that overlies the first planar dielectric spacer plate, and a connecting segment that contacts a first sidewall of the first planar dielectric spacer plate and connecting the first segment and the second segment;

wherein a portion of a bottom surface of the first conductive gate cap structure contacts a top surface of the protruding region of the first portion of the trench isolation structure.

3. A semiconductor structure comprising a first field effect transistor, wherein:

the first field effect transistor comprises a first active region having a pair of lengthwise sidewalls and a pair of widthwise sidewalls that contact sidewalls of and are laterally surrounded by a first portion of a trench isolation structure;

the first active region comprises a first source region, a first drain region, and a first channel region located between the first source region and the first drain region;

a first gate structure includes a first gate dielectric, a first gate electrode, a first planar dielectric spacer plate, and a first conductive gate cap structure that overlies the first channel region;

the first gate dielectric and the first gate electrode contact a sidewall of a protruding region of the first portion of the trench isolation structure that laterally extends along a first horizontal direction;

the first planar dielectric spacer plate contacts a first portion of a top surface of the first gate electrode; and the first conductive gate cap structure comprises a first segment that contacts a second portion of the top surface of the first gate electrode, a second segment that overlies the first planar dielectric spacer plate, and a connecting segment that contacts a first sidewall of the first planar dielectric spacer plate and connecting the first segment and the second segment; and further comprising a first planar semiconductor spacer plate contacting a top surface of the first planar dielectric spacer plate, having a lesser area than the first planar dielectric spacer plate, and contacting a bottom surface of the second segment of the first conductive gate cap structure.

4. The semiconductor structure of claim 3, wherein a first sidewall of the first planar semiconductor spacer plate overlies, and is vertically coincident with, the first sidewall of the first planar dielectric spacer plate, and contacts the connecting segment of the first conductive gate cap structure.

5. The semiconductor structure of claim 4, further comprising a first dielectric gate spacer comprising an upper portion that laterally surrounds and contacts the first conductive gate cap structure and the first planar semiconductor spacer plate, and contacts a portion of a top surface of the first planar dielectric spacer plate.

6. The semiconductor structure of claim 5, wherein:

the first dielectric gate spacer contacts a second sidewall of the first planar semiconductor spacer plate; and an outer sidewall of the first dielectric gate spacer is vertically coincident with a second sidewall of the first planar dielectric spacer plate.

7. The semiconductor structure of claim 5, wherein:

the first gate dielectric comprises a first sidewall that contacts the sidewall of the protruding region of the first portion of the trench isolation structure;

the first gate electrode comprises a first sidewall that contacts the sidewall of the protruding region of the first portion of the trench isolation structure;

a second sidewall of the first gate dielectric and a second sidewall of the first gate electrode that laterally extend along the first horizontal direction contacts a sidewall of a lower portion of the first dielectric gate spacer.

8. The semiconductor structure of claim 7, wherein additional sidewalls of the first gate dielectric and the first gate electrode contact additional sidewalls of the lower portion of the first dielectric gate spacer that laterally extends along a second horizontal direction that is perpendicular to the first horizontal direction.

9. A semiconductor structure comprising a first field effect transistor, wherein:

the first field effect transistor comprises a first active region having a pair of lengthwise sidewalls and a pair of widthwise sidewalls that contact sidewalls of and are laterally surrounded by a first portion of a trench isolation structure;

the first active region comprises a first source region, a first drain region, and a first channel region located between the first source region and the first drain region;

a first gate structure includes a first gate dielectric, a first gate electrode, a first planar dielectric spacer plate, and a first conductive gate cap structure that overlies the first channel region;

the first gate dielectric and the first gate electrode contact a sidewall of a protruding region of the first portion of the trench isolation structure that laterally extends along a first horizontal direction;

the first planar dielectric spacer plate contacts a first portion of a top surface of the first gate electrode; and the first conductive gate cap structure comprises a first segment that contacts a second portion of the top surface of the first gate electrode, a second segment that overlies the first planar dielectric spacer plate, and a connecting segment that contacts a first sidewall of the first planar dielectric spacer plate and connecting the first segment and the second segment;

further comprising a second field effect transistor, wherein:

the second field effect transistor comprises a second active region having a pair of lengthwise sidewalls and a pair of widthwise sidewalls that contact sidewalls of and are laterally surrounded by a second portion of the trench isolation structure;

a second gate structure including a second gate dielectric and a second gate electrode overlies the second active region;

a contact-level dielectric layer overlies the first gate structure and the second gate structure;

at least one gate contact structure is in contact with a portion of a top surface of the second gate electrode; and an entirety of the top surface of the second gate electrode that is not in contact with the at least one gate contact structure is in contact with the contact-level dielectric layer; and further comprising an additional field effect transistor, wherein:

the additional field effect transistor comprises an additional active region having a pair of lengthwise sidewalls and a pair of widthwise sidewalls that contact sidewalls of and are laterally surrounded by an additional portion of the trench isolation structure; and an additional gate structure including an additional composite gate dielectric comprising a silicon oxide sublayer having a greater thickness than the first gate dielectric and a silicon nitride sublayer, and an additional gate electrode comprising an additional conductive gate cap structure having a same thickness and a same material composition as the first segment of the first conductive gate cap structure, the additional gate structure overlies the additional active region.

10. A semiconductor structure comprising a first field effect transistor, wherein:

the first field effect transistor comprises a first active region having a pair of lengthwise sidewalls and a pair of widthwise sidewalls that contact sidewalls of and are laterally surrounded by a first portion of a trench isolation structure;

the first active region comprises a first source region, a first drain region, and a first channel region located between the first source region and the first drain region;

a first gate structure includes a first gate dielectric, a first gate electrode, a first planar dielectric spacer plate, and a first conductive gate cap structure that overlies the first channel region;

the first gate dielectric and the first gate electrode contact a sidewall of a protruding region of the first portion of the trench isolation structure that laterally extends along a first horizontal direction;

the first planar dielectric spacer plate contacts a first portion of a top surface of the first gate electrode; and the first conductive gate cap structure comprises a first segment that contacts a second portion of the top surface of the first gate electrode, a second segment that overlies the first planar dielectric spacer plate, and a connecting segment that contacts a first sidewall of the first planar dielectric spacer plate and connecting the first segment and the second segment; and further comprising a passive device comprising at least one of capacitor or a resistor, wherein:

the passive device comprises a layer stack including from bottom to top, a first dielectric layer, a second dielectric layer, a semiconductor plate, and a metallic plate;

the second dielectric layer has a same material composition and a same thickness as the first planar dielectric spacer plate; and the metallic plate has a same material composition and a same thickness as the first segment of the first conductive gate cap structure.

* * * * *